(12) United States Patent
Fujii et al.

(10) Patent No.: US 8,647,812 B2
(45) Date of Patent: Feb. 11, 2014

(54) PATTERN FORMING METHOD, CHEMICAL AMPLIFICATION RESIST COMPOSITION AND RESIST FILM

(75) Inventors: Kana Fujii, Shizuoka (JP); Shinji Tarutani, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/636,834

(22) PCT Filed: Mar. 18, 2011

(86) PCT No.: PCT/JP2011/057499
§ 371 (c)(1),
(2), (4) Date: Sep. 24, 2012

(87) PCT Pub. No.: WO2011/118824
PCT Pub. Date: Sep. 29, 2011

(65) Prior Publication Data
US 2013/0011619 A1    Jan. 10, 2013

(30) Foreign Application Priority Data

Mar. 23, 2010  (JP) ................................. 2010-067076
Feb. 16, 2011  (JP) ................................. 2011-031437

(51) Int. Cl.
*G03F 7/00* (2006.01)
*G03F 7/004* (2006.01)
*G03F 7/028* (2006.01)
*G03F 7/40* (2006.01)

(52) U.S. Cl.
USPC ......... 430/270.1; 430/330; 430/331; 430/913

(58) Field of Classification Search
USPC ............................... 430/270.1, 330, 331, 913
See application file for complete search history.

(56) References Cited

U.S. PATENT DOCUMENTS

| | | | | |
|---|---|---|---|---|
| 4,743,529 A | * | 5/1988 | Farid et al. ................. | 430/281.1 |
| 6,872,503 B2 | * | 3/2005 | Wheland et al. ........... | 430/270.1 |
| 7,368,220 B2 | * | 5/2008 | Kanda et al. ............... | 430/270.1 |
| 7,504,194 B2 | * | 3/2009 | Fukuhara et al. .......... | 430/270.1 |
| 7,611,820 B2 | * | 11/2009 | Kanda et al. ............... | 430/270.1 |

(Continued)

FOREIGN PATENT DOCUMENTS

| | | |
|---|---|---|
| EP | 2157479 A1 | 2/2010 |
| JP | 2000-199953 A | 7/2000 |

(Continued)

OTHER PUBLICATIONS

International Search Report for PCT/JP2011/057499 dated Apr. 26, 2011, previously submitted on Sep. 24, 2012 [PCT/ISA/210].

(Continued)

*Primary Examiner* — Amanda C. Walke
(74) *Attorney, Agent, or Firm* — Sughrue Mion, PLLC

(57) ABSTRACT

A pattern forming method comprising (i) a step of forming a film from a chemical amplification resist composition, (ii) a step of exposing the film, and (iii) a step of developing the exposed film by using an organic solvent-containing developer, wherein the resist composition contains (A) a resin capable of increasing the polarity to decrease the solubility for an organic solvent-containing developer by the action of an acid, (B) at least one kind of a compound capable of generating a sulfonic acid represented by the specific formula upon irradiation with an actinic ray or radiation, and (C) a solvent.

21 Claims, 1 Drawing Sheet

(56) References Cited

U.S. PATENT DOCUMENTS

| | | | |
|---|---|---|---|
| 7,635,554 B2* | 12/2009 | Fukuhara et al. | 430/270.1 |
| 7,794,914 B2* | 9/2010 | Ando et al. | 430/270.1 |
| 7,851,140 B2* | 12/2010 | Tsubaki | 430/325 |
| 7,985,534 B2* | 7/2011 | Tsubaki | 430/322 |
| 7,998,655 B2* | 8/2011 | Tsubaki | 430/270.1 |
| 8,017,298 B2* | 9/2011 | Tsubaki | 430/270.1 |
| 8,017,304 B2* | 9/2011 | Tarutani et al. | 430/270.1 |
| 8,034,547 B2* | 10/2011 | Tsubaki et al. | 430/326 |
| 8,071,272 B2* | 12/2011 | Tsubaki | 430/270.1 |
| 8,080,363 B2* | 12/2011 | Kanda | 430/270.1 |
| 8,088,557 B2* | 1/2012 | Tsubaki | 430/270.1 |
| 8,227,183 B2* | 7/2012 | Tsubaki et al. | 430/434 |
| 8,241,840 B2* | 8/2012 | Tsubaki et al. | 430/325 |
| 2002/0102491 A1 | 8/2002 | Kodama et al. | |
| 2005/0130060 A1 | 6/2005 | Kodama et al. | |
| 2007/0003871 A1 | 1/2007 | Kodama et al. | |
| 2007/0134588 A1* | 6/2007 | Kanda et al. | 430/270.1 |
| 2008/0187860 A1* | 8/2008 | Tsubaki et al. | 430/270.1 |
| 2008/0261150 A1 | 10/2008 | Tsubaki et al. | |
| 2009/0148791 A1 | 6/2009 | Kodama et al. | |
| 2010/0136479 A1 | 6/2010 | Yamaguchi et al. | |
| 2010/0167201 A1 | 7/2010 | Tsubaki | |
| 2010/0255419 A1 | 10/2010 | Kodama et al. | |
| 2010/0304303 A1* | 12/2010 | Maeda et al. | 430/286.1 |
| 2010/0323305 A1* | 12/2010 | Tsubaki et al. | 430/325 |
| 2011/0045413 A1* | 2/2011 | Tsubaki | 430/326 |
| 2011/0075238 A1* | 3/2011 | Sewell et al. | 359/241 |
| 2011/0236826 A1* | 9/2011 | Hatakeyama et al. | 430/270.1 |
| 2011/0236831 A1* | 9/2011 | Hasegawa et al. | 430/285.1 |
| 2012/0058436 A1 | 3/2012 | Tsubaki et al. | |
| 2012/0289697 A1* | 11/2012 | Murai et al. | 544/126 |
| 2012/0328985 A1* | 12/2012 | Kato et al. | 430/284.1 |
| 2013/0052588 A1* | 2/2013 | Yoshida et al. | 430/285.1 |

FOREIGN PATENT DOCUMENTS

| | | |
|---|---|---|
| JP | 2002-214774 A | 7/2002 |
| JP | 2005-148291 A | 6/2005 |
| JP | 2006-156422 A | 6/2006 |
| JP | 2007-206639 A | 8/2007 |
| JP | 2008-292975 A | 12/2008 |
| JP | 2010-138330 A | 6/2010 |
| JP | 2010-150234 A | 7/2010 |
| WO | 2008/153109 A1 | 12/2008 |
| WO | WO 2008153109 A1 * | 12/2008 |
| WO | 2009/057769 A1 | 5/2009 |
| WO | WO 2009057769 A1 * | 5/2009 |

OTHER PUBLICATIONS

Written Opinion for PCT/JP2011/057499, dated Apr. 26, 2011, previously submitted on Sep. 24, 2012 [PCT/ISA/237].

* cited by examiner

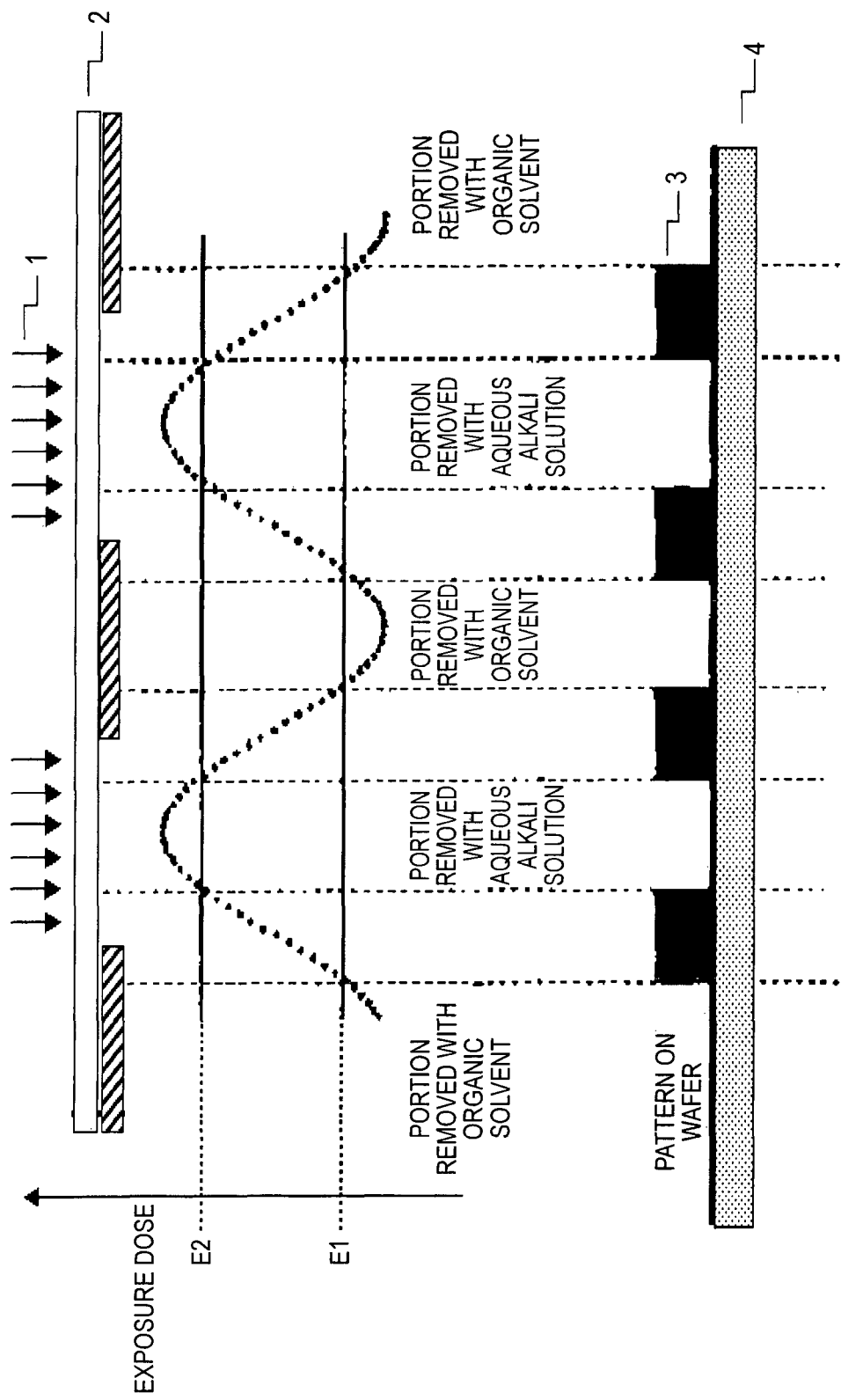

PATTERN FORMING METHOD, CHEMICAL AMPLIFICATION RESIST COMPOSITION AND RESIST FILM

TECHNICAL FIELD

The present invention relates to a pattern forming method applicable to the production of an electronic device such as a semiconductor device or a liquid crystal device or thermal head or the process of producing a semiconductor such as IC or the production of a circuit board such as thermal head and further to the lithography in other photo-fabrication processes, a chemical amplification resist composition used in the pattern forming method, and a resist film formed using the chemical amplification resist composition. More specifically, the present invention relates to a pattern fainting method suitable for exposure by an ArF exposure apparatus, an ArF immersion-type projection exposure apparatus or an EUV exposure apparatus each using a light source that emits far ultraviolet light at a wavelength of 300 nm or less, a chemical amplification resist composition used in the pattern forming method, and a resist film formed using the chemical amplification resist composition.

BACKGROUND ART

Since the advent of a resist for KrF excimer laser (248 nm), an image forming method called chemical amplification is used as an image forming method for a resist so as to compensate for sensitivity reduction caused by light absorption. For example, the image forming method by positive chemical amplification is an image forming method of decomposing an acid generator in the exposed area upon exposure with excimer laser, electron beam, extreme-ultraviolet light or the like to produce an acid, converting an alkali-insoluble group into an alkali-soluble group by using the generated acid as a reaction catalyst in the baking after exposure (PEB: Post Exposure Bake), and removing the exposed area with an alkali developer.

As for the alkali developer used in the method above, various alkali developers have been proposed, but an aqueous alkali developer of 2.38 mass % TMAH (an aqueous tetramethylammonium hydroxide solution) is being used for general purposes.

Also, due to miniaturization of a semiconductor device, the trend is moving into a shorter wavelength of the exposure light source and a higher numerical aperture (high NA) of the projection lens, and an exposure machine using an ArF excimer laser with a wavelength of 193 nm as a light source has been developed at present. Furthermore, a so-called immersion method of filling a high refractive-index liquid (hereinafter sometimes referred to as an "immersion liquid") between the projection lens and the sample is being aggressively studied. The immersion method can be combined with the super-resolution technology under study at present, such as phase-shift method and modified illumination method.

As for the technique to more enhance the resolution, double exposure technology or double patterning technology has been proposed.

In conventional pattern formation of an electronic device such as semiconductor device, a mask or reticle pattern enlarged to 4 to 5 times the size of a pattern intended to form is size-reduced and transferred on an exposure target such as wafer by using a reduction projection exposure apparatus.

However, the dimensional miniaturization brings about a problem that in the conventional exposure system, lights irradiated on adjacent patterns interfere with each other to decrease the optical contrast. Therefore, in such technology, an approach of dividing the exposure mask design into two or more parts and synthesizing an image by independently exposing these masks is being taken. In this double exposure system, it is necessary to divide the exposure mask design and again synthesize an image of the design on an exposure target (wafer), and therefore, division of the mask design must be devised so that the pattern on the reticle can be faithfully reproduced on the exposure target.

Studies of applying the effect of such a double exposure system to the transfer of a fine image pattern of a semiconductor device are introduced, for example, in JP-A-2006-156422 (the term "JP-A" as used herein means an "unexamined published Japanese patent application").

In the case of simply applying the conventional resist composition to the double exposure system, the pattern formation needs to be performed near the resolution limit of the resist, and this incurs a problem that sufficient exposure margin or depth of focus cannot be obtained.

JP-A-2000-199953 describes a double development technology as the double patterning technology for enhancing the resolution. In this example, an image forming method by general chemical amplification is utilized, and by making use of a property that the polarity of a resin in a resist composition when exposed becomes high in a region irradiated with a high light intensity and maintained low in a region irradiated with a low light intensity, the high exposure region of a specific resist film is dissolved with a high-polarity developer (specifically, a conventional aqueous alkali solution) (positive development) and the low exposure region is dissolved with a low-polarity developer (specifically, an organic solvent) (negative development). More specifically, the region not lower than an exposure dose E2 of irradiation light 1 shown in FIG. 1 is dissolved using an aqueous alkali solution, and the region not higher than an exposure dose E1 is dissolved using a specific organic solvent, whereby, as shown in FIG. 1, the region with a medium exposure dose (E2-E1) is allowed to remain without being developed and an L/S pattern 3 having a pitch half the pitch of the exposure mask 2 is formed on a wafer 4.

However, it is very difficult to select an optimal combination of a resist composition and an organic solvent developer, and there is a problem that developability when using an organic solvent developer becomes bad.

Furthermore, at the formation of a fine pattern by double development, merely showing good resolution on use of an organic solvent or an aqueous alkali solution alone is not enough, and it is demanded to show good pattern resolution for both developers.

Considering these problems, in the double development technology, JP-A-2008-292975 proposes a pattern forming method using a specific resist composition. According to this technique, a high-precision fine pattern is supposed to be stably obtained.

However, more improvements are demanded in the sensitivity, exposure latitude (EL) and other various performances.

SUMMARY OF INVENTION

An object of the present invention is to solve those problems and provide a pattern forming method, a chemical amplification resist composition and a resist film, ensuring that the performance in terms of sensitivity, exposure latitude (EL), mask error enhancement factor (MEEF) and pattern profile is excellent and the line width variation (LWR) is reduced.

The present invention includes the following configurations and thanks to these configurations, the above-described object of the present invention is achieved.

(1) A pattern forming method comprising:
(i) a step of forming a film from a chemical amplification resist composition,
(ii) a step of exposing the film, and
(iii) a step of developing the exposed film by using an organic solvent-containing developer,
wherein the resist composition contains:
(A) a resin capable of increasing the polarity to decrease the solubility for an organic solvent-containing developer by the action of an acid,
(B) at least one kind of a compound capable of generating a sulfonic acid represented by the following formula (I) upon irradiation with an actinic ray or radiation, and
(C) a solvent,

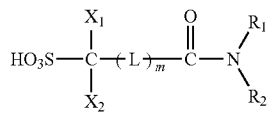
(I)

wherein each of $X_1$ and $X_2$ independently represents a fluorine atom or a fluoroalkyl group;
each of $R_1$ and $R_2$ independently represents a hydrogen atom, an alkyl group or a group having a cyclic structure, and $R_1$ and $R_2$ may combine with each other to form a ring, provided that $R_1$ and $R_2$ are not a hydrogen atom at the same time;
L represents a divalent linking group and when a plurality of L's are present, each L may be the same as or different from every other L; and
m represents an integer of 0 or more.

(2) The pattern forming method as described in (1) above, wherein the content of the organic solvent in the organic solvent-containing developer is from 90 to 100 mass % based on the entire amount of the developer.

(3) The pattern forming method as described in (1) or (2) above, wherein the compound (B) is a compound represented by the following formula (II):

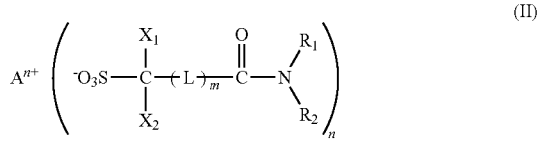
(II)

wherein $A^{n+}$ represents an n-valent cation, n represents 1 or 2, and $X_1$, $X_2$, $R_1$, $R_2$, L and m have the same meanings as $X_1$, $X_2$, $R_1$, $R_2$, L and m in formula (I).

(4) The pattern forming method as described in any one of (1) to (3) above, wherein in formula (I) or (II), $R_1$ is a group having a polycyclic structure.

(5) The pattern forming method as described in any one of (1) to (4) above, wherein in formula (I) or (II), each of $X_1$ and $X_2$ is independently a fluorine atom or a perfluoroalkyl group.

(6) The pattern forming method as described in any one of (1) to (5) above, wherein in formula (I) or (II), each of $X_1$ and $X_2$ is a fluorine atom.

(7) The pattern forming method as described in any one of (1) to (6) above, wherein the developer is a developer containing at least one kind of an organic solvent selected from the group consisting of a ketone-based solvent, an ester-based solvent, an alcohol-based solvent, an amide-based solvent and an ether-based solvent.

(8) The pattern forming method as described in any one of (1) to (7) above, wherein the resin (A) is a resin capable of increasing the polarity to increase the solubility for an alkali developer by the action of an acid and the method further comprises:
(iv) a step of developing the film by using an alkali developer.

(9) The pattern forming method as described in any one of (1) to (8) above, wherein the exposure in the step (ii) is immersion exposure.

(10) The pattern forming method as described in any one of (1) to (9) above, which is a negative-type pattern forming method.

(11) A chemical amplification resist composition that is used in the pattern forming method as described in any one of (1) to (10) above.

(12) The chemical amplification resist composition as described in (11) above, wherein in formula (I) or (II), $R_1$ is a group having a polycyclic structure.

(13) A resist film formed of the chemical amplification resist composition as described in (11) or (12) above.

(14) A method for producing an electronic device, comprising the pattern forming method as described in any one of (1) to (10) above.

(15) An electronic device formed by the method as described in (14) above.

The present invention preferably further includes the following configurations.

(16) The pattern forming method as described in any one of (1) to (10) above, wherein in formula (I) or (II), $X_1$ and $X_2$ are a fluorine atom.

(17) The pattern forming method as described in any one of (1) to (10) and (16) above, wherein in formula (I) or (II), n is 1.

(18) The pattern forming method as described in any one of (1) to (10), (16) and (17) above, wherein in formula (I) or (II), m is 0.

(19) The pattern forming method as described in any one of (1) to (10) and (16) to (18) above, wherein in formula (I) or (II), L is —COO—, —OCO—, —CO—, —O—, —S—, —SO—, —SO$_2$—, an alkylene group, a cycloalkylene group or an alkenylene group.

(20) The pattern forming method as described in any one of (1) to (10) and (16) to (19) above, wherein the chemical amplification resist composition further contains a hydrophobic resin having at least either a fluorine atom or a silicon atom.

(21) The pattern forming method as described in any one of (1) to (10) and (16) to (20) above, wherein the water content percentage as the entire developer of the organic solvent-containing developer is less than 10 mass %.

(22) The pattern forming method as described in any one of (1) to (10) and (16) to (21) above, wherein the content of the organic solvent in the organic solvent-containing developer is from 90 to 100 mass % based on the entire amount of the developer.

According to the present invention, a pattern forming method, a chemical amplification resist composition and a resist film, ensuring that the performance in terms of sensitivity, exposure latitude (EL), mask error enhancement factor (MEEF) and pattern profile is excellent and the line width variation (LWR) is reduced, can be provided.

BRIEF DESCRIPTION OF THE DRAWINGS

FIG. 1 is a schematic view showing the pattern forming method using positive development and negative development in combination;
wherein 1 denotes Irradiation light, 2 denotes Exposure mask, 3 denotes Pattern, 4 denotes Wafer.

DESCRIPTION OF EMBODIMENT

The mode for carrying out the present invention is described below.

In the present invention, when a group (atomic group) is denoted without specifying whether substituted or unsubstituted, the group includes both a group having no substituent and a group having a substituent. For example, "an alkyl group" includes not only an alkyl group having no substituent (unsubstituted alkyl group) but also an alkyl group having a substituent (substituted alkyl group).

In the present invention, the term "actinic ray" or "radiation" indicates, for example, a bright line spectrum of mercury lamp, a far ultraviolet ray typified by excimer laser, an extreme-ultraviolet ray (EUV light), an X-ray or an electron beam. Also, in the present invention, the "light" means an actinic ray or radiation.

Furthermore, in the present invention, unless otherwise indicated, the "exposure" includes not only exposure to a mercury lamp, a far ultraviolet ray typified by excimer laser, an extreme-ultraviolet ray, an X-ray, EUV light or the like but also lithography with a particle beam such as electron beam and ion beam.

The pattern forming method of the present invention comprises:
(i) a step of forming a film by using a chemical amplification resist composition containing (A) a resin capable of increasing the polarity to decrease the solubility for an organic solvent-containing developer by the action of an acid, (B) at least one kind of a compound capable of generating a sulfonic acid represented by the later-described formula (I) upon irradiation with an actinic ray or radiation, and (C) a solvent,
(ii) a step of exposing the film, and
(iii) a step of developing the exposed film by using an organic solvent-containing developer:

In the pattern forming method of the present invention, the developer is preferably a developer containing at least one kind of an organic solvent selected from the group consisting of a ketone-based solvent, an ester-based solvent, an alcohol-based solvent, an amide-based solvent and an ether-based solvent.

The pattern forming method of the present invention preferably further comprises (iv) a step of performing rinsing by using an organic solvent-containing rinsing solution.

The rinsing solution is preferably a rinsing solution containing at least one kind of an organic solvent selected from the group consisting of a hydrocarbon-based solvent, a ketone-based solvent, an ester-based solvent, an alcohol-based solvent, an amide-based solvent and an ether-based solvent.

The pattern forming method of the present invention preferably further comprises (v) a heating step after the exposure step (ii).

In the pattern forming method of the present invention, the resin (A) may be a resin capable of increasing the polarity to increase the solubility for an alkali developer by the action of an acid and the method may further comprise (vi) a step of developing the film by using an alkali developer.

In the pattern forming method of the present invention, the exposure step (ii) may be performed a plurality of times.

In the pattern forming method of the present invention, the heating step (v) may be performed a plurality of times.

The resist film of the present invention is a film formed of a chemical amplification resist composition containing (A) a resin capable of increasing the polarity to decrease the solubility for an organic solvent-containing developer by the action of an acid, (B) at least one kind of a compound capable of generating a sulfonic acid represented by the later-described formula (I) upon irradiation with an actinic ray or radiation, and (C) a solvent, and this film is formed, for example, by coating the resist composition on a base material.

The resist composition which can be used in the present invention is described below.

[1] (A) Resin having an acid-decomposable repeating unit and being capable of increasing the polarity to decrease the solubility for an organic solvent-containing developer by the action of an acid The resin capable of increasing the polarity to decrease the solubility for an organic solvent-containing developer by the action of an acid, which is used in the resist composition of the present invention, includes, for example, a resin having a group capable of decomposing by the action of an acid to produce a polar group (hereinafter sometimes referred to as an "acid-decomposable group"), on either one or both of the main and side chains of the resin (hereinafter sometimes referred to as an "acid-decomposable resin" or a "resin (A)). Incidentally, this resin is also a resin capable of increasing the polarity to increase the solubility for an alkali developer by the action of an acid.

The acid-decomposable group preferably has a structure where a polar group is protected by a group capable of leaving by the action of an acid.

The polar group is not particularly limited as long as it is a group capable of becoming sparingly soluble or insoluble in an organic solvent-containing developer, but examples thereof include a phenolic hydroxyl group, a carboxyl group, a fluorinated alcohol group (preferably hexafluoroisopropanol group), a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group and a tris(alkylsulfonyl)methylene group.

Preferred polar groups include a carboxyl group, a fluorinated alcohol group (preferably hexafluoroisopropanol group) and a sulfonic acid group.

The group preferred as the acid-decomposable group is a group where a hydrogen atom of the group above is substituted for by a group capable of leaving by the action of an acid.

Examples of the group capable of leaving by the action of an acid include —$C(R_{36})(R_{37})(R_{38})$, —$C(R_{36})(R_{37})(R_{39})$ and —$C(R_{01})(R_{02})(OR_{39})$.

In the formulae, each of $R_{36}$ to $R_{39}$ independently represents an alkyl group, a cycloalkyl group, an aryl group, an aralkyl group or an alkenyl group. $R_{36}$ and $R_{37}$ may combine with each other to form a ring.

Each of $R_{01}$ and $R_{02}$ independently represents a hydrogen atom, an alkyl group, a cycloalkyl group, an aryl group, an aralkyl group or an alkenyl group.

The acid-decomposable group is preferably a cumyl ester group, an enol ester group, an acetal ester group, a tertiary alkyl ester group or the like, more preferably a tertiary alkyl ester group.

The acid-decomposable group-containing repeating unit which can be contained in the resin (A) is preferably a repeating unit represented by the following formula (AI):

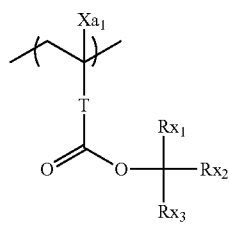

(AI)

In formula (AI), $Xa_1$ represents a hydrogen atom, a methyl group which may have a substituent, or a group represented by —$CH_2$—$R_9$. $R_9$ represents a hydroxyl group or a monovalent organic group. Examples of the monovalent organic group include an alkyl group having a carbon number of 5 or less and an acyl group having a carbon number of 5 or less. Of these, an alkyl group having a carbon number of 3 or less is preferred, and a methyl group is more preferred. $Xa_1$ is preferably a hydrogen atom, a methyl group, a trifluoromethyl group or a hydroxymethyl group.

T represents a single bond or a divalent linking group.

Each of $Rx_1$ to $Rx_3$ independently represents an alkyl group (linear or branched) or a cycloalkyl group (monocyclic or polycyclic).

Two members out of $Rx_1$ to $Rx_3$ may combine to form a cycloalkyl group (monocyclic or polycyclic).

Examples of the divalent linking group of T include an alkylene group, a —COO—Rt- group and a —O—Rt- group. In the formulae, Rt represents an alkylene group or a cycloalkylene group.

T is preferably a single bond or a —COO—Rt- group. Rt is preferably an alkylene group having a carbon number of 1 to 5, more preferably a —$CH_2$— group, —$(CH_2)_2$— group or a —$(CH_2)_3$— group.

The alkyl group of $Rx_1$ to $Rx_3$ is preferably an alkyl group having a carbon number of 1 to 4, such as methyl group, ethyl group, n-propyl group, isopropyl group, n-butyl group, isobutyl group and tert-butyl group.

The cycloalkyl group of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The cycloalkyl group formed by combining two members out of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group. Above all, a monocyclic cycloalkyl group having a carbon number of 5 to 6 is preferred.

An embodiment where $Rx_1$ is a methyl group or an ethyl group and $Rx_2$ and $Rx_3$ are combined to form the above-described cycloalkyl group is preferred.

Each of the groups above may have a substituent, and examples of the substituent include an alkyl group (having a carbon number of 1 to 4), a halogen atom, a hydroxyl group, an alkoxy group (having a carbon number of 1 to 4), a carboxyl group and an alkoxycarbonyl group (having a carbon number of 2 to 6). The carbon number of the substituent is preferably 8 or less.

The content in total of the acid-decomposable group-containing repeating units is preferably from 20 to 70 mol %, more preferably from 30 to 65 mol %, based on all repeating units in the resin (A).

Specific preferred examples of the repeating unit having an acid-decomposable group are illustrated below, but the present invention is not limited thereto.

In specific examples, each of Rx and $Xa_1$ represents a hydrogen atom, $CH_3$, $CF_3$ or $CH_2OH$, and each of Rxa and Rxb represents an alkyl group having a carbon number of 1 to 4. Z represents a substituent containing a polar group, and when a plurality of Z's are present, each Z may be the same as or different from every other Z. p represents 0 or a positive integer. Specific examples and preferred examples of Z are the same as specific examples and preferred examples of $R_{10}$ in formula (2-1) described later.

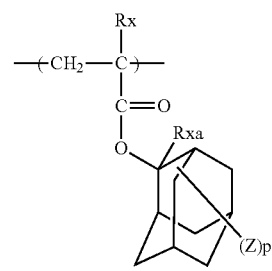

1

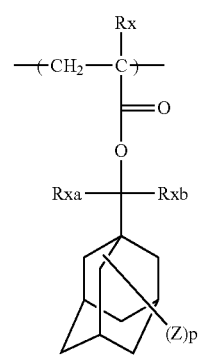

2

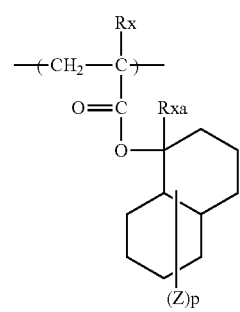

3

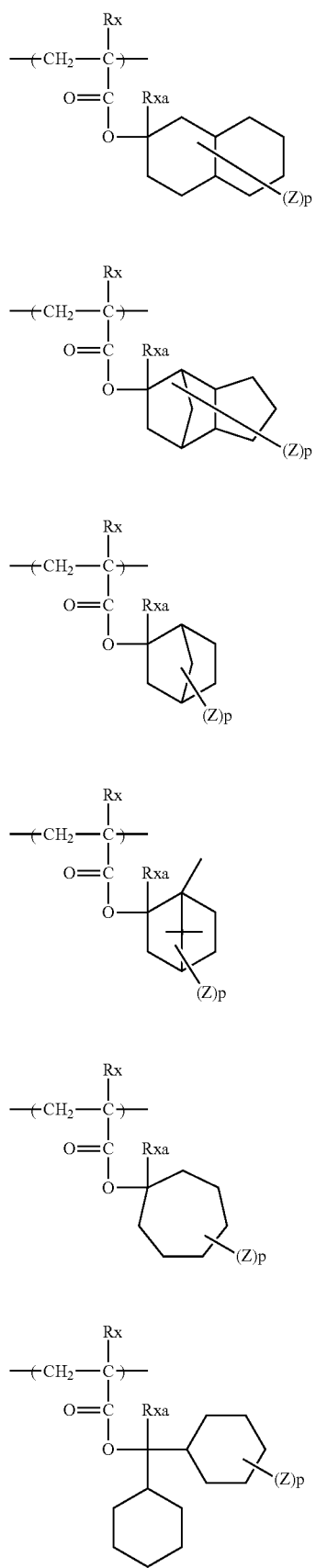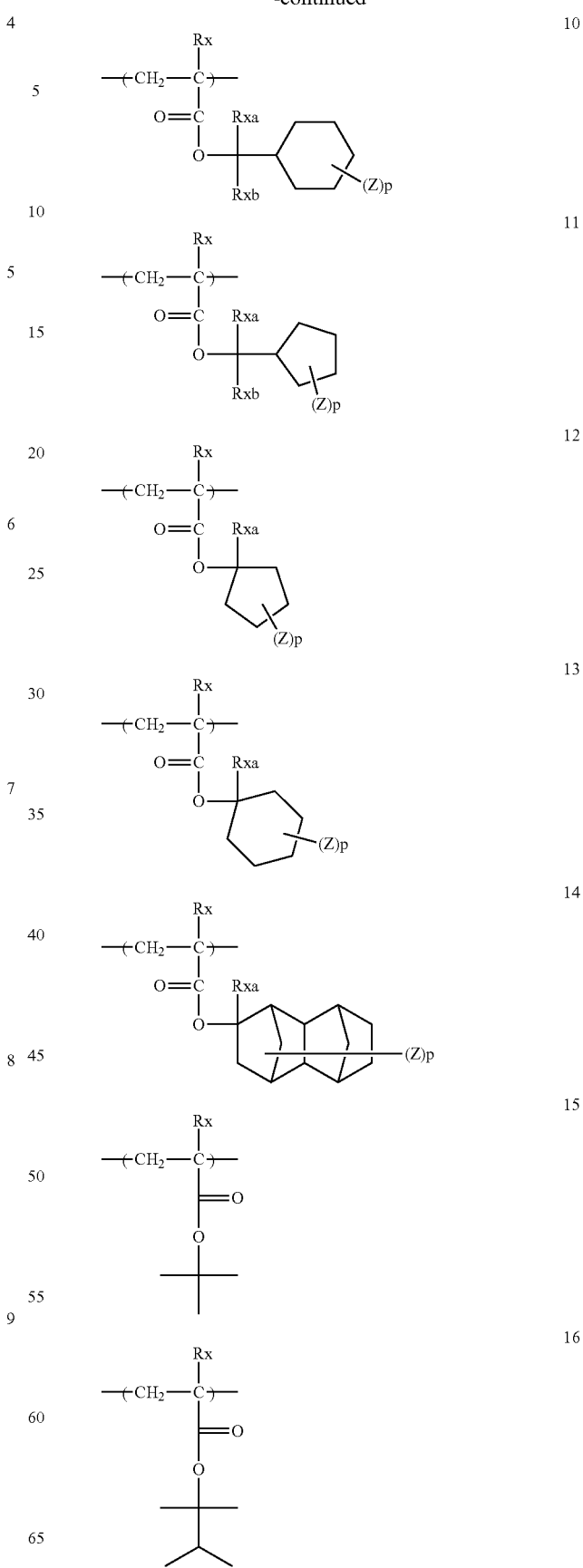

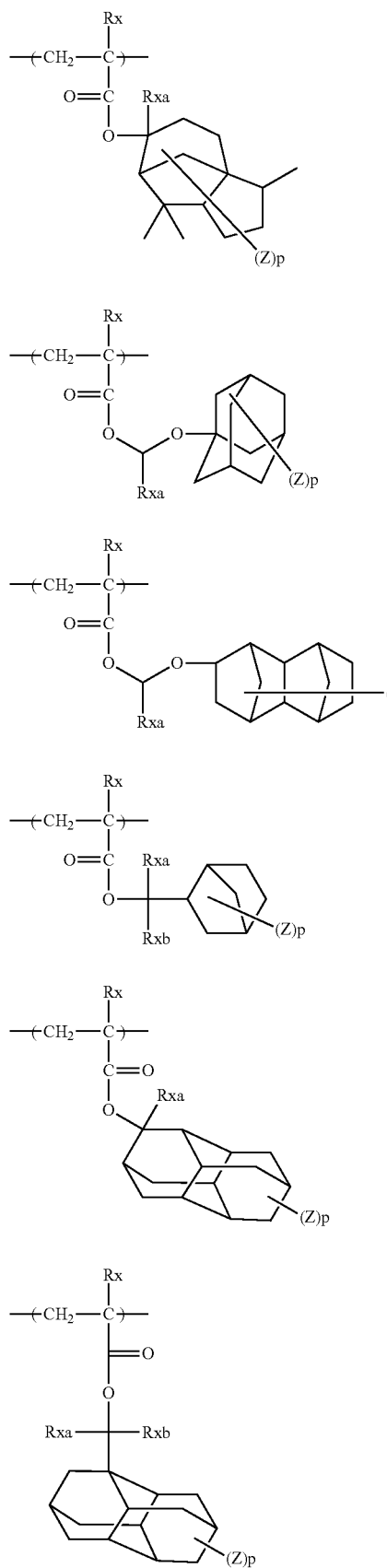
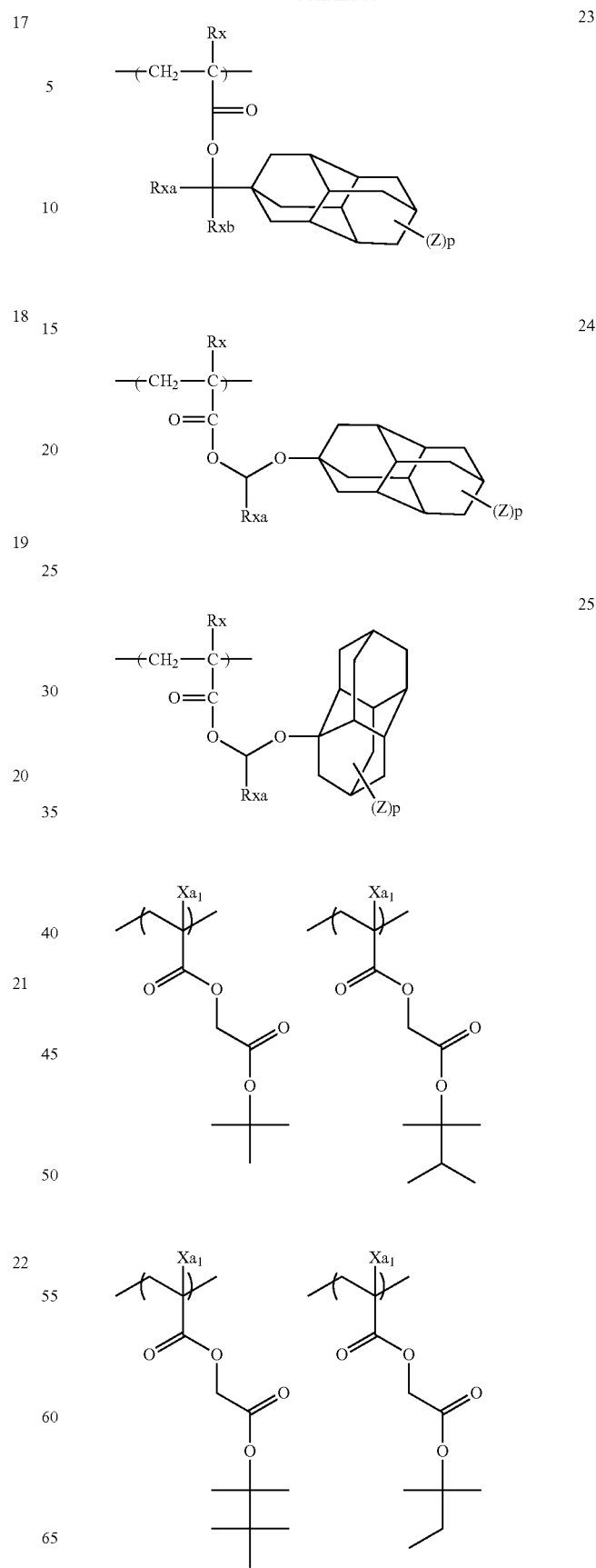

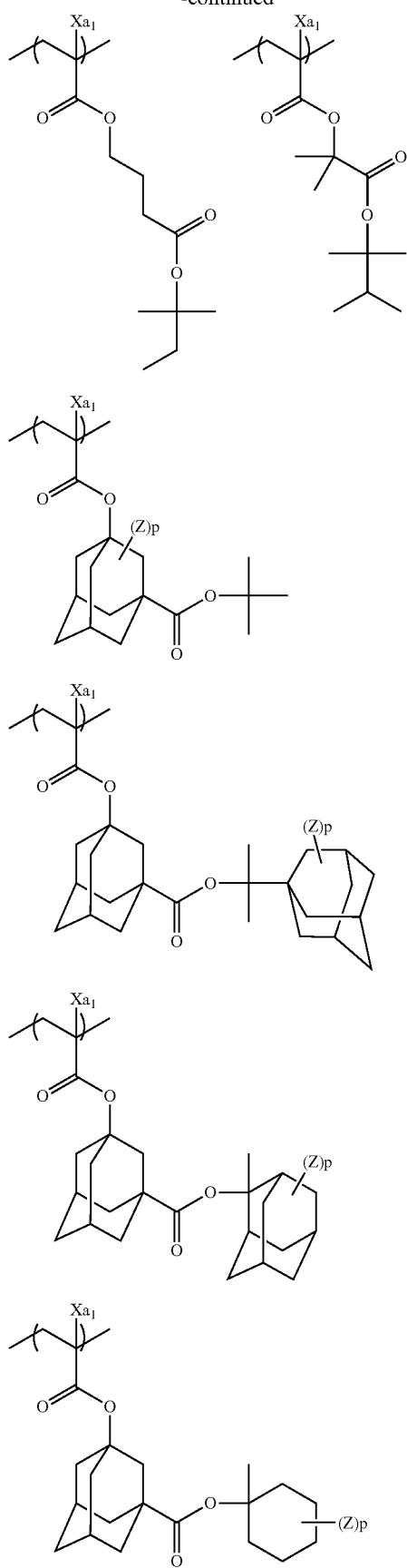
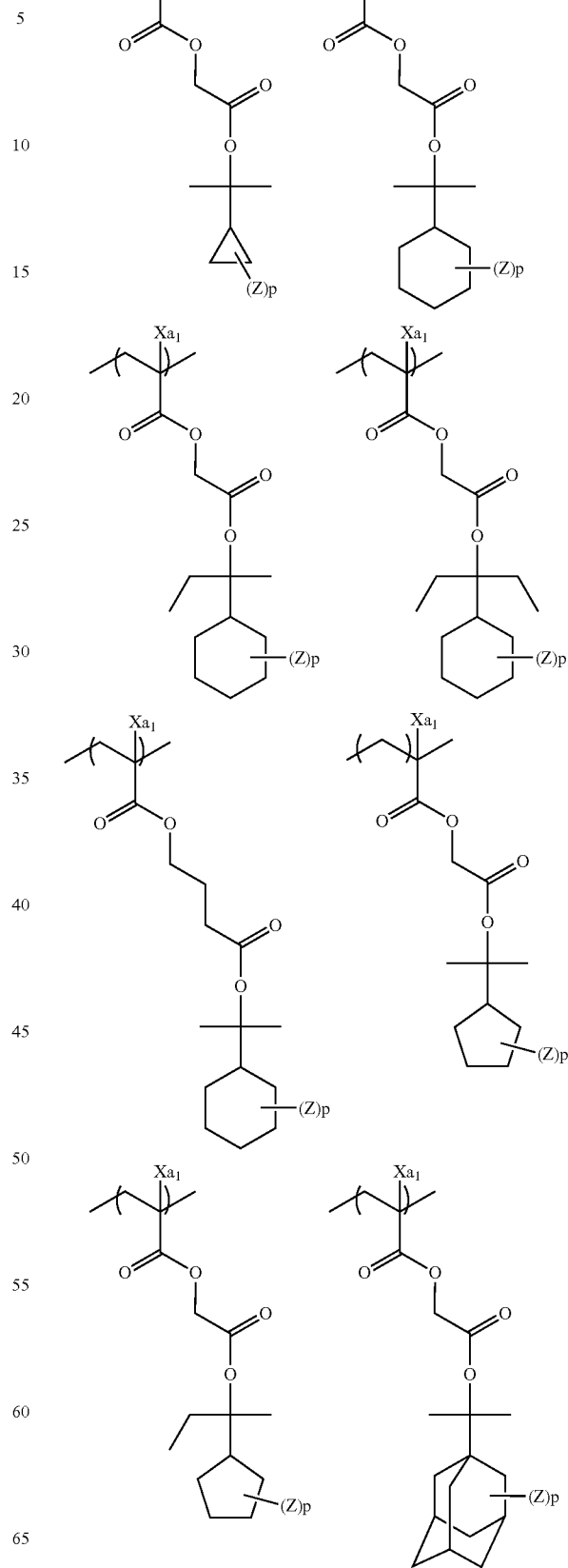

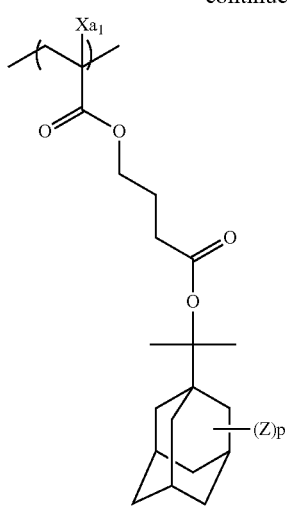
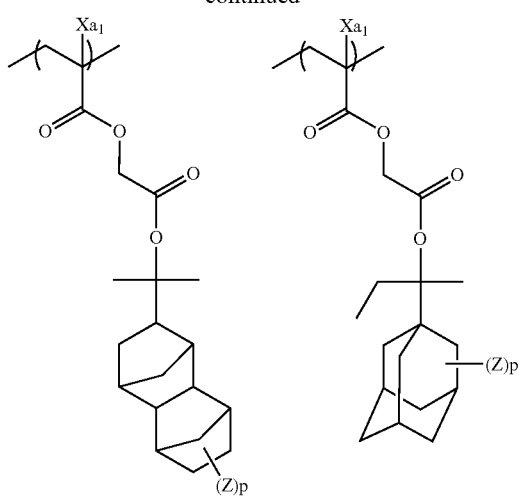
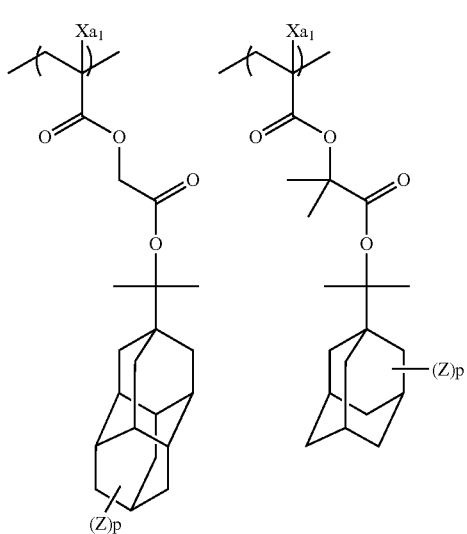
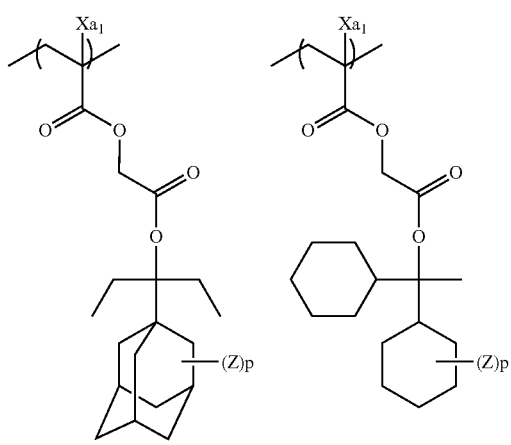
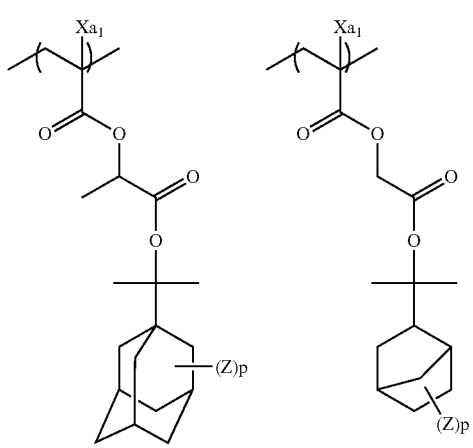
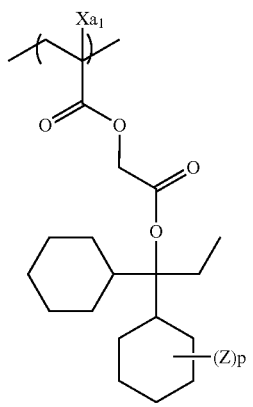

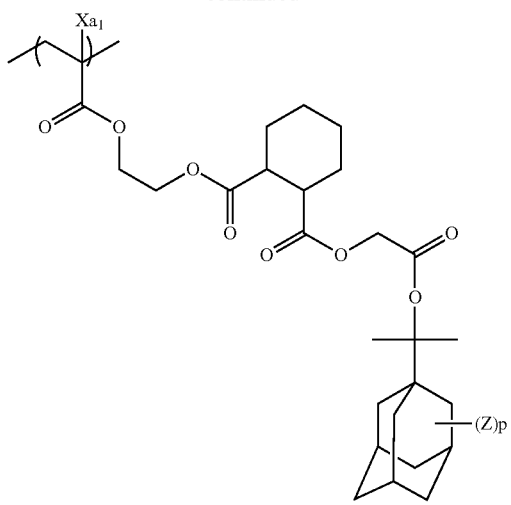
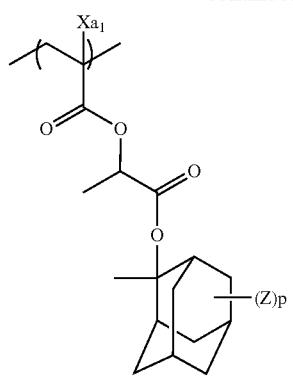
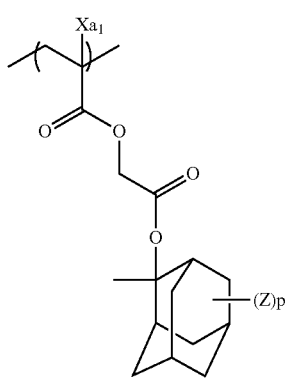
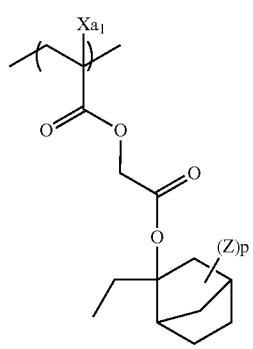
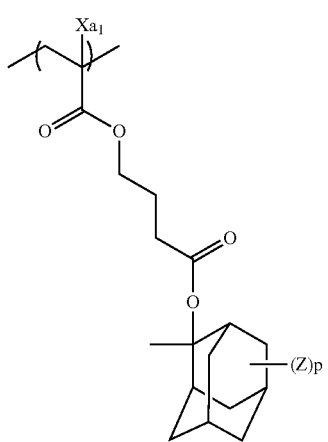
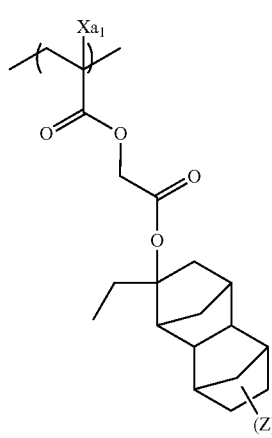
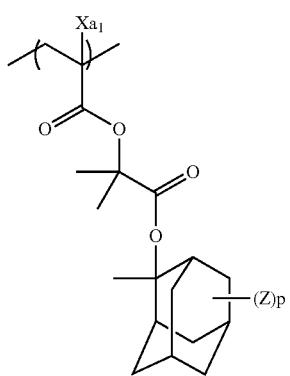
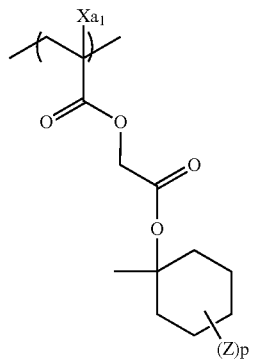
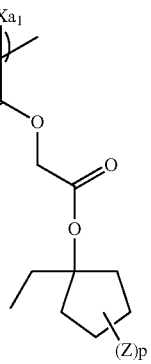

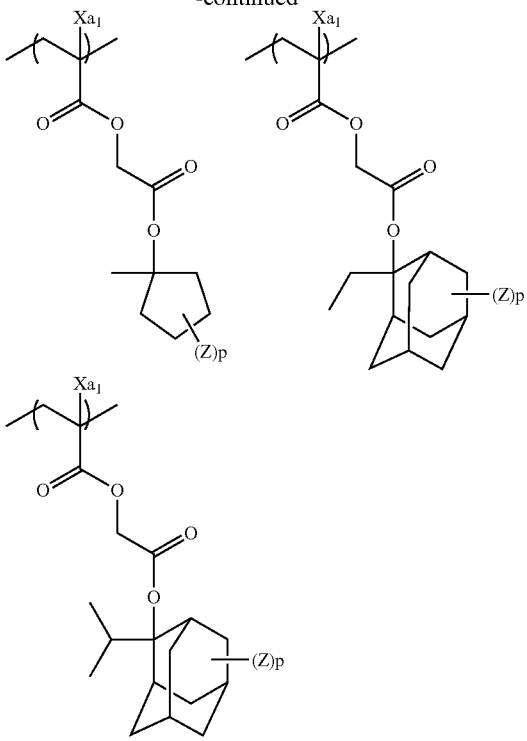

The resin (A) is more preferably a resin containing, as the repeating unit represented by formula (AI), at least either a repeating unit represented by formula (1) or a repeating unit represented by formula (2).

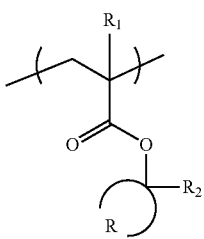

(1)

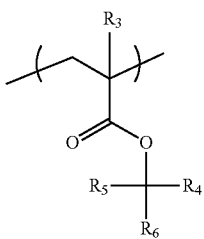

(2)

In formulae (1) and (2), each of $R_1$ and $R_3$ independently represents a hydrogen atom, a methyl group which may have a substituent, or a group represented by —$CH_2$—$R_9$. $R_9$ represents a hydroxyl group or a monovalent organic group.

Each of $R_2$, $R_4$, $R_5$ and $R_6$ independently represents an alkyl group or a cycloalkyl group.

R represents an atomic group necessary for forming an alicyclic structure together with the carbon atom.

Each of $R_1$ and $R_3$ is preferably a hydrogen atom, a methyl group, a trifluoromethyl group or a hydroxymethyl group.

Specific examples and preferred examples of the monovalent organic group in $R_9$ are the same as those described for $R_9$ in formula (AI).

The alkyl group in $R_2$ may be linear or branched and may have a substituent. The cycloalkyl group in $R_2$ may be monocyclic or polycyclic and may have a substituent.

$R_2$ is preferably an alkyl group, more preferably an alkyl group having a carbon number of 1 to 10, still more preferably an alkyl group having a carbon number of 1 to 5, and examples thereof include a methyl group and an ethyl group.

R represents an atomic group necessary for forming an alicyclic structure together with the carbon atom. The alicyclic structure formed by R together with the carbon atom is preferably a monocyclic alicyclic structure, and the carbon number thereof is preferably from 3 to 7, more preferably 5 or 6.

The alkyl group in $R_4$, $R_5$ and $R_6$ may be linear or branched and may have a substituent. The alkyl group is preferably an alkyl group having a carbon number of 1 to 4, such as methyl group, ethyl group, n-propyl group, isopropyl group, n-butyl group, isobutyl group and tert-butyl group.

The cycloalkyl group in $R_4$, $R_5$ and $R_6$ may be monocyclic or polycyclic and may have a substituent. The cycloalkyl group is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The repeating unit represented by formula (1) includes, for example, a repeating unit represented by the following formula (1-a).

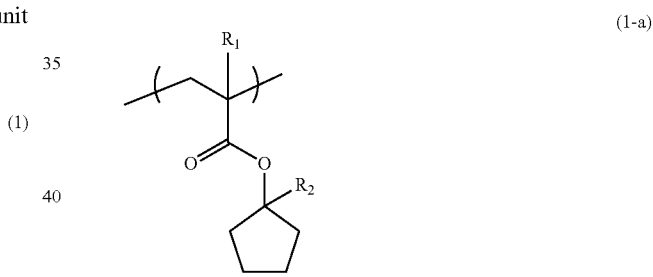

(1-a)

In the formula, $R_1$ and $R_2$ have the same meanings as those in formula (1).

The repeating unit represented by formula (2) is preferably a repeating unit represented by the following formula (2-1):

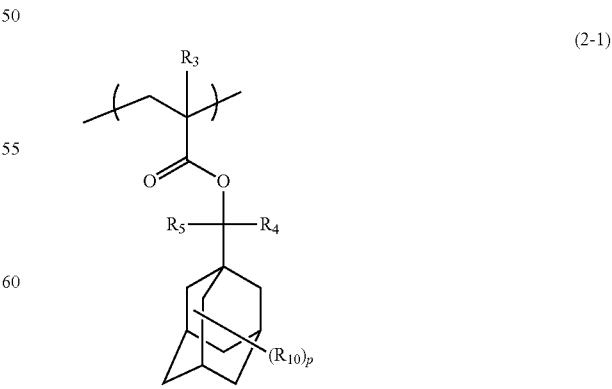

(2-1)

In formula (2-1), $R_3$ to $R_5$ have the same meanings as those in formula (2).

R₁₀ represents a polar group-containing substituent. In the case where a plurality of $R_{10}$'s are present, each $R_{10}$ may be the same as or different from every other $R_{10}$. Examples of the polar group-containing substituent include a hydroxyl group, a cyano group, an amino group, an alkylamide group, a sulfonamide group itself, and a linear or branched alkyl group or cycloalkyl group, having at least one of these groups. An alkyl group having a hydroxyl group is preferred, and a branched alkyl group having a hydroxyl group is more preferred. The branched alkyl group is preferably an isopropyl group.

p represents an integer of 0 to 15. p is preferably an integer of 0 to 2, more preferably 0 or 1.

The resin (A) is preferably a resin containing, as the repeating unit represented by formula (AI), at least either one of a repeating unit represented by formula (1) and a repeating unit represented by formula (2). In another embodiment, the resin is preferably a resin containing, as the repeating unit represented by formula (AI), at least two kinds of repeating units represented by formula (1).

As for the repeating unit having an acid-decomposable group of the resin (A), one kind of a repeating unit may be used, or two or more kinds of repeating units may be used. In the case of using the repeating units in combination, preferred examples of the combination are illustrated below. In the formulae below, each R independently represents a hydrogen atom or a methyl group.

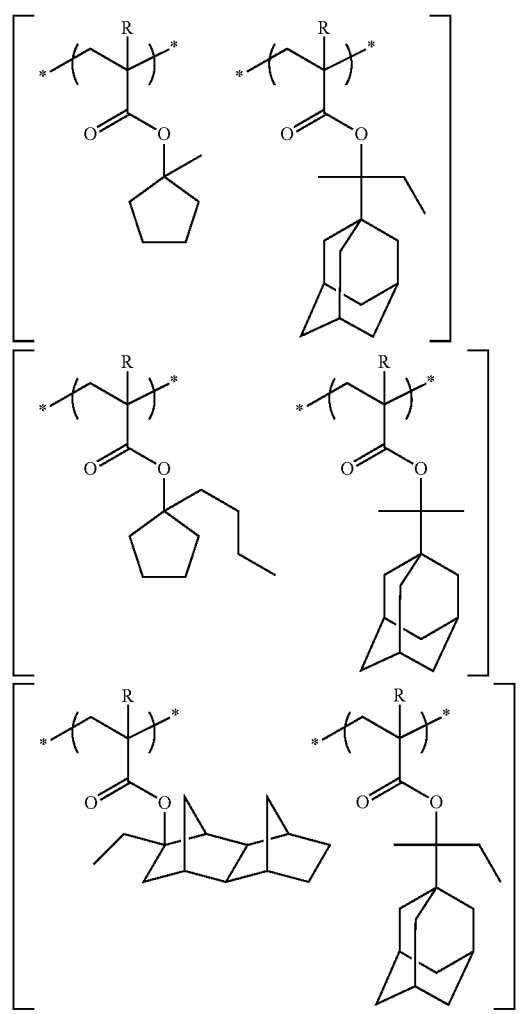

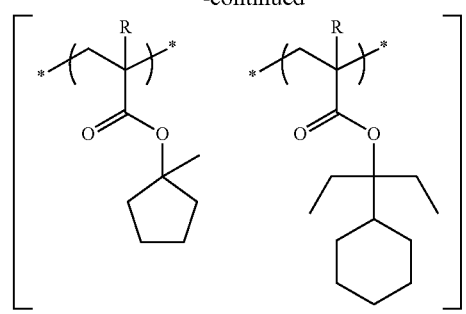

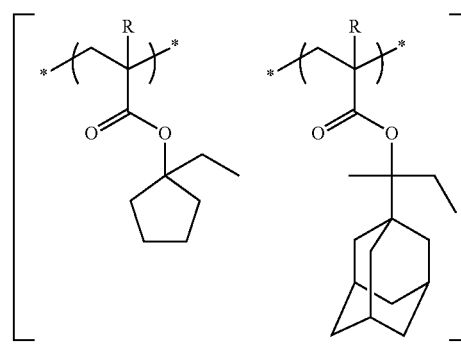

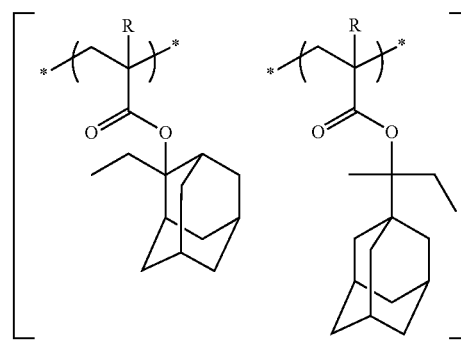

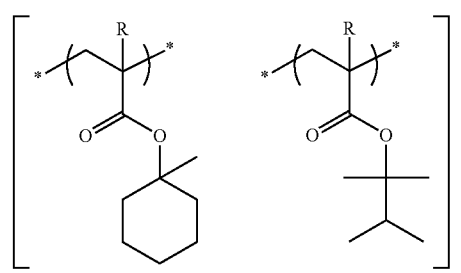

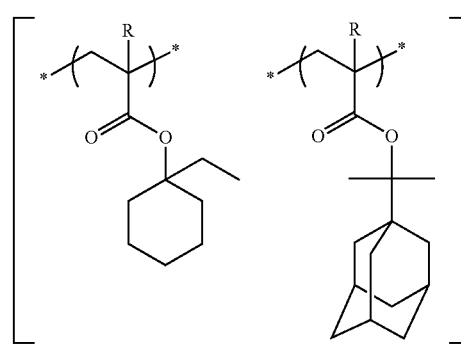

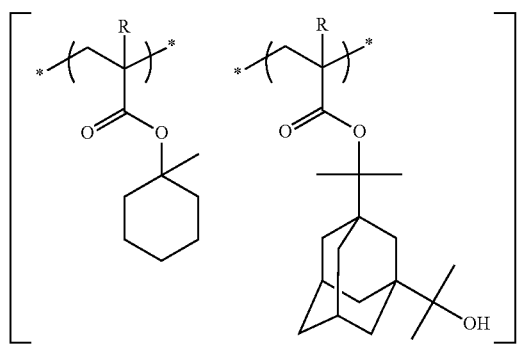
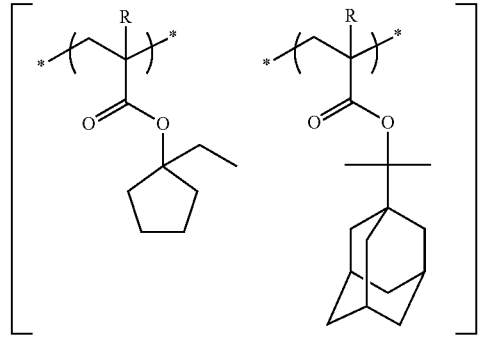
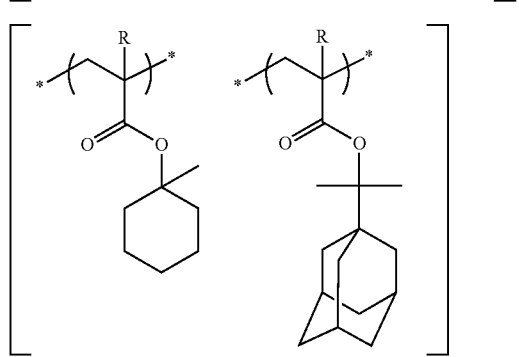
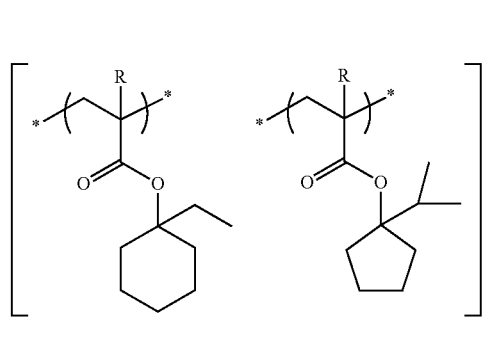
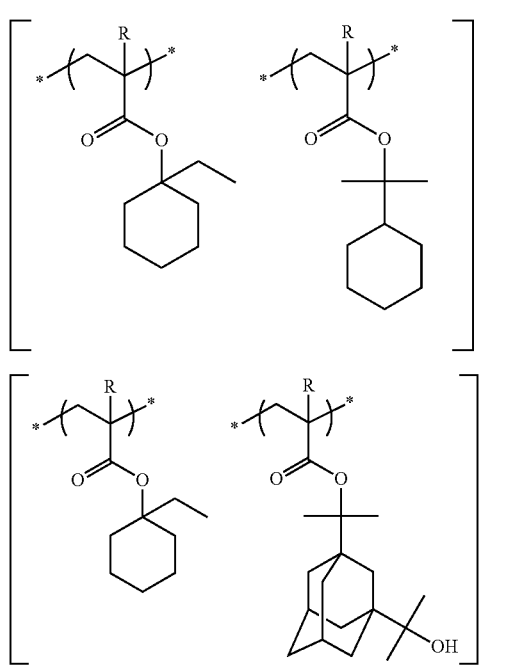
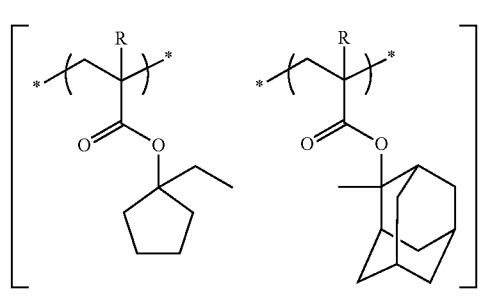
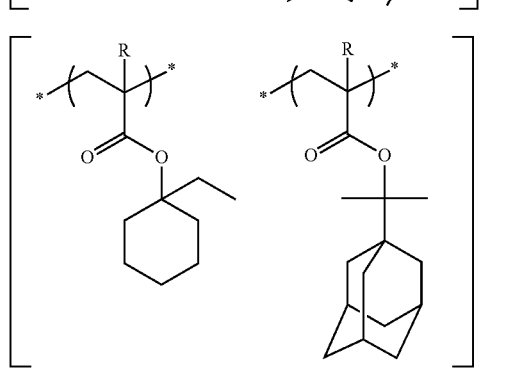
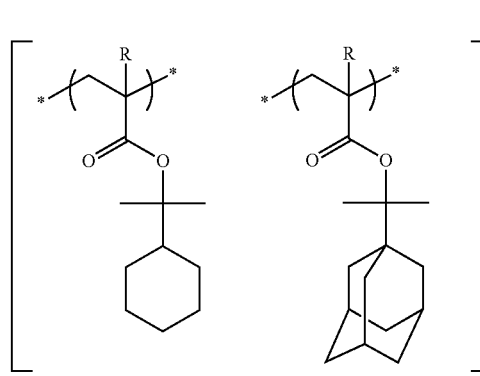

-continued

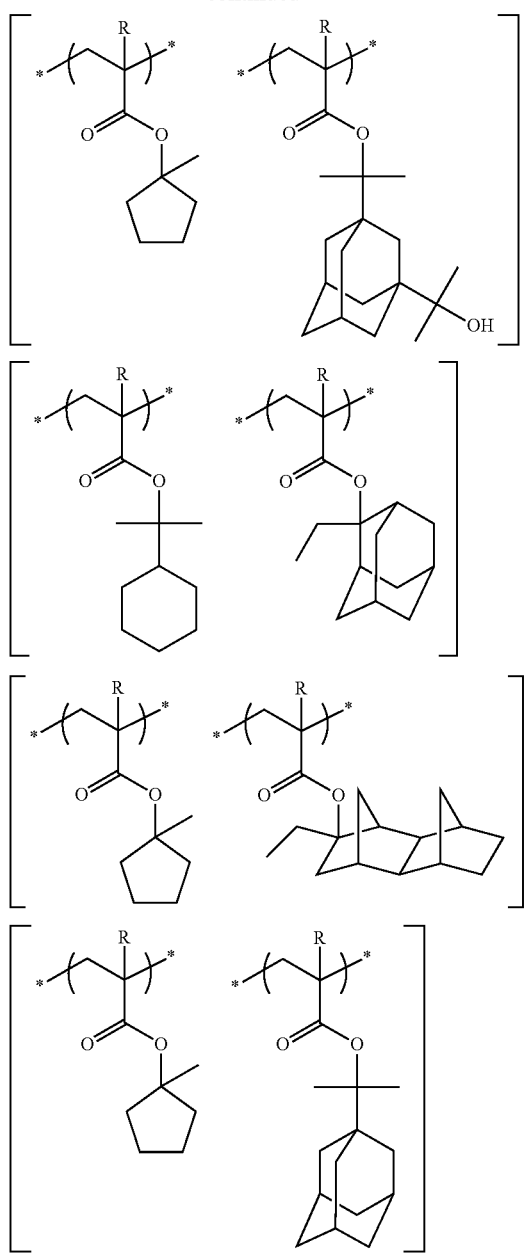

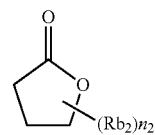
LC1-1

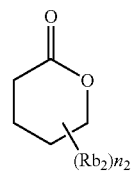
LC1-2

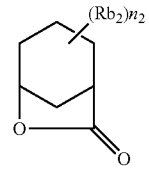
LC1-3

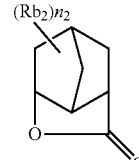
LC1-4

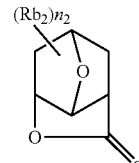
LC1-5

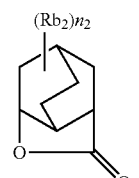
LC1-6

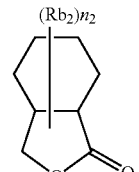
LC1-7

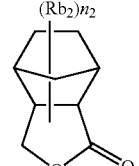
LC1-8

The resin (A) preferably contains a repeating unit having a lactone structure.

As for the lactone structure, any may be used as long as it has a lactone structure, but the lactone structure is preferably a 5- to 7-membered ring lactone structure, and a structure where another ring structure is fused to a 5- to 7-membered ring lactone structure in the form of forming a bicyclo or spiro structure, is preferred. The resin more preferably contains a repeating unit having a lactone structure represented by any one of the following formulae (LC1-1) to (LC1-17). The lactone structure may be bonded directly to the main chain. Preferred lactone structures are (LC1-1), (LC1-4), (LC1-5), (LC1-6), (LC1-13), (LC1-14) and (LC1-17), with the lactone structure of (LC1-4) being more preferred. By using such a specific lactone structure, LWR and development defect are improved.

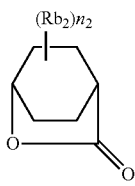
LC1-9

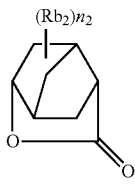
LC1-10

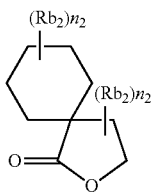
LC1-11

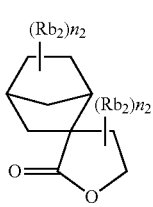
LC1-12

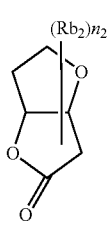
LC1-13

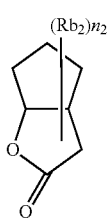
LC1-14

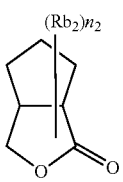
LC1-15

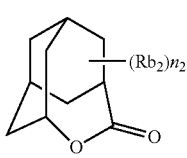
LC1-16

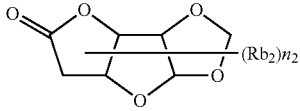
LC1-17

The lactone structure moiety may or may not have a substituent ($Rb_2$). Preferred examples of the substituent ($Rb_2$) include an alkyl group having a carbon number of 1 to 8, a cycloalkyl group having a carbon number of 4 to 7, an alkoxy group having a carbon number of 1 to 8, an alkoxycarbonyl group having a carbon number of 2 to 8, a carboxyl group, a halogen atom, a hydroxyl group, a cyano group, and an acid-decomposable group. Among these, an alkyl group having a carbon number of 1 to 4, a cyano group and an acid-decomposable group are more preferred. $n_2$ represents an integer of 0 to 4. When $n_2$ is an integer of 2 or more, each substituent ($Rb_2$) may be the same as or different from every other substituents ($Rb_2$), and also, the plurality of substituents ($Rb_2$) may combine with each other to form a ring.

The repeating unit having a lactone group usually has an optical isomer, but any optical isomer may be used. One optical isomer may be used alone or a mixture of a plurality of optical isomers may be used. In the case of mainly using one optical isomer, the optical purity (ee) thereof is preferably 90% or more, more preferably 95% or more.

The repeating unit having a lactone structure is preferably a repeating unit represented by the following formula (AII):

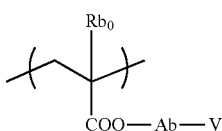

(AII)

In formula (AII), $Rb_o$ represents a hydrogen atom, a halogen atom, or an alkyl group having a carbon number of 1 to 4, which may have a substituent. Preferred examples of the substituent which the alkyl group of $Rb_o$ may have include a hydroxyl group and a halogen atom. The halogen atom of $Rb_o$ includes a fluorine atom, a chlorine atom, a bromine atom and an iodine atom. $Rb_o$ is preferably a hydrogen atom, a methyl group, a hydroxymethyl group or a trifluoromethyl group, more preferably a hydrogen atom or a methyl group.

Ab represents a single bond, an alkylene group, a divalent linking group having a monocyclic or polycyclic alicyclic hydrocarbon structure, an ether bond, an ester bond, a carbonyl group, or a divalent linking group formed by combining two or more thereof, and is preferably a single bond or a divalent linking group represented by -$Ab_1$-$CO_2$—.

$Ab_1$ represents a linear or branched alkylene group or a monocyclic or polycyclic cycloalkylene group and is preferably a methylene group, an ethylene group, a cyclohexylene group, an adamantylene group or a norbornylene group.

V represents a group having a lactone structure and specifically includes, for example, a group having a structure represented by any one of formulae (LC1-1) to (LC1-17).

Specific examples of the repeating unit having a lactone structure are illustrated below, but the present invention is not limited thereto.

(In the formulae, Rx represents H, CH₃, CH₂OH or CF₃.)
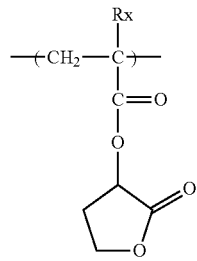 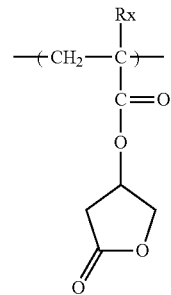
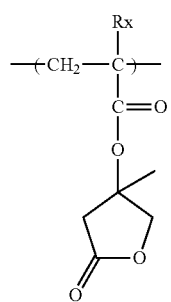 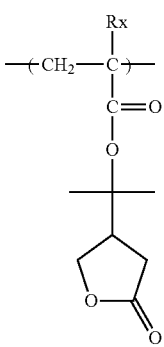
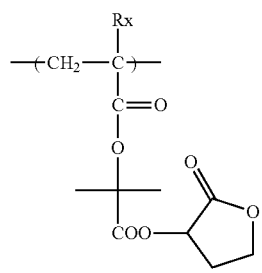 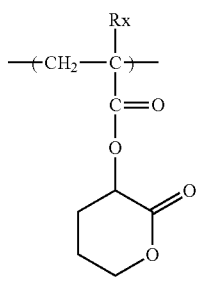
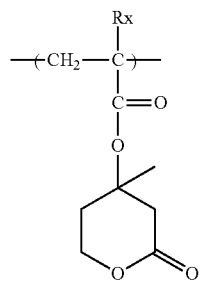 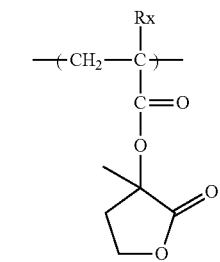
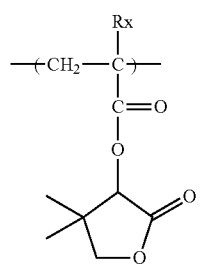 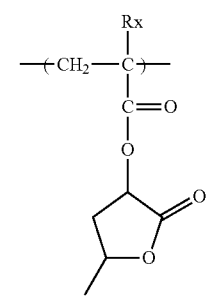
-continued
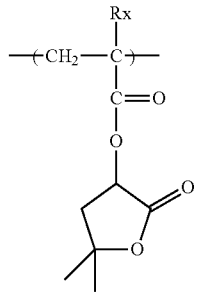 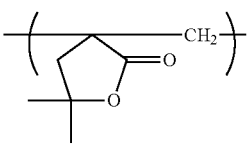
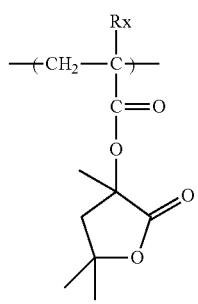 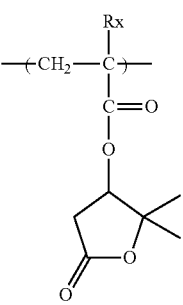
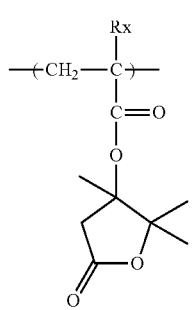 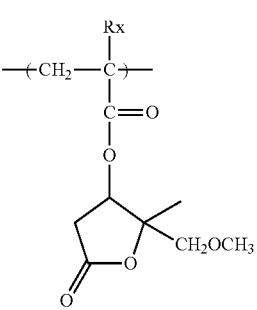
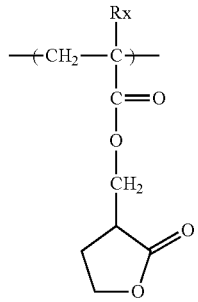 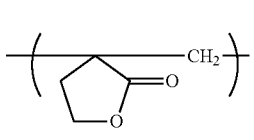
(In the formulae, Rx represents H, CH₃, CH₂OH or CF₃.)
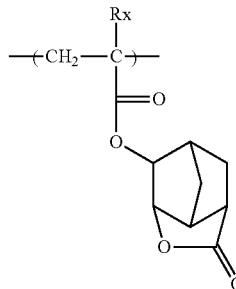 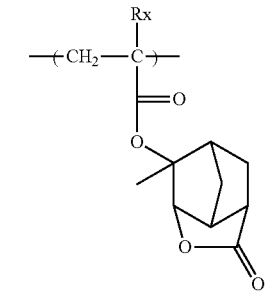

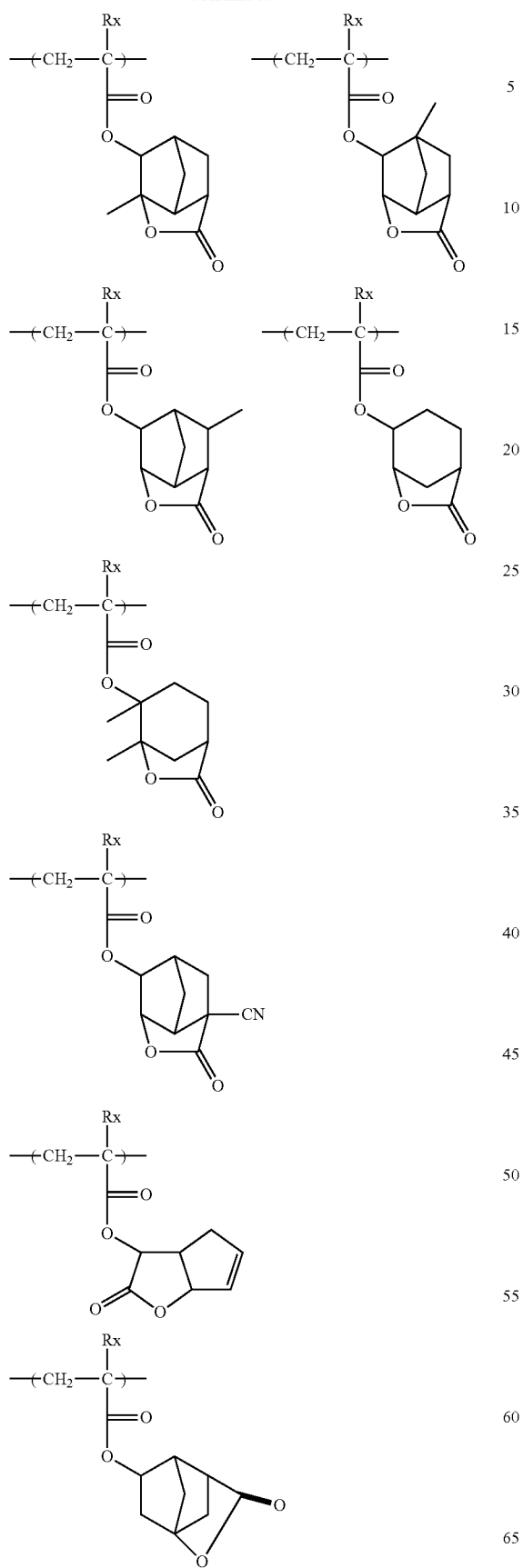
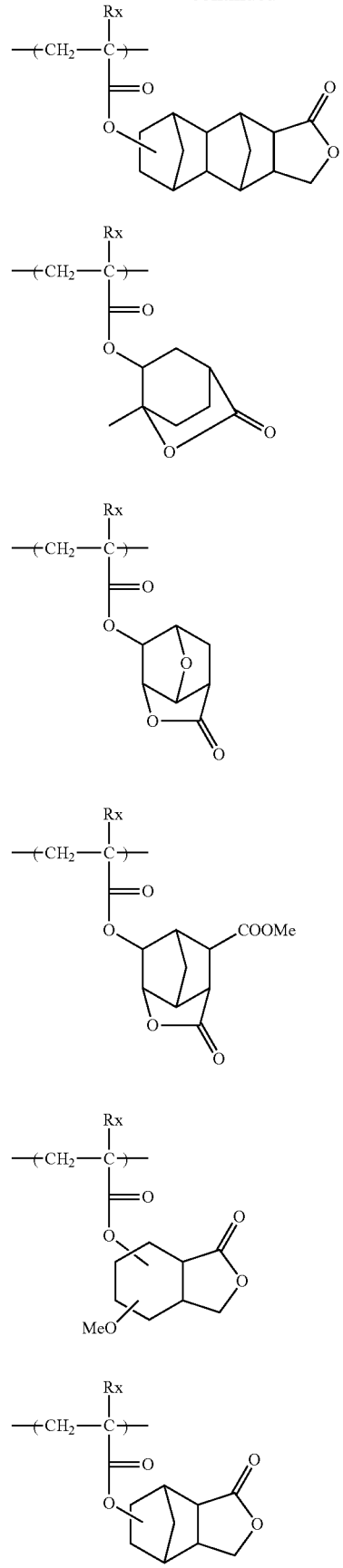

33
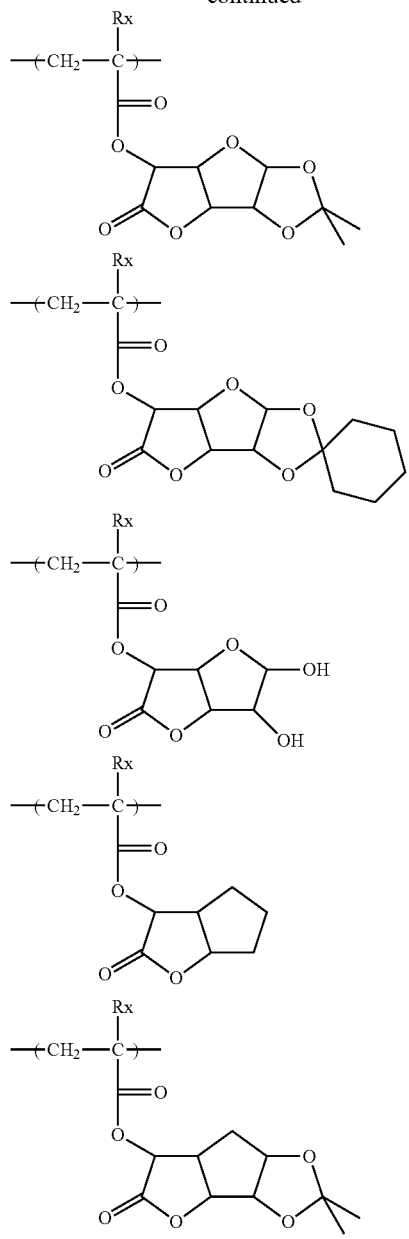
(In the formulae, Rx represents H, CH$_3$, CH$_2$OH or CF$_3$.)
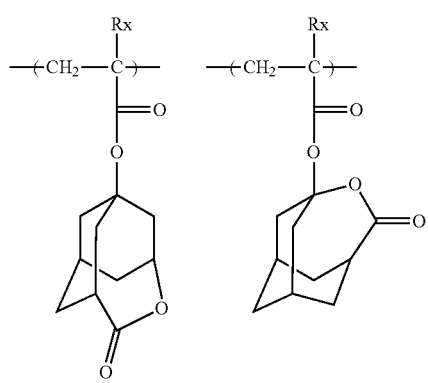
34
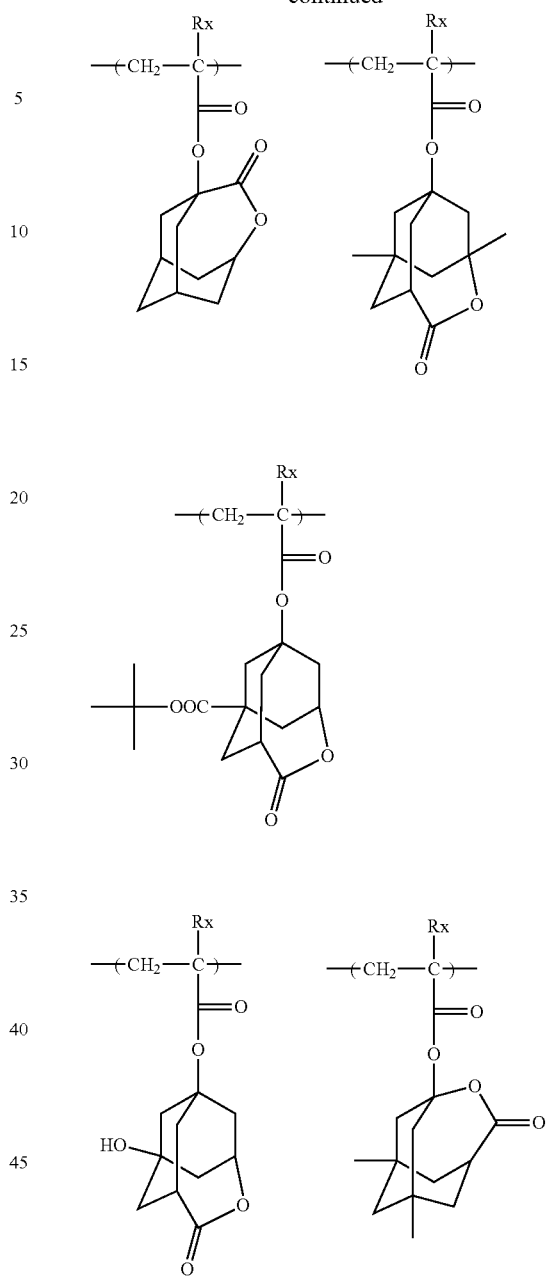
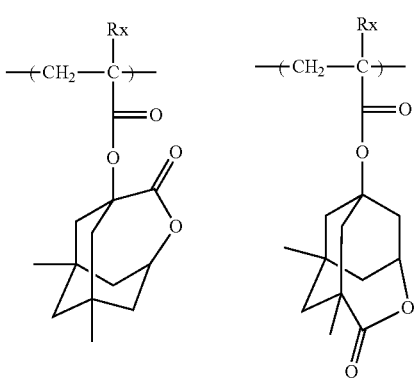

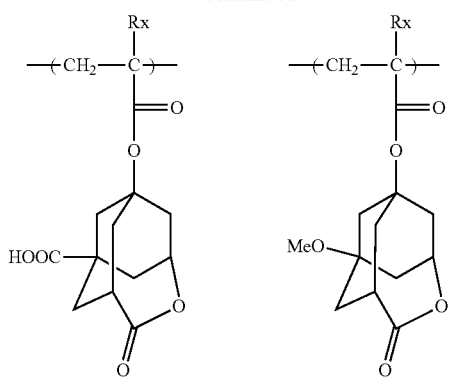

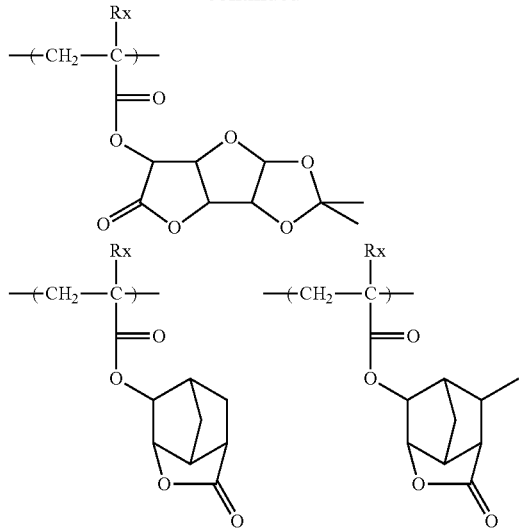

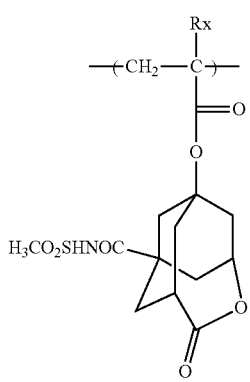

Particularly preferred repeating units having a lactone structure include the following repeating units. By selecting an optimal lactone structure, the pattern profile and the iso/dense bias are improved.

(In the formulae, Rx represents H, CH$_3$, CH$_2$OH or CF$_3$.)

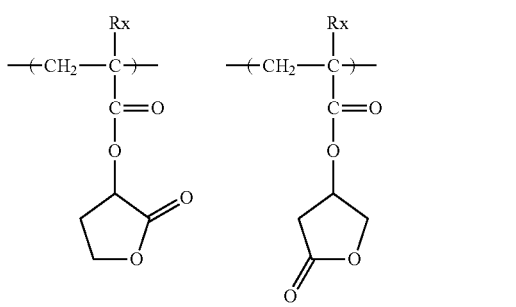

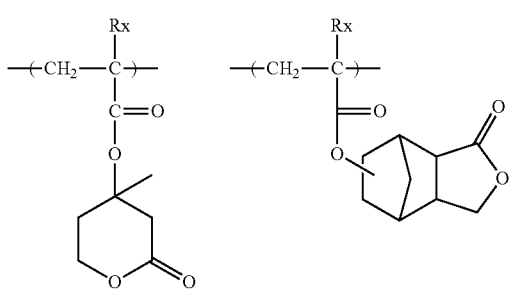

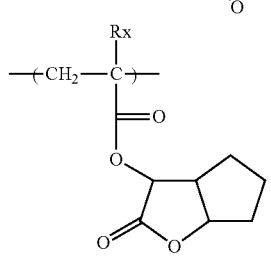

The repeating unit having a lactone structure is preferably a unit represented by the following formula (III):

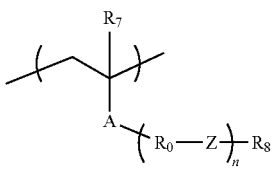
(III)

In formula (III), A represents an ester bond (a group represented by —COO—) or an amido bond (a group represented by —CONH—).

$R_0$ represents, when a plurality of $R_0$'s are present, each independently represents, an alkylene group, a cycloalkylene group or a combination thereof.

Z represents, when a plurality of Z's are present, each independently represents, an ether bond, an ester bond, an amide bond, a urethane bond (a group represented by

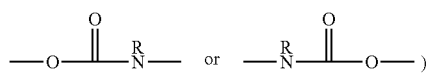

or a urea bond (a group represented by

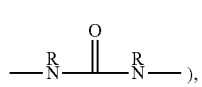

wherein each R independently represents a hydrogen atom, an alkyl group, a cycloalkyl group or an aryl group.

$R_8$ represents a monovalent organic group having a lactone structure.

n is the repetition number of the structure represented by —$R_0$—Z— and represents an integer of 1 to 5, preferably 1.

$R_7$ represents a hydrogen atom, a halogen atom or an alkyl group.

The alkylene group and cycloalkylene group of $R_0$ may have a substituent.

Z is preferably an ether bond or an ester bond, more preferably an ester bond.

The alkyl group of $R_7$ is preferably an alkyl group having a carbon number of 1 to 4, more preferably a methyl group or an ethyl group, still more preferably a methyl group.

The alkyl group in the alkylene group and cycloalkylene group of $R_0$ and in $R_7$ may be substituted, and examples of the substituent include a halogen atom such as fluorine atom, chlorine atom and bromine atom, a mercapto group, a hydroxyl group, an alkoxy group such as methoxy group, ethoxy group, isopropoxy group, tert-butoxy group and benzyloxy group, and an acyloxy group such as acetyloxy group and propionyloxy group.

$R_7$ is preferably a hydrogen atom, a methyl group, a trifluoromethyl group or a hydroxymethyl group.

The chain alkylene group in $R_0$ is preferably a chain alkylene group having a carbon number of 1 to 10, more preferably a carbon number of 1 to 5, and examples thereof include a methylene group, an ethylene group and a propylene group. The cycloalkylene group is preferably a cycloalkylene group having a carbon number of 3 to 20, and examples thereof include a cyclohexylene group, a cyclopentylene group, a norbornylene group and an adamantylene group. For bringing out the effects of the present invention, a chain alkylene group is more preferred, and a methylene group is still more preferred.

The lactone structure-containing monovalent organic group represented by $R_8$ is not limited as long as it has a lactone structure. Specific examples thereof include lactone structures represented by formulae (LC1-1) to (LC1-17) and among these, a structure represented by (LC1-4) is preferred. Also, structures where $n_2$ in (LC1-1) to (LC1-17) is an integer of 2 or less are more preferred.

$R_8$ is preferably a monovalent organic group having an unsubstituted lactone structure or a monovalent organic group having a lactone structure containing a methyl group, a cyano group or an alkoxycarbonyl group as the substituent, more preferably a monovalent organic group having a lactone structure containing a cyano group as the substituent (cyanolactone).

Specific examples of the repeating unit containing a group having a lactone structure represented by formula (III) are illustrated below, but the present invention is not limited thereto.

In specific examples, R represents a hydrogen atom, an alkyl group which may have a substituent, or a halogen atom, preferably a hydrogen atom, a methyl group, a hydroxymethyl group or an acetyloxymethyl group.

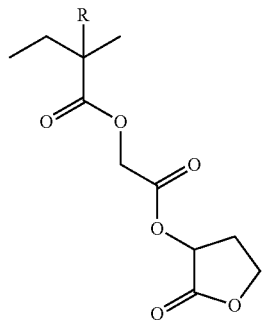

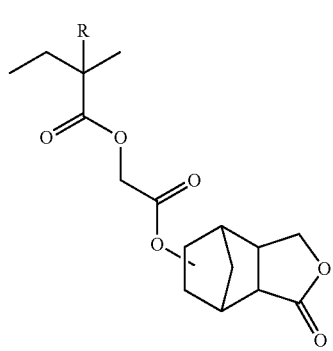

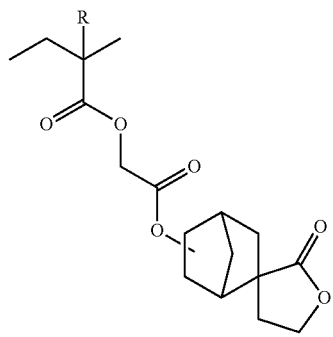

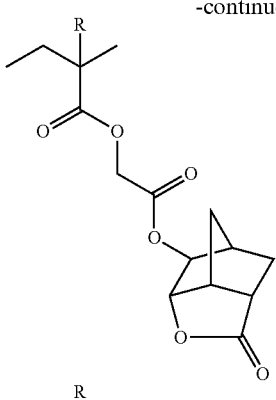

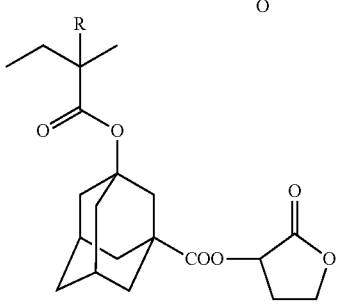

The lactone structure-containing repeating unit is more preferably a repeating unit represented by the following formula (III-1):

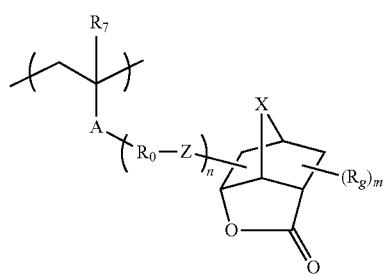
(III-1)

In formula (III-1), $R_7$, A, $R_0$, Z and n have the same meanings as in formula $R_9$ represents, when a plurality of $R_9$'s are present, each independently represents, an alkyl group, a cycloalkyl group, an alkoxycarbonyl group, a cyano group, a hydroxyl group or an alkoxy group, and when a plurality of $R_9$'s are present, two members thereof may combine to form a ring.

X represents an alkylene group, an oxygen atom or a sulfur atom.

m is the number of substituents and represents an integer of 0 to 5. m is preferably 0 or 1.

The alkyl group of $R_9$ is preferably an alkyl group having a carbon number of 1 to 4, more preferably a methyl group or an ethyl group, and most preferably a methyl group. Examples of the cycloalkyl group include a cyclopropyl group, a cyclobutyl group, a cyclopentyl group and a cyclohexyl group. Examples of the alkoxycarbonyl group include a methoxycarbonyl group, an ethoxycarbonyl group, an n-butoxycarbonyl group and a tert-butoxycarbonyl group. Examples of the alkoxy group include a methoxy group, an ethoxy group, a propoxy group, an isopropoxy group and a butoxy group. These groups may have a substituent, and the substituent includes a hydroxy group, an alkoxy group such as methoxy group and ethoxy group, a cyano group, and a halogen atom such as fluorine atom. $R_9$ is preferably a methyl group, a cyano group or an alkoxycarbonyl group, more preferably a cyano group.

Examples of the alkylene group of X include a methylene group and an ethylene group. X is preferably an oxygen atom or a methylene group, more preferably a methylene group.

When m is an integer of 1 or more, at least one $R_9$ is preferably substituted on the α-position or β-position, more preferably on the α-position, of the carbonyl group of lactone.

Specific examples of the repeating unit having a lactone structure-containing group represented by formula (III-1) are illustrated below, but the present invention is not limited thereto. In specific examples, R represents a hydrogen atom, an alkyl group which may have a substituent, or a halogen atom, preferably a hydrogen atom, a methyl group, a hydroxymethyl group or an acetyloxymethyl group.

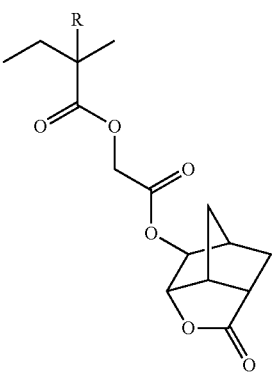

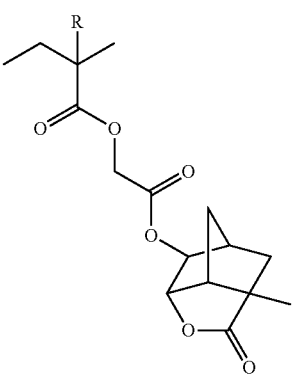

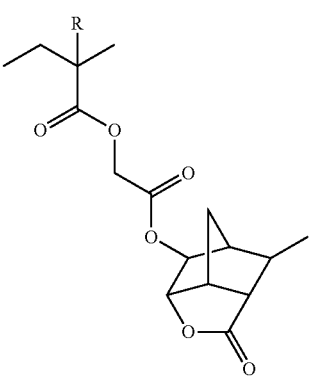

41
-continued
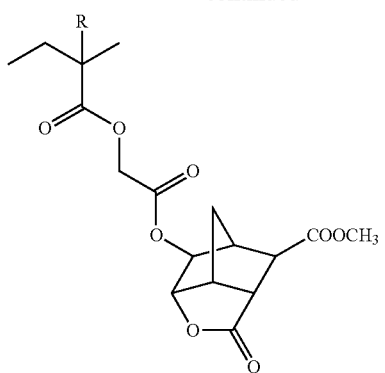
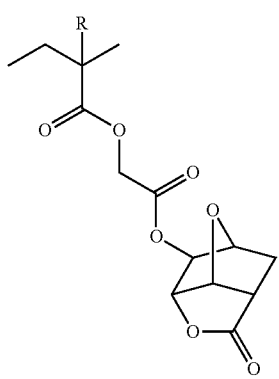
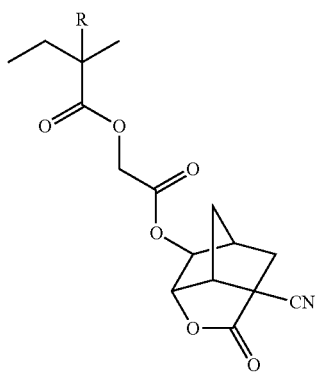
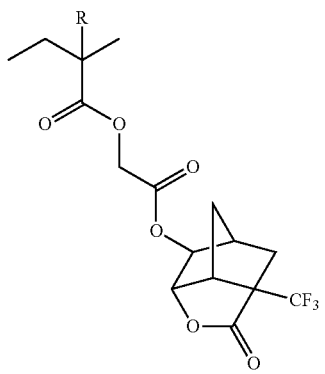
42
-continued
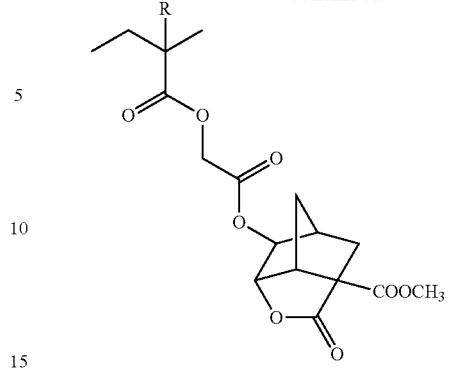
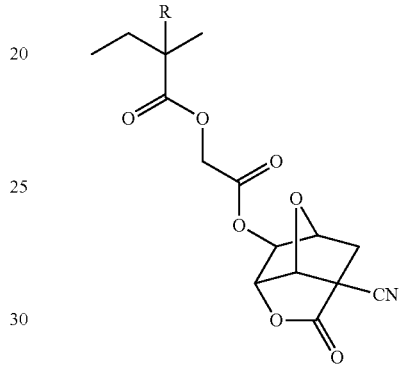
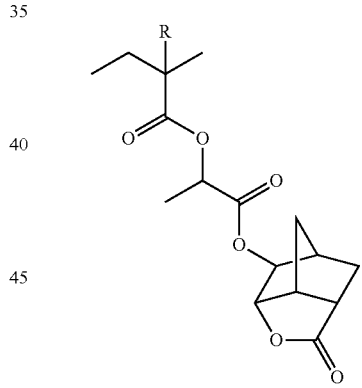
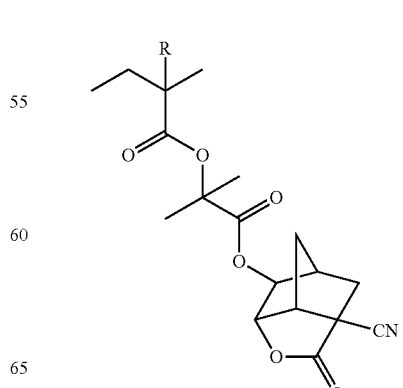

-continued
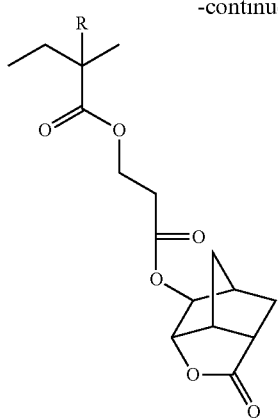
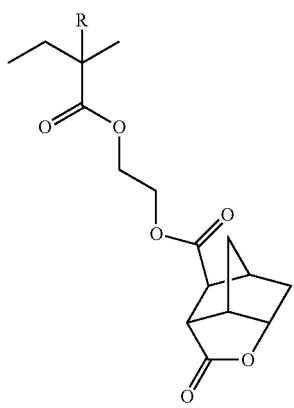
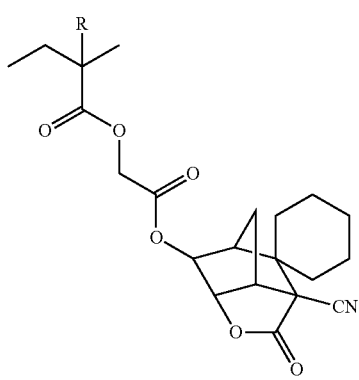
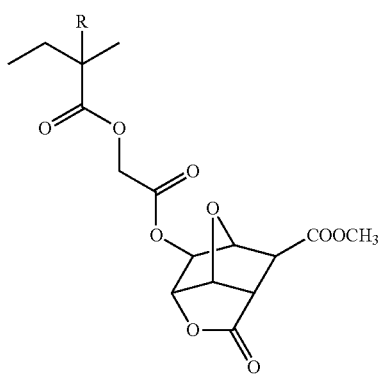
-continued
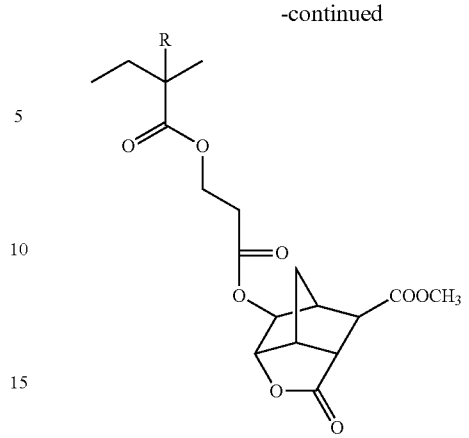
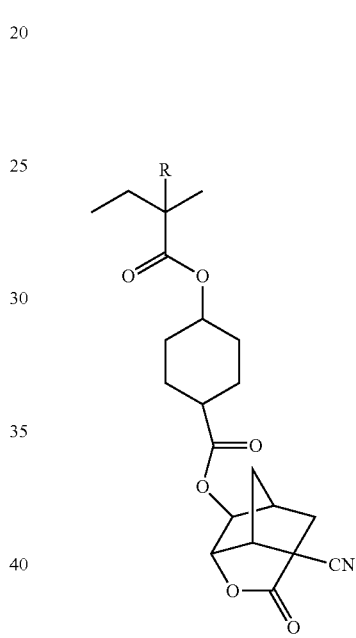
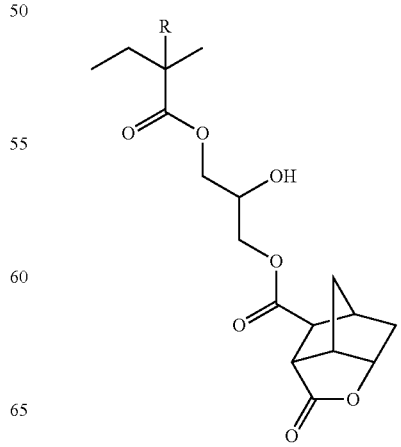

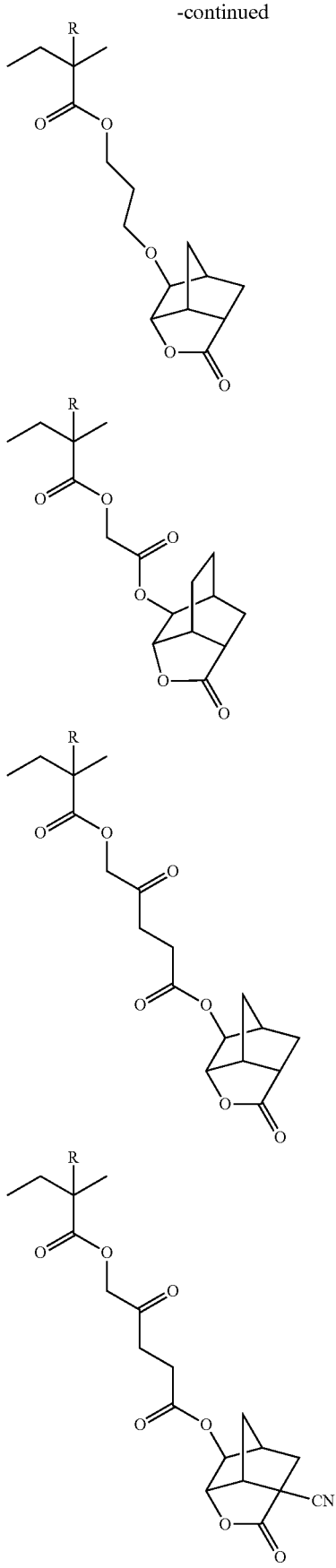
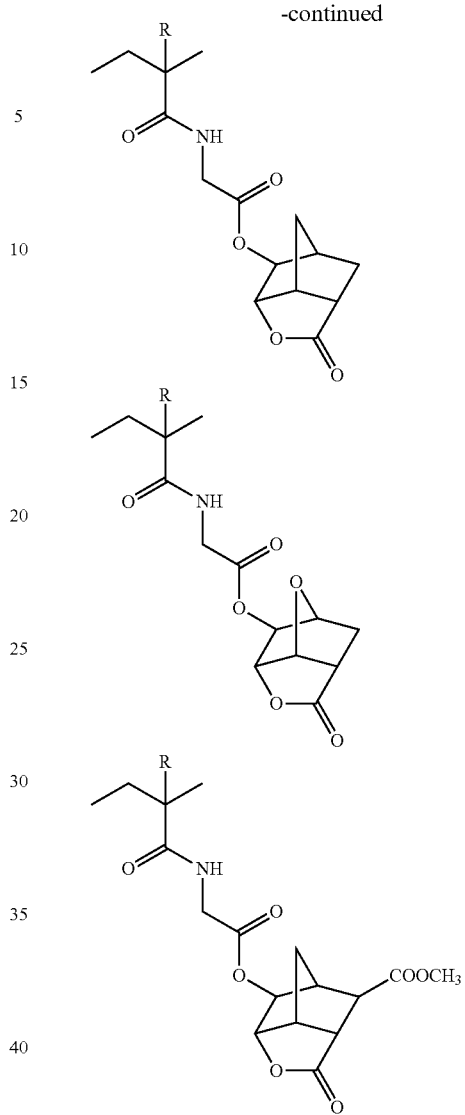

Two or more kinds of lactone structure-containing repeating units may also be used in combination for increasing the effects of the present invention. In the case of using the repeating units in combination, it is also preferred that out of formula (III), two or more kinds of lactone repeating units where n is 1 are selected and used in combination.

The content of the repeating unit having a lactone group is preferably from 15 to 60 mol %, more preferably from 20 to 50 mol %, still more preferably from 30 to 50 mol %, based on all repeating units in the resin (A).

The resin (A) preferably contains a repeating unit having a hydroxyl group or a cyano group, other than formulae (AI) and (III)). Thanks to this repeating unit, the adherence to substrate and affinity for developer are enhanced. The repeating unit having a hydroxyl group or a cyano group is preferably a repeating unit having an alicyclic hydrocarbon structure substituted with a hydroxyl group or a cyano group and preferably has no acid-decomposable group. The alicyclic hydrocarbon structure in the alicyclic hydrocarbon structure substituted with a hydroxyl group or a cyano group is preferably an adamantyl group, a diamantyl group or a norbornyl group. The alicyclic hydrocarbon structure substituted with a hydroxyl group or a cyano group is preferably a partial structure represented by the following formulae (VIIa) to (VIId):

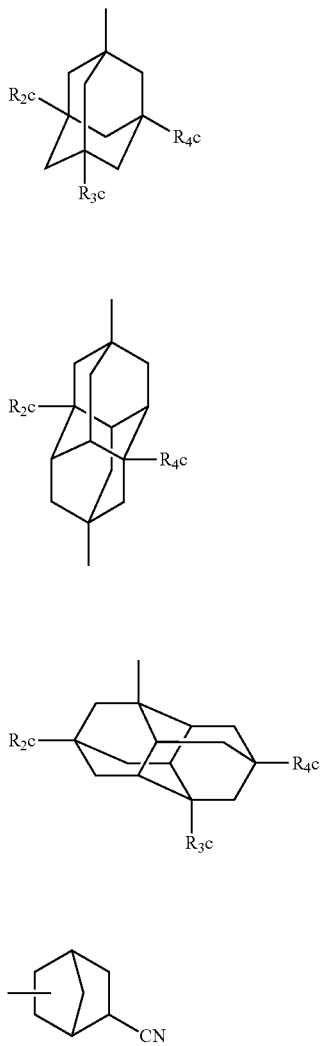

(VIIa)

(VIIb)

(VIIc)

(VIId)

In formulae (VIIa) to (VIIc), each of $R_2c$ to $R_4c$ independently represents a hydrogen atom, a hydroxyl group or a cyano group, provided that at least one of $R_2c$ to $R_4c$ represents a hydroxyl group or a cyano group. A structure where one or two members out of $R_2c$ to $R_4c$ are a hydroxyl group with the remaining being a hydrogen atom is preferred. In formula (VIIa), it is more preferred that two members out of $R_2c$ to $R_4c$ are a hydroxyl group and the remaining is a hydrogen atom.

The repeating unit having a partial structure represented by formulae (VIIa) to (VIId) includes repeating units represented by the following formulae (AIIa) to (AIId):

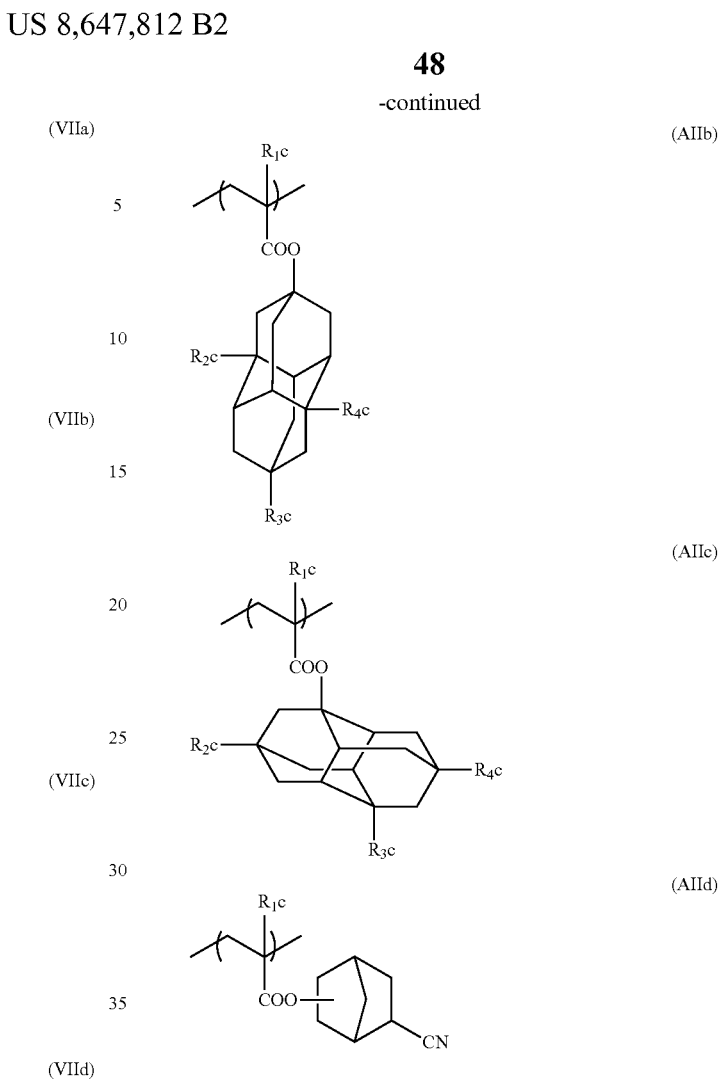

(AIIa)

(AIIb)

(AIIc)

(AIId)

In formulae (AIIa) to (AIId), $R_1c$ represents a hydrogen atom, a methyl group, a trifluoromethyl group or a hydroxymethyl group.

$R_2c$ to $R_1c$ have the same meanings as $R_2c$ to $R_4c$ in formulae (VIIa) to (VIIc).

The content of the repeating unit having a hydroxyl group or a cyano group is preferably from 5 to 40 mol %, more preferably from 5 to 30 mol %, still more preferably from 5 to 25 mol %, based on all repeating units in the resin (A).

Specific examples of the repeating unit having a hydroxyl group or a cyano group are illustrated below, but the present invention is not limited thereto.

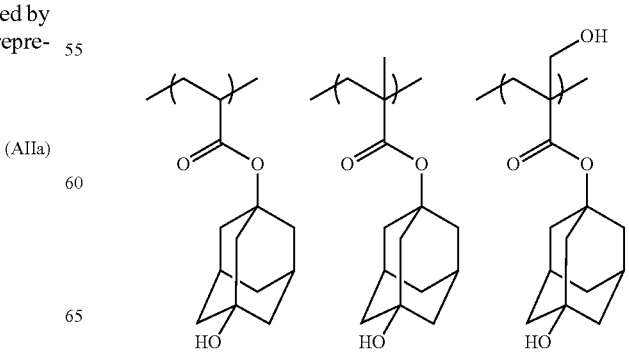

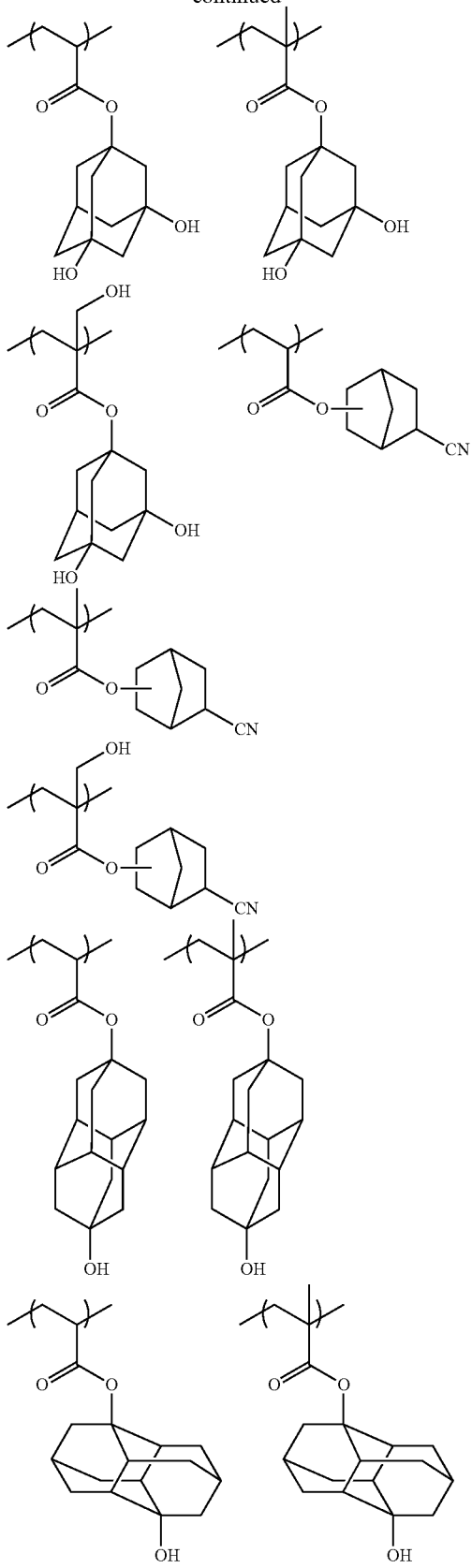

The resin (A) may contain a repeating unit having an acid group. The acid group includes a carboxyl group, a sulfona- mide group, a sulfonylimide group, a bisulfonylimide group, and an aliphatic alcohol substituted with an electron-withdrawing group at the α-position (for example, hexafluoroisopropanol group), and a repeating unit having a carboxyl group is preferred. By virtue of containing a repeating unit having an acid group, the resolution increases in the usage of forming contact holes. As for the repeating unit having an acid group, all of a repeating unit where an acid group is directly bonded to the main chain of the resin, such as repeating unit by an acrylic acid or a methacrylic acid, a repeating unit where an acid group is bonded to the main chain of the resin through a linking group, and a repeating unit where an acid group is introduced into the polymer chain terminal by using an acid group-containing polymerization initiator or chain transfer agent at the polymerization, are preferred. The linking group may have a monocyclic or polycyclic cyclohydrocarbon structure. In particular, a repeating unit by an acrylic acid or a methacrylic acid is preferred.

The resin (A) may or may not contain a repeating unit having an acid group, but in the case of containing the repeating unit, the content of the repeating unit having an acid group is preferably 10 mol % or less, more preferably 5 mol % or less, based on all repeating units in the resin (A). In the case where the resin (A) contains a repeating unit having an acid group, the content of the acid group-containing repeating unit in the resin (A) is usually 1 mol % or more.

Specific examples of the repeating unit having an acid group are illustrated below, but the present invention is not limited thereto.

In specific examples, Rx represents H, CH$_3$, CH$_2$OH or CF$_3$.

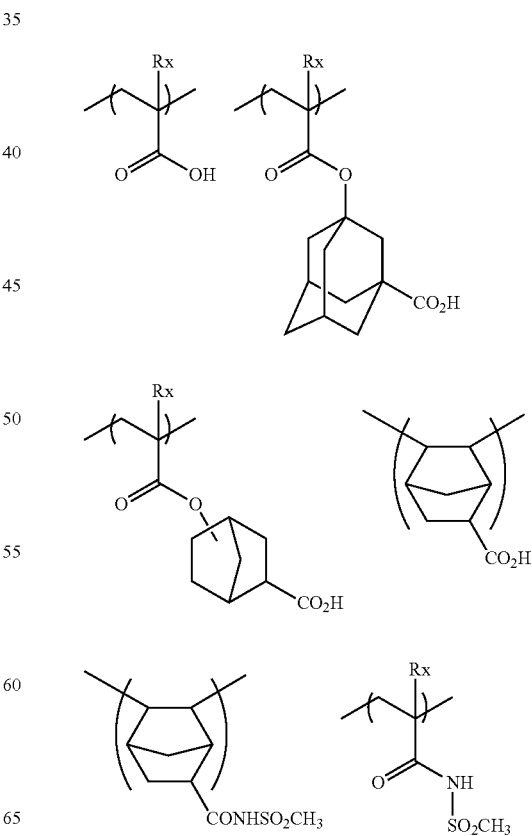

-continued

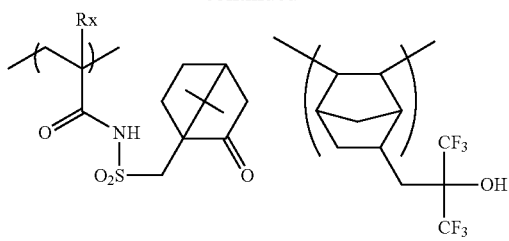

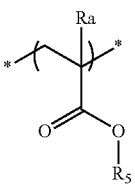

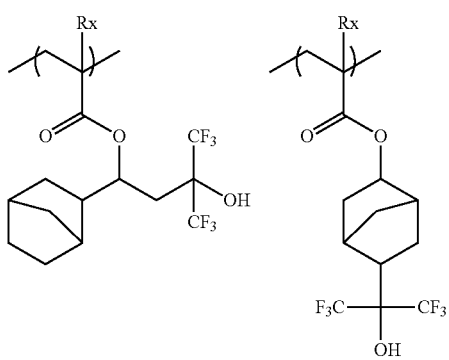

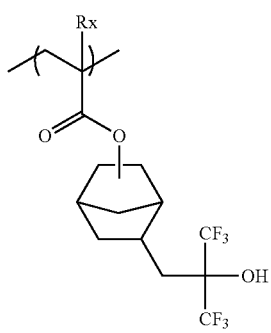

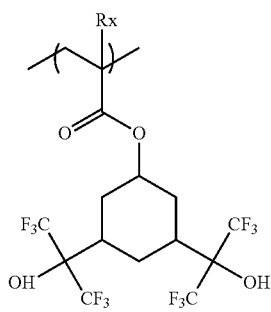

The resin (A) for use in the present invention may further contain a repeating unit having an alicyclic hydrocarbon structure free from a polar group (such as the above-described acid group, a hydroxyl group or a cyano group) and not exhibiting acid decomposability. Thanks to this repeating unit, the solubility of the resin at the development using an organic solvent-containing developer can be appropriately adjusted. Such a repeating unit includes a repeating unit represented by formula (IV):

(IV)

In formula (IV), $R_5$ represents a hydrocarbon group having at least one cyclic structure and having no polar group.

Ra represents a hydrogen atom, an alkyl group or a —$CH_2$—O—$Ra_2$ group, wherein $Ra_2$ represents a hydrogen atom, an alkyl group or an acyl group. Ra is preferably a hydrogen atom, a methyl group, a hydroxymethyl group or a trifluoromethyl group, more preferably a hydrogen atom or a methyl group.

The cyclic structure contained in $R_5$ includes a monocyclic hydrocarbon group and a polycyclic hydrocarbon group. Examples of the monocyclic hydrocarbon group include a cycloalkyl group having a carbon number of 3 to 12, such as cyclopentyl group, cyclohexyl group, cycloheptyl group and cyclooctyl group, and a cycloalkenyl group having a carbon number of 3 to 12, such as cyclohexenyl group. The monocyclic hydrocarbon group is preferably a monocyclic hydrocarbon group having a carbon number of 3 to 7, more preferably a cyclopentyl group or a cyclohexyl group.

The polycyclic hydrocarbon group includes a ring-assembled hydrocarbon group and a crosslinked cyclic hydrocarbon group. Examples of the ring-assembled hydrocarbon group include a bicyclohexyl group and a perhydronaphthalenyl group. Examples of the crosslinked cyclic hydrocarbon ring include a bicyclic hydrocarbon ring such as pinane ring, bornane ring, norpinane ring, norbornane ring and bicyclooctane ring (e.g., bicyclo[2.2.2]octane ring, bicyclo[3.2.1]octane ring), a tricyclic hydrocarbon ring such as homobledane ring, adamantane ring, tricyclo[5.2.1.0$^{2,6}$]decane ring and tricyclo[4.3.1.1$^{2,5}$]undecane ring, and a tetracyclic hydrocarbon ring such as tetracyclo [4.4.0.1$^{2,5}$.1$^{7,10}$]dodecane ring and perhydro-1,4-methano-5,8-methanonaphthalene ring. The crosslinked cyclic hydrocarbon ring also includes a condensed cyclic hydrocarbon ring, for example, a condensed ring formed by fusing a plurality of 5- to 8-membered cycloalkane rings, such as perhydronaphthalene (decalin) ring, perhydroanthracene ring, perhydrophenathrene ring, perhydroacenaphthene ring, perhydrofluorene ring, perhydroindene ring and perhydrophenalene ring.

Preferred examples of the crosslinked cyclic hydrocarbon ring include a norbornyl group, an adamantyl group, a bicyclooctanyl group and a tricyclo[5,2,1,0$^{2,6}$]decanyl group. Among these crosslinked cyclic hydrocarbon rings, a norbornyl group and an adamantyl group are more preferred.

Such an alicyclic hydrocarbon group may have a substituent, and preferred examples of the substituent include a halogen atom, an alkyl group, a hydroxyl group with a hydrogen atom being substituted for, and an amino group with a hydrogen atom being substituted for. The halogen atom is preferably bromine atom, chlorine atom or fluorine atom, and the alkyl group is preferably a methyl group, an ethyl group, a butyl group or a tert-butyl group. This alkyl group may further have a substituent, and the substituent which the alkyl group may further have includes a halogen atom, an alkyl group, a hydroxyl group with a hydrogen atom being substituted for, and an amino group with a hydrogen atom being substituted for.

Examples of the substituent for the hydrogen atom include an alkyl group, a cycloalkyl group, an aralkyl group, a substituted methyl group, a substituted ethyl group, an alkoxycarbonyl group and an aralkyloxycarbonyl group. The alkyl group is preferably an alkyl group having a carbon number of 1 to 4; the substituted methyl group is preferably a methoxymethyl group, a methoxythiomethyl group, a benzyloxymethyl group, a tert-butoxymethyl group or a 2-methoxyethoxymethyl group; the substituted ethyl group is preferably a 1-ethoxyethyl group or a 1-methyl-1-methoxyethyl group; the acyl group is preferably an aliphatic acyl group having a carbon number of 1 to 6, such as formyl group, acetyl group, propionyl group, butyryl group, isobutyryl group, valeryl group and pivaloyl group; and the alkoxycarbonyl group is preferably an alkoxycarbonyl group having a carbon number of 1 to 4.

The resin (A) may or may not contain a repeating unit having an alicyclic hydrocarbon structure free from a polar group and not exhibiting acid decomposability, but in the case of containing this repeating unit, the content thereof is preferably from 1 to 40 mol %, more preferably from 5 to 20 mol %, based on all repeating units in the resin (A).

Specific examples of the repeating unit having an alicyclic hydrocarbon structure free from a polar group and not exhibiting acid decomposability are illustrated below, but the present invention is not limited thereto. In the formulae, Ra represents H, $CH_3$, $CH_2OH$ or $CF_3$.

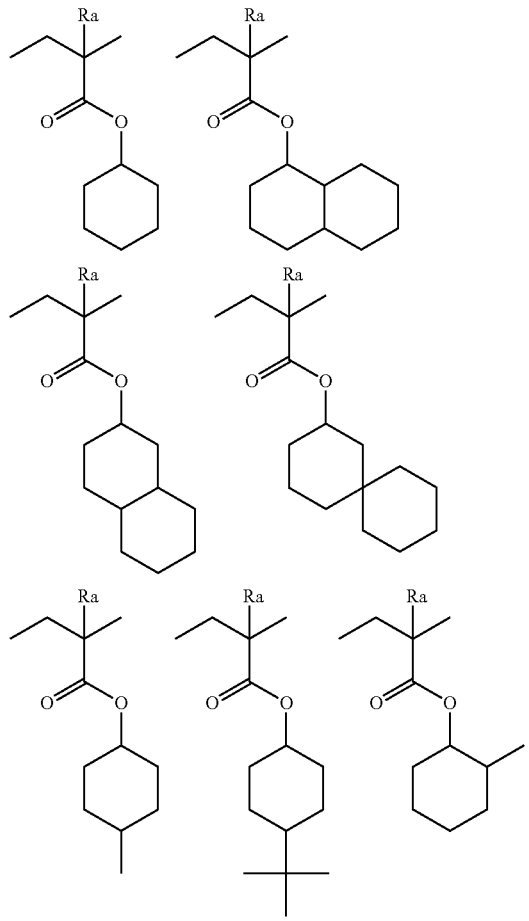

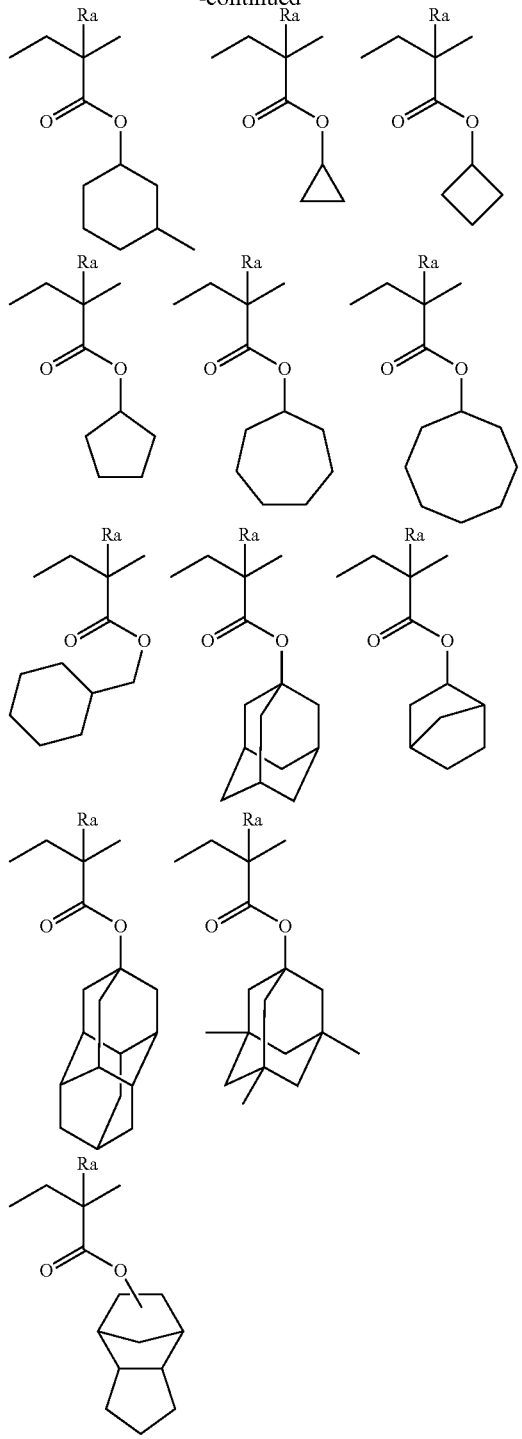

The resin (A) for use in the composition of the present invention may contain, in addition to the above-described repeating structural units, various repeating structural units for the purpose of controlling the dry etching resistance, suitability for standard developer, adherence to substrate, resist profile and properties generally required of a resist, such as resolution, heat resistance and sensitivity.

Examples of such a repeating structural unit include, but are not limited to, repeating structural units corresponding to the monomers described below.

Thanks to such a repeating structural unit, the performance required of the resin used in the composition of the present invention, particularly
(1) solubility in the coating solvent,
(2) film-forming property (glass transition point),
(3) alkali developability,
(4) film loss (selection of hydrophilic, hydrophobic or alkali-soluble group),
(5) adherence of unexposed area to substrate,
(6) dry etching resistance,
and the like, can be subtly controlled.

Examples of the monomer include a compound having one addition-polymerizable unsaturated bond selected from acrylic acid esters, methacrylic acid esters, acrylamides, methacrylamides, allyl compounds, vinyl ethers and vinyl esters.

Other than these, an addition-polymerizable unsaturated compound copolymerizable with the monomers corresponding to the above-described various repeating structural units may be copolymerized.

In the resin (A) for use in the composition of the present invention, the molar ratio of respective repeating structural units contained is appropriately set to control the dry etching resistance of resist, suitability for standard developer, adherence to substrate, resist profile and performances generally required of a resist, such as resolution, heat resistance and sensitivity.

In the case where the composition of the present invention is used for ArF exposure, in view of transparency to ArF light, the resin (A) for use in the composition of the present invention preferably has substantially no aromatic group (specifically, the ratio of an aromatic group-containing repeating unit in the resin is preferably 5 mol % or less, more preferably 3 mol % or less, and ideally 0 mol %, that is, the resin does not have an aromatic group), and the resin (A) preferably has a monocyclic or polycyclic alicyclic hydrocarbon structure.

Also, in the case where the composition of the present invention contains a resin (D) described later, the resin (A) preferably contains no fluorine atom and no silicon atom in view of compatibility with the resin (D).

The resin (A) for use in the composition of the present invention is preferably a resin where all repeating units are composed of a (meth)acrylate-based repeating unit. In this case, all repeating units may be a methacrylate-based repeating unit, all repeating units may be an acrylate-based repeating unit, or all repeating units may be composed of a methacrylate-based repeating unit and an acrylate-based repeating unit, but the content of the acrylate-based repeating unit is preferably 50 mol % or less based on all repeating units. It is also preferred that the resin is a copolymerized polymer containing from 20 to 50 mol % of an acid decomposable group-containing (meth)acrylate-based repeating unit, from 20 to 50 mol % of a lactone group-containing (meth)acrylate-based repeating unit, from 5 to 30 mol % of a (meth)acrylate-based repeating unit having an alicyclic hydrocarbon structure substituted with a hydroxyl group or a cyano group, and from 0 to 20 mol % of other (meth)acrylate-based repeating units.

In the case of irradiating the composition of the present invention with KrF excimer laser light, electron beam, X-ray or high-energy beam at a wavelength of 50 nm or less (e.g., EUV), the resin (A) preferably further contains a hydroxystyrene-based repeating unit. It is more preferred to contain a hydroxystyrene-based repeating unit, a hydroxystyrene-based repeating unit protected by an acid-decomposable group, and an acid-decomposable repeating unit such as tertiary alkyl(meth)acrylate.

Preferred examples of the hydroxystyrene-based repeating unit having an acid-decomposable group include repeating units composed of a tert-butoxycarbonyloxystyrene, a 1-alkoxyethoxystyrene and a tertiary alkyl(meth)acrylate. Repeating units composed of a 2-alkyl-2-adamantyl(meth)acrylate and a dialkyl(1-adamantyl)methyl(meth)acrylate are more preferred.

The resin (A) for use in the present invention can be synthesized by a conventional method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and the later-described solvent capable of dissolving the composition of the present invention, such as propylene glycol monomethyl ether acetate, propylene glycol monomethyl ether and cyclohexanone. The polymerization is more preferably performed using the same solvent as the solvent used in the photosensitive composition of the present invention. By the use of the same solvent, production of particles during storage can be suppressed.

The polymerization reaction is preferably performed in an inert gas atmosphere such as nitrogen or argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The initiator is added additionally or in parts, if desired. After the completion of reaction, the reaction solution is poured in a solvent, and the desired polymer is collected by a method such as powder or solid recovery. The concentration at the reaction is from 5 to 50 mass %, preferably from 10 to 30 mass %, and the reaction temperature is usually from 10 to 150° C., preferably from 30 to 120° C., more preferably from 60 to 100° C.

After the completion of reaction, the reaction solution is allowed to cool to room temperature and purified. The purification may be performed by a normal method, for example, a liquid-liquid extraction method of applying water washing or combining an appropriate solvent to remove residual monomers or oligomer components; a purification method in a solution sate, such as ultrafiltration of extracting and removing only polymers having a molecular weight not more than a specific value; a reprecipitation method of adding dropwise the resin solution in a poor solvent to solidify the resin in the poor solvent and thereby remove residual monomers and the like; and a purification method in a solid state, such as washing of a resin slurry with a poor solvent after separation of the slurry by filtration. For example, the resin is precipitated as a solid by contacting the reaction solution with a solvent in which the resin is sparingly soluble or insoluble (poor solvent) and which is in a volumetric amount of 10 times or less, preferably from 10 to 5 times, the reaction solution.

The solvent used at the operation of precipitation or reprecipitation from the polymer solution (precipitation or reprecipitation solvent) may be sufficient if it is a poor solvent for the polymer, and the solvent which can be used may be appropriately selected from a hydrocarbon, a halogenated hydrocarbon, a nitro compound, an ether, a ketone, an ester, a carbonate, an alcohol, a carboxylic acid, water, a mixed solvent containing such a solvent, and the like, according to the kind of the polymer. Among these solvents, a solvent containing at least an alcohol (particularly, methanol or the like) or water is preferred as the precipitation or reprecipitation solvent.

The amount of the precipitation or reprecipitation solvent used may be appropriately selected by taking into consideration the efficiency, yield and the like, but in general, the amount used is from 100 to 10,000 parts by mass, preferably from 200 to 2,000 parts by mass, more preferably from 300 to 1,000 parts by mass, per 100 parts by mass of the polymer solution.

The temperature at the precipitation or reprecipitation may be appropriately selected by taking into consideration the efficiency or operability but is usually on the order of 0 to 50° C., preferably in the vicinity of room temperature (for example, approximately from 20 to 35° C.). The precipitation or reprecipitation operation may be performed using a commonly employed mixing vessel such as stirring tank by a known method such as batch system and continuous system.

The precipitated or reprecipitated polymer is usually subjected to commonly employed solid-liquid separation such as filtration and centrifugation, then dried and used. The filtration is performed using a solvent-resistant filter element preferably under pressure. The drying is performed under atmospheric pressure or reduced pressure (preferably under reduced pressure) at a temperature of approximately from 30 to 100° C., preferably on the order of 30 to 50° C.

Incidentally, after the resin is once precipitated and separated, the resin may be again dissolved in a solvent and then put into contact with a solvent in which the resin is sparingly soluble or insoluble. That is, there may be used a method comprising, after the completion of radical polymerization reaction, bringing the polymer into contact with a solvent in which the polymer is sparingly soluble or insoluble, to precipitate a resin (step a), separating the resin from the solution (step b), anew dissolving the resin in a solvent to prepare a resin solution A (step c), bringing the resin solution A into contact with a solvent in which the resin is sparingly soluble or insoluble and which is in a volumetric amount of less than 10 times (preferably 5 times or less) the resin solution A, to precipitate a resin solid (step d), and separating the precipitated resin (step e).

The weight average molecular weight of the resin (A) for use in the present invention is preferably from 1,000 to 200,000, more preferably from 2,000 to 20,000, still more preferably from 3,000 to 15,000, yet still more preferably from 3,000 to 10,000, in terms of polystyrene by the GPC method. When the weight average molecular weight is from 1,000 to 200,000, reduction in the heat resistance and dry etching resistance can be avoided and at the same time, the film-forming property can be prevented from deterioration due to impairment of developability or increase in the viscosity.

The polydispersity (molecular weight distribution) is usually from 1.0 to 3.0, preferably from 1.0 to 2.6, more preferably from 1.0 to 2.0, still more preferably from 1.4 to 2.0. As the molecular weight distribution is smaller, the resolution and resist profile are more excellent, the side wall of the resist pattern is smoother, and the roughness is more improved.

In the resist composition of the present invention, the blending ratio of the resin (A) in the entire composition is preferably from 30 to 99 mass %, more preferably from 60 to 95 mass %, based on the entire solid content.

As for the resin (A) used in the present invention, one kind of a resin may be used or a plurality of kinds of resins may be used in combination.

[2] (B) Compound Capable of Generating Acid Represented by Formula (i) Upon Irradiation with Actinic Ray or Radiation The resist composition of the present invention contains a compound capable of generating an acid represented by formula (I) upon irradiation with an actinic ray or radiation (hereinafter, sometimes referred to as a "compound (B)").

As to why when the unexposed area of the resist film obtained from a resist composition containing such a compound (B) is developed with an organic solvent-containing developer, an excellent performance can be obtained in terms of sensitivity, exposure latitude (EL), mask error enhancement factor (MEEF) and pattern profile and the line width variation (LWR) can be reduced, the operation mechanism is not completely known but is presumed as follows.

That is, the acid represented by formula (I) has an amide group, and there is a great difference between the SP value of the acid and the SP value of the organic solvent-containing developer. Thanks to such a great difference, when the exposed area of the resist film is reduced in the solubility for the organic solvent-containing developer, dissolution discrimination is produced, and this contributes to reduction of LWR and improvement of pattern profile.

Also, the carbon atom at the position adjacent to the sulfonic acid group represented by formula (I) is substituted with a fluorine atom or a fluoroalkyl group, which are an electron-withdrawing group and therefore, the sulfonic acid represented by formula (I) becomes a strong acid, whereby excellent sensitivity is considered to be obtained.

Furthermore, the acid represented by formula (I) has an amide group, and this amide group interacts with "a resin increased in the polarity by the action of an acid" present in the exposed area of the resist film, which is considered to prevent the acid represented by formula (I) from excessive diffusion (for example, prevent the acid from diffusing in an unintended amount even to the unexposed area), thereby increasing the resolution and improving EL and MEEF.

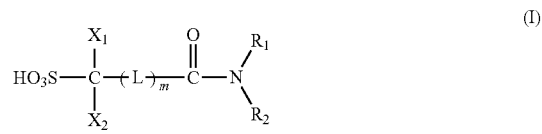

In formula (I), each of $X_1$ and $X_2$ independently represents a fluorine atom or a fluoroalkyl group.

Each of $R_1$ and $R_2$ independently represents a hydrogen atom, an alkyl group or a group having a cyclic structure, and $R_1$ and $R_2$ may combine with each other to form a ring, provided that $R_1$ and $R_2$ are not a hydrogen atom at the same time.

L represents a divalent linking group and when a plurality of L's are present, each L may be the same as or different from every other L.

m represents an integer of 0 or more.

Formula (I) is described in detail below.

The fluoroalkyl group as $X_1$ and $X_2$ is preferably a fluoroalkyl group having a carbon number of 1 to 6, more preferably a carbon number of 1 to 4. Also, the fluoroalkyl group as $X_1$ and $X_2$ is preferably a perfluoroalkyl group.

Each of $X_1$ and $X_2$ is preferably a fluorine atom or a perfluoroalkyl group.

Specific examples of $X_1$ and $X_2$ include a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$. Among these, a fluorine atom and $CF_3$ are preferred. In particular, it is preferred that both $X_1$ and $X_2$ are a fluorine atom.

Each of $R_1$ and $R_2$ independently represents a hydrogen atom, an alkyl group or a group having a cyclic structure.

The alkyl group may be linear or branched and is preferably an alkyl group having a carbon number of 1 to 10, more preferably a carbon number of 1 to 7. Specific examples of $R_1$ and $R_2$ include a methyl group, an ethyl group, an n-propyl group, an n-butyl group, an n-pentyl group, an n-hexyl group, an n-heptyl group, an n-octyl group, an n-dodecyl group, a 2-ethylhexyl group, an isopropyl group, a sec-butyl group, a tert-butyl group and an isoamyl group. Among these, a methyl group, an ethyl group, a propyl group, an isopropyl group, an n-butyl group, a sec-butyl group and a tert-butyl group are preferred.

The group above may have a substituent, and examples of the substituent include a hydroxyl group, a halogen atom (e.g., fluorine, chlorine, bromine, iodine), a nitro group, a cyano group, an amide group, a sulfonamide group, an alkyl group such as methyl group, ethyl group, propyl group, n-butyl group, sec-butyl group, hexyl group, 2-ethylhexyl group and octyl group, an alkoxy group such as methoxy group, ethoxy group, hydroxyethoxy group, propoxy group, hydroxypropoxy group and butoxy group, an alkoxycarbonyl group such as methoxycarbonyl group and ethoxycarbonyl group, an acyl group such as formyl group, acetyl group and benzoyl group, an acyloxy group such as acetoxy group and butyryloxy group, and a carboxy group.

The cyclic structure-containing group as $R_1$ and $R_2$ includes a monocyclic structure-containing group (preferably having a carbon number of 3 to 12) and a polycyclic structure-containing group (preferably having a carbon number of 4 to 25).

Examples of the monocyclic structure-containing group include a monocyclic hydrocarbon group, a monocyclic heterocyclic group, and an alkyl group having at least either one of these groups.

The monocyclic hydrocarbon group includes a monocyclic alkyl group and a monocyclic aryl group.

The monocyclic alkyl group is preferably a monocyclic alkyl group having a carbon number of 3 to 10. Specific examples of the monocyclic alkyl group include a cyclopropyl group, a cyclobutyl group, a cyclopentyl group, a cyclohexyl group, a cycloheptyl group, a cyclooctyl group, a cyclododecanyl group, a cyclopentenyl group, a cyclohexenyl group and a cyclooctadienyl group. Among these, a cyclopropyl group, a cyclopentyl group, a cyclohexyl group and a cyclooctyl group are preferred.

The monocyclic aryl group includes a substituted or unsubstituted phenyl group.

The monocyclic heterocyclic group includes a saturated heterocyclic group and an unsaturated heterocyclic group and is preferably a monocyclic heterocyclic group having a carbon number of 5 to 10. Examples of the saturated heterocyclic group include a 1-piperidyl group, a 4-piperidyl group, a 4-morpholyl group, a 1,3-dioxolan-2-ylmethyl group and an azepan-2-on-1-yl group. Examples of the unsaturated heterocyclic group include a pyrrole group, a furan group and a thiophene group.

The alkyl group containing at least either a monocyclic hydrocarbon group or a monocyclic heterocyclic group is suitably a group where an arbitrary hydrogen atom of an alkyl group having a carbon number of 1 to 5 (preferably a carbon number of 1 to 3) is substituted for with at least either a monocyclic hydrocarbon group or a monocyclic heterocyclic group.

Examples of the polycyclic structure-containing group includes:
(i) a polycyclic hydrocarbon group,
(ii) a polycyclic heterocyclic group,
(iii) an alkyl group having two or more groups selected from a monocyclic hydrocarbon group and a monocyclic heterocyclic group, and
(iv) an alkyl group having a polycyclic hydrocarbon group or a polycyclic heterocyclic group.

The polycyclic hydrocarbon group and the monocyclic hydrocarbon group may be an aliphatic group or an aromatic group and are preferably an alicyclic hydrocarbon group.

Specifically, the polycyclic hydrocarbon group is preferably a polycyclic hydrocarbon group having a carbon number of 10 to 20. Specific examples of the polycyclic hydrocarbon group include a bicyclo[4.3.0]nonanyl group, a naphthalenyl group, a decahydronaphthalenyl group, a 1,2,3,4-tetrahydronaphthalenyl group, a tricyclo[5.2.1.0$^{2,6}$]decanyl group, a bornyl group, an isobornyl group, a norbornyl group, an adamantyl group, a noradamantyl group, a 1,7,7-trimethyltricyclo[2.2.1.0$^{2,6}$]heptanyl group and a 3,7,7-trimethylbicyclo[4.1.0]heptanyl group. Among these, a norbornyl group, an adamantyl group and a noradamantyl group are preferred.

The polycyclic heterocyclic group is preferably a polycyclic heterocyclic group having a carbon number of 10 to 20. Specific examples of the polycyclic heterocyclic group include an indole group and a carbazole group.

The monocyclic hydrocarbon group and monocyclic heterocyclic group in the alkyl group having two or more groups selected from a monocyclic hydrocarbon group and a monocyclic heterocyclic group include those described above.

The alkyl group having two or more groups selected from a monocyclic hydrocarbon group and a monocyclic heterocyclic group is suitably a group where two or more arbitrary hydrogen atoms of an alkyl group having a carbon number of 1 to 5 (preferably a carbon number of 1 to 3) are substituted for by a group selected from a monocyclic hydrocarbon group and a monocyclic heterocyclic group.

$R_1$ and $R_2$ may combine with each other to form a ring. The ring may be a monocyclic structure or a polycyclic structure. The ring structure which may be formed by $R_1$ and $R_2$ includes a monocyclic structure such as piperidine structure, and a polycyclic structure such as decahydroquinoline ring and decahydroisoquinoline ring.

The cyclic structure-containing group as $R_1$ and $R_2$ and the ring formed by combining $R_1$ and $R_2$ with each other may further have a substituent, and examples of the further substituent include a hydroxyl group, a halogen atom (e.g., fluorine, chlorine, bromine, iodine), a nitro group, a cyano group, an amide group, a sulfonamide group, an alkyl group such as methyl group, ethyl group, propyl group, n-butyl group, sec-butyl group, hexyl group, 2-ethylhexyl group and octyl group, an alkoxy group such as methoxy group, ethoxy group, hydroxyethoxy group, propoxy group, hydroxypropoxy group and butoxy group, an alkoxycarbonyl group such as methoxycarbonyl group and ethoxycarbonyl group, an acyl group such as formyl group, acetyl group and benzoyl group, an acyloxy group such as acetoxy group and butyryloxy group, and a carboxy group.

An embodiment where $R_1$ and $R_2$ combine with each other to form a ring or $R_1$ is an alkyl group having a carbon number of 5 or more or a group having a cyclic structure (preferably having a carbon number of 5 or more) is preferred; an embodiment where $R_1$ and $R_2$ combine with each other to form a ring or $R_1$ is a group having a cyclic structure (preferably having a carbon number of 5 or more) is more preferred; and an embodiment where $R_1$ and $R_2$ combine with each other to form a ring or $R_1$ is a group having a polycyclic structure is still more preferred.

In the case where $R_1$ is a group having a cyclic structure, $R_2$ is also preferably a group having a cyclic structure.

Thanks to these embodiments, the acid can be more unfailingly prevented from excessive diffusion and maybe because of this, EL and MEEF can be more improved.

The divalent linking group of L is not particularly limited, but examples thereof include —COO—, —OCO—, —CO—, —O—, —S—, —SO—, —SO$_2$—, an alkylene group, a cycloalkylene group and an alkenylene group. Among these, —COO—, —OCO—, —CO—, —O—, —SO$_2$— and an alkylene group are preferred, and —COO—, —OCO—, —SO$_2$— and an alkylene group are more preferred. The alkylene group, cycloalkylene group and alkenylene group as L may further have a substituent, and specific examples of the substituent are the same as those described above for the substituent which the cyclic structure-containing group as $R_1$ and $R_2$ may further have.

m is preferably 0 to 10, more preferably 0 to 8, still more preferably 0 to 4.

Specific examples of the sulfonic acid represented by formula (I) for use in the present invention are illustrated below. (Each of $X_1$ and $X_2$ independently represents a fluorine atom or a perfluoroalkyl group having a carbon number of 1 to 6.)

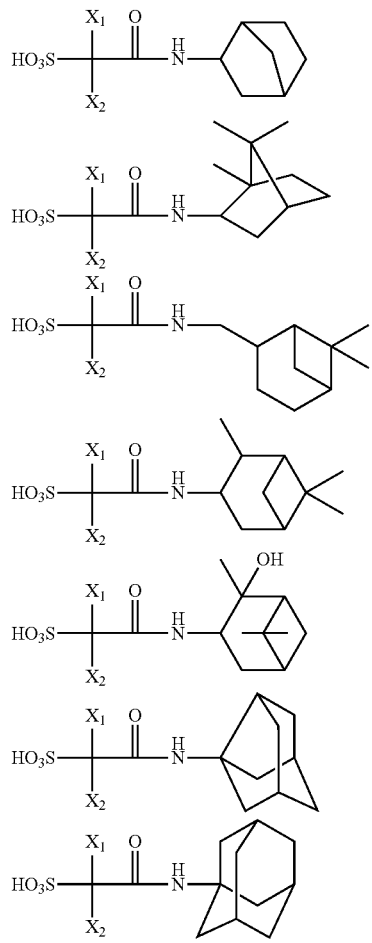

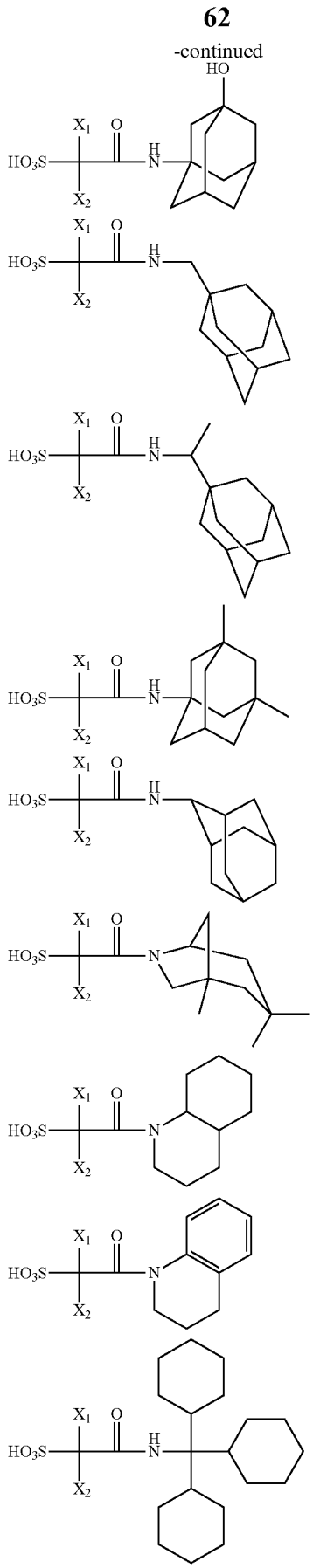

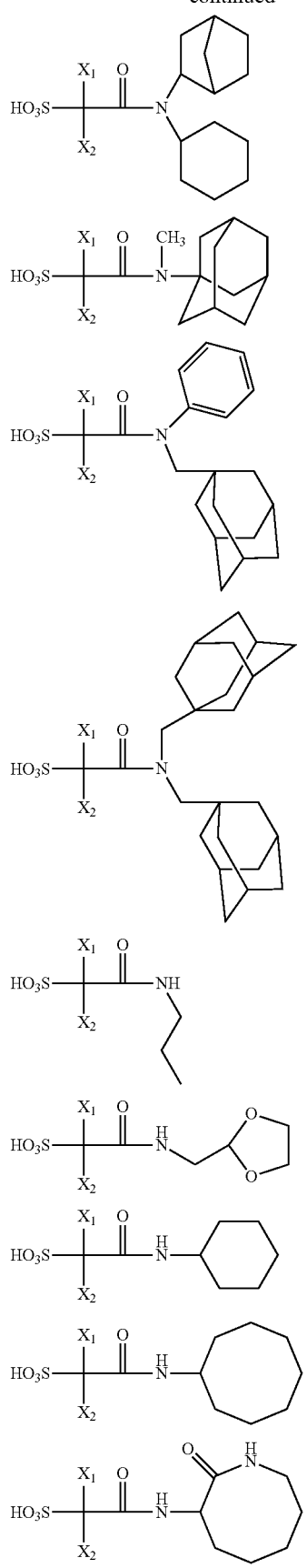
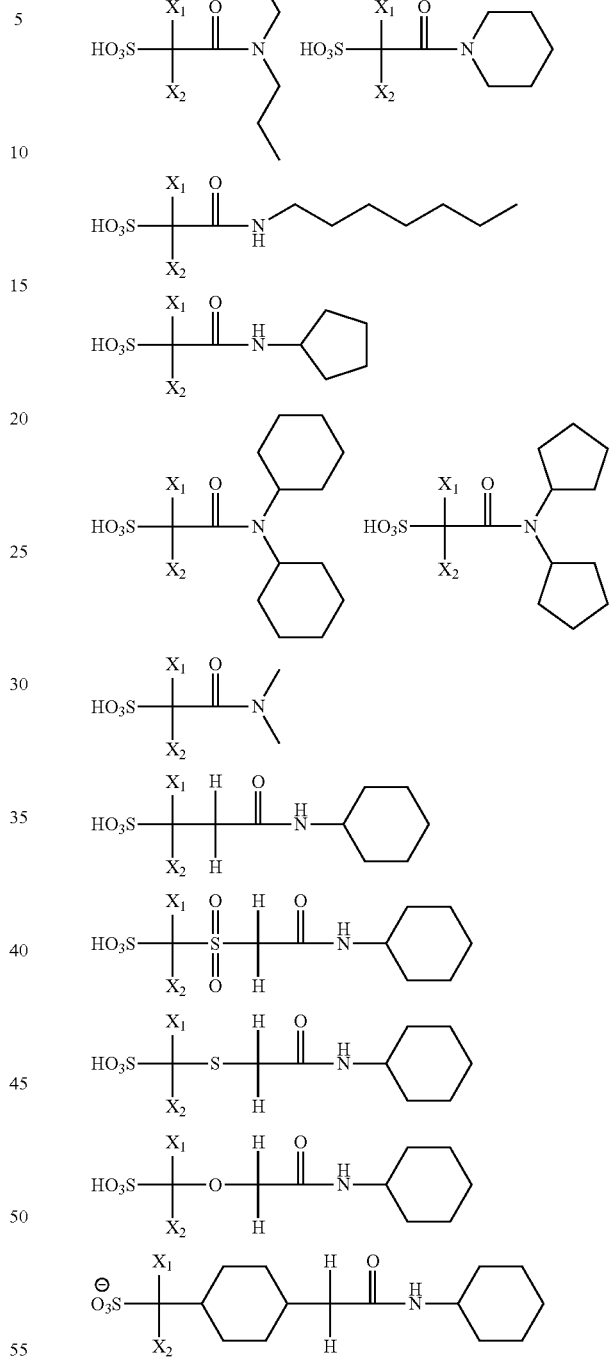

Out of the compounds capable of generating a sulfonic acid represented by formula (I) upon irradiation with an actinic ray or radiation, the compound (B) is preferably a compound having an ionic structure, such as sulfonium salt and iodonium salt, or a compound having a nonionic compound structure, such as oxime ester and imide ester. The compound having an ionic structure is more preferably a sulfonium salt. That is, the compound (B) is preferably a compound represented by the following formula (II):

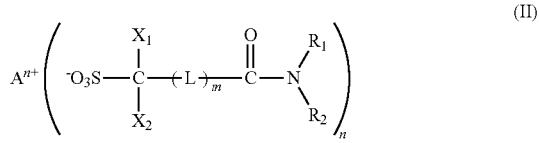

(II)

In formula (II), $A^{n+}$ represents an n-valent cation, and n represents 1 or 2. n is preferably 1. $X_1$, $X_2$, $R_1$, $R_2$, L and m have the same meanings as $X_1$, $X_2$, $R_f$, $R_2$, L and m in formula (I).

In formula (II), when n is 1, the compound represented by formula (II) includes compounds represented by the following formulae (ZI) and (ZII):

In formula (ZI), each of $R_{201}$, $R_{202}$ and $R_{203}$ independently represents an organic group.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene).

$Z^-$ represents an anion structure of the acid represented by formula (I) (in other words, a sulfonate anion of the compound represented by formula (II)).

The organic group represented by $R_{201}$, $R_{202}$ and $R_{203}$ includes, for example, corresponding groups in the later-described compounds (ZI-1), (ZI-2), (ZI-3) and (ZI-4).

The compound (ZI-1) is an arylsulfonium compound where at least one of $R_{201}$ to $R_{203}$ in formula (ZI) is an aryl group, that is, a compound having an arylsulfonium as the cation.

In the arylsulfonium compound, all of $R_{201}$ to $R_{203}$ may be an aryl group or a part of $R_{201}$ to $R_{203}$ may be an aryl group, with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably a phenyl group or a naphthyl group, more preferably a phenyl group. The aryl group may be an aryl group having a heterocyclic structure containing an oxygen, a nitrogen atom, a sulfur atom or the like. Examples of the heterocyclic structure include a pyrrole residue, a furan residue, a thiophene residue, an indole residue, a benzofuran residue and a benzothiophene residue. In the case where the arylsulfonium compound has two or more aryl groups, these two or more aryl groups may be the same or different.

The alkyl or cycloalkyl group which is present, if desired, in the arylsulfonium compound is preferably a linear or branched alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group and a cyclohexyl group.

The aryl group, alkyl group and cycloalkyl group of $R_{201}$ to $R_{203}$ may have, as the substituent, an alkyl group (for example, having a carbon number of 1 to 15), a cycloalkyl group (for example, having a carbon number of 3 to 15), an aryl group (for example, having a carbon number of 6 to 14), an alkoxy group (for example, having a carbon number of 1 to 15), a halogen atom, a hydroxyl group, a phenylthio group or an alkoxymethyloxy group-containing group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4, or an alkoxy group having a carbon number of 1 to 4. The substituent may be substituted on any one of three members $R_{201}$ to $R_{203}$ or may be substituted on all of these three members. In the case where $R_{201}$ to $R_{203}$ are an aryl group, the substituent is preferably substituted on the p-position of the aryl group.

The compound (ZI-2) is described below.

The compound (ZI-2) is a compound where each of $R_{201}$ to $R_{203}$ in formula (ZI) independently represents an aromatic ring-free organic group. The aromatic ring as used herein includes an aromatic ring containing a heteroatom.

The aromatic ring-free organic group as $R_{201}$ to $R_{203}$ has a carbon number of generally from 1 to 30, preferably from 1 to 20.

Each of $R_{201}$ to $R_{203}$ independently represents preferably an alkyl group, a cycloalkyl group, an allyl group or a vinyl group, more preferably a linear or branched 2-oxoalkyl group, a 2-oxocycloalkyl group or an alkoxycarbonylmethyl group, still more preferably a linear or branched 2-oxoalkyl group.

The alkyl group and cycloalkyl group of $R_{201}$ to $R_{203}$ are preferably a linear or branched alkyl group having a carbon number of 1 to 10 (e.g., methyl group, ethyl group, propyl group, butyl group, pentyl group), and a cycloalkyl group having a carbon number of 3 to 10 (e.g., cyclopentyl group, cyclohexyl group, norbornyl group). The alkyl group is more preferably a 2-oxoalkyl group or an alkoxycarbonylmethyl group. The cycloalkyl group is more preferably a 2-oxocycloalkyl group.

The 2-oxoalkyl group may be either linear or branched and is preferably a group having $>C=O$ at the 2-position of the above-described alkyl group.

The 2-oxocycloalkyl group is preferably a group having $>C=O$ at the 2-position of the above-described cycloalkyl group.

The alkoxy group in the alkoxycarbonylmethyl group is preferably an alkoxy group having a carbon number of 1 to 5 (e.g., methoxy, ethoxy, propoxy, butoxy, pentoxy).

$R_{201}$ to $R_{203}$ may be further substituted with a halogen atom, an alkoxy group (for example, having a carbon number of 1 to 5), a hydroxyl group, a cyano group or a nitro group.

The compound (ZI-3) is described below.

The compound (ZI-3) is a compound represented by the following formula (ZI-3), and this is a compound having a phenacylsulfonium salt structure.

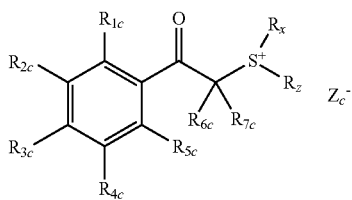

(ZI-3)

In formula (ZI-3), each of $R_{1c}$ to $R_{5c}$ independently represents a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group or an arylthio group.

Each of $R_{6c}$ and $R_{7c}$ independently represents a hydrogen atom, an alkyl group, a cycloalkyl group, a halogen atom, a cyano group or an aryl group.

Each of $R_x$ and $R_y$ independently represents an alkyl group, a cycloalkyl group, a 2-oxoalkyl group, a 2-oxocycloalkyl group, an alkoxycarbonylalkyl group, an allyl group or a vinyl group.

Any two or more members out of $R_{1c}$ to $R_{5c}$, a pair of $R_{5c}$ and $R_{6c}$, a pair of $R_{6c}$ and $R_{7c}$, a pair of $R_{5c}$ and $R_x$, or a pair of $R_x$ and $R_y$ may combine together to form a ring structure. This ring structure may contain an oxygen atom, a sulfur atom, a ketone group, an ester bond or an amide bond.

The ring structure includes an aromatic or non-aromatic hydrocarbon ring, an aromatic or non-aromatic heterocyclic ring, and a polycyclic condensed ring formed by combining two or more of these rings. The ring structure is a 3- to 10-membered ring, preferably a 4- to 8-membered ring, more preferably a 5- or 6-membered ring.

Examples of the group formed by combining any two or more members out of $R_{1c}$ to $R_{5c}$, a pair of $R_{6c}$ and $R_{7c}$, or a pair of $R_x$ and $R_y$ include a butylene group and a pentylene group.

The group formed by combining a pair of $R_{5c}$ and $R_{6c}$ or a pair of $R_{5c}$ and $R_x$ is preferably a single bond or an alkylene group, and examples of the alkylene group include a methylene group and an ethylene group.

$Zc^-$ represents an anion structure of the acid represented by formula (I) (in other words, a sulfonate anion of the compound represented by formula (II).

The alkyl group as $R_{1c}$ to $R_{7c}$ may be either linear or branched and is, for example, an alkyl group having a carbon number of 1 to 20, preferably a linear or branched alkyl group having a carbon number of 1 to 12 (e.g., methyl group, ethyl group, linear or branched propyl group, linear or branched butyl group, linear or branched pentyl group). The cycloalkyl group is, for example, a cycloalkyl group having a carbon number of 3 to 10 (e.g., cyclopentyl group, cyclohexyl group).

The aryl group as $R_{1c}$ to $R_{7c}$ is preferably an aryl group having a carbon number of 5 to 15, and examples thereof include a phenyl group and a naphthyl group.

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 (e.g., methoxy group, ethoxy group, linear or branched propoxy group, linear or branched butoxy group, linear or branched pentoxy group), or a cyclic alkoxy group having a carbon number of 3 to 10 (e.g., cyclopentyloxy group, cyclohexyloxy group).

Specific examples of the alkoxy group in the alkoxycarbonylalkyl group of $R_{1c}$ to $R_{5c}$ are the same as specific examples of the alkoxy group of $R_{1c}$ to $R_{5c}$.

Specific examples of the alkyl group in the alkylcarbonyloxy group and alkylthio group of $R_{1c}$ to $R_{5c}$ are the same as specific examples of the alkyl group of $R_{1c}$ to $R_{5c}$.

Specific examples of the cycloalkyl group in the cycloalkylcarbonyloxy group of $R_{1c}$ to $R_{5c}$ are the same as specific examples of the cycloalkyl group of $R_{1c}$ to $R_{5c}$.

Specific examples of the aryl group in the aryloxy group and arylthio group of $R_{1c}$ to $R_{5c}$ are the same as specific examples of the aryl group of $R_{1c}$ to $R_{5c}$.

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. Thanks to such a compound, the solvent solubility is more enhanced and production of particles during storage can be suppressed.

The ring structure which may be formed by combining any two or more members out of $R_1$ to $R_5$, with each other is preferably a 5- or 6-membered ring, more preferably a 6-membered ring (for example, a phenyl ring).

The ring structure which may be formed by combining $R_{5c}$ and $R_{6c}$ with each other includes a 4- or higher-membered ring (preferably a 5- or 6-membered ring) formed together with the carbonyl carbon atom and carbon atom in formula (I) by combining $R_{5c}$ and $R_{6c}$ with each other to constitute a single bond or an alkylene group (for example, a methylene group or an ethylene group).

An embodiment where $R_{6c}$ and $R_{7c}$ both are an alkyl group is preferred, an embodiment where each of $R_{6c}$ and $R_{7c}$ is a linear or branched alkyl group having a carbon number of 1 to 4 is more preferred, and an embodiment where both are a methyl group is still more preferred.

In the case where $R_{6c}$ and $R_{7c}$ combine to form a ring, the group formed by combining $R_{6c}$ and $R_{7c}$ is preferably an alkylene group having a carbon number of 2 to 10, and examples thereof include an ethylene group, a propylene group, a butylene group, a pentylene group and a hexylene group. Also, the ring formed by combining $R_{6c}$ and $R_{7c}$ may contain a heteroatom such as oxygen atom in the ring.

Examples of the alkyl group and cycloalkyl group as $R_x$ and $R_y$ are the same as those of the alkyl group and cycloalkyl group in $R_{1c}$ to $R_{7c}$.

Examples of the 2-oxoalkyl group and 2-oxocycloalkyl group as $R_x$ and $R_y$ include a group having >C=O at the 2-position of the alkyl group or cycloalkyl group as $R_{1c}$ to $R_{1c}$.

Examples of the alkoxy group in the alkoxycarbonylalkyl group as $R_x$ and $R_y$ are the same as those of the alkoxy group in $R_{1c}$ to $R_{5c}$. The alkyl group is, for example, an alkyl group having a carbon number of 1 to 12, preferably a linear alkyl group having a carbon number of 1 to 5 (e.g., methyl group, ethyl group).

The allyl group as $R_x$ and $R_y$ is not particularly limited but is preferably an unsubstituted ally group or an ally group substituted with a monocyclic or polycyclic cycloalkyl group (preferably a cycloalkyl group having a carbon number of 3 to 10).

The vinyl group as $R_x$ and $R_y$ is not particularly limited but is preferably an unsubstituted vinyl group or a vinyl group substituted with a monocyclic or polycyclic cycloalkyl group (preferably a cycloalkyl group having a carbon number of 3 to 10).

The ring structure which may be formed by combining $R_{5c}$ and $R_x$ with each other includes a 5- or higher-membered ring (preferably a 5-membered ring) formed together with the sulfur atom and carbonyl carbon atom in formula (I) by combining $R_{5c}$ and $R_x$ with each other to constitute a single bond or an alkylene group (e.g., methylene group, ethylene group).

The ring structure which may be formed by combining $R_x$ and $R_y$ with each other includes a 5- or 6-membered ring, preferably a 5-membered ring (that is, tetrahydrothiophene ring), formed together with the sulfur atom in formula (ZI-3) by divalent $R_x$ and $R_y$ (e.g., methylene group, ethylene group, propylene group).

Each of $R_x$ and $R_y$ is preferably an alkyl or cycloalkyl group having a carbon number of 4 or more, more preferably 6 or more, still more preferably 8 or more.

$R_{1c}$ to $R_{1c}$, $R_x$ and $R_y$ may further have a substituent, and examples of such a substituent include a halogen atom (e.g., fluorine atom), a hydroxyl group, a carboxyl group, a cyano group, a nitro group, an alkyl group, a cycloalkyl group, an aryl group, an alkoxy group, an aryloxy group, an acyl group, an arylcarbonyl group, an alkoxyalkyl group, an aryloxyalkyl group, an alkoxycarbonyl group, an aryloxycarbonyl group, an alkoxycarbonyloxy group and an aryloxycarbonyloxy group.

The alkyl group includes, for example, a linear or branched alkyl group having a carbon number of 1 to 12, such as methyl group, ethyl group, n-propyl group, i-propyl group, n-butyl group, 2-methylpropyl group, 1-methylpropyl group and tert-butyl group.

The cycloalkyl group includes, for example, a cycloalkyl group having a carbon number of 3 to 10, such as cyclopentyl group and cyclohexyl group.

The aryl group includes, for example, an aryl group having a carbon number of 6 to 15, such as phenyl group and naphthyl group.

The alkoxy group includes, for example, a linear, branched or cyclic alkoxy group having a carbon number of 1 to 20, such as methoxy group, ethoxy group, n-propoxy group, i-propoxy group, n-butoxy group, 2-methylpropoxy group, 1-methylpropoxy group, tert-butoxy group, cyclopentyloxy group and cyclohexyloxy group.

The aryloxy group includes, for example, an aryloxy group having a carbon number of 6 to 10, such as phenyloxy group and naphthyloxy group.

The acyl group includes, for example, a linear or branched acyl group having a carbon number of 2 to 12, such as acetyl group, propionyl group, n-butanoyl, butanoyl, n-heptanoyl, 2-methylbutanoyl, 1-methylbutanoyl and tert-heptanoyl.

The arylcarbonyl group includes, for example, an aryloxy group having a carbon number of 6 to 10, such as phenylcarbonyl group and naphthylcarbonyl group.

The alkoxyalkyl group includes, for example, a linear, branched or cyclic alkoxyalkyl group having a carbon number of 2 to 21, such as such as methoxymethyl group, ethoxymethyl group, 1-methoxyethyl group, 2-methoxyethyl group, 1-ethoxyethyl group and 2-ethoxyethyl group.

The aryloxyalkyl group includes, for example, an aryloxy group having a carbon number of 7 to 12, such as phenyloxymethyl group, phenyloxyethyl group, naphthyloxymethyl group and naphthyloxyethyl group.

The alkoxycarbonyl group includes, for example, a linear, branched or cyclic alkoxycarbonyl group having a carbon number of 2 to 21, such as methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, tert-butoxycarbonyl group, cyclopentyloxycarbonyl group and cyclohexyloxycarbonyl group.

The aryloxycarbonyl group includes, for example, an aryloxycarbonyl group having a carbon number of 7 to 11, such as phenyloxycarbonyl group and naphthyloxycarbonyl group.

The alkoxycarbonyloxy group includes, for example, a linear, branched or cyclic alkoxycarbonyloxy group having a carbon number of 2 to 21, such as methoxycarbonyloxy group, ethoxycarbonyloxy group, n-propoxycarbonyloxy group, i-propoxycarbonyloxy group, n-butoxycarbonyloxy group, tert-butoxycarbonyloxy group, cyclopentyloxycarbonyloxy group and cyclohexyloxycarbonyloxy group.

The aryloxycarbonyloxy group includes, for example, an aryloxycarbonyloxy group having a carbon number of 7 to 11, such as phenyloxycarbonyloxy group and naphthyloxycarbonyloxy group.

In formula (ZI-3), it is more preferred that each of $R_{1c}$, $R_{2c}$, $R_{4c}$ and $R_{5c}$ independently represents a hydrogen atom and $R_{1c}$ represents a group except for a hydrogen atom, that is, represents an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group or an arylthio group.

Specific examples of the cation in the compound represented by formula (ZI-2) or (ZI-3) for use in the present invention are illustrated below.

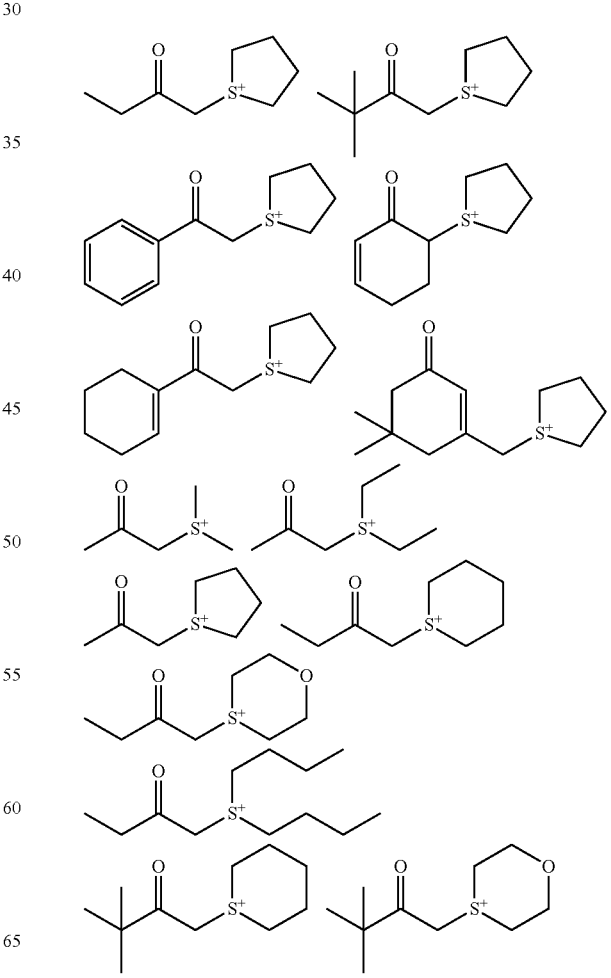

-continued
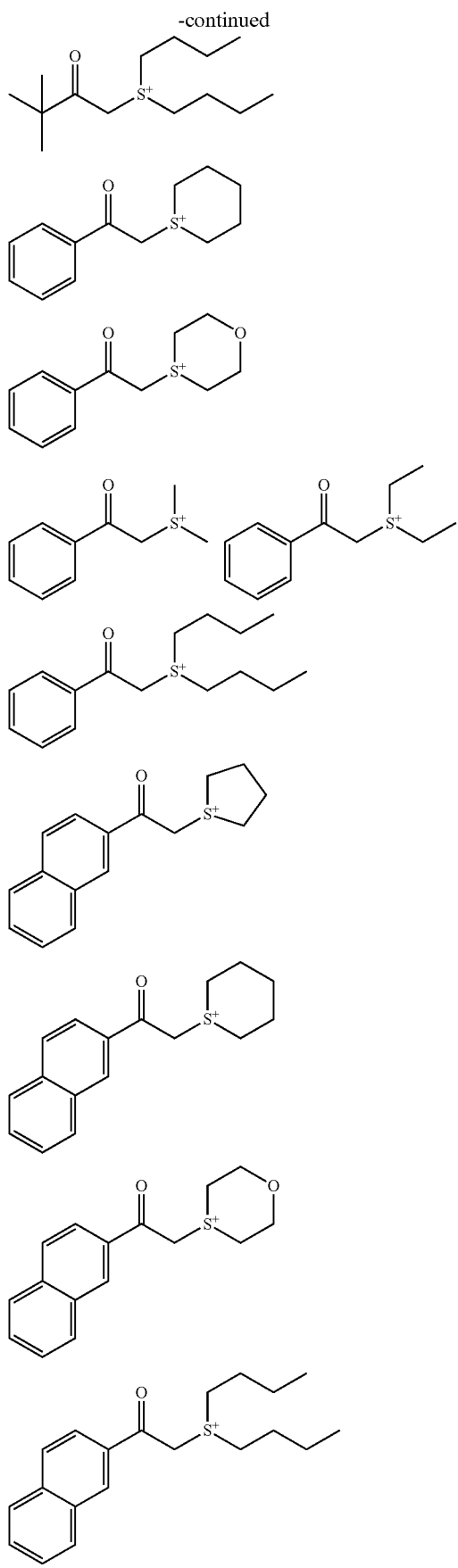
-continued
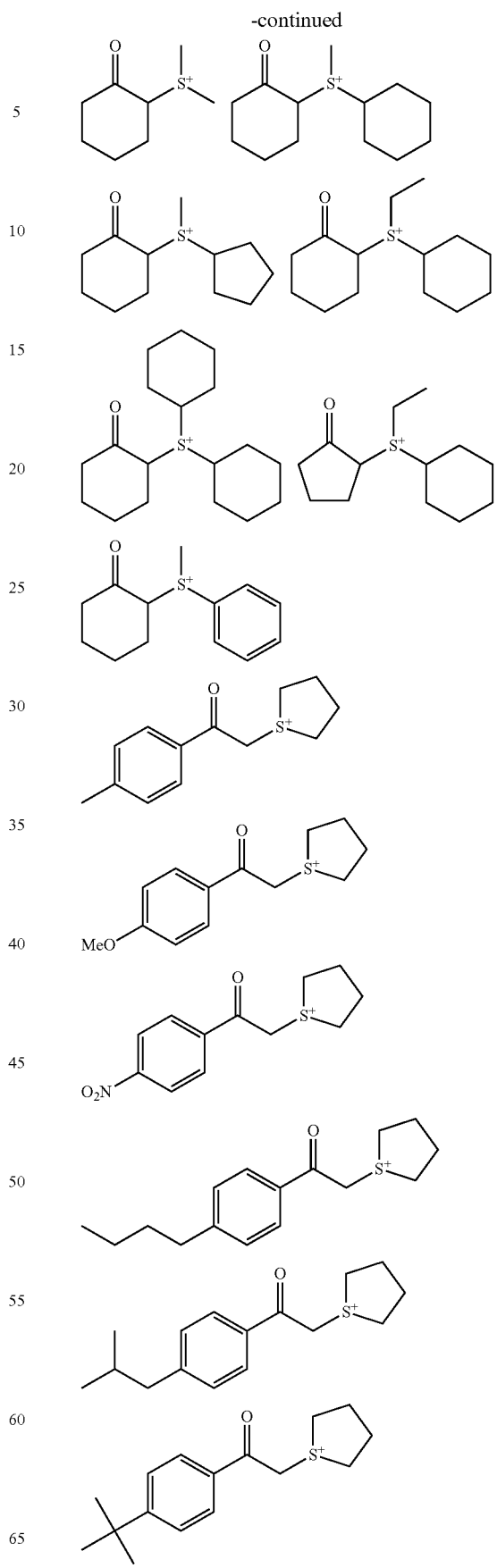

73
-continued
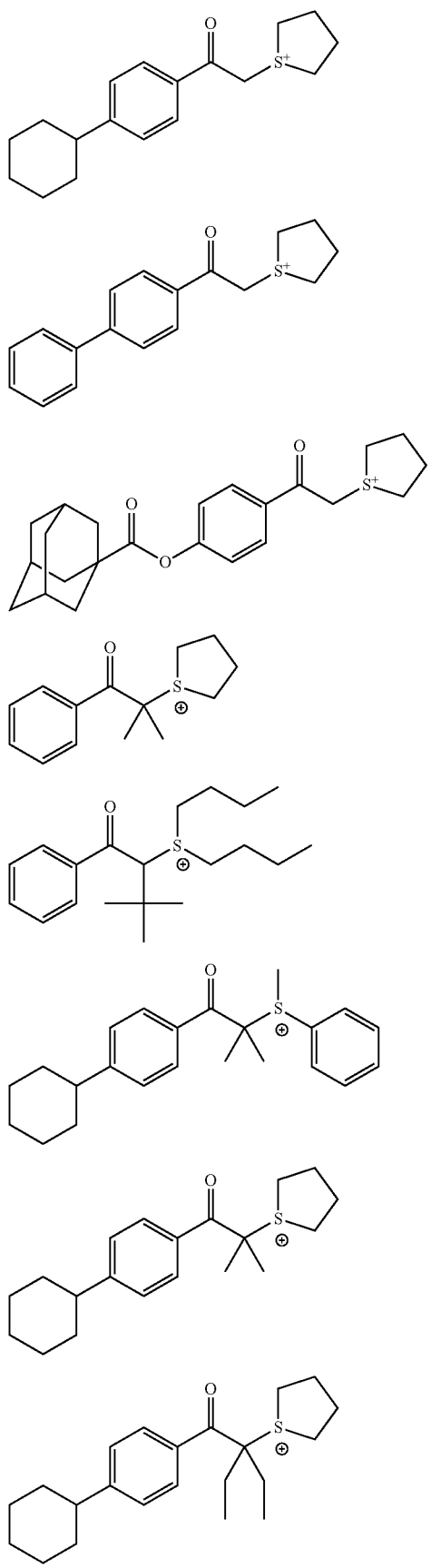
74
-continued
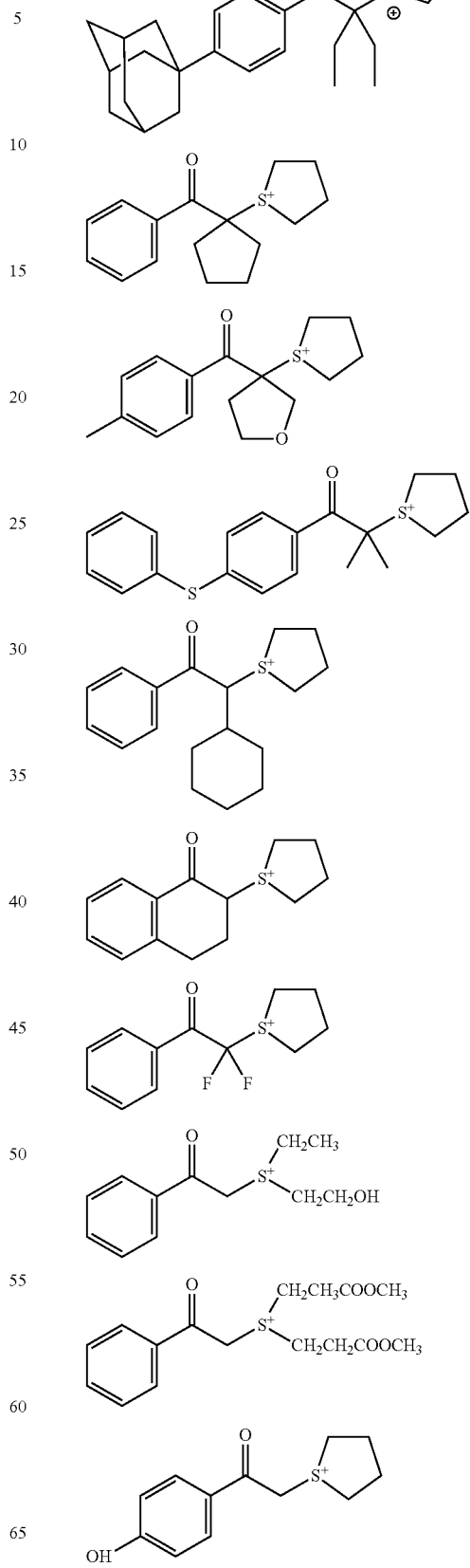

-continued
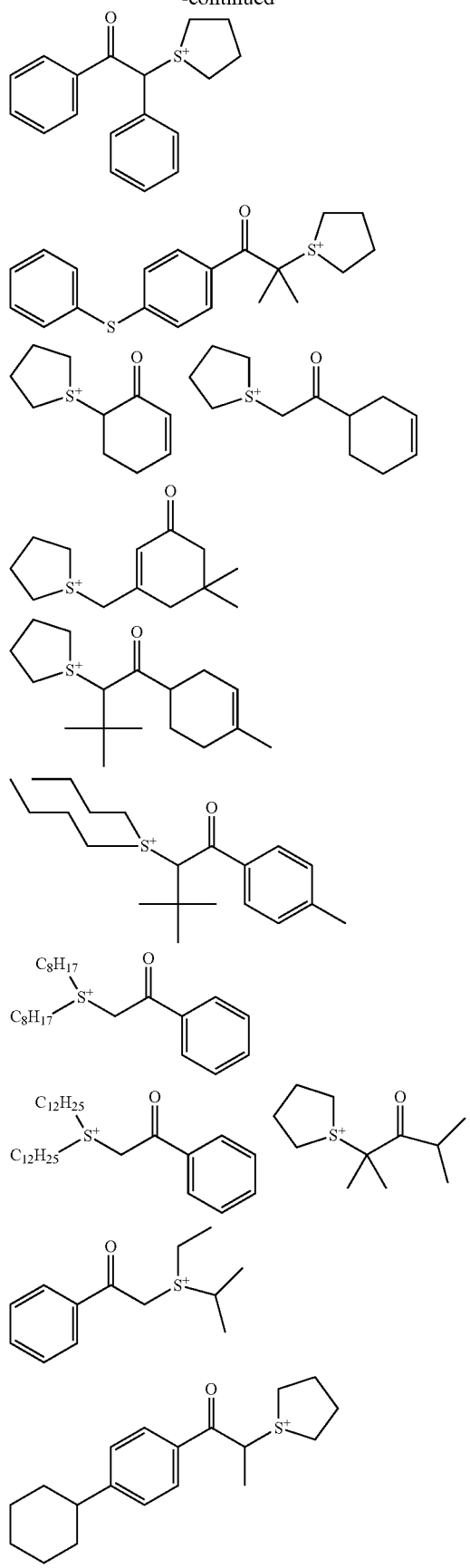
-continued
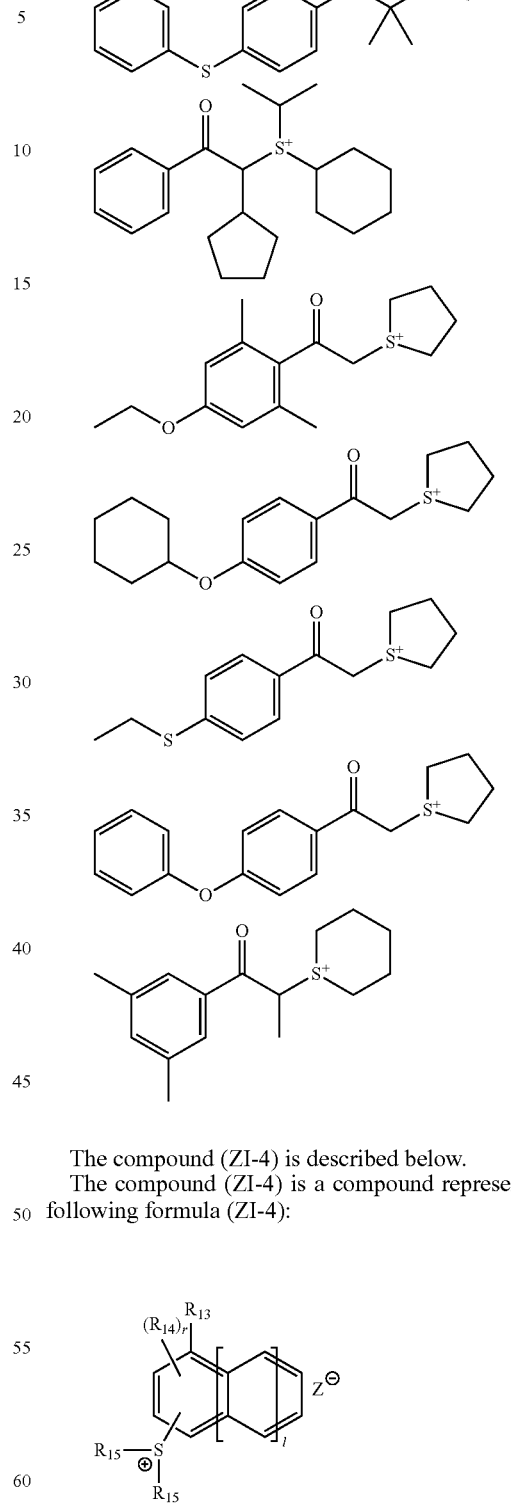
The compound (ZI-4) is described below.
The compound (ZI-4) is a compound represented by the following formula (ZI-4):
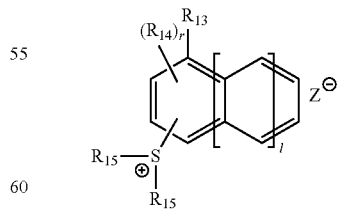
(ZI-4)
In formula (ZI-4), $R_{13}$ represents a hydrogen atom, a fluorine atom, a hydroxyl group, an alkyl group, a cycloalkyl group, an alkoxy group, an alkoxycarbonyl group, or a group having a cycloalkyl group. These groups may have a substituent.

$R_{14}$ represents, when a plurality of $R_{14}$'s are present, each independently represents, a hydroxyl group, an alkyl group, a cycloalkyl group, an alkoxy group, an alkoxycarbonyl group, an alkylcarbonyl group, an alkylsulfonyl group, a cycloalkylsulfonyl group, or a group having a cycloalkyl group. These groups may have a substituent.

Each $R_{15}$ independently represents an alkyl group, a cycloalkyl group or a naphthyl group. Two $R_{15}$'s may combine with each other to form a ring. These groups may have a substituent.

l represents an integer of 0 to 2.

r represents an integer of 0 to 8.

$Z^-$ represents an anion structure of the acid represented by formula (I) (in other words, a sulfonate anion of the compound represented by formula (II)).

In formula (ZI-4), the alkyl group of $R_{13}$, $R_{14}$ and $R_{15}$ is a linear or branched alkyl group preferably having a carbon number of 1 to 10, and examples thereof include a methyl group, an ethyl group, an n-propyl group, an i-propyl group, an n-butyl group, a 2-methylpropyl group, a 1-methylpropyl group, a tert-butyl group, an n-pentyl group, a neopentyl group, an n-hexyl group, an n-heptyl group, an n-octyl group, a 2-ethylhexyl group, an n-nonyl group and an n-decyl group. Among these alkyl groups, a methyl group, an ethyl group, an n-butyl group and a tert-butyl group are preferred.

The cycloalkyl group of $R_{13}$, $R_{14}$ and $R_{15}$ includes a monocyclic or polycyclic cycloalkyl group (preferably a cycloalkyl group having a carbon number of 3 to 20), and examples thereof include cyclopropyl, cyclobutyl, cyclopentyl, cyclohexyl, cycloheptyl, cyclooctyl, cyclododecanyl, cyclopentenyl, cyclohexenyl, cyclooctadienyl, norbornyl, tricyclodecanyl, tetracyclodecanyl and adamantyl. Among these, cyclopropyl, cyclopentyl, cyclohexyl, cycloheptyl and cyclooctyl are preferred.

The alkoxy group of $R_{13}$ and $R_{14}$ is a linear or branched alkoxy group preferably having a carbon number of 1 to 10, and examples thereof include a methoxy group, an ethoxy group, an n-propoxy group, an i-propoxy group, an n-butoxy group, a 2-methylpropoxy group, a 1-methylpropoxy group, a tert-butoxy group, an n-pentyloxy group, a neopentyloxy group, an n-hexyloxy group, an n-heptyloxy group, an n-octyloxy group, a 2-ethylhexyloxy group, an n-nonyloxy group and an n-decyloxy group. Among these alkoxy groups, a methoxy group, an ethoxy group, an n-propoxy group and an n-butoxy group are preferred.

The alkoxycarbonyl group of $R_{13}$ and $R_{14}$ is a linear or branched alkoxycarbonyl group preferably having a carbon number of 2 to 11, and examples thereof include a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a tert-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, an n-nonyloxycarbonyl group and an n-decyloxycarbonyl group. Among these alkoxycarbonyl groups, a methoxycarbonyl group, an ethoxycarbonyl group and an n-butoxycarbonyl group are preferred.

The group having a cycloalkyl group of $R_{13}$ and $R_{14}$ includes a monocyclic or polycyclic cycloalkyloxy group (preferably a cycloalkyl group having a carbon number of 3 to 20), and examples thereof include a monocyclic or polycyclic cycloalkyloxy group and an alkoxy group having a monocyclic or polycyclic cycloalkyl group. These groups may further have a substituent.

The monocyclic or polycyclic cycloalkyloxy group of $R_{13}$ and $R_{14}$ preferably has a total carbon number of 7 or more, more preferably a total carbon number of 7 to 15, and preferably has a monocyclic cycloalkyl group. The monocyclic cycloalkyloxy group having a total carbon number of 7 or more indicates a monocyclic cycloalkyloxy group where a cycloalkyloxy group such as cyclopropyloxy group, cyclobutyloxy group, cyclopentyloxy group, cyclohexyloxy group, cycloheptyloxy group, cyclooctyloxy group and cyclododecanyloxy group arbitrarily has a substituent such as alkyl group (e.g., methyl group, ethyl group, propyl group, butyl group, pentyl group, hexyl group, heptyl group, octyl group, dodecyl group, 2-ethylhexyl group, isopropyl group, sec-butyl group, tert-butyl group, isoamyl group), hydroxyl group, halogen atom (e.g., fluorine, chlorine, bromine, iodine), nitro group, cyano group, amido group, sulfonamido group, alkoxy group (e.g., methoxy group, ethoxy group, hydroxyethoxy group, propoxy group, hydroxypropoxy group, butoxy group), alkoxycarbonyl group (e.g., methoxycarbonyl group, ethoxycarbonyl group), acyl group (e.g., formyl group, acetyl group, benzoyl group), acyloxy group (e.g., acetoxy group, butyryloxy group) and carboxy group and where the total carbon number inclusive of the carbon number of the arbitrary substituent on the cycloalkyl group is 7 or more.

Examples of the polycyclic cycloalkyloxy group having a total carbon number of 7 or more include a norbornyloxy group, a tricyclodecanyloxy group, a tetracyclodecanyloxy group and an adamantyloxy group.

The alkoxy group having a monocyclic or polycyclic cycloalkyl group of $R_{13}$ and $R_{14}$ preferably has a total carbon number of 7 or more, more preferably a total carbon number of 7 to 15, and is preferably an alkoxy group having a monocyclic cycloalkyl group. The alkoxy group having a total carbon number of 7 or more and having a monocyclic cycloalkyl group indicates an alkoxy group where the above-described monocyclic cycloalkyl group which may have a substituent is substituted on an alkoxy group such as methoxy, ethoxy, propoxy, butoxy, pentyloxy, hexyloxy, heptoxy, octyloxy, dodecyloxy, 2-ethylhexyloxy, isopropoxy, sec-butoxy, tert-butoxy and isoamyloxy and where the total carbon number inclusive of the carbon number of the substituent is 7 or more. Examples thereof include a cyclohexylmethoxy group, a cyclopentylethoxy group and a cyclohexylethoxy group, with a cyclohexylmethoxy group being preferred.

Examples of the alkoxy group having a total carbon number of 7 or more and having a polycyclic cycloalkyl group include a norbornylmethoxy group, a norbornylethoxy group, a tricyclodecanylmethoxy group, a tricyclodecanylethoxy group, a tetracyclodecanylmethoxy group, a tetracyclodecanylethoxy group, an adamantylmethoxy group and an adamantylethoxy group, with a norbornylmethoxy group and a norbornylethoxy group being preferred.

Specific examples of the alkyl group in the alkylcarbonyl group of $R_{14}$ are the same as those of the alkyl group of $R_{13}$ to $R_{15}$.

The alkylsulfonyl or cycloalkylsulfonyl group of $R_{14}$ is a linear, branched or cyclic alkylsulfonyl group preferably having a carbon number of 1 to 10, and examples thereof include a methanesulfonyl group, an ethanesulfonyl group, an n-propanesulfonyl group, an n-butanesulfonyl group, a tert-butanesulfonyl group, an n-pentanesulfonyl group, a neopentanesulfonyl group, an n-hexanesulfonyl group, an n-heptanesulfonyl group, an n-octanesulfonyl group, a 2-ethylhexanesulfonyl group, an n-nonanesulfonyl group, an n-decanesulfonyl group, a cyclopentanesulfonyl group and a cyclohexanesulfonyl group. Among these alkylsulfonyl groups and cycloalkylsulfonyl groups, a methanesulfonyl group, an ethanesulfonyl group, an n-propanesulfonyl group, an n-butanesulfonyl group, a cyclopentanesulfonyl group and a cyclohexanesulfonyl group are preferred.

Examples of the substituent which each of the groups above may have include a halogen atom (e.g., fluorine), a hydroxyl group, a carboxyl group, a cyano group, a nitro group, an alkoxy group, an alkoxyalkyl group, an alkoxycarbonyl group and an alkoxycarbonyloxy group.

Examples of the alkoxy group include a linear, branched or cyclic alkoxy group having a carbon number of 1 to 20, such as methoxy group, ethoxy group, n-propoxy group, i-propoxy group, n-butoxy group, 2-methylpropoxy group, 1-methylpropoxy group, tert-butoxy group, cyclopentyloxy group and cyclohexyloxy group.

Examples of the alkoxyalkyl group include a linear, branched or cyclic alkoxyalkyl group having a carbon number of 2 to 21, such as methoxymethyl group, ethoxymethyl group, 1-methoxyethyl group, 2-methoxyethyl group, 1-ethoxyethyl group and 2-ethoxyethyl group.

Examples of the alkoxycarbonyl group include a linear, branched or cyclic alkoxycarbonyl group having a carbon number of 2 to 21, such as methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, tert-butoxycarbonyl group, cyclopentyloxycarbonyl group and cyclohexyloxycarbonyl group.

Examples of the alkoxycarbonyloxy group include a linear, branched or cyclic alkoxycarbonyloxy group having a carbon number of 2 to 21, such as methoxycarbonyloxy group, ethoxycarbonyloxy group, n-propoxycarbonyloxy group, i-propoxycarbonyloxy group, n-butoxycarbonyloxy group, tert-butoxycarbonyloxy group, cyclopentyloxycarbonyloxy group and cyclohexyloxycarbonyloxy group.

The ring structure which may be formed by combining two $R_{15}$'s with each other includes a 5- or 6-membered ring, preferably a 5-membered ring (that is, tetrahydrothiophene ring), formed together with the sulfur atom in formula (ZI-4) by two divalent $R_{15}$'s and may be fused with an aryl group or a cycloalkyl group. The divalent $R_{15}$ may have a substituent, and examples of the substituent include a hydroxyl group, a carboxyl group, a cyano group, a nitro group, an alkyl group, a cycloalkyl group, an alkoxy group, an alkoxyalkyl group, an alkoxycarbonyl group and an alkoxycarbonyloxy group. As for the substituent on the ring structure, a plurality of substituents may be present, and they may combine with each other to form a ring (an aromatic or non-aromatic hydrocarbon ring, an aromatic or non-aromatic heterocyclic ring, or a polycyclic condensed ring formed by combining two or more of these rings).

In formula (ZI-4), $R_{15}$ is preferably, for example, a methyl group, an ethyl group, a naphthyl group, or a divalent group of fainting a tetrahydrothiophene ring structure together with the sulfur atom when two $R_{15}$'s are combined.

The substituent which $R_{13}$ and $R_{14}$ may have is preferably a hydroxyl group, an alkoxy group, an alkoxycarbonyl group or a halogen atom (particularly fluorine atom).

l is preferably 0 or 1, more preferably 1.

r is preferably from 0 to 2.

Specific preferred examples of the cation in the compound represented by formula (ZI-4) for use in the present invention are illustrated below.

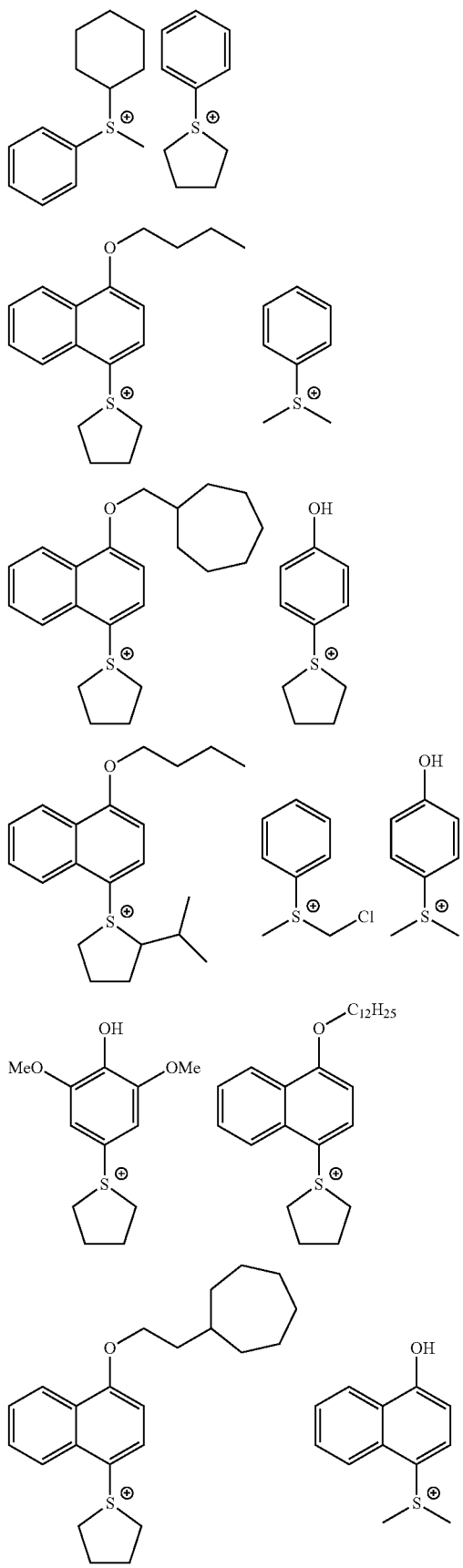

81
-continued
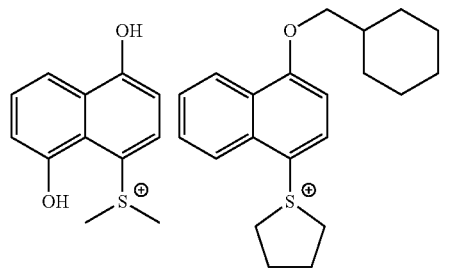
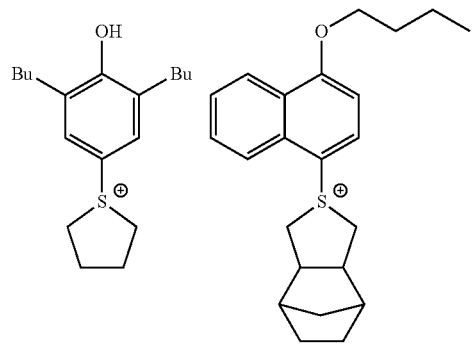
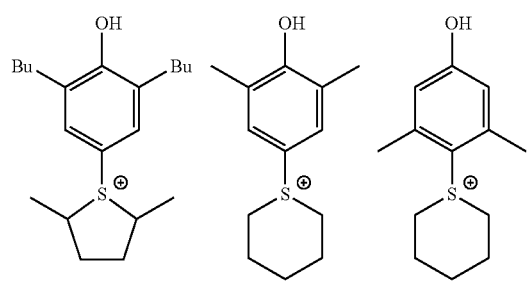
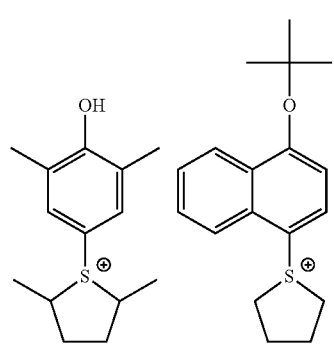
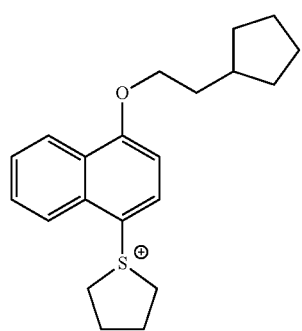
82
-continued
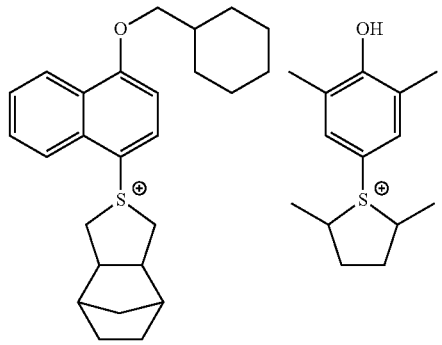
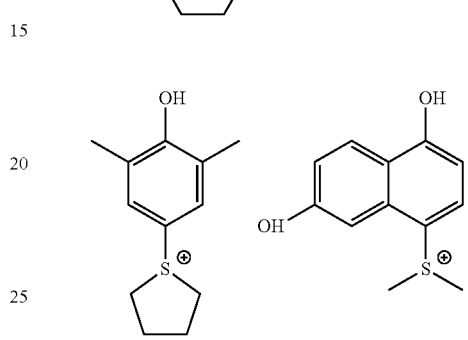
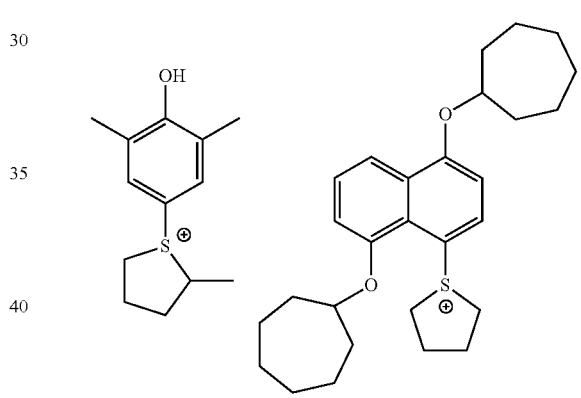
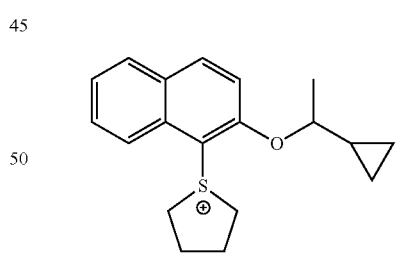
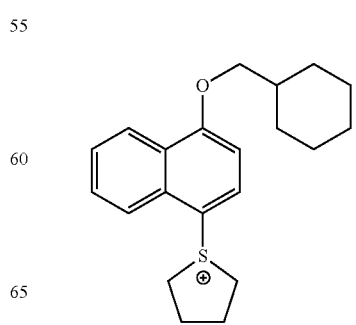

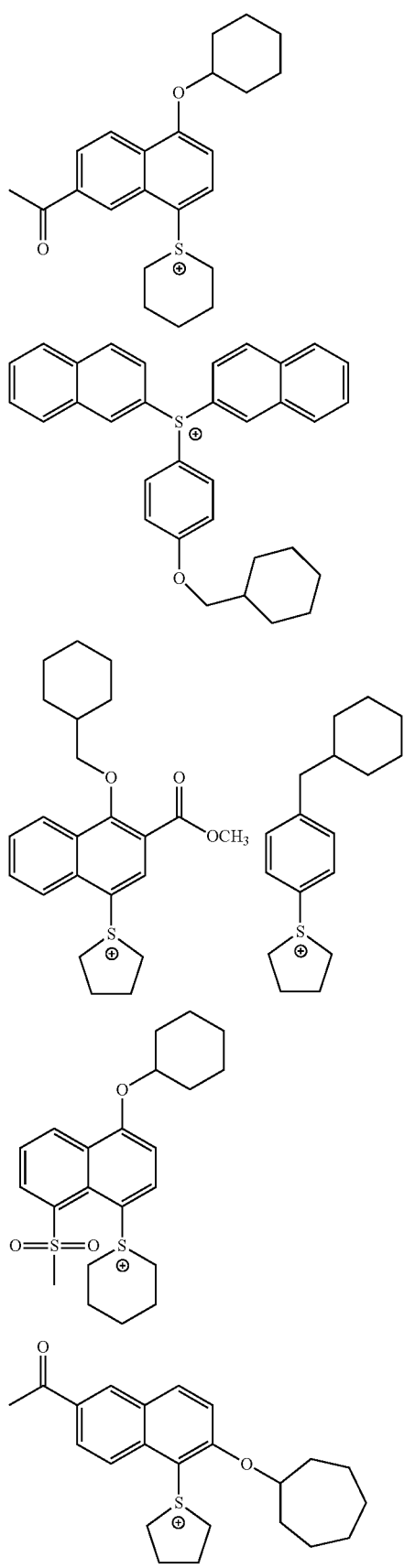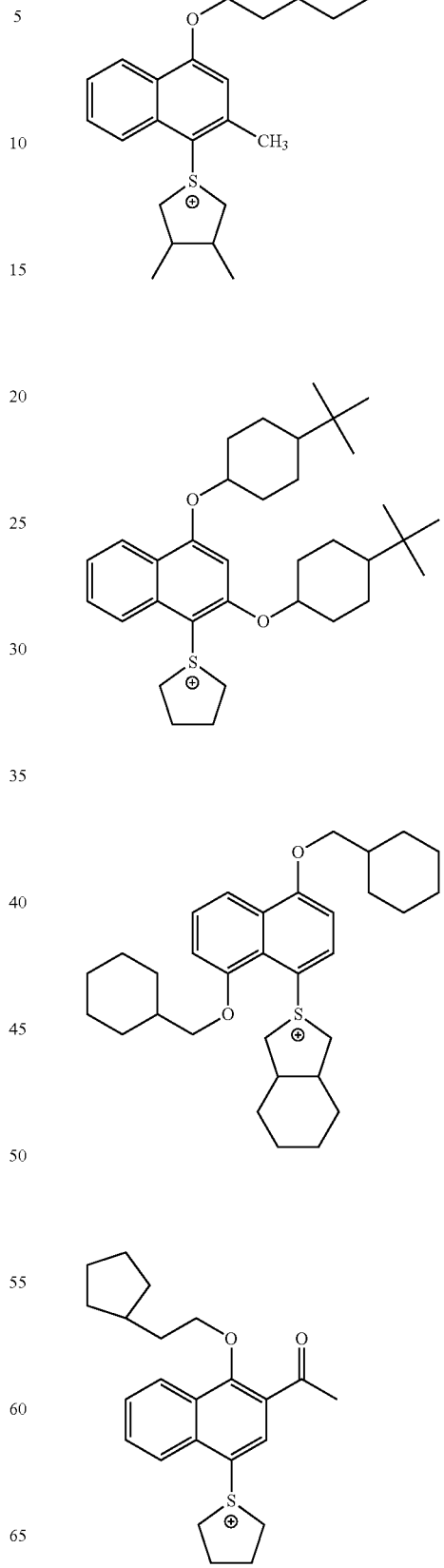

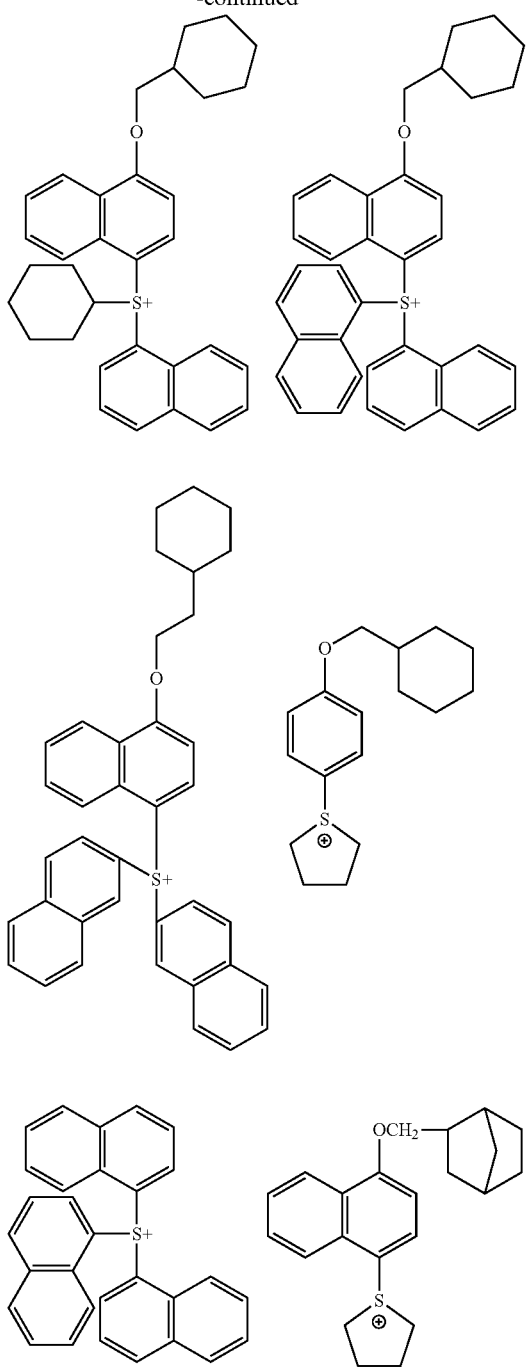

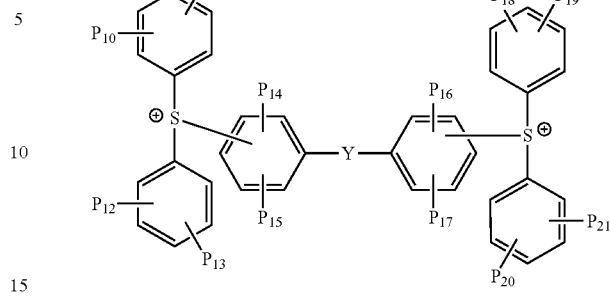

In the case where n is 2 in formula (II), the compound represented by formula (II) includes a compound having a plurality of structures represented by formula (ZI). For example, the compound may be a compound having a structure where at least one of $R_{201}$ to $R_{203}$ in the compound represented by formula (ZI) is bonded to at least one of $R_{201}$ to $R_{203}$ in another compound represented by formula (ZI) through a single bond or a linking group.

In the case where n is 2 in formula (II), the divalent cation $A^{2+}$ is preferably a sulfonium cation represented by the following formula (III):

In formula (III), each of $P_{10}$ to $P_{21}$ independently represents a hydrogen atom, a hydroxyl group, an alkyl group, a cycloalkyl group, an alkoxy group or a halogen atom (e.g., fluorine atom, chlorine atom, bromine atom, iodine atom). Y represents a sulfur atom or an oxygen atom.

The alkyl group may be linear or branched and is preferably an alkyl group having a carbon number of 1 to 12. Specific examples of the alkyl group include a methyl group, an ethyl group, a propyl group, a butyl group, a pentyl group, a hexyl group, a heptyl group, an octyl group, a dodecyl group, a 2-ethylhexyl group, an isopropyl group, a sec-butyl group, a tert-butyl group and an isoamyl group.

The cycloalkyl group is preferably a cycloalkyl group having a carbon number of 3 to 12. Specific examples of the cycloalkyl group include a cyclopropyl group, a cyclobutyl group, q cyclopentyl group, q cyclohexyl group, a cycloheptyl group, a cyclooctyl group, a cyclododecanyl group, a cyclopentenyl group, a cyclohexenyl group, a cyclooctadienyl group, a bicyclo[4.3.0]nonanyl group, a decahydronaphthalenyl group, a tricyclo[5.2.1.0(2,6)]decanyl group, a bornyl group, an isobornyl group, a norbornyl group, an adamantyl group, a noradamantyl group, a 1,7,7-trimethyltricyclo[2.2.1.0$^{2,6}$]heptanyl group and a 3,7,7-trimethylbicyclo[4.1.0]heptanyl group. Among these, a cyclopropyl group, a cyclopentyl group, a cyclohexyl group, a cyclooctyl group, a norbornyl group, an adamantyl group and a noradamantyl group are preferred.

The alkoxy group may be linear or branched or may have an alicyclic structure. Examples of the chain alkoxy include a methoxy group, an ethoxy group, a propoxy group, a butoxy group, a pentyloxy group, a hexyloxy group, a heptyloxy group, an octyloxy group, a dodecyloxy group, a 2-ethylhexyloxy group, an isopropyloxy group, a sec-butyloxy group, a tert-butyloxy and an isoamyloxy group. Examples of the cyclic alkoxy group include a cyclopropoxy group, a cyclobutoxy group, a cyclopentyloxy group, a cyclohexyloxy group, a cyclobutyloxy group, a cyclooctyloxy group, a cyclododecanyloxy group, a cyclopentenyloxy group, a cyclohexenyloxy group and a cyclooctadienyloxy group, with a cyclopropoxy group, a cyclopentyloxy group, a cyclohexyloxy and a cyclooctyloxy group being preferred.

The alkyl group, cycloalkyl group and alkoxy group as $P_{10}$ to $P_{21}$ may further have a substituent, and specific examples of the substituent are the same as specific examples of the substituent which the cyclic structure-containing group as $R_1$ and $R_2$ in formula (I) may further have.

Formula (ZII) is described below.

In formula (ZII), each of $R_{204}$ and $R_{205}$ independently represents an aryl group, an alkyl group or a cycloalkyl group.

The aryl group of R$_{204}$ and R$_{235}$ is preferably a phenyl group or a naphthyl group, more preferably a phenyl group. The aryl group of R$_{204}$ and R$_{205}$ may be an aryl group having a heterocyclic structure containing an oxygen atom, a nitrogen atom, a sulfur atom or the like. Examples of the skeletal structure of the aryl group having a heterocyclic structure include pyrrole, furan, thiophene, indole, benzofuran and benzothiophene.

The alkyl or cycloalkyl group of R$_{204}$ and R$_{205}$ is preferably a linear or branched alkyl group having a carbon number of 1 to 10 (e.g., methyl group, ethyl group, propyl group, butyl group, pentyl group) or a cycloalkyl group having a carbon number of 3 to 10 (e.g., cyclopentyl group, cyclohexyl group, norbornyl group).

The aryl group, alkyl group and cycloalkyl group of R$_{204}$ and R$_{205}$ may have a substituent. Examples of the substituent which the aryl group, alkyl group and cycloalkyl group of R$_{204}$ and R$_{205}$ may have include an alkyl group (for example, having a carbon number of 1 to 15), a cycloalkyl group (for example, having a carbon number of 3 to 15), an aryl group (for example, having a carbon number of 6 to 15), an alkoxy group (for example, having a carbon number of 1 to 15), a halogen atom, a hydroxyl group and a phenylthio group.

Z represents an anion structure of the acid represented by formula (I) (in other words, a sulfonate anion of the compound represented by formula (II)).

Specific examples of the cation in the compound represented by formula (ZII) are illustrated below.

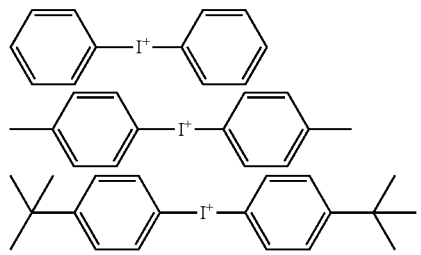

Other examples of the compound (B) include, as the compound having a nonionic compound structure, compounds represented by the following formulae (ZV) and (ZVI):

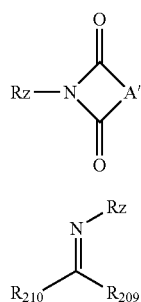

In formulae (ZV) and (ZVI), each of R$_{209}$ and R$_{210}$ independently represents an alkyl group, a cycloalkyl group, a cyano group or an aryl group. Examples of the aryl group, alkyl group and cycloalkyl group of R$_{209}$ and R$_{210}$ are the same as those of the aryl group, alkyl group and cycloalkyl group of R$_{201}$ to R$_{203}$ in formula (ZI-1). The aryl group, alkyl group and cycloalkyl group of R$_{209}$ and R$_{210}$ may have a substituent. Examples of this substituent are also the same as those of the substituent which the aryl group, alkyl group and cycloalkyl group of R$_{201}$ to R$_{203}$ in formula (ZI-1) may have.

A' represents an alkylene group, an alkenylene group or an arylene group.

The alkylene group as A' may have a substituent and is preferably an alkylene group having a carbon number of 1 to 8, and examples thereof include a methylene group, an ethylene group, a propylene group, a butylene group, a hexylene group and an octylene group.

The alkenylene group as A' may have a substituent and is preferably an alkenylene group having a carbon number of 2 to 6, and examples thereof include an ethenylene group, a propenylene group and a butenylene group.

The arylene group as A' may have a substituent and is preferably an arylene group having a carbon number of 6 to 15, and examples thereof include a phenylene group, a tolylene group and a naphthylene group.

Examples of the substituent which A' may have include those having active hydrogen, such as cycloalkyl group, aryl group, amino group, amido group, ureido group, urethane group, hydroxyl group and carboxyl group, a halogen atom (e.g., fluorine atom, chlorine atom, bromine atom, iodine atom), an alkoxy group (e.g., methoxy group, ethoxy group, propoxy group, butoxy group), a thioether group, an acyl group (e.g., acetyl group, propanoyl group, benzoyl group), an acyloxy group (e.g., acetoxy group, propanoyloxy group, benzoyloxy group), an alkoxycarbonyl group (e.g., methoxycarbonyl group, ethoxycarbonyl group, propoxycarbonyl group), a cyano group and a nitro group. As for the arylene group, examples of the substituent further include an alkyl group (e.g., methyl group, ethyl group, propyl group, butyl group).

Rz represents a structure where H of the acid represented by formula (I) is dissociated, and is represented by the following formula (I-s):

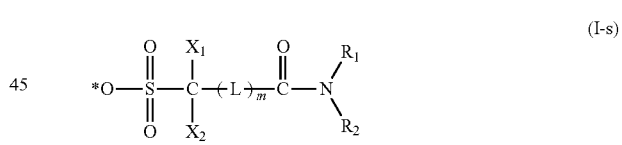

In the formula, X$_1$, X$_2$, R$_1$, R$_2$, L and m have the same meanings as in formula (I), and * represents a bonding site to the residue of the compound represented by formula (ZV) or (ZVI).

Specific examples of the residues of the compounds represented by formulae (ZV) and (ZVI) are illustrated below. In specific examples, * indicates a bonding site to * in formula (I-s).

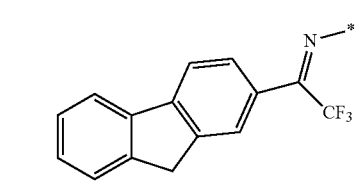

89
-continued
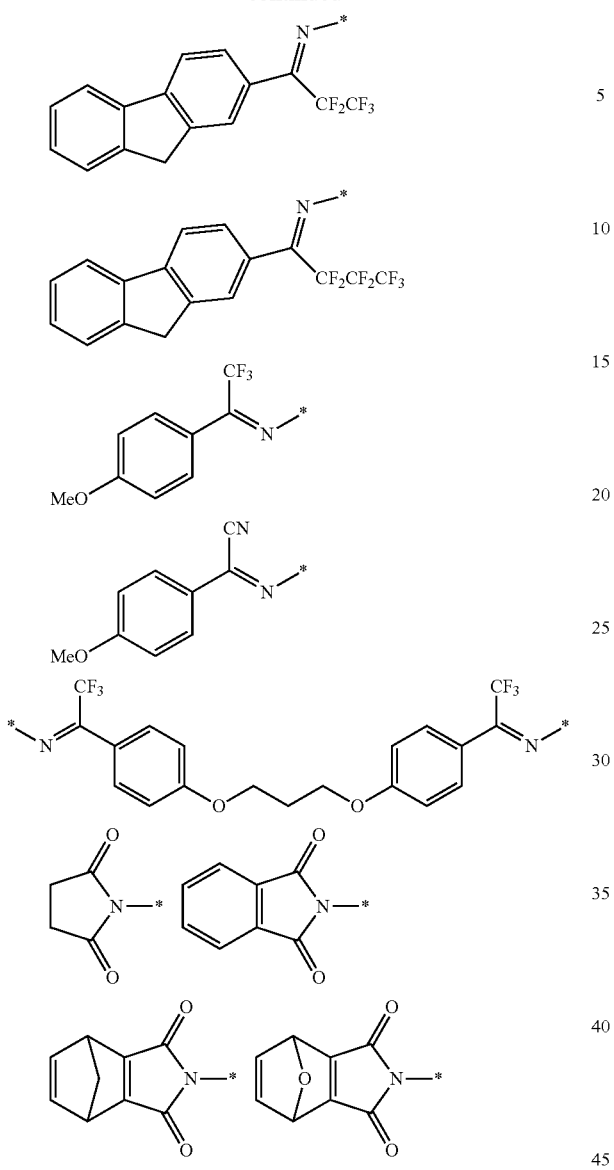
90
-continued
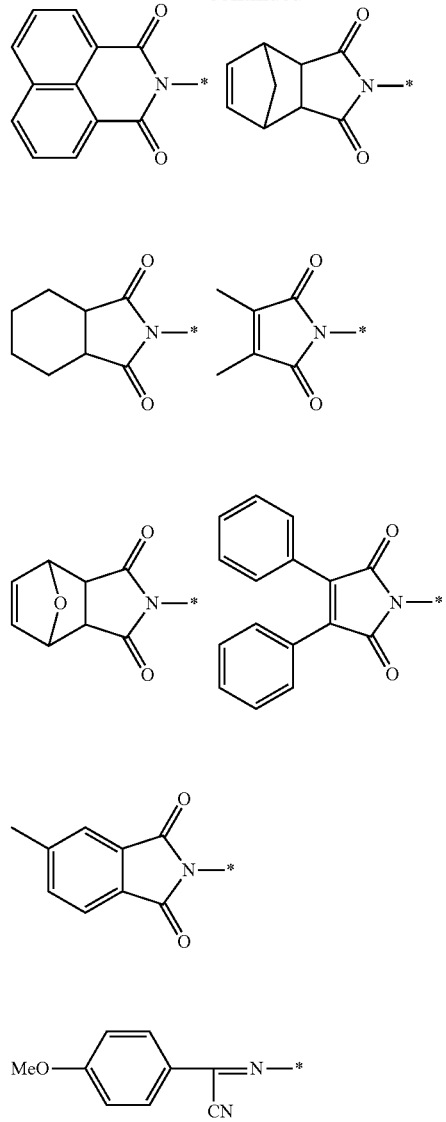
Specific examples of the compound (B) are illustrated below, but the present invention is not limited thereto.
(X1)
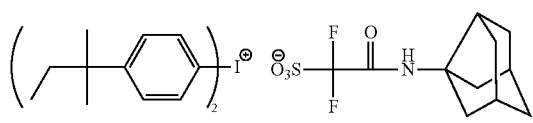
(X2)
(X3)
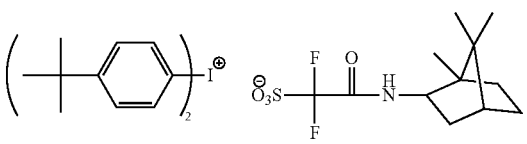
(X4)

-continued
(X5) 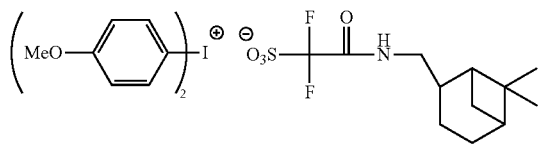
(X6) 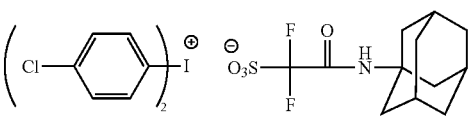
(X7) 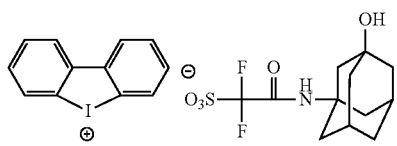
(X8) 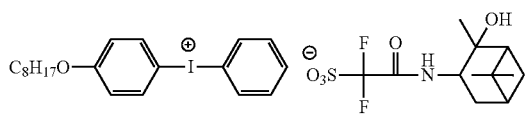
(X9) 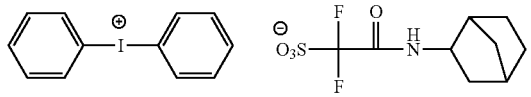
(X10) 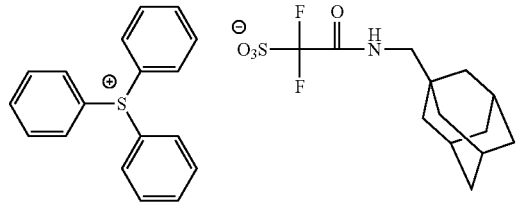
(X11) 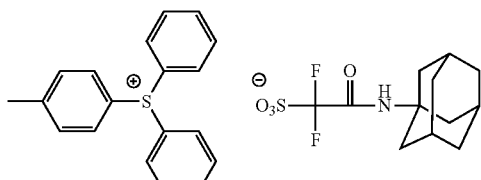
(X12) 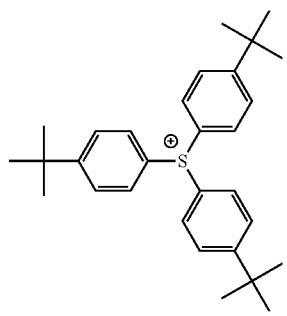
(X13) 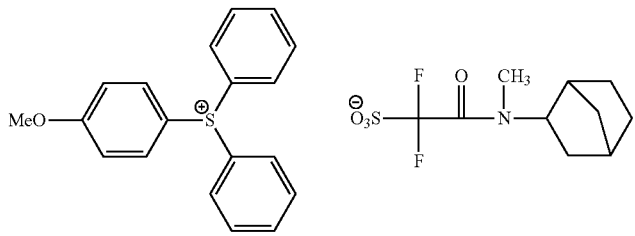
(X14) 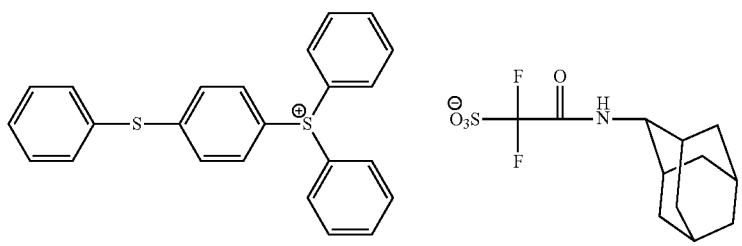
(X15) 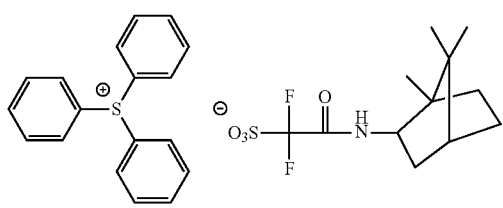
(X16) 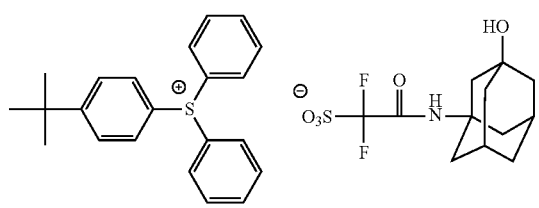

-continued
(X17)
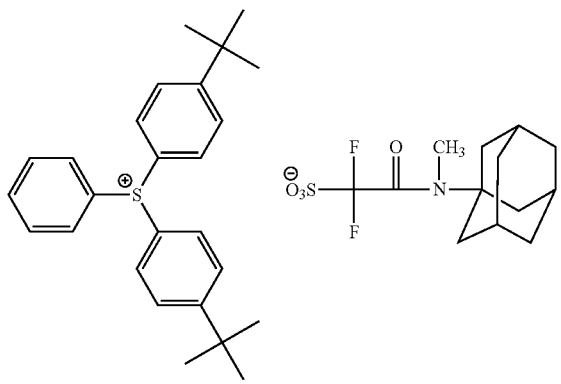
(X18)
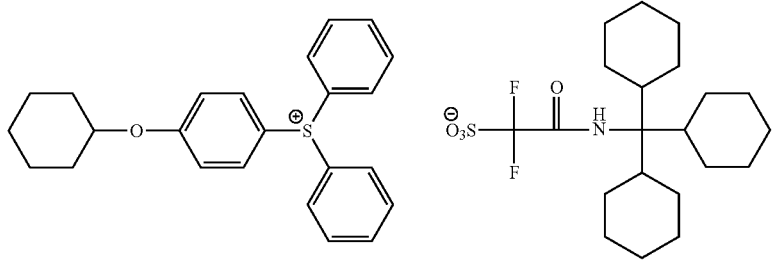
(X19)
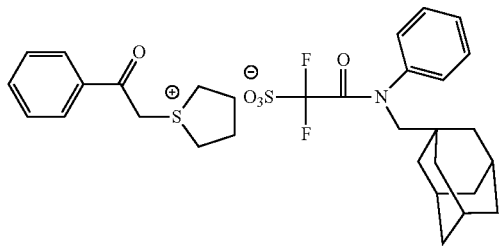
(X20)
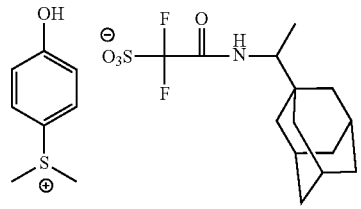
(X21)
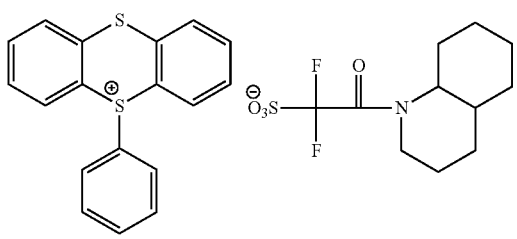
(X22)
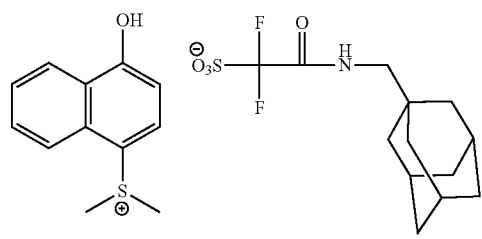
(X23)
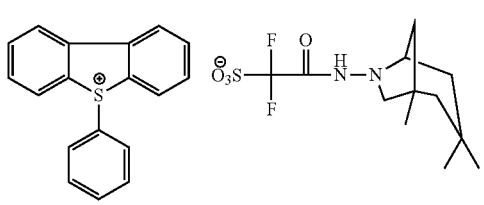
(X24)
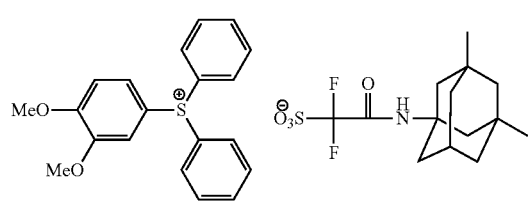
(X25)
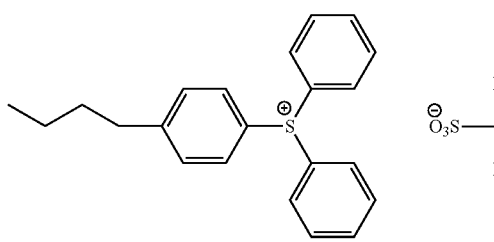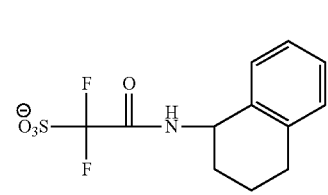

-continued
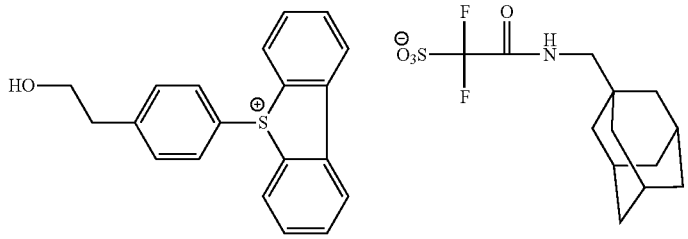 (X26)
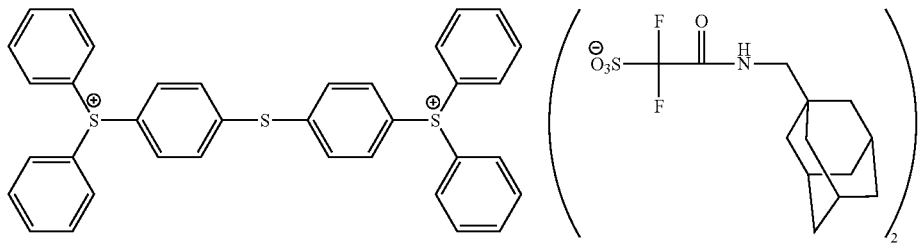 (X27)
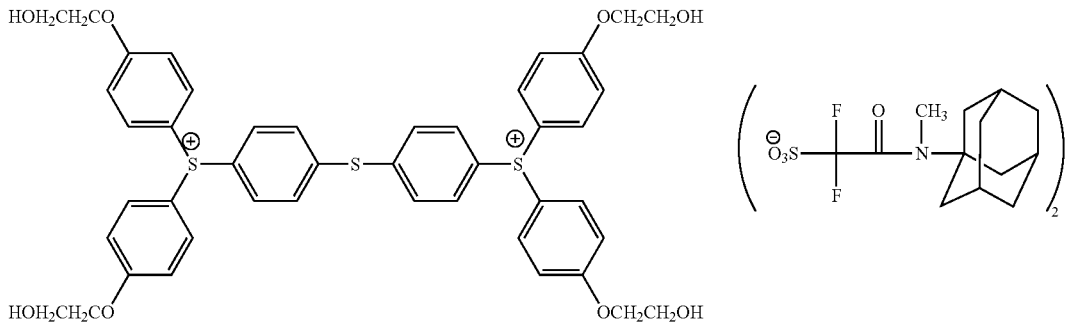 (X28)
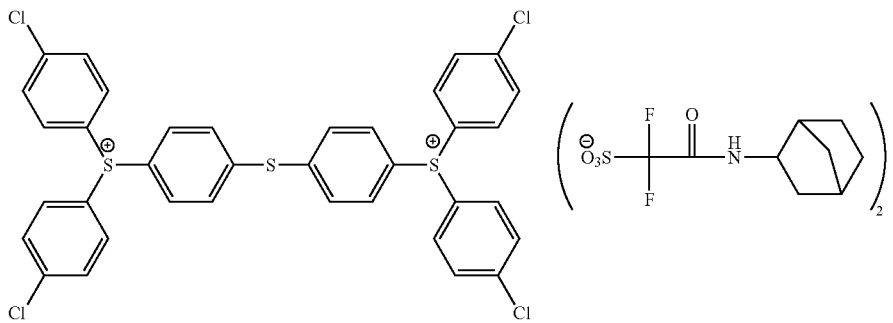 (X29)
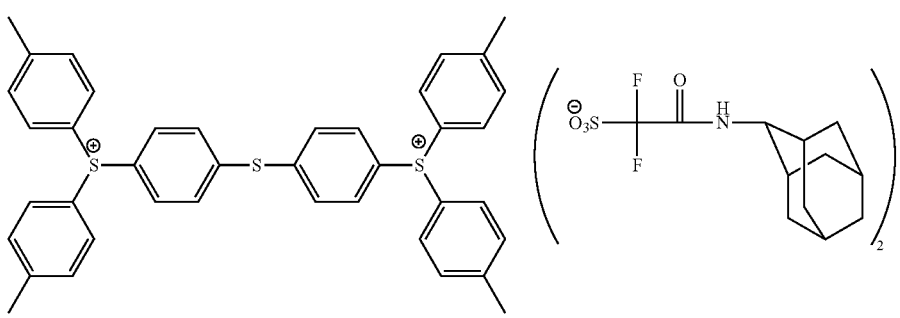 (X30)
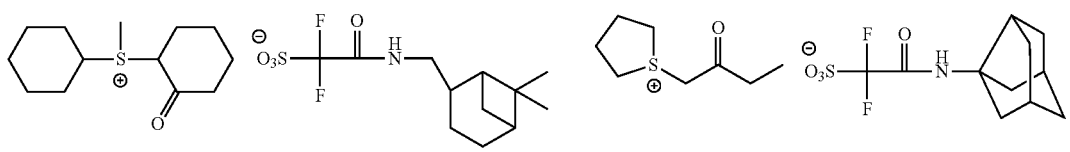 (X31) (X32)

-continued
(X33)
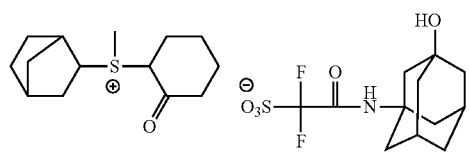
(X34)
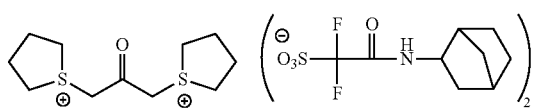
(X35)
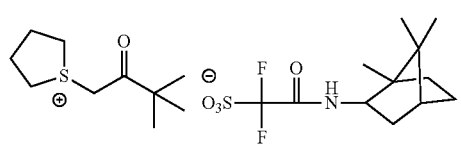
(X36)
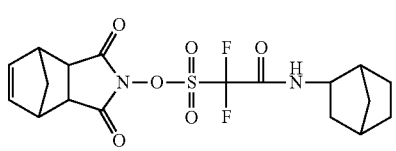
(X37)
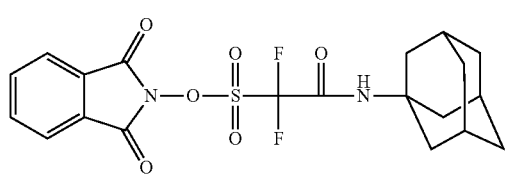
(X38)
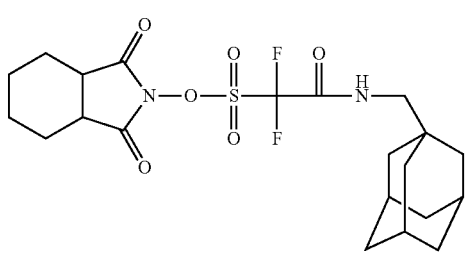
(X39)
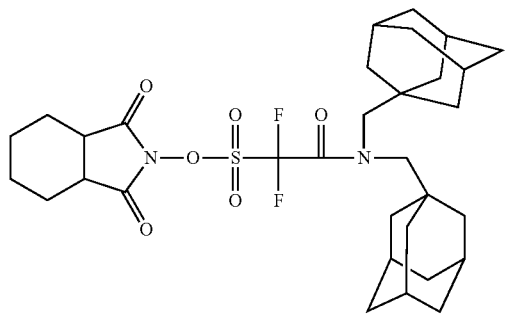
(X40)
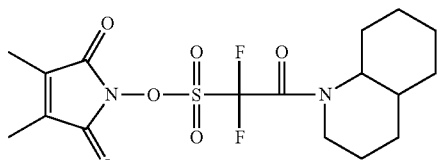
(X41)
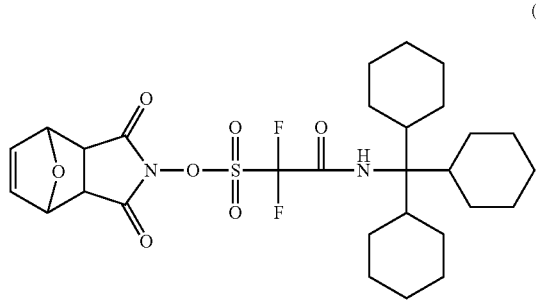
(X42)
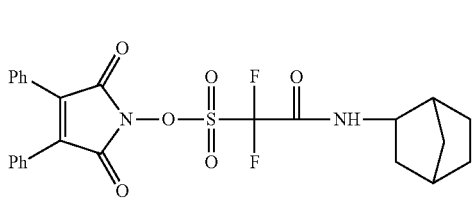
(X43)
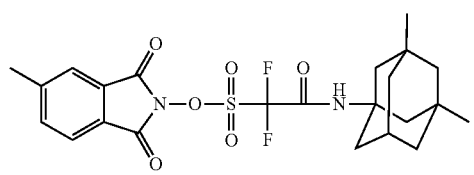
(X44)
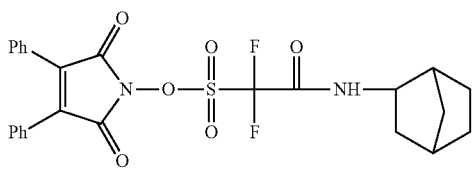
(X45)
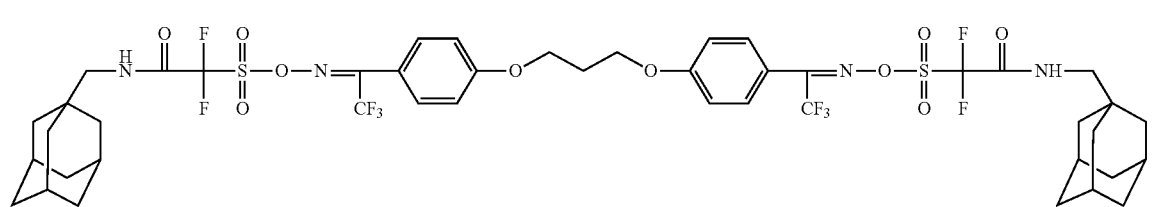

-continued
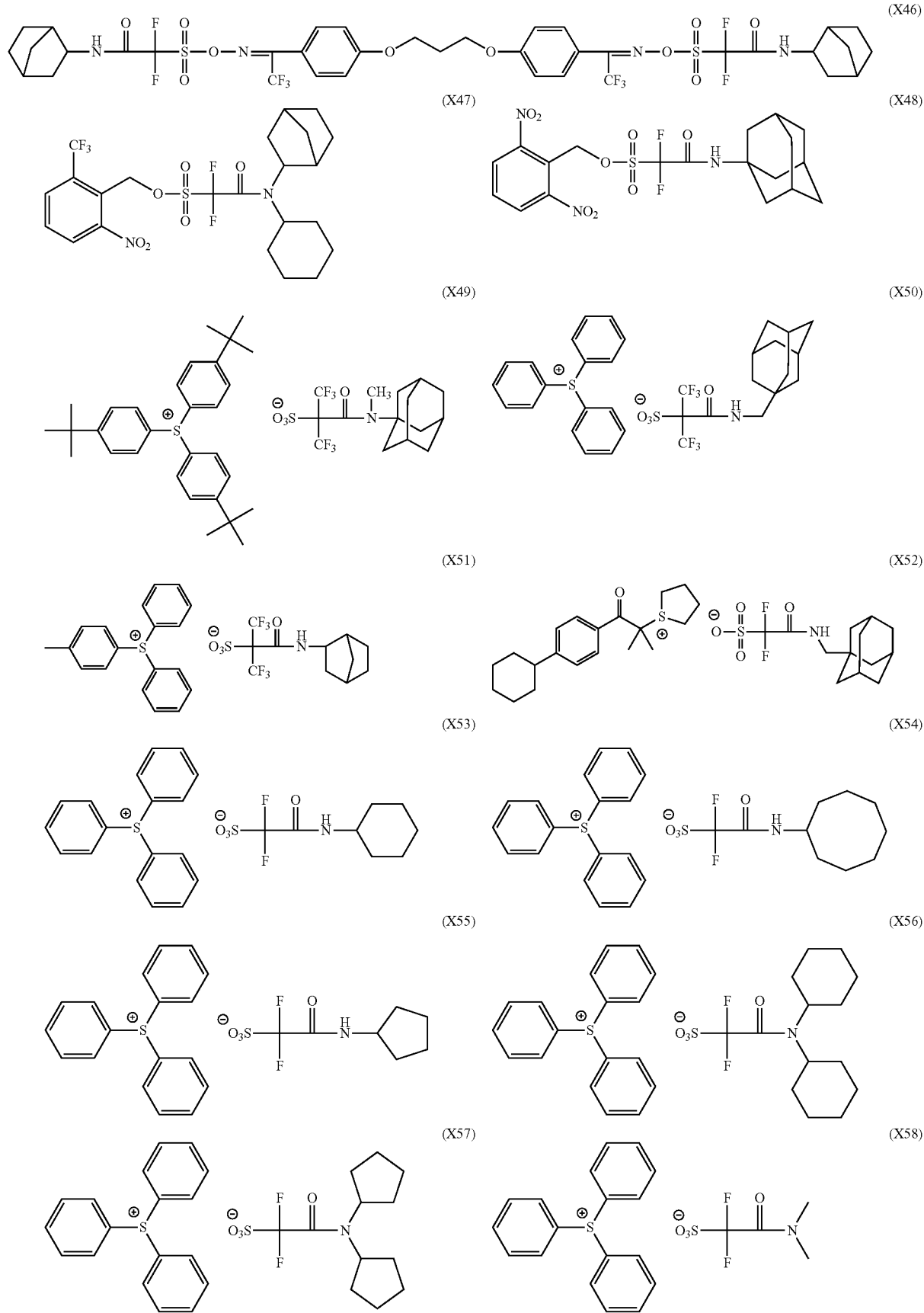

-continued
(X59)
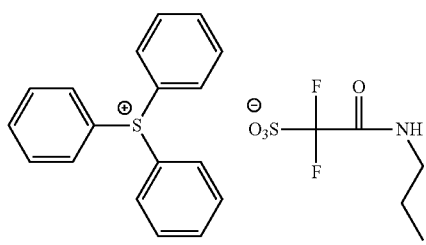
(X60)
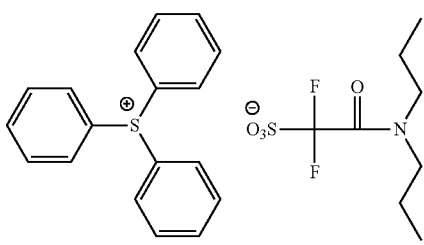
(X61)
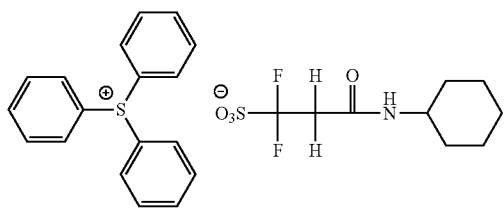
(X62)
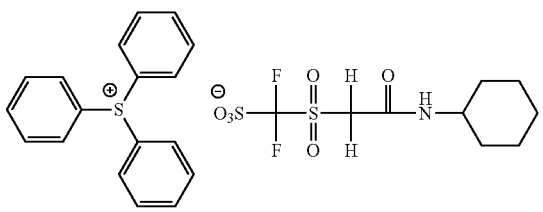
(X63)
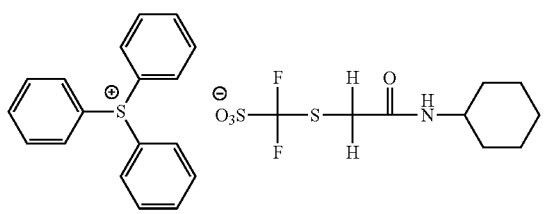
(X64)
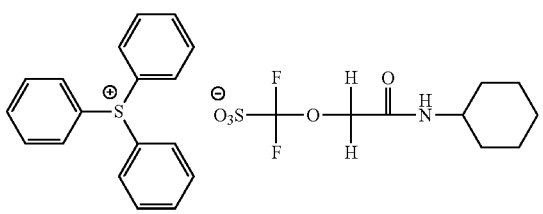
(X65)
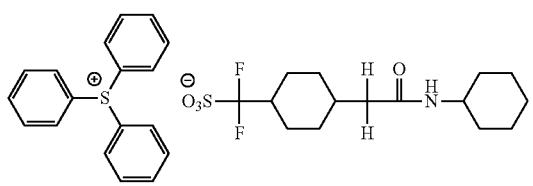
(X66)
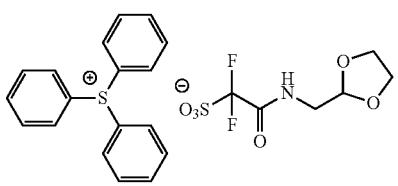
(X67)
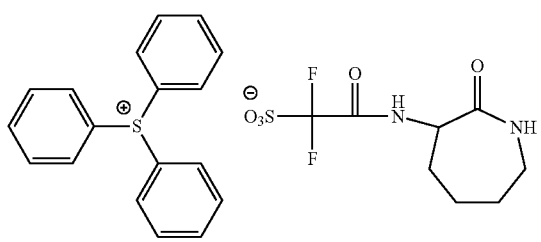
(X68)
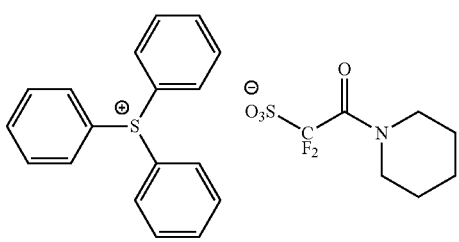
(X69)
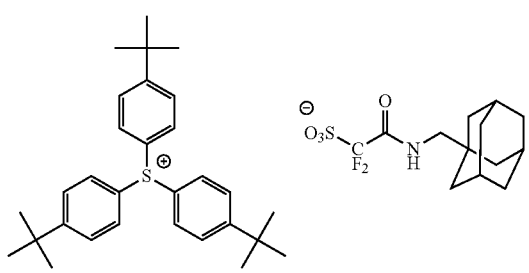
(X70)
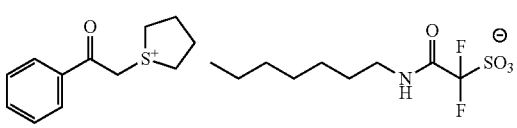

-continued (X71)
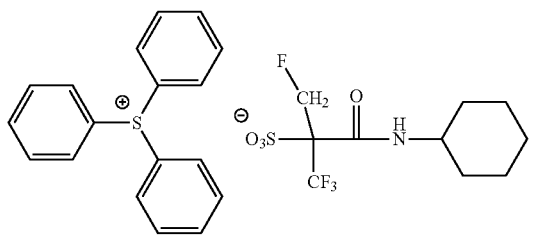

(X72)
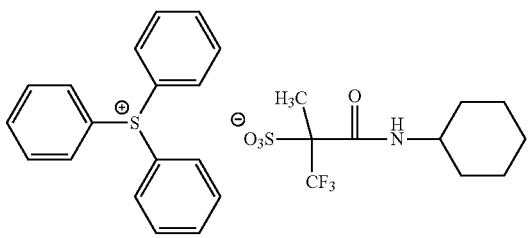

(X73)
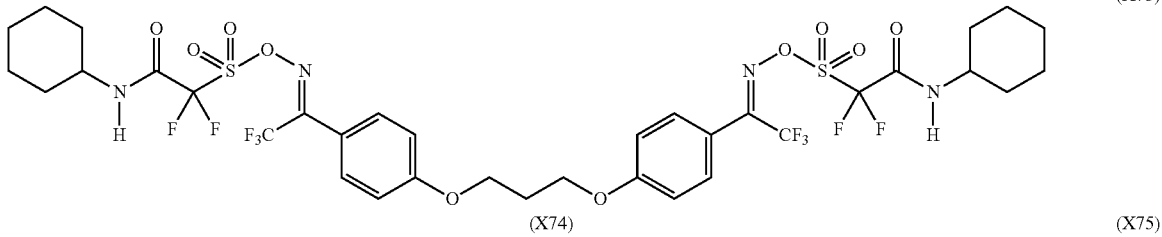

(X74)
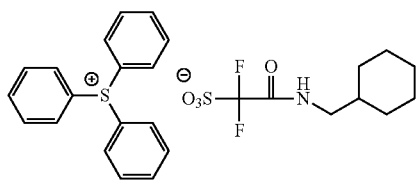

(X75)
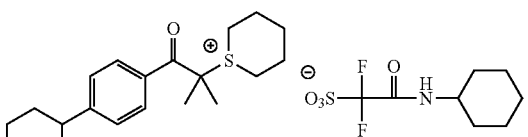

(X76)
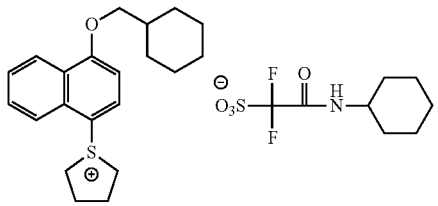

(X77)
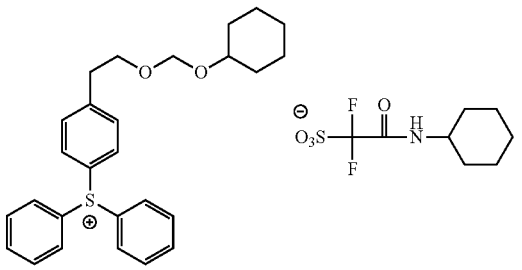

The compound represented by formula (II) can be synthesized by reacting an amine represented by the following formula (V) and an ester form represented by the following formula (VII).

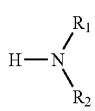
(V)

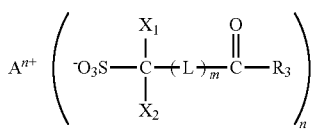
(VII)

In formula (V), $R_1$ and $R_2$ have the same meanings as $R_1$ and $R_2$ in formula (II), respectively.

In formula (VII), $A^{n+}$, $X_1$, $X_2$, L, n and m have the same meanings as $A^{n+}$, $X_1$, $X_2$, L, n and m in formula (II). $R_3$ represents a chain alkyl group, a cycloalkyl group or a group having a polycyclic structure, and the chain alkyl group and the cycloalkyl group may have a substituent.

The chain alkyl group represented by $R_3$ may be linear or branched, and examples thereof include methyl, ethyl, propyl, butyl, pentyl, hexyl, heptyl, octyl, dodecyl, 2-ethylhexyl, isopropyl, sec-butyl, tert-butyl and iso-amyl. The alkyl group may further have a substituent, and specific examples of the substituent are the same as specific examples of the substituent which the cyclic structure-containing group as $R_1$ and $R_2$ in formula (I) may further have.

Examples of the cycloalkyl group include cyclopropyl, cyclobutyl, cyclopentyl, cyclohexyl, cycloheptyl, cyclooctyl, cyclododecanyl, cyclopentenyl, cyclohexenyl, cyclooctadienyl, bicyclo[4.3.0]nonanyl, decahydronaphthalenyl, tricyclo[5.2.1.0(2,6)]decanyl, bornyl, isobornyl, norbornyl, adamantyl, noradamantyl, 1,7,7-trimethyltricyclo[2.2.1.0$^{2,6}$]heptanyl and 3,7,7-trimethylbicyclo[4.1.0]heptanyl Among these, cyclopropyl, cyclopentyl, cyclohexyl, cyclooctyl, norbornyl, adamantyl and noradamantyl are preferred. The cycloalkyl group may further have a substituent, and specific examples of the substituent are the same as specific examples of the substituent which the cyclic structure-containing group as $R_1$ and $R_2$ in formula (I) may further have.

The group having a polycyclic structure has the same meaning as the group having a polycyclic structure described in formula (I), and specific examples and substituents are also the same.

In the amide reaction, for example, the compounds represented by formulae (V) and (VII) are mixed and reacted with stirring at a temperature of 0 to 200° C., preferably from 0 to 100° C., whereby amidation can be effected. This reaction may be performed in a solventless system or may be performed using a solvent such as tetrahydrofuran (THF), acetonitrile, acetone, ethyl acetate, dimethylformamide, dimethylacetamide, N-methylpyrrolidone and dimethylsulfoxide. The mixing ratio between the compound represented by formula (V) and the compound represented by formula (VII) is not particularly limited, but the compound represented by formula (V) is preferably used in an amount of 0.1 to 50 molar equivalents, more preferably from 0.5 to 30 molar equivalents, per 1 molar equivalent of the compound represented by formula (VII).

The compound represented by formula (II) for use in the present invention can be obtained by amidating a compound represented by the following formula (VI) with use of an amine represented by formula (V) by the same method as above to obtain a compound represented by the following formula (IV) and reacting the obtained compound with a compound represented by formula (IX).

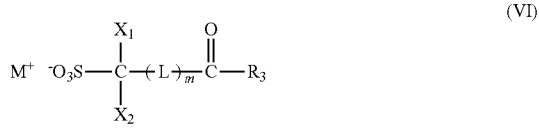
(VI)

In formula (VI), $X_1$, $X_2$, L and m have the same meanings as $X_1$, $X_2$, L and m in formula (II), respectively. $R_3$ has the same meaning as $R_3$ in formula (VII).

$M^+$ represents a metal ion, and examples thereof include lithium, sodium potassium and silver ions.

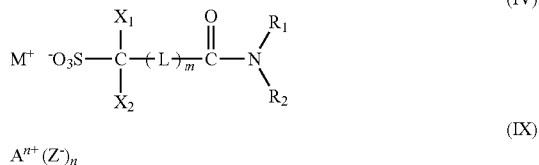
(IV)

$A^{n+}(Z^-)_n$ (IX)

In formula (IV), $M^+$ has the same meaning as $M^+$ in formula (VI), and $X_1$, $X_2$, L, $R_1$, $R_2$ and m have the same meanings as $X_1$, $X_2$, L, $R_1$, $R_2$ and m in formula (II), respectively.

In formula (IX), n and $A^{n+}$ have the same meanings as n and $A^{n+}$ in formula (II).

$Z^-$ represents $OH^-$, $F^-$, $Br^-$, $I^-$, $BF_4^-$, $AsF_6^-$, $SbF_6^-$, $PF_6^-$ or $ClO_4^-$.

The reaction of the compound represented by formula (IV) with the compound represented by formula (IX) is performed, for example, by stirring the compounds in an inactive solvent such as acetonitrile, water, methanol, chloroform and methylene chloride at a temperature of 0 to 150° C., whereby the compound represented by formula (II) can be obtained.

The amount used of the compound represented by formula (IX) is not particularly limited with respect to the compound represented by formula (IV) but is preferably used in an amount of 0.1 to 5 molar equivalents, more preferably from 0.5 to 3 molar equivalents, per 1 molar equivalent of the compound represented by formula (IV).

As for the compound (B), one kind of a compound may be used, or two or more kinds of compounds may be used in combination.

The content of the compound (B) in the resist composition is preferably from 0.1 to 20 mass %, more preferably from 0.5 to 15 mass %, still more preferably from 1 to 15 mass %, yet still more preferably from 3 to 12 mass %, based on the entire solid content of the resist composition.

The compound (B) may also be used in combination with an acid generator (hereinafter sometimes referred to as a "compound (B')") other than the compound (B).

Examples of the compound (B') which can be used in combination with the compound (B) include acid generators described in paragraph [0150] of U.S. Patent Application Publication No. 2008/0248425.

The compound (B') which can be used in combination may be appropriately selected from a photo-initiator for cationic photopolymerization, a photo-initiator for radical photopolymerization, a photo-decoloring agent for dyes, a photo-discoloring agent, a known compound that generates an acid upon irradiation with an actinic ray or radiation and is used for microresist or the like, and a mixture thereof.

Furthermore, a diazonium salt, a phosphonium salt, a sulfonium salt, an iodonium salt, an imidosulfonate, an oxime sulfonate, a diazodisulfone, a disulfone or an o-nitrobenzyl sulfonate may be used in combination, and a compound where a group or compound capable of generating an acid upon irradiation with an actinic ray or radiation is introduced into the main or side chain of the polymer, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Also, compounds capable of generating an acid by the effect of light described, for example, in U.S. Pat. No. 3,779,778 and European Patent 126,712 may be used.

Out of the compounds (B'), preferred compounds include compounds represented by the following formulae (ZI'), (ZII') and (ZIII')

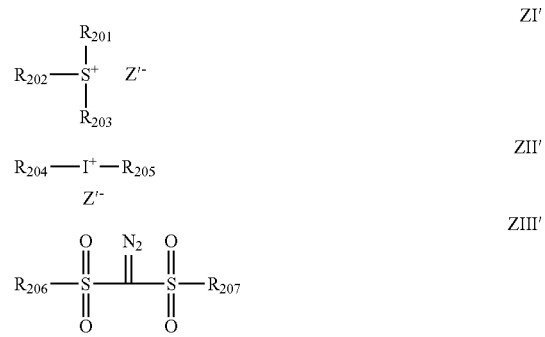

In formula (ZI'), $R_{201}$, $R_{202}$ and $R_{203}$ have the same meanings as in formula (ZI).

$Z'^-$ represents a non-nucleophilic anion.

Examples of the non-nucleophilic anion as $Z'^-$ include a sulfonate anion, a carboxylate anion, a sulfonylimide anion, a bis(alkylsulfonyl)imide anion and a tris(alkylsulfonyl)methide anion. The non-nucleophilic anion is an anion having an extremely low ability of causing a nucleophilic reaction, and this anion can suppress the decomposition with aging due to an intramolecular nucleophilic reaction. Thanks to this anion, the aging stability of the resist is enhanced.

The sulfonate anion includes, for example, an aliphatic sulfonate anion, an aromatic sulfonate anion and a camphorsulfonate anion.

The carboxylate anion includes, for example, an aliphatic carboxylate anion, an aromatic carboxylate anion and an aralkylcarboxylate anion.

The aliphatic moiety in the aliphatic sulfonate anion may be an alkyl group or a cycloalkyl group but is preferably an alkyl group having a carbon number of 1 to 30 or a cycloalkyl group having a carbon number of 3 to 30, and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a bornyl group.

The aromatic group in the aromatic sulfonate anion is preferably an aryl group having a carbon number of 6 to 14, and examples thereof include a phenyl group, a tolyl group and a naphthyl group.

The alkyl group, cycloalkyl group and aryl group in the aliphatic sulfonate anion and aromatic sulfonate anion may have a substituent. Examples of the substituent of the alkyl group, cycloalkyl group and aryl group in the aliphatic sulfonate anion and aromatic sulfonate anion include a nitro group, a halogen atom (e.g., fluorine atom, chlorine atom, bromine atom, iodine atom), a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7), an alkylthio group (preferably having a carbon number of 1 to 15), an alkylsulfonyl group (preferably having a carbon number of 1 to 15), an alkyliminosulfonyl group (preferably having a carbon number of 2 to 15), an aryloxysulfonyl group (preferably having a carbon number of 6 to 20), an alkylaryloxysulfonyl group (preferably having a carbon number of 7 to 20), a cycloalkylaryloxysulfonyl group (preferably having a carbon number of 10 to 20), an alkyloxyalkyloxy group (preferably having a carbon number of 5 to 20), and a cycloalkylalkyloxyalkyloxy group (preferably having a carbon number of 8 to 20). As for the aryl group or ring structure in each group, examples of the substituent further include an alkyl group (preferably having a carbon number of 1 to 15).

Examples of the aliphatic moiety in the aliphatic carboxylate anion include the same alkyl groups and cycloalkyl groups as those in the aliphatic sulfonate anion.

Examples of the aromatic group in the aromatic carboxylate anion include the same aryl groups as those in the aromatic sulfonate anion.

The aralkyl group in the aralkylcarboxylate anion is preferably an aralkyl group having a carbon number of 7 to 12, and examples thereof include a benzyl group, a phenethyl group, a naphthylmethyl group, a naphthylethyl group and a naphthylbutyl group.

The alkyl group, cycloalkyl group, aryl group and aralkyl group in the aliphatic carboxylate anion, aromatic carboxylate anion and aralkylcarboxylate anion may have a substituent. Examples of the substituent of the alkyl group, cycloalkyl group, aryl group and aralkyl group in the aliphatic carboxylate anion, aromatic carboxylate anion and aralkylcarboxylate anion include the same halogen atoms, alkyl groups, cycloalkyl groups, alkoxy groups and alkylthio groups as those in the aromatic sulfonate anion.

Examples of the sulfonylimide anion include saccharin anion.

The alkyl group in the bis(alkylsulfonyl)imide anion and tris(alkylsulfonyl)methide anion is preferably an alkyl group having a carbon number of 1 to 5, and examples thereof include a methyl group, an ethyl group, a propyl group, an isopropyl group, an n-butyl group, an isobutyl group, a sec-butyl group, a pentyl group and a neopentyl group. Examples of the substituent of such an alkyl group include a halogen atom, a halogen atom-substituted alkyl group, an alkoxy group, an alkylthio group, an alkyloxysulfonyl group, an aryloxysulfonyl group and a cycloalkylaryloxysulfonyl group, with a fluorine atom-substituted alkyl group being preferred.

Other examples of the non-nucleophilic anion include fluorinated phosphorus, fluorinated boron and fluorinated antimony.

The non-nucleophilic anion of $Z^-$ is preferably an aliphatic sulfonate anion substituted with a fluorine atom at the α-position of sulfonic acid, an aromatic sulfonate anion substituted with a fluorine atom or a fluorine atom-containing group, a bis(alkylsulfonyl)imide anion in which the alkyl group is substituted with a fluorine atom, or a tris(alkylsulfonyl)methide anion in which the alkyl group is substituted with a fluorine atom. The non-nucleophilic anion is more preferably a perfluoroaliphatic sulfonate anion having a carbon number of 4 to 8 or a benzenesulfonate anion having a fluorine atom, still more preferably nonafluorobutanesulfonate anion, perfluorooctanesulfonate anion, pentafluorobenzenesulfonate anion or 3,5-bis(trifluoromethyl)benzenesulfonate anion.

The compound may be a compound having a plurality of structures represented by formula (ZI'). For example, the compound may be a compound having a structure where at least one of $R_{201}$ to $R_{203}$ in the compound represented by formula (ZI') is bonded to at least one of $R_{201}$ to $R_{203}$ in another compound represented by formula (ZI').

More preferred components (ZI') include compounds (ZI-1'), (ZI-2') and (ZI-3') described below.

The compound (ZI-1') is an arylsulfonium compound where at least one of $R_{201}$ to $R_{203}$ in formula (ZI') is an aryl group, that is, a compound having an arylsulfonium as the cation. $R_{201}$ to $R_{203}$ in the compound (ZI-1') have the same meanings as $R_{201}$ to $R_{203}$ in the compound (ZI-1).

The compound (ZI-2') is described below.

The compound (ZI-2') is a compound where each of $R_{201}$ to $R_{203}$ in formula (ZI') independently represents an aromatic ring-free organic group. $R_{201}$ to $R_{203}$ in the compound (ZI-2') have the same meanings as $R_{201}$ to $R_{203}$ in the compound (ZI-2).

The compound (ZI-3') is a compound represented by the following formula (ZI-3), and this is a compound having a phenacylsulfonium salt structure.

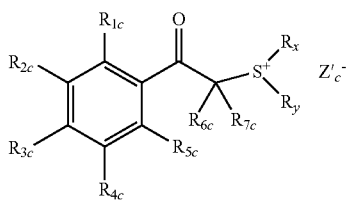
(ZI-3')

In formula (ZI-3'), $R_{1c}$ to $R_{7c}$, $R_x$ and $R_y$ have the same meanings as those in formula (ZI-3).

$Zc'^-$ represents a non-nucleophilic anion, and examples thereof include the same non-nucleophilic anions as $Z'^-$ in formula (ZI').

In formulae (ZII) and (ZIII'), each of $R_{204}$ to $R_{207}$ independently represents an aryl group, an alkyl group or a cycloalkyl group.

Examples of the aryl group of $R_{204}$ to $R_{207}$ include the same groups as those described for the aryl group of $R_{204}$ and $R_{205}$ of formula (ZII).

Examples of the alkyl group and cycloalkyl group of $R_{204}$ to $R_{207}$ include the same groups as those described for the alkyl group and cycloalkyl group of $R_{204}$ and $R_{205}$ of formula (ZII).

$Z'^-$ represents a non-nucleophilic anion, and examples thereof are the same as those of the non-nucleophilic anion of $Z'^-$ in formula (ZI').

Other examples of the compound (B') include compounds represented by the following formulae (ZIV'), (ZV') and (ZVI'):

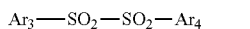 ZIV'

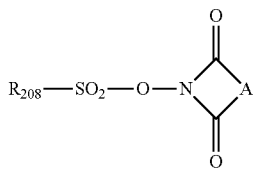 ZV'

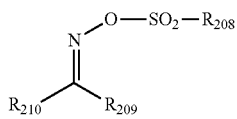 ZVI'

In formulae (ZIV') to (ZVI'), each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

Specific examples of the aryl group of $Ar_3$, $Ar_4$, $R_{208}$, $R_{209}$ and $R_{210}$ are the same as specific examples of the aryl group of $R_{201}$, $R_{202}$ and $R_{203}$ in formula (ZI-1').

Specific examples of the alkyl group and cycloalkyl group of $R_{208}$, $R_{209}$ and $R_{210}$ are the same as specific examples of the alkyl group and cycloalkyl group of $R_{201}$, $R_{202}$ and $R_{203}$ in formula (ZI-2').

The alkylene group of A includes an alkylene group having a carbon number of 1 to 12 (e.g., methylene group, ethylene group, propylene group, isopropylene group, butylenes group, isobutylene group); the alkenylene group of A includes an alkenylene group having a carbon number of 2 to 12 (e.g., ethynylene group, propenylene group, butenylene group); and the arylene group of A includes an arylene group having a carbon number of 6 to 10 (e.g., phenylene group, tolylene group, naphthylene group).

Among the compounds (B'), more preferred are the compounds represented by formulae (ZI') to (ZIII').

The compound (B') is preferably a compound capable of generating an acid having one sulfonic acid group or imide group, more preferably a compound capable of generating a monovalent perfluoroalkanesulfonic acid, a compound capable of generating an aromatic sulfonic acid substituted with a monovalent fluorine atom or a fluorine atom-containing group, or a compound capable of generating an imide acid substituted with a monovalent fluorine atom or a fluorine atom-containing group, still more preferably a sulfonium salt of fluoro-substituted alkanesulfonic acid, fluorine-substituted benzenesulfonic acid, fluorine-substituted imide acid or fluorine-substituted methide acid. In particular, the acid generator which can be used is preferably a compound capable of generating a fluoro-substituted alkanesulfonic acid, a fluoro-substituted benzenesulfonic acid or a fluoro-substituted imide acid, where pKa of the acid generated is −1 or less, and in this case, the sensitivity is enhanced.

Out of the compounds (B'), particularly preferred examples are illustrated below.

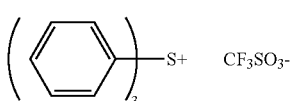 (z1)

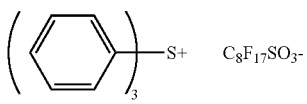 (z3)

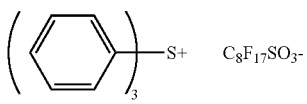 (z2)

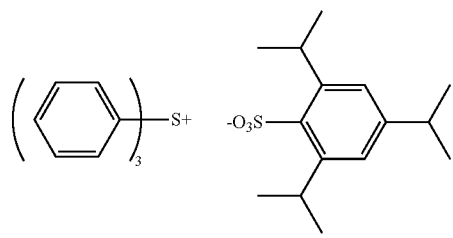 (z4)

-continued
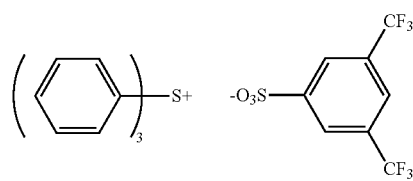 (z5)
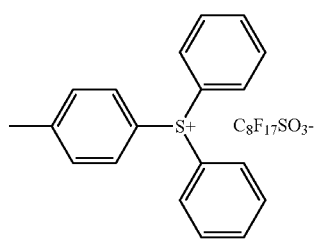 (z6)
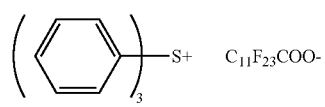 (z7)
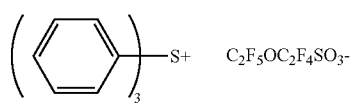 (z8)
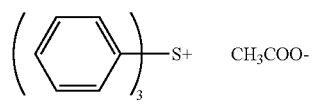 (z9)
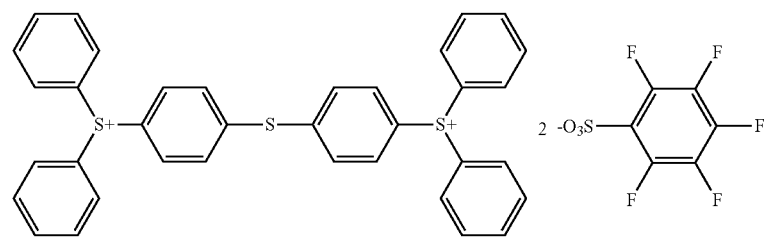 (z10)
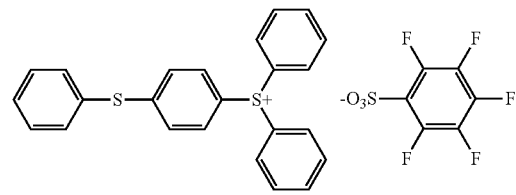 (z11)
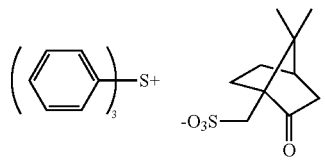 (z12)
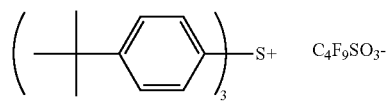 (z13)
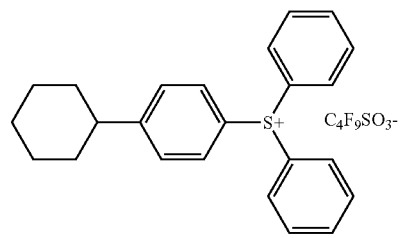 (z14)
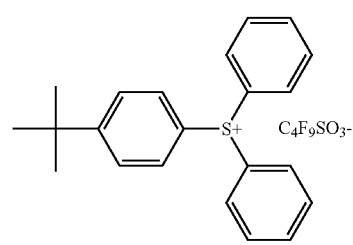 (z15)
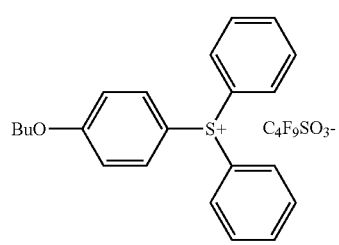 (z16)
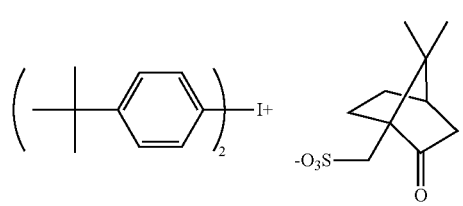 (z17)
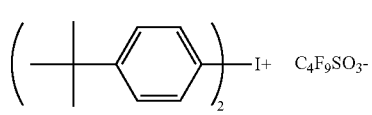 (z18)

-continued
(z19)
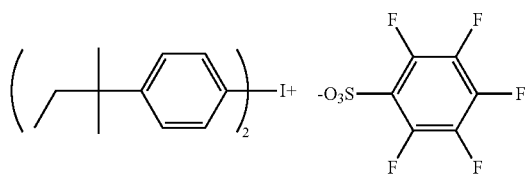
(z20)
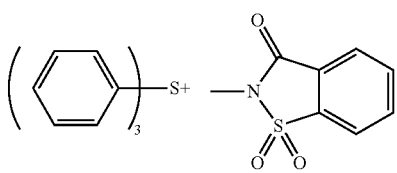
(a21)
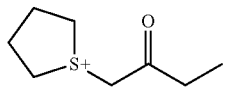
(z22)
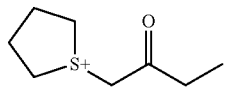
(z23)
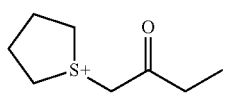
(z24)
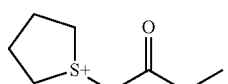
(z25)
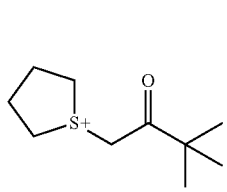
(z26)
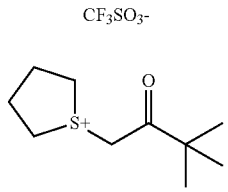
(z27)
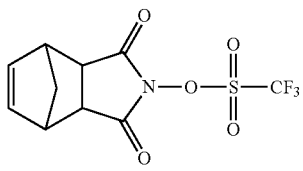
(z28)
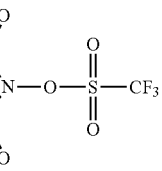
(z29)
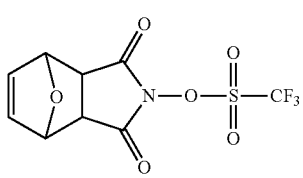
(z30)
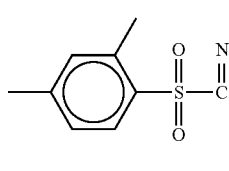
(z31)
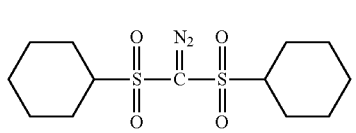
(z32)
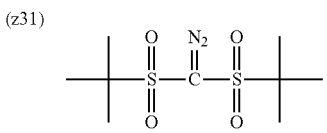
(z33)
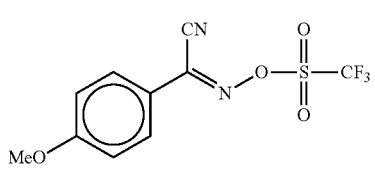
(z34)
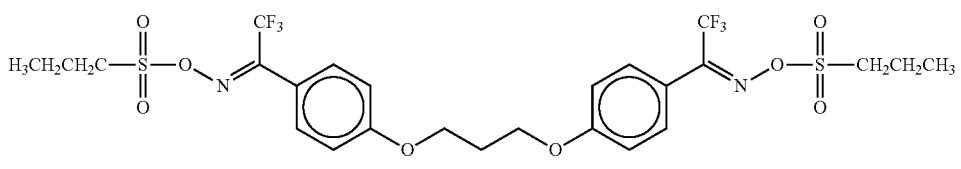

-continued
(z35)
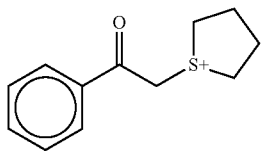
CF₃SO₃⁻
(z36)
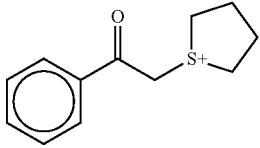
C₄F₉SO₃⁻
(z37)
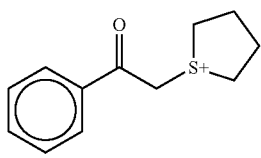
C₈F₁₇SO₃⁻
(z38)
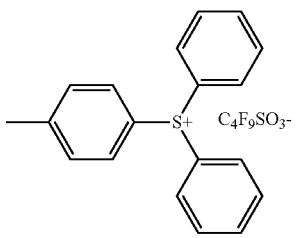
C₄F₉SO₃⁻
(z39)
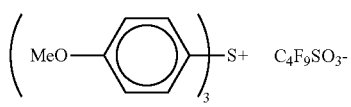
C₄F₉SO₃⁻
(z40)
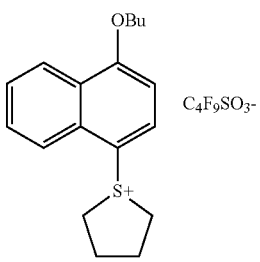
C₄F₉SO₃⁻
(z41)
C₄F₉SO₃⁻
(z42)
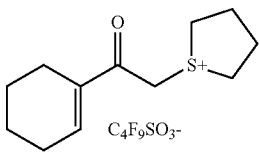
C₄F₉SO₃⁻
(z43)
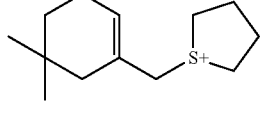
C₄F₉SO₃⁻
(z44)
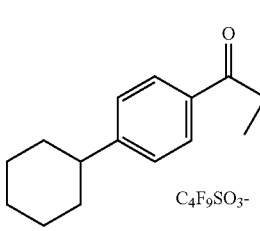
C₄F₉SO₃⁻
(z45)
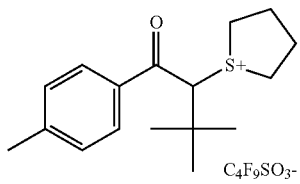
C₄F₉SO₃⁻
(z46)
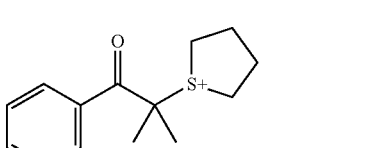
C₄F₉SO₃⁻
(z47)
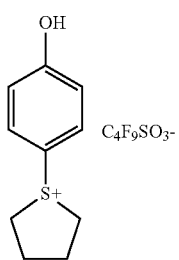
C₄F₉SO₃⁻
(z48)
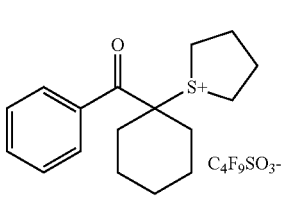
C₄F₉SO₃⁻

-continued
(z49) 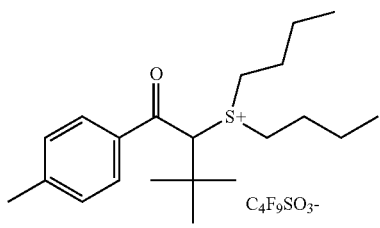
(z50) 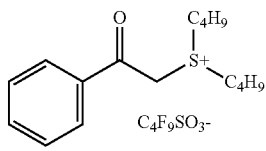
(z51) 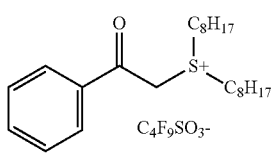
(z52) 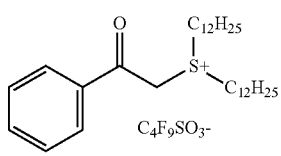
(z53) 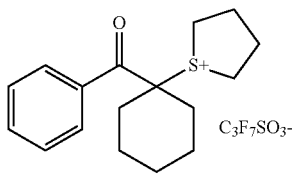
(z54) 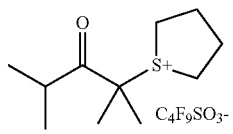
(z55) 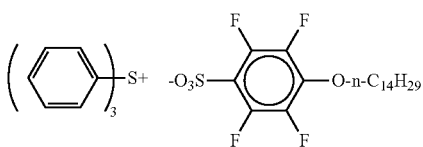
(z56) 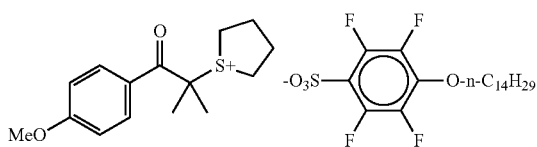
(z57) 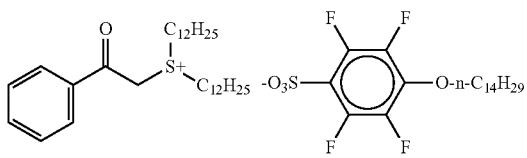
(z58) 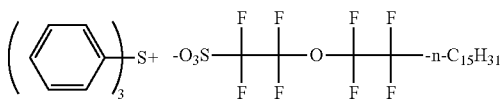
(z59) 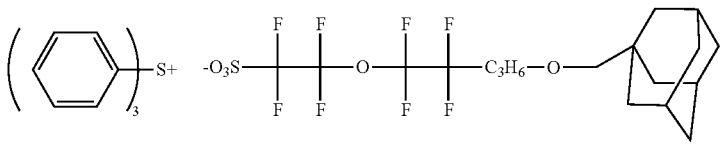
(z60) 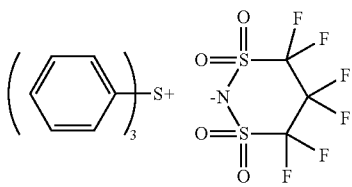
(z61) 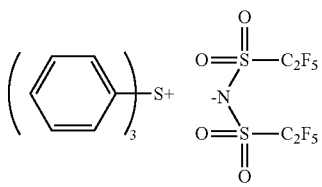
(z62) 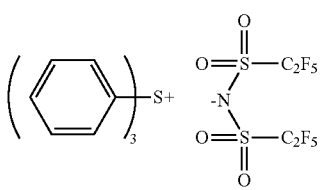
(z63) 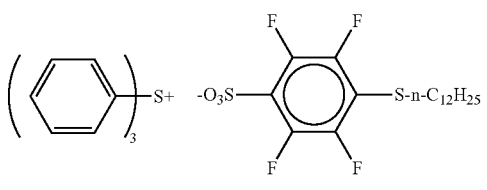

(z64) 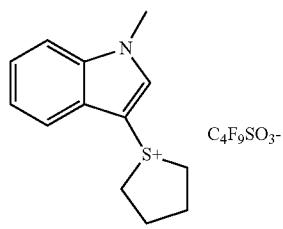
(z65) 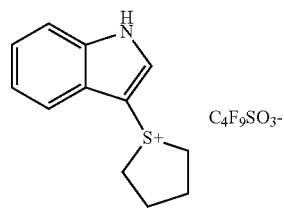
(z66) 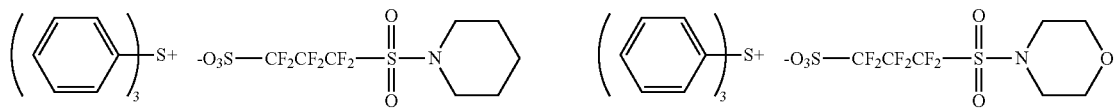
(z67) 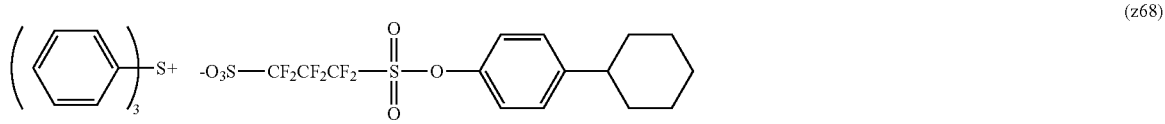
(z68) 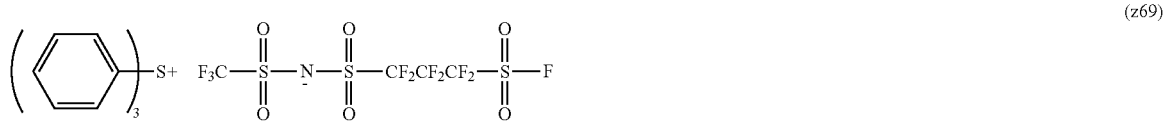
(z69) 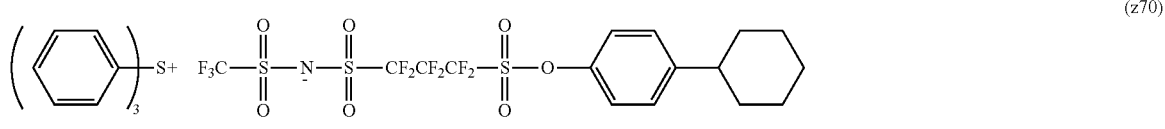
(z70) 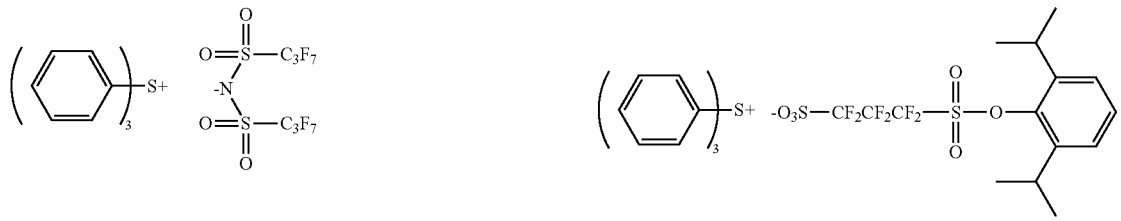
(z71) 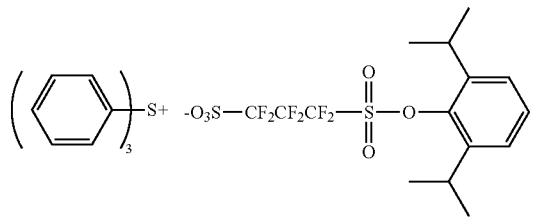
(z72) 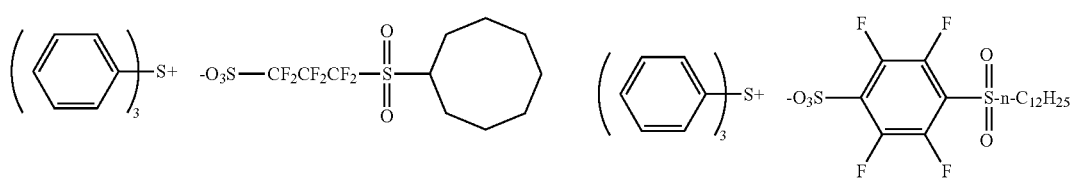
(z73) 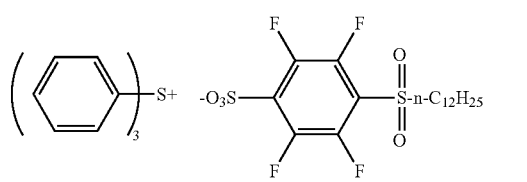
(z74) 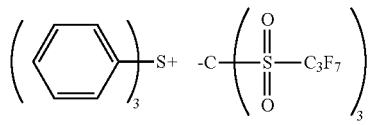
(z75) 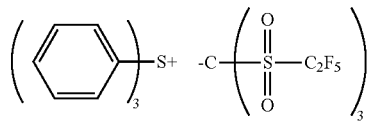
(z76) 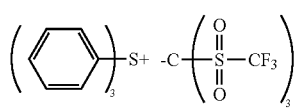
(z77) 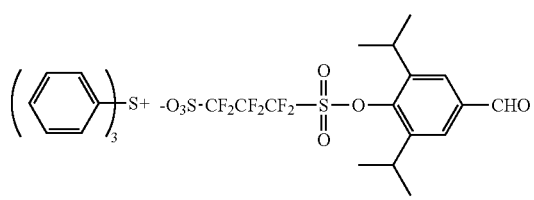
(z78)

-continued
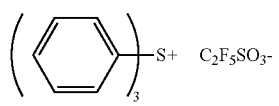 (z79)
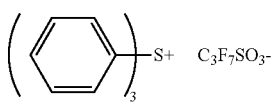 (z80)
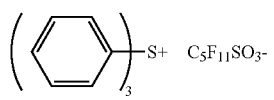 (z81)
(z82)
(z83)
(z84)
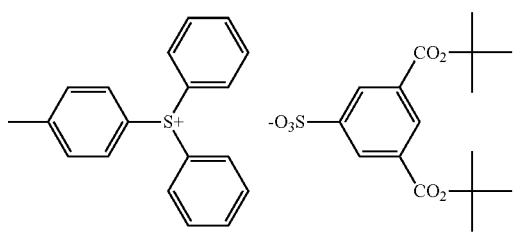
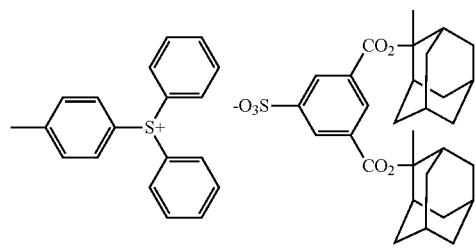
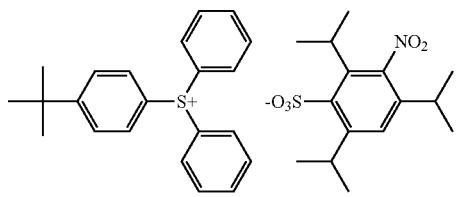
(z85)
(z86)
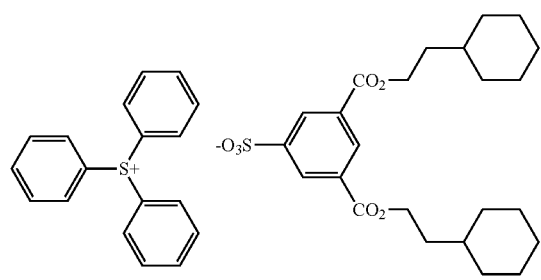
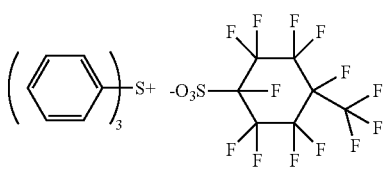
(z87)
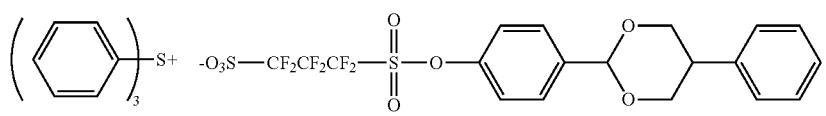
(z88)
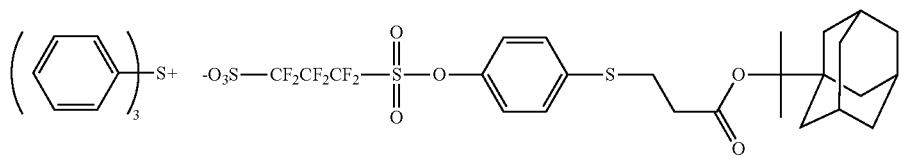
(z89)
(z90)
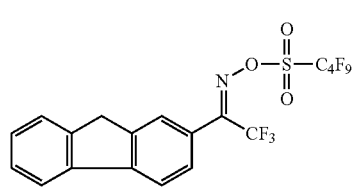
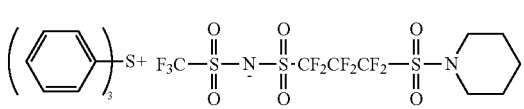
(z91)
(z92)
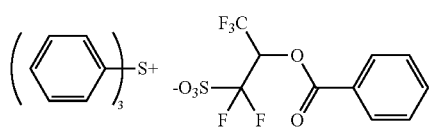
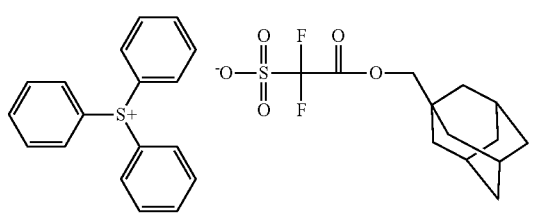

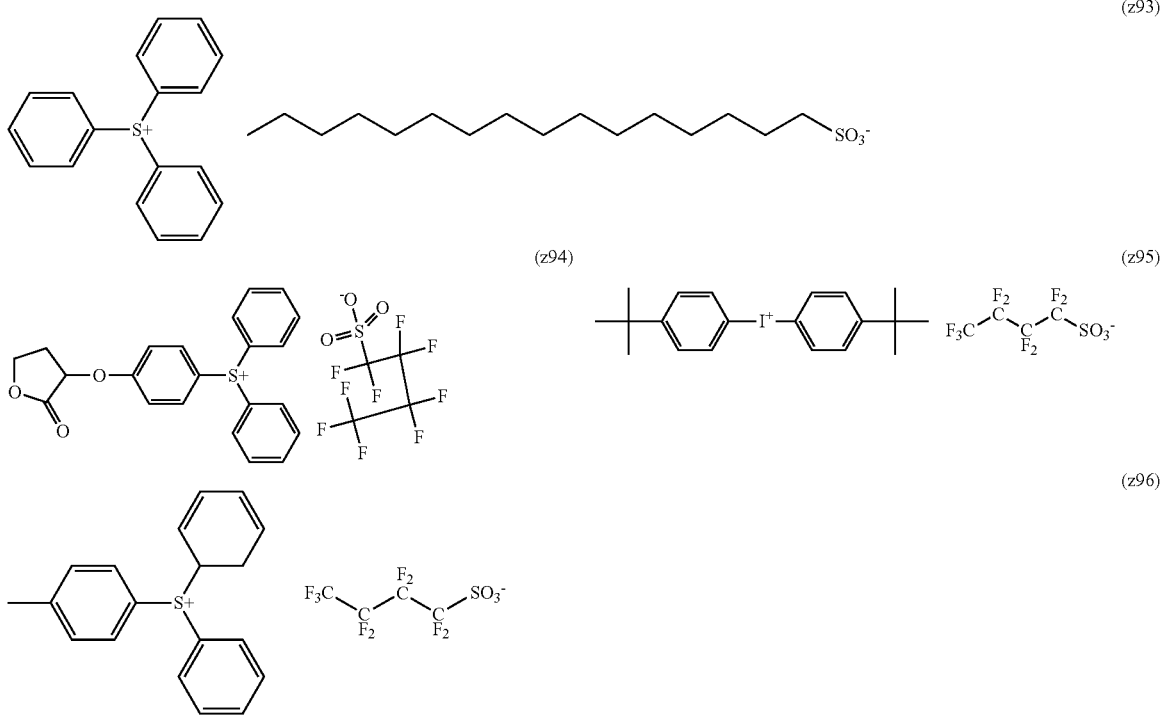

The total amount of the acid generator (in the case of using an acid generator other than the compound (B) in combination, including the amount of this acid generator) is preferably from 0.1 to 25 mass %, more preferably from 0.5 to 20 mass %, still more preferably from 1 to 20 mass %, yet still more preferably from 2 to 18 mass %, even yet still more preferably from 2 to 13 mass %, based on the entire solid content of the resist composition.

In the case of using the compound (B) and the compound (B') in combination, the amount of acid generators used is, in terms of the molar ratio (compound (B)/compound (B')), usually from 99/1 to 20/80, preferably from 99/1 to 40/60, more preferably from 99/1 to 50/50.

[3] (C) Solvent

Examples of the solvent which can be used at the time of preparing the resist composition of the present invention include an organic solvent such as alkylene glycol monoalkyl ether carboxylate, alkylene glycol monoalkyl ether, alkyl lactate, alkyl alkoxypropionate, cyclic lactone (preferably having a carbon number of 4 to 10), monoketone compound (preferably having a carbon number of 4 to 10) which may contain a ring, alkylene carbonate, alkyl alkoxyacetate and alkyl pyruvate.

Specific examples of these solvents include those described in paragraphs [0441] to [0455] of U.S. Patent Application Publication No. 2008/0187860.

In the present invention, a mixed solvent prepared by mixing a solvent containing a hydroxyl group in the structure and a solvent not containing a hydroxyl group may be used as the organic solvent.

The solvent containing a hydroxyl group and the solvent not containing a hydroxyl group may be appropriately selected from the compounds exemplified above, but the solvent containing a hydroxyl group is preferably an alkylene glycol monoalkyl ether, an alkyl lactate or the like, more preferably propylene glycol monomethyl ether (PGME, another name: 1-methoxy-2-propanol) or ethyl lactate. The solvent not containing a hydroxyl group is preferably an alkylene glycol monoalkyl ether acetate, an alkyl alkoxypropionate, a monoketone compound which may contain a ring, a cyclic lactone, an alkyl acetate or the like, more preferably propylene glycol monomethyl ether acetate (PGMEA, another name: 1-methoxy-2-acetoxypropane), ethyl ethoxy propionate, 2-heptanone, γ-butyrolactone, cyclohexanone or butyl acetate, and most preferably propylene glycol monomethyl ether acetate, ethyl ethoxypropionate or 2-heptanone.

The mixing ratio (by mass) of the solvent containing a hydroxyl group to the solvent not containing a hydroxyl group is from 1/99 to 99/1, preferably from 10/90 to 90/10, more preferably from 20/80 to 60/40. A mixed solvent in which the solvent not containing a hydroxyl group accounts for 50 mass % or more is particularly preferred in view of coating uniformity.

The solvent preferably contains propylene glycol monomethyl ether acetate and is preferably a single solvent of propylene glycol monomethyl ether acetate, or a mixed solvent of two or more kinds of solvents containing propylene glycol monomethyl ether acetate.

[4] (D) Hydrophobic Resin

The resist composition of the present invention may contain a hydrophobic resin having at least either a fluorine atom or a silicon atom particularly when the resist composition is applied to immersion exposure (hereinafter, sometimes referred to as a "hydrophobic resin (D)" or simply as a "resin (D)"). The hydrophobic resin (D) is unevenly distributed to the film surface layer and when the immersion medium is water, the static/dynamic contact angle on the resist film surface for water as well as the followability of immersion liquid can be enhanced.

The hydrophobic resin (D) is, as described above, unevenly distributed to the interface but unlike a surfactant, need not have necessarily a hydrophilic group in the molecule and may not contribute to uniform mixing of polar/nonpolar substances.

The hydrophobic resin typically contains a fluorine atom and/or a silicon atom. The fluorine atom and/or silicon atom in the hydrophobic resin (D) may be contained in the main chain of the resin or contained in the side chain.

In the case where the hydrophobic resin (D) contains a fluorine atom, the resin preferably contains, as the fluorine atom-containing partial structure, a fluorine atom-containing alkyl group, a fluorine atom-containing cycloalkyl group or a fluorine atom-containing aryl group.

The fluorine atom-containing alkyl group (preferably having a carbon number of 1 to 10, more preferably from 1 to 4) is a linear or branched alkyl group with at least one hydrogen atom being substituted for by a fluorine atom and may further have a substituent other than fluorine atom.

The fluorine atom-containing cycloalkyl group is a monocyclic or polycyclic cycloalkyl group with at least one hydrogen atom being substituted for by a fluorine atom and may further have a substituent other than fluorine atom.

The fluorine atom-containing aryl group includes a group where at least one hydrogen atom of an aryl group is substituted for by a fluorine atom, and may further have a substituent other than fluorine atom.

Preferred examples of the fluorine atom-containing alkyl group, fluorine atom-containing cycloalkyl group and fluorine atom-containing aryl group include the groups represented by the following formulae (F2) to (F4), but the present invention is not limited thereto.

Specific examples of the group represented by formula (F2) include p-fluorophenyl group, pentafluorophenyl group and 3,5-di(trifluoromethyl)phenyl group.

Specific examples of the group represented by formula (F3) include trifluoromethyl group, pentafluoropropyl group, pentafluoroethyl group, heptafluorobutyl group, hexafluoroisopropyl group, heptafluoroisopropyl group, hexafluoro(2-methyl)isopropyl group, nonafluorobutyl group, octafluoroisobutyl group, nonafluorohexyl group, nonafluoro-tert-butyl group, perfluoroisopentyl group, perfluorooctyl group, perfluoro(trimethyl)hexyl group, 2,2,3,3-tetrafluorocyclobutyl group and perfluorocyclohexyl group. Among these, hexafluoroisopropyl group, heptafluoroisopropyl group, hexafluoro(2-methyl)isopropyl group, octafluoroisobutyl group, nonafluoro-tert-butyl group and perfluoroisopentyl group are preferred, and hexafluoroisopropyl group and heptafluoroisopropyl group are more preferred.

Specific examples of the group represented by formula (F4) include —C(CF$_3$)$_2$OH, —C(C$_2$F$_5$)$_2$OH, —C(CF$_3$)(CH$_3$)OH and —CH(CF$_3$)OH, with —C(CF$_3$)$_2$OH being preferred.

The fluorine atom-containing partial structure may be bonded directly to the main chain or may be bonded to the main chain through a group selected from the group consisting of an alkylene group, a phenylene group, an ether bond, a thioether bond, a carbonyl group, an ester bond, an amide bond, a urethane bond and a ureylene bond, or a group formed by combining two or more of these groups and bonds.

As for the repeating unit having a fluorine atom, those shown below are preferred.

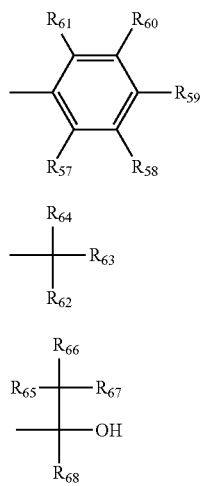

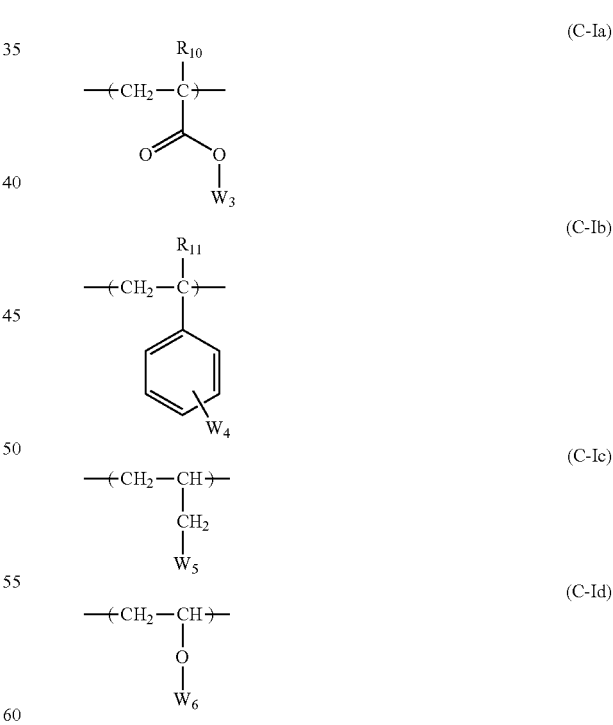

In formulae (F2) to (F4), each of $R_{57}$ to $R_{68}$ independently represents a hydrogen atom, a fluorine atom or an alkyl group (linear or branched). However, at least one of $R_{57}$ to $R_{61}$, at least one of $R_{62}$ to $R_{64}$, and at least one of $R_{65}$ to $R_{68}$ each independently represents a fluorine atom or an alkyl group (preferably having a carbon number of 1 to 4) with at least one hydrogen atom being substituted for by a fluorine atom.

It is preferred that all of $R_{57}$ to $R_{61}$ and $R_{65}$ to $R_{67}$ are a fluorine atom. Each of $R_{62}$, $R_{63}$ and $R_{68}$ is preferably an alkyl group (preferably having a carbon number of 1 to 4) with at least one hydrogen atom being substituted for by a fluorine atom, more preferably a perfluoroalkyl group having a carbon number of 1 to 4. $R_{62}$ and $R_{63}$ may combine with each other to form a ring.

In the formulae, each of $R_{10}$ and $R_{11}$ independently represents a hydrogen atom, a fluorine atom or an alkyl group. The alkyl group is preferably a linear or branched alkyl group having a carbon number of 1 to 4 and may have a substituent, and the alkyl group having a substituent includes, in particular, a fluorinated alkyl group.

Each of $W_3$ to $W_6$ independently represents an organic group having at least one or more fluorine atoms. Specific examples thereof include the atomic groups of (F2) to (F4).

Other than these, the hydrophobic resin (D) may contain a unit shown below as the repeating unit having a fluorine atom.

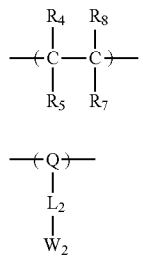

(C-II)

(C-III)

In the formulae, each of $R_4$ to $R_7$ independently represents a hydrogen atom, a fluorine atom or an alkyl group. The alkyl group is preferably a linear or branched alkyl group having a carbon number of 1 to 4 and may have a substituent, and the alkyl group having a substituent includes, in particular, a fluorinated alkyl group.

However, at least one of $R_4$ to $R_7$ represents a fluorine atom. $R_4$ and $R_5$, or $R_6$ and $R_7$ may form a ring.

$W_2$ represents an organic group having at least one fluorine atom. Specific examples thereof includes the atomic groups of (F2) to (F4).

$L_2$ represents a single bond or a divalent linking group. The divalent linking group is a substituted or unsubstituted arylene group, a substituted or unsubstituted alkylene group, a substituted or unsubstituted cycloalkylene group, —O—, —SO$_2$—, —CO—, —N(R)— (wherein R represents a hydrogen atom or an alkyl group), —NHSO$_2$—, or a divalent linking group formed by combining a plurality of these groups.

Q represents an alicyclic structure. The alicyclic structure may have a substituent and may be monocyclic or polycyclic, and in the case of a polycyclic structure, the structure may be a crosslinked structure. The monocyclic structure is preferably a cycloalkyl group having a carbon number of 3 to 8, and examples thereof include a cyclopentyl group, a cyclohexyl group, a cyclobutyl group and a cyclooctyl group. Examples of the polycyclic structure include a group containing a bicyclo, tricyclo or tetracyclo structure having a carbon number of 5 or more. A cycloalkyl group having a carbon number of 6 to 20 is preferred, and examples thereof include an adamantyl group, a norbornyl group, a dicyclopentyl group, a tricyclodecanyl group and a tetracyclododecyl group. A part of carbon atoms in the cycloalkyl group may be substituted with a heteroatom such as oxygen atom. In particular, Q is preferably a norbornyl group, a tricyclodecanyl group, a tetracyclododecyl group or the like.

Specific examples of the repeating unit containing a fluorine atom are illustrated below, but the present invention is not limited thereto.

In specific examples, $X_1$ represents a hydrogen atom, —CH$_3$, —F or —CF$_3$, and $X_2$ represents —F or —CF$_3$.

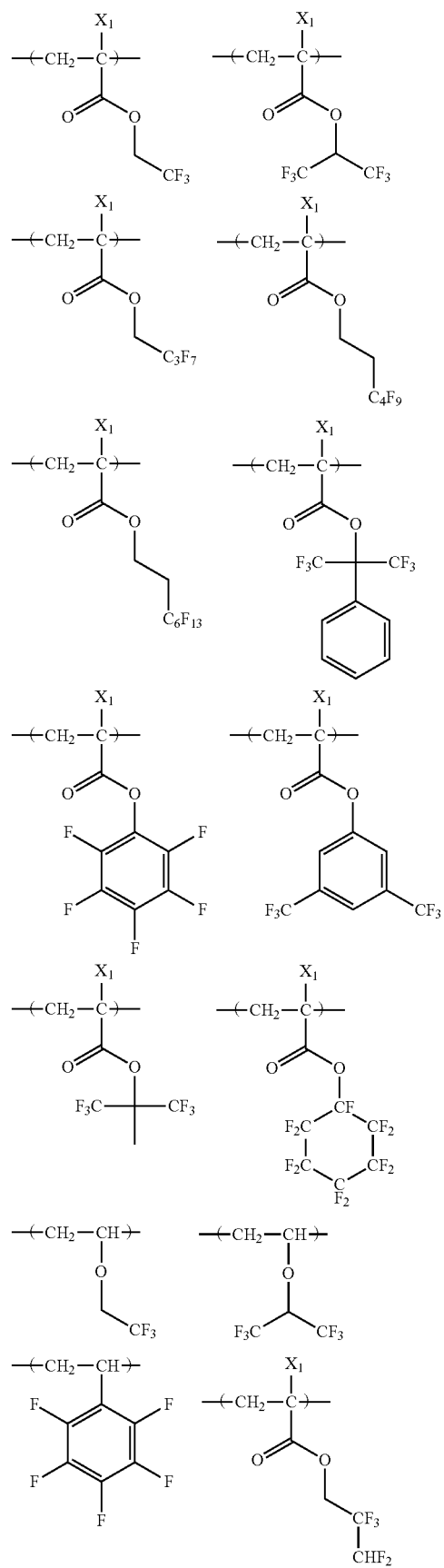

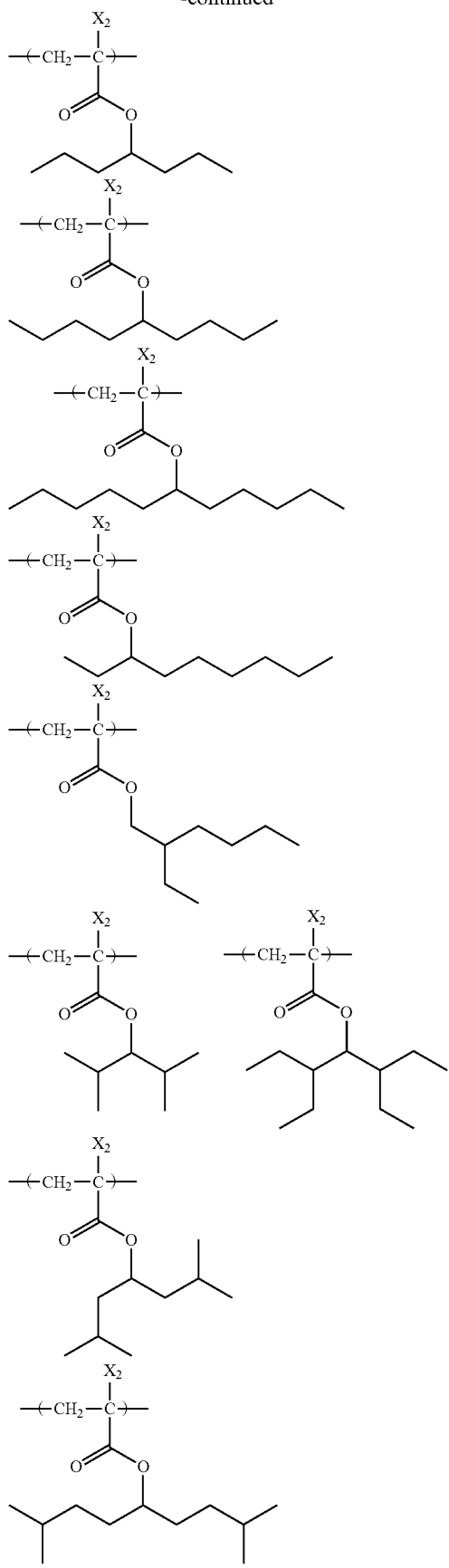
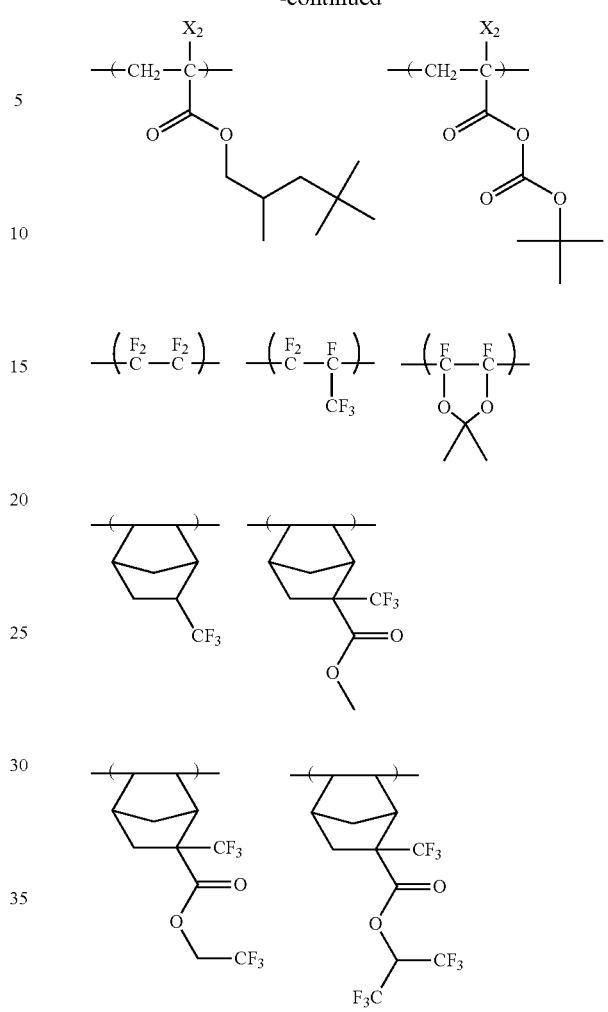

The hydrophobic resin (D) may contain a silicon atom. The resin preferably has, as the silicon atom-containing partial structure, an alkylsilyl structure (preferably a trialkylsilyl group) or a cyclic siloxane structure.

Specific examples of the alkylsilyl structure and cyclic siloxane structure include the groups represented by the following formulae (CS-1) to (CS-3):

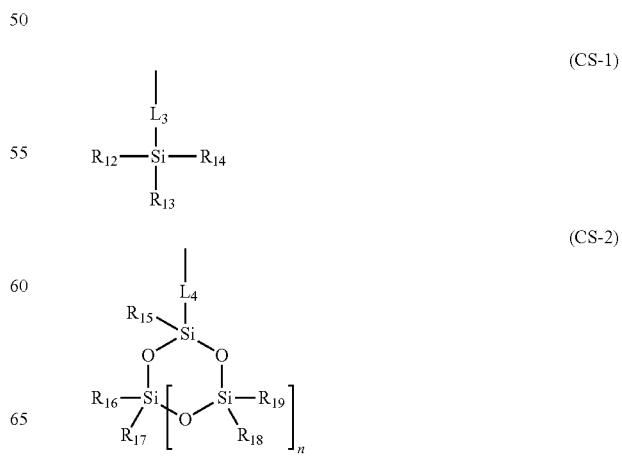

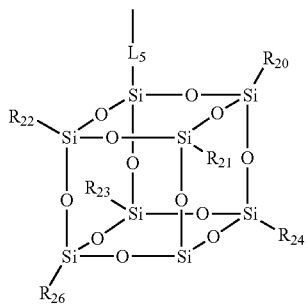
(CS-3)

In formulae (CS-1) to (CS-3), each of $R_{12}$ to $R_{26}$ independently represents a linear or branched alkyl group (preferably having a carbon number of 1 to 20) or a cycloalkyl group (preferably having a carbon number of 3 to 20).

Each of $L_3$ to $L_5$ represents a single bond or a divalent linking group. The divalent linking group is a sole group or a combination of two or more groups selected from the group consisting of an alkylene group, a phenylene group, an ether bond, a thioether bond, a carbonyl group, an ester bond, an amide bond, a urethane bond and a ureylene bond (the total carbon number is preferably 12 or less).

n represents an integer of 1 to 5. n is preferably an integer of 2 to 4.

Specific examples of the repeating unit having a group represented by formulae (CS-1) to (CS-3) are illustrated below, but the present invention is not limited thereto. In specific examples, $X_1$ represents a hydrogen atom, —$CH_3$, —F or —$CF_3$.

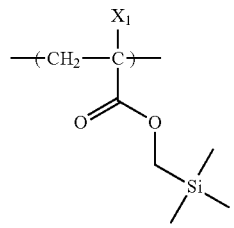
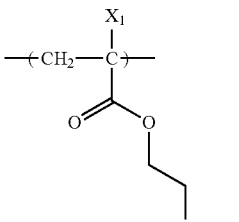
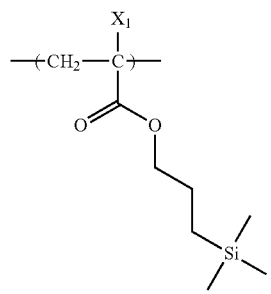
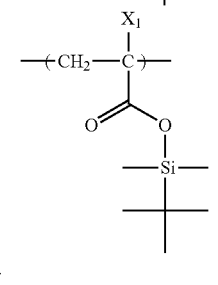
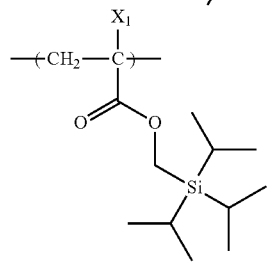
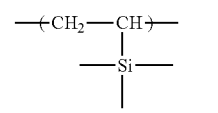
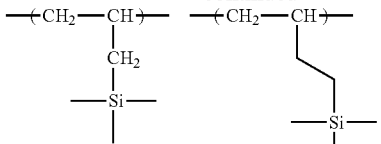
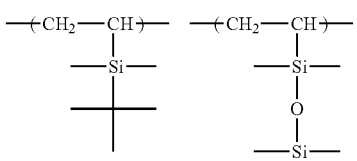
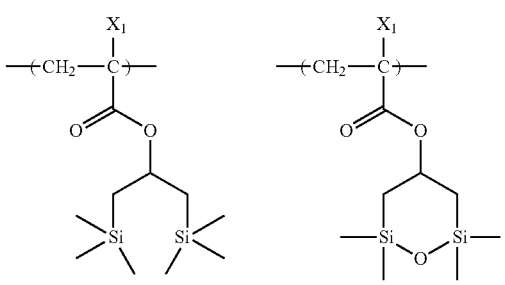
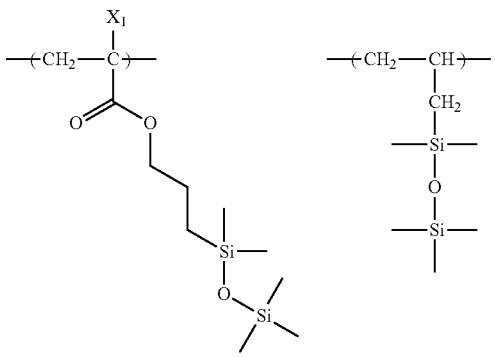
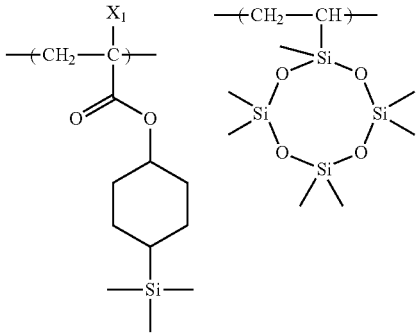
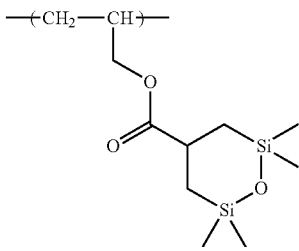

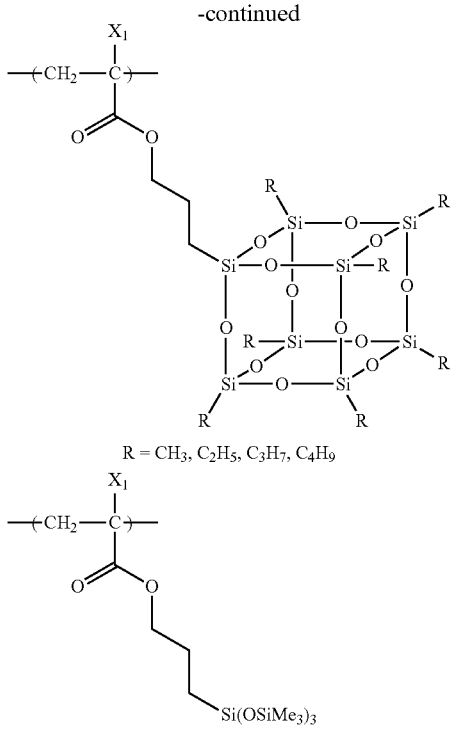

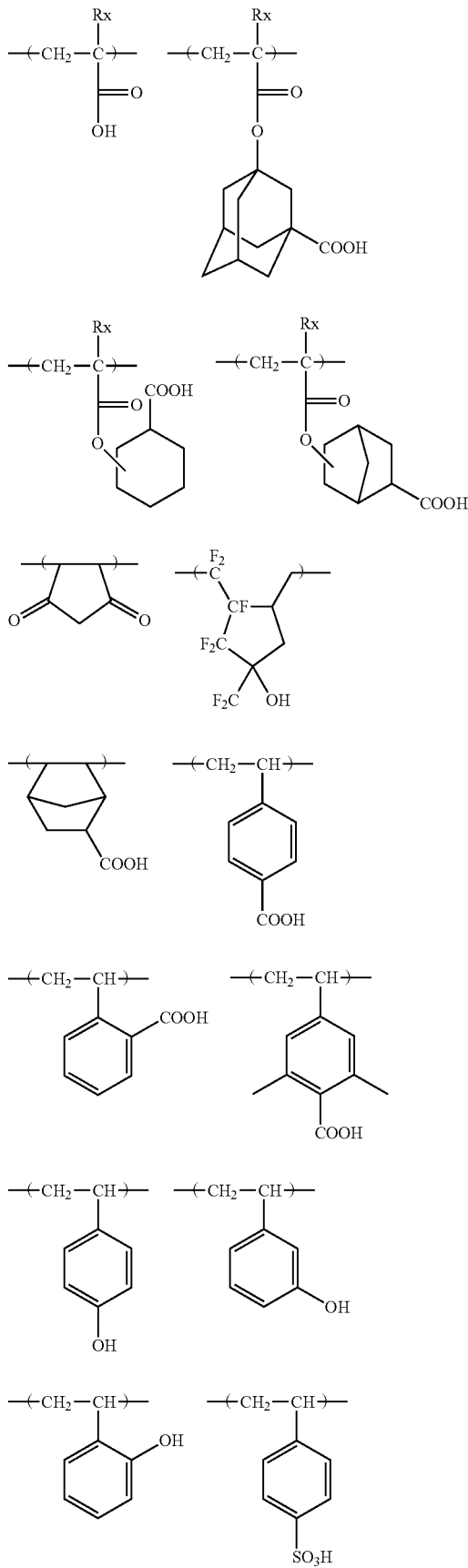

The hydrophobic resin (D) may further contain at least one group selected from the group consisting of the following (x) to (z):

(x) an acid group,
(y) a group having a lactone structure, an acid anhydride group, or an acid imide group, and
(z) a group capable of decomposing by the action of an acid.

Examples of the (x) acid group include a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group and a tris(alkylsulfonyl)methylene group.

Preferred acid groups include a fluorinated alcohol group (preferably hexafluoroisopropanol group), a sulfonimide group and a bis(carbonyl)methylene group.

Examples of the repeating unit having (x) an acid group include a repeating unit where an acid group is directly bonded to the main chain of the resin, such as repeating unit by an acrylic acid or a methacrylic acid, and a repeating unit where an acid group is bonded to the main chain of the resin through a linking group. Furthermore, an acid group may be introduced into the terminal of the polymer chain by using an acid group-containing polymerization initiator or chain transfer agent at the polymerization. All of these cases are preferred. The repeating unit having (x) an acid group may have at least either a fluorine atom or a silicon atom.

The content of the repeating unit having (x) an acid group is preferably from 1 to 50 mol %, more preferably from 3 to 35 mol %, still more preferably from 5 to 20 mol %, based on all repeating units in the hydrophobic resin (D).

Specific examples of the repeating unit having (x) an acid group are illustrated below, but the present invention is not limited thereto. In the formulae, Rx represents a hydrogen atom, $CH_3$, $CF_3$ or $CH_2OH$.

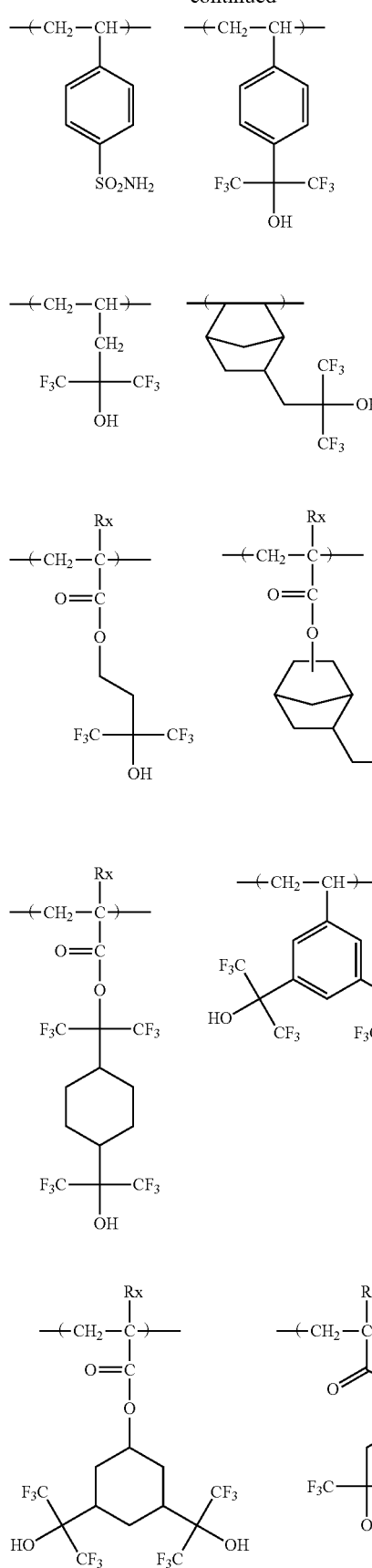
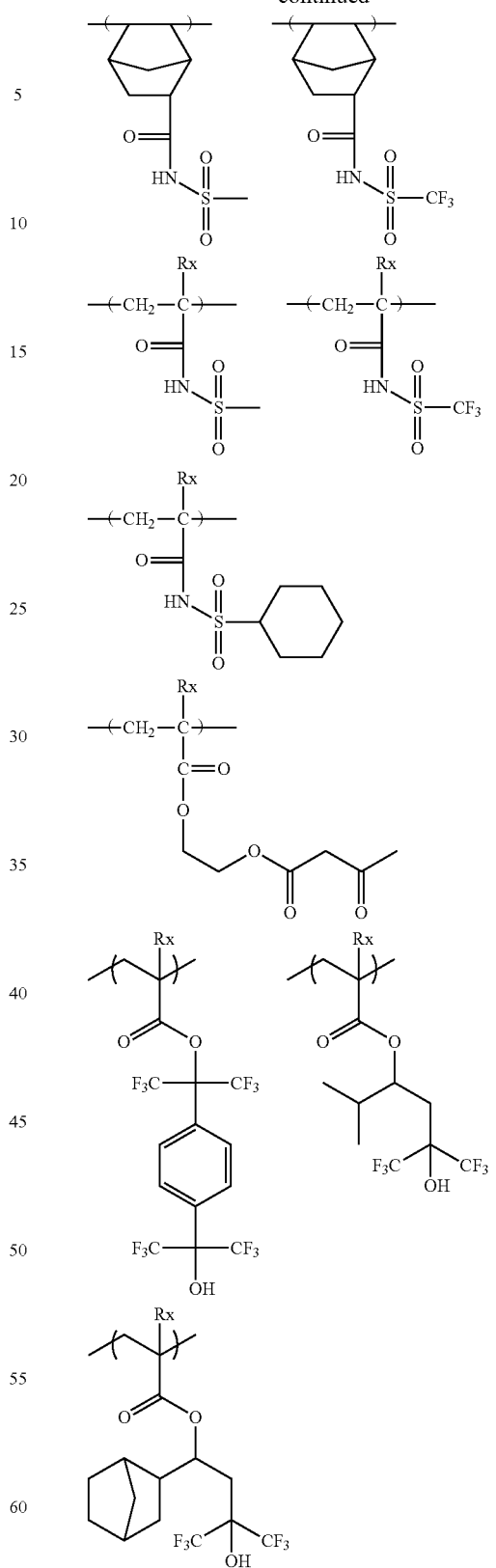
The (y) group having a lactone structure, acid anhydride group or acid imide group is preferably a group having a lactone structure.

The repeating unit having such a group is a repeating unit where the group is directly bonded to the main chain of the resin, such as repeating unit by an acrylic acid ester or a methacrylic acid ester. This repeating unit may also be a repeating unit where the group is bonded to the main chain of the resin through a linking group. Alternatively, in this repeating unit, the group may be introduced into the terminal of the resin by using a polymerization initiator or chain transfer agent containing the group at the polymerization.

Examples of the repeating unit containing a group having a lactone structure are the same as those of the repeating unit having a lactone structure described above in the paragraph of the (A) acid-decomposable resin.

The lactone structure-containing group is preferably a group having a partial structure represented by the following formula (KA-1). By virtue of having this structure, it is expected that, for example, the receding contact angle of the immersion liquid is enhanced.

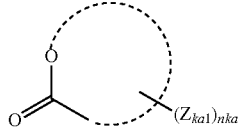

(KA-1)

In formula (KA-1), $Z_{ka1}$ represents, when nka is 2 or more, each $Z_{ka1}$ independently represents, an alkyl group, a cycloalkyl group, an ether group, a hydroxy group, an amide group, an aryl group, a lactone ring group or an electron-withdrawing group. In the case where nka is 2 or more, the plurality of $Z_{ka1}$'s may combine with each other to faun a ring. Examples of the ring include a cycloalkyl ring and a heterocyclic ring such as cyclic ether ring and lactone ring.

nka represents an integer of 0 to 10. nka is preferably an integer of 0 to 8, more preferably an integer of 0 to 5, still more preferably an integer of 1 to 4, yet still more preferably an integer of 1 to 3.

Incidentally, the structure represented by formula (KA-1) is a partial structure present in the main chain, side chain, terminal or the like of the resin and is present as a monovalent or higher valent substituent by removing at least one hydrogen atom contained in the structure.

$Z_{ka1}$ is preferably an alkyl group, a cycloalkyl group, an ether group, a hydroxy group or an electron-withdrawing group, more preferably an alkyl group, a cycloalkyl group or an electron-withdrawing group. The ether group is preferably an alkyl ether group or a cycloalkyl ether group.

The alkyl group of $Z_{ka1}$ may be either linear or branched, and the alkyl group may further have a substituent.

The alkyl group of $Z_{ka1}$ is preferably an alkyl group having a carbon number of 1 to 4, such as methyl group, ethyl group, n-propyl group, i-propyl group, n-butyl group, i-butyl group and tert-butyl group.

The cycloalkyl group of $Z_{ka1}$ may be monocyclic or polycyclic. In the latter case, the cycloalkyl group may be of crosslinked type. That is, in this case, the cycloalkyl group may have a bridged structure. Incidentally, a part of carbon atoms in the cycloalkyl group may be substituted with a heteroatom such as oxygen atom.

The monocyclic cycloalkyl group is preferably a cycloalkyl group having a carbon number of 3 to 8, and examples thereof include a cyclopropyl group, a cyclobutyl group, a cyclopentyl group, a cyclohexyl group and a cyclooctyl group.

Examples of the polycyclic cycloalkyl group include a group having a bicyclo, tricyclo or tetracyclo structure and having a carbon number of 5 or more. The polycyclic cycloalkyl group is preferably a cycloalkyl group having a carbon number of 6 to 20, and examples thereof include an adamantyl group, a norbornyl group, an isoboronyl group, a camphanyl group, a dicyclopentyl group, an α-pinel group, a tricyclodecanyl group, a tetracyclododecyl group and an androstanyl group.

These structures may further have a substituent. Examples of the substituent include an alkyl group, a halogen atom, a hydroxyl group, an alkoxy group, a carboxy group and an alkoxycarbonyl group.

The alkyl group as the substituent is preferably a lower alkyl group such as methyl group, ethyl group, propyl group, isopropyl group and butyl group, more preferably a methyl group, an ethyl group, a propyl group or an isopropyl group.

The alkoxy group as the substituent is preferably an alkoxy group having a carbon number of 1 to 4, such as methoxy group, ethoxy group, propoxy group and butoxy group.

The alkyl group and alkoxy group as the substituent may further have a substituent, and examples of the further substituent include a hydroxyl group, a halogen atom and an alkoxy group (preferably having a carbon number of 1 to 4).

Examples of the aryl group of $Z_{ka1}$ include a phenyl group and a naphthyl group.

Examples of the substituent which the alkyl group, cycloalkyl group and aryl group of $Z_{ka1}$ may further have include a hydroxyl group; a halogen atom; a nitro group; a cyano group; the above-described alkyl group; an alkoxy group such as methoxy group, ethoxy group, hydroxyethoxy group, propoxy group, hydroxypropoxy group, n-butoxy group, isobutoxy group, sec-butoxy group and tert-butoxy group; an alkoxycarbonyl group such as methoxycarbonyl group and ethoxycarbonyl group; an aralkyl group such as benzyl group, phenethyl group and cumyl group; an aralkyloxy group; an acyl group such as formyl group, acetyl group, butyryl group, benzoyl group, cinnamyl group and valeryl group; an acyloxy group such as butyryloxy group; an alkenyl group; an alkenyloxy group such as vinyloxy group, propenyloxy group, allyloxy group and butenyloxy group; the above-described aryl group; an aryloxy group such as phenoxy group; and an aryloxycarbonyl group such as benzoyloxy group.

Examples of the electron-withdrawing group of $Z_{ka1}$ include a halogen atom, a cyano group, an oxy group, a carbonyl group, a carbonyloxy group, an oxycarbonyl group, a nitrile group, a nitro group, a sulfonyl group, a sulfinyl group, a halo(cyclo)alkyl group represented by —C($R_{f1}$)($R^{f2}$)—$R_{f3}$, a haloaryl group, and a combination thereof. The term "halo(cyclo)alkyl group" indicates a (cyclo)alkyl group with at least one hydrogen atom being substituted for by a halogen atom.

The halogen atom of $Z_{ka1}$ includes a fluorine atom, a chlorine atom, a bromine atom and an iodine atom. Among these, a fluorine atom is preferred.

In the halo(cyclo)alkyl group represented by —C($R_{f1}$)($R_{f2}$)—$R_{f3}$, $R_{f1}$ represents a halogen atom, a perhaloalkyl group, a perhalocycloalkyl group or a perhaloaryl group. $R_{f1}$ is preferably a fluorine atom, a perfluoroalkyl group or a perfluorocycloalkyl group, more preferably a fluorine atom or a trifluoromethyl group.

In the halo(cyclo)alkyl group represented by —C($R_{f1}$)($R_{f2}$)—$R_{f3}$, each of $R_{f2}$ and $R_{f3}$ independently represents a hydrogen atom, a halogen atom or an organic group. Examples of the organic group include an alkyl group, a cycloalkyl group and an alkoxy group. These groups may further have a substituent such as halogen atom.

At least two members out of $R_{f1}$ to $R_{f3}$ may combine with each other to form a ring. Examples of the ring include a cycloalkyl ring, a halocycloalkyl ring, an aryl ring and a haloaryl ring.

Examples of the alkyl group and haloalkyl group of $R_{f1}$ to $R_{f3}$ include the alkyl groups described above for $Z_{ka1}$ and groups where at least a part of hydrogen atoms of such an alkyl group is substituted for by a halogen atom.

Examples of the halocycloalkyl group and haloaryl group include groups where at least a part of hydrogen atoms in the cycloalkyl group or aryl group described above for $Z_{ka1}$ is substituted for by a halogen atom. More preferred examples of the halocycloalkyl group and haloaryl group include a fluorocycloalkyl group represented by —$C_nF_{(2n-2)}H$ and a perfluoroaryl group. Here, the range of carbon number n is not particularly limited, but n is preferably an integer of 5 to 13, and n is more preferably 6.

$R_{f2}$ is preferably the same group as $R_{f1}$ or combines with $R_{f3}$ to form a ring.

The electron-withdrawing group is preferably a halogen atom, a halo(cyclo)alkyl group or a haloaryl group.

In the electron-withdrawing group, a part of fluorine atoms may be substituted for by an electron-withdrawing group except for fluorine atom.

Incidentally, when the electron-withdrawing group is a divalent or higher valent group, the remaining bond is used for bonding to an arbitrary atom or substituent. In this case, the partial structure above may be bonded to the main chain of the hydrophobic resin through a further substituent.

Out of the structures represented by formula (KA-1), a structure represented by the following formula (KY-1) is preferred.

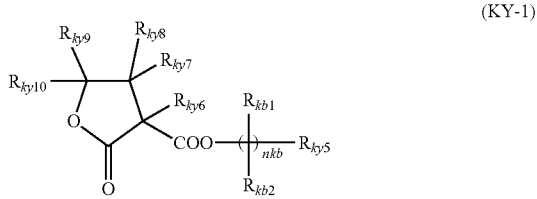

(KY-1)

In formula (KY-1), each of $R_{ky6}$ to $R_{ky10}$ independently represents a hydrogen atom, a halogen atom, an alkyl group, a cycloalkyl group, a carbonyl group, a carbonyloxy group, an oxycarbonyl group, an ether group, a hydroxy group, a cyano group, an amide group or an aryl group. At least two members out of $R_{ky6}$ to $R_{ky10}$ may combine with each other to form a ring.

$R_{ky5}$ represents an electron-withdrawing group. Examples of the electron-withdrawing group are the same as those for $Z_{ka1}$ in formula (KA-1). The electron-withdrawing group is preferably a halogen atom, a halo(cyclo)alkyl represented by —C($R_{f1}$)($R_{f2}$)—$R_{f3}$, or a haloaryl group. Specific examples of these groups are the same as specific examples in formula (KA-1).

nkb represents 0 or 1.

Each of $R_{kb1}$ and $R_{kb2}$ independently represents a hydrogen atom, an alkyl group, a cycloalkyl group, an aryl group or an electron-withdrawing group. Specific examples of these atomic groups are the same as those for $Z_{ka1}$ in formula (KA-1).

The structure represented by formula (KY-1) is more preferably a structure represented by the following formula (KY-1-1).

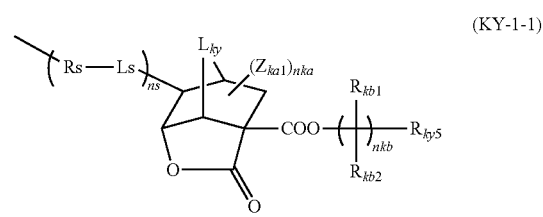

(KY-1-1)

In formula (KY-1-1), $Z_{ka1}$ and nka have the same meanings as those in formula (KA-1). $R_{ky5}$, $R_{kb1}$, $R_{kb2}$ and nkb have the same meaning as those in formula (KY-1).

$L_{ky}$ represents an alkylene group, an oxygen atom or a sulfur atom. Examples of the alkylene group of $L_{ky}$ include a methylene group and an ethylene group. $L_{ky}$ is preferably an oxygen atom or a methylene group, more preferably a methylene group.

Ls represents a single bond, an ether bond, an ester bond, an amide bond, a urethane bond or a urea bond, and when a plurality of Ls's are present, each Ls may be the same as or different from every other Ls.

Rs represents, when ns is 2 or more, each independently represents, an alkylene group or a cycloalkylene group. When ns is 2 or more, each Rs may be the same as or different from every other Rs.

ns is the repetition number of the linking group represented by —(Rs-Ls)- and represents an integer of 0 to 5.

Specific preferred examples of the repeating unit having a structure represented by formula (KA-1) are illustrated below, but the present invention is not limited thereto. Ra represents a hydrogen atom, a fluorine atom, a methyl group or a trifluoromethyl group.

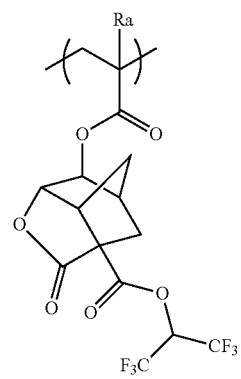

141
-continued
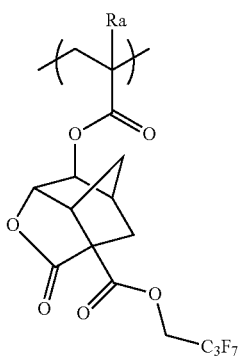
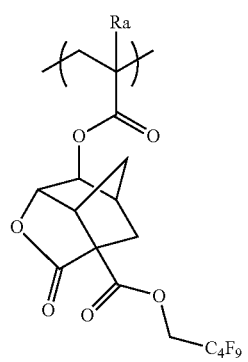
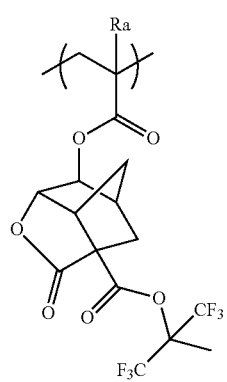
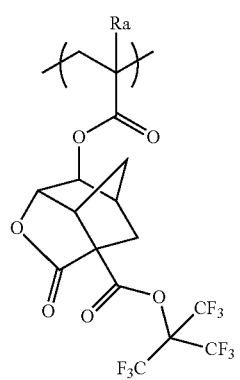
142
-continued
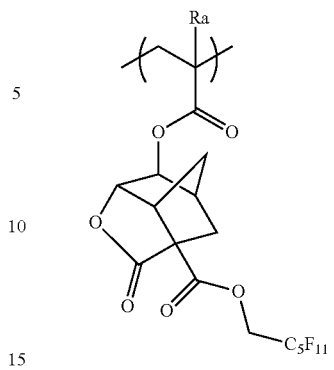
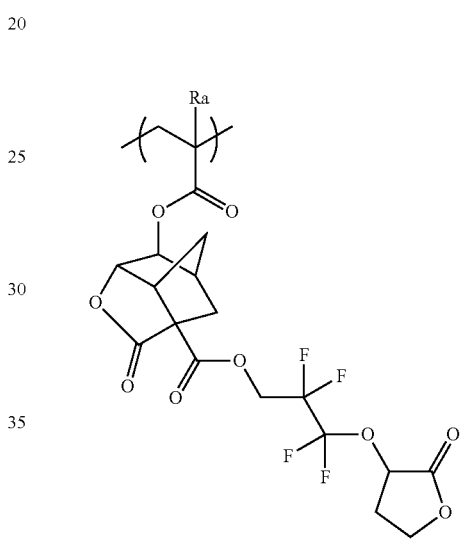
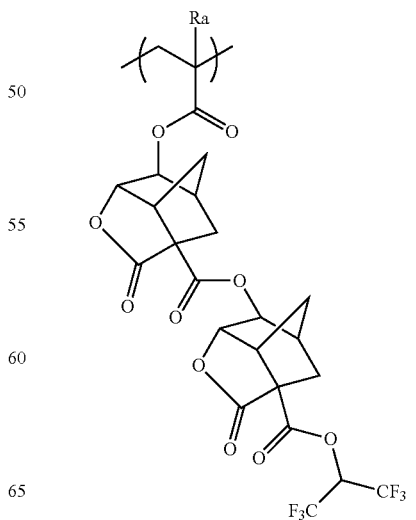

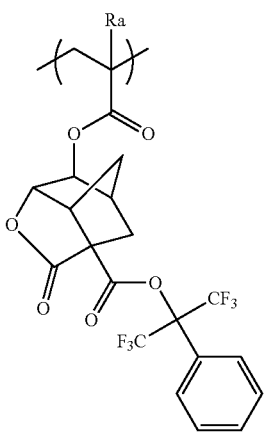
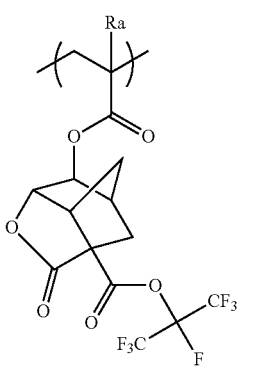
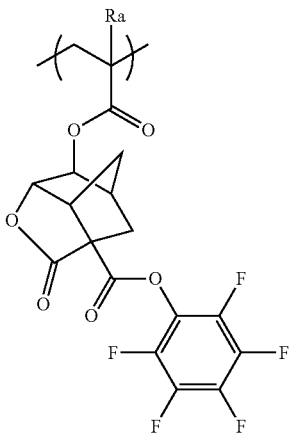
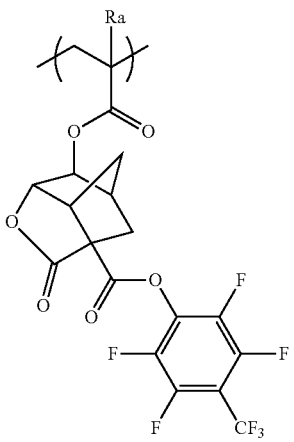
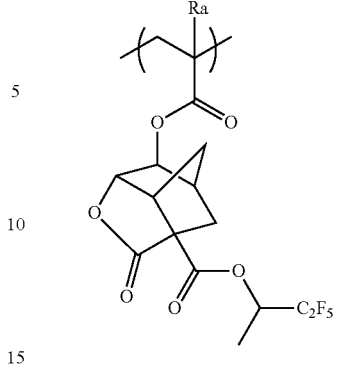

The content of the repeating unit having a lactone structure-containing group, an acid anhydride group or an acid imide group is preferably from 1 to 100 mol %, more preferably from 3 to 98 mol %, still more preferably from 5 to 95 mol %, based on all repeating units in the hydrophobic resin.

Examples of the repeating unit having (z) a group capable of decomposing by the action of an acid, which is contained in the hydrophobic resin (D), are the same as those of the repeating unit having an acid-decomposable group described for the resin (A). The repeating unit having (z) a group capable of decomposing by the action of an acid may contain at least either a fluorine atom or a silicon atom. The content of the repeating unit having (z) a group capable of decomposing by the action of an acid, in the hydrophobic resin (D), is preferably from 1 to 80 mol %, more preferably from 10 to 80 mol %, still more preferably from 20 to 60 mol %, based on all repeating units in the resin (D).

The hydrophobic resin (D) may further contain a repeating unit represented by the following formula (III):

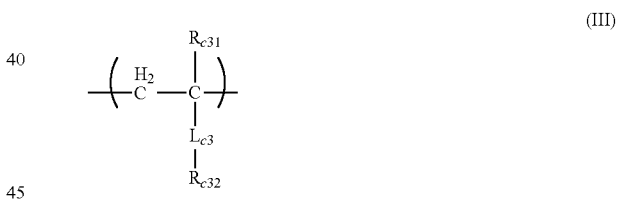

(III)

In formula $R_{c31}$ represents a hydrogen atom, an alkyl group, an alkyl group which may be substituted with a fluorine atom, a cyano group or a —CH$_2$—O—Rac$_2$ group, wherein Race represents a hydrogen atom, an alkyl group or an acyl group. $R_{c31}$ is preferably a hydrogen atom, a methyl group, a hydroxymethyl group or a trifluoromethyl group, more preferably a hydrogen atom or a methyl group.

$R_{c32}$ represents a group having an alkyl group, a cycloalkyl group, an alkenyl group, a cycloalkenyl group or an aryl group. These groups may be substituted with a fluorine atom or a silicon atom-containing group.

$L_{c3}$ represents a single bond or a divalent linking group.

In formula (III), the alkyl group of $R_{c32}$ is preferably a linear or branched alkyl group having a carbon number of 3 to 20.

The cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

The aryl group is preferably a phenyl group or a naphthyl group, which are an aryl group having a carbon number of 6 to 20, and these groups may have a substituent.

$R_{c32}$ is preferably an unsubstituted alkyl group or an alkyl group with a fluorine atom.

The divalent linking group of $L_{c3}$ is preferably an alkylene group (preferably having a carbon number of 1 to 5), an ether bond, a phenylene group or an ester bond (a group represented by —COO—).

The content of the repeating unit represented by formula (III) is preferably from 1 to 100 mol %, more preferably from 10 to 90 mol %, still more preferably from 30 to 70 mol %, based on all repeating units in the hydrophobic resin.

The hydrophobic resin (D) may further contain a repeating unit represented by the following formula (CII-AB):

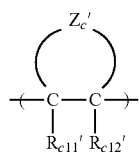

(CII-AB)

In formula (CII-AB), each of $R_{c11}'$ and $R_{c12}'$ independently represents a hydrogen atom, a cyano group, a halogen atom or an alkyl group.

$Z_c'$ represents an atomic group for forming an alicyclic structure containing two bonded carbon atoms (C—C).

The content of the repeating unit represented by formula (CII-AB) is preferably from 1 to 100 mol %, more preferably from 10 to 90 mol %, still more preferably from 30 to 70 mol %, based on all repeating units in the hydrophobic resin.

Specific examples of the repeating units represented by formulae (III) and (CII-AB) are illustrated below, but the present invention is not limited thereto. In the formulae, Ra represents H, $CH_3$, $CH_2OH$, $CF_3$ or CN.

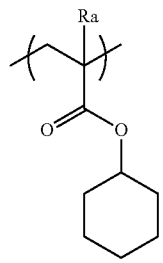
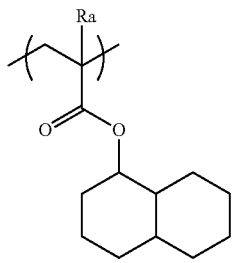
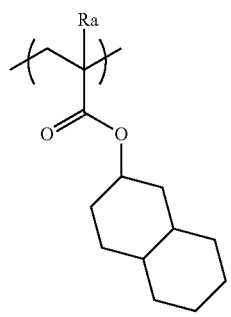
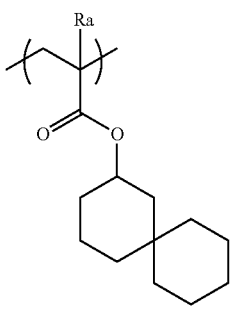
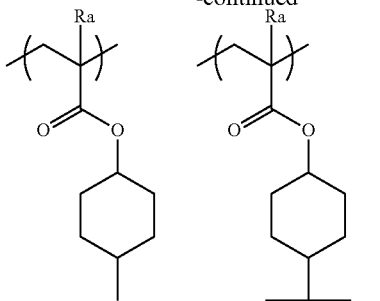
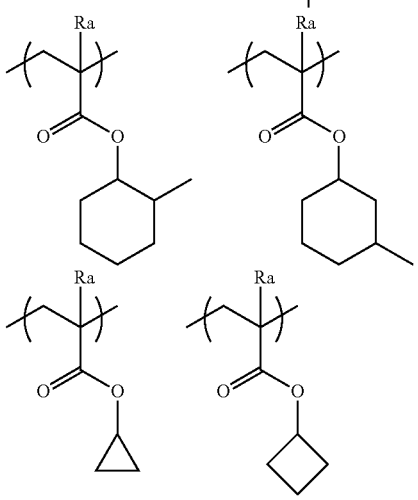
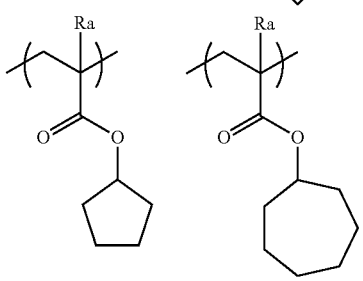
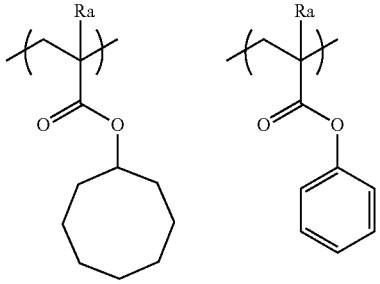
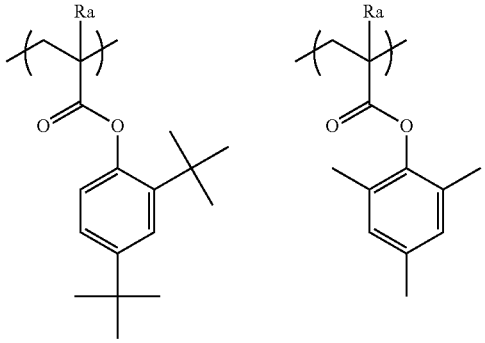

-continued

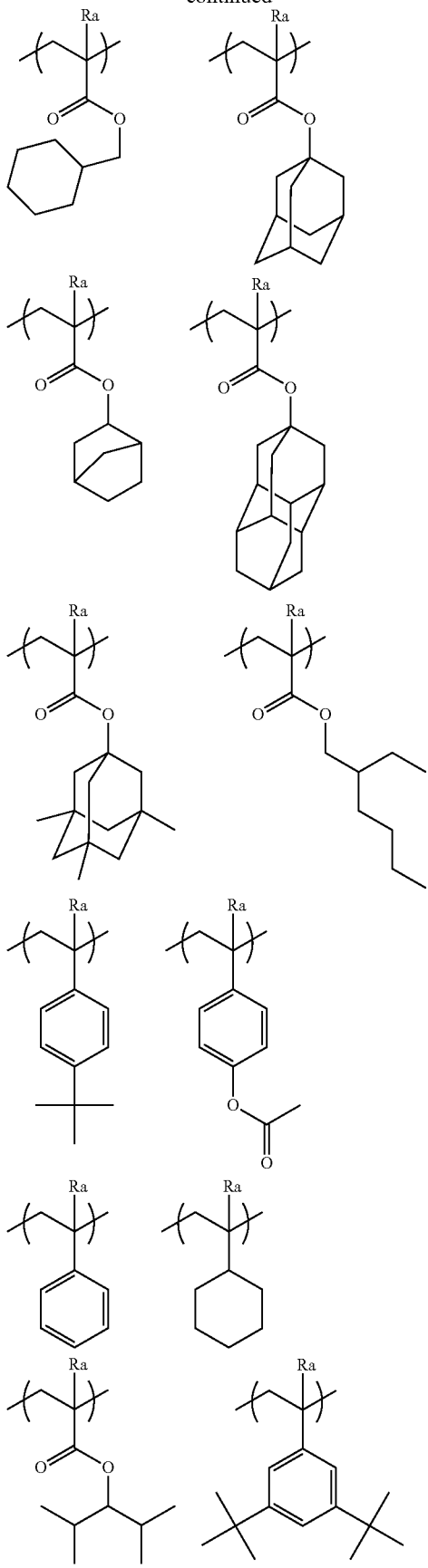

-continued

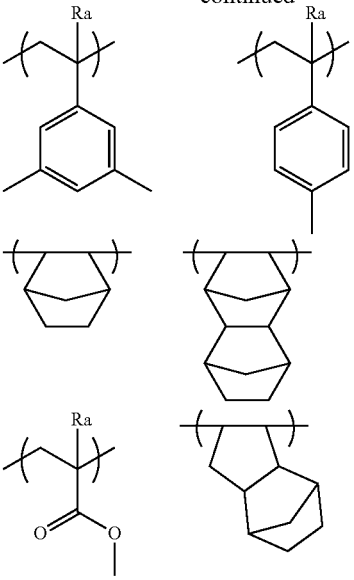

In the case where the hydrophobic resin (D) contains a fluorine atom, the fluorine atom content is preferably from 5 to 80 mass %, more preferably from 10 to 80 mass %, based on the weight average molecular weight of the hydrophobic resin (D). Also, the fluorine atom-containing repeating unit preferably accounts for 10 to 100 mol %, more preferably from 30 to 100 mol %, in the hydrophobic resin (D).

In the case where the hydrophobic resin (D) contains a silicon atom, the silicon atom content is preferably from 2 to 50 mass %, more preferably from 2 to 30 mass %, based on the weight average molecular weight of the hydrophobic resin (D). Also, the silicon atom-containing repeating unit preferably accounts for 10 to 100 mol %, more preferably from 20 to 100 mol %, in the hydrophobic resin (D).

The weight average molecular weight of the hydrophobic resin (D) is preferably from 1,000 to 100,000, more preferably from 1,000 to 50,000, still more preferably from 2,000 to 15,000, in terms of standard polystyrene.

As for the hydrophobic resin (D), one kind of a resin may be used, or a plurality of kinds of resins may be used in combination.

The content of the hydrophobic resin (D) in the composition is preferably from 0.01 to 10 mass %, more preferably from 0.05 to 8 mass %, still more preferably from 0.1 to 5 mass %, based on the entire solid content in the composition of the present invention.

In the hydrophobic resin (D), similarly to the resin (A), it is of course preferred that the content of impurities such as metal is small, but also, the content of residual monomers or oligomer components is preferably from 0.01 to 5 mass %, more preferably from 0.01 to 3 mass %, still more preferably from 0.05 to 1 mass %. When these conditions are satisfied, a resist composition free from extraneous substances in the liquid or change with aging of sensitivity or the like can be obtained. Furthermore, in view of resolution, resist profile, side wall of resist pattern, roughness and the like, the molecular weight distribution (Mw/Mn, sometimes referred to as "polydispersity") is preferably from 1 to 5, more preferably from 1 to 3, still more preferably from 1 to 2.

As for the hydrophobic resin (D), various commercially available products may be used, or the resin may be synthesized by a conventional method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred.

The reaction solvent, the polymerization initiator, the reaction conditions (e.g., temperature, concentration) and the purification method after reaction are the same as those described for the resin (A), but in the synthesis of the hydrophobic resin (D), the concentration in reaction is preferably from 30 to 50 mass %.

Specific examples of the hydrophobic resin (D) are illustrated below. Also, the molar ratio of repeating units (corresponding to repeating units starting from the left), weight average molecular weight and polydispersity of each resin are shown in Tables 1 and 2 later.

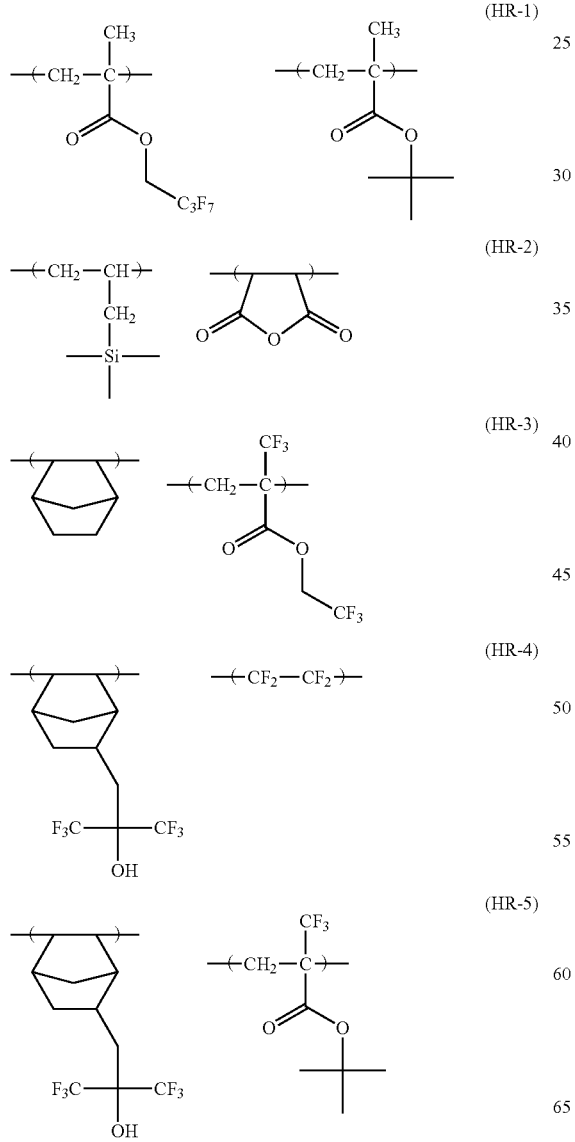

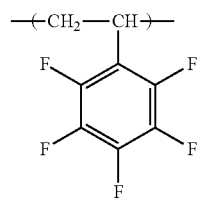

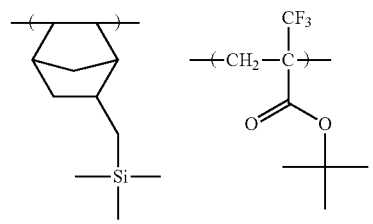

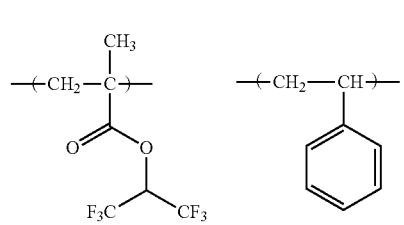

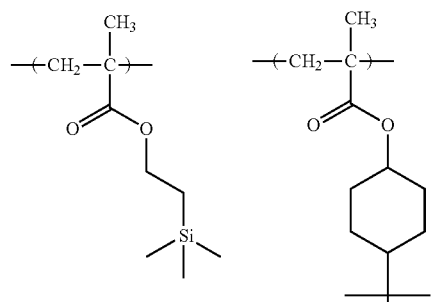

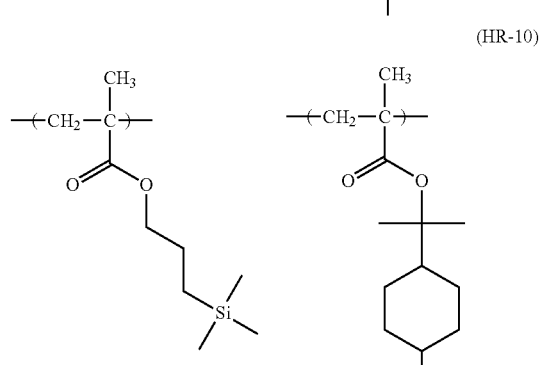

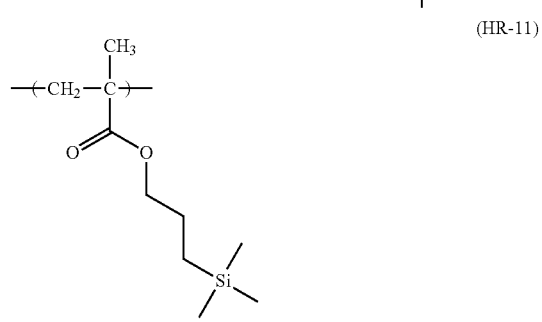

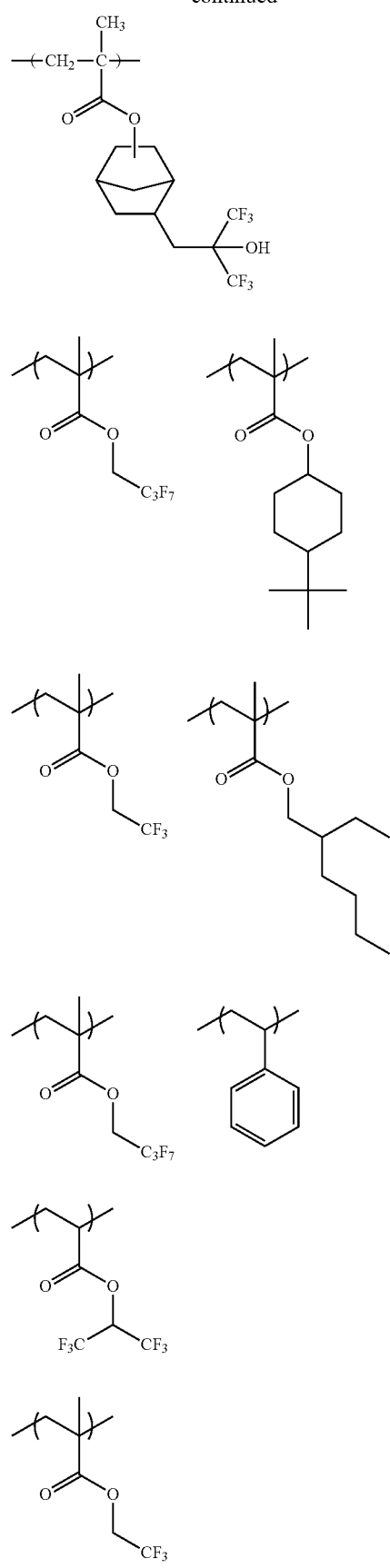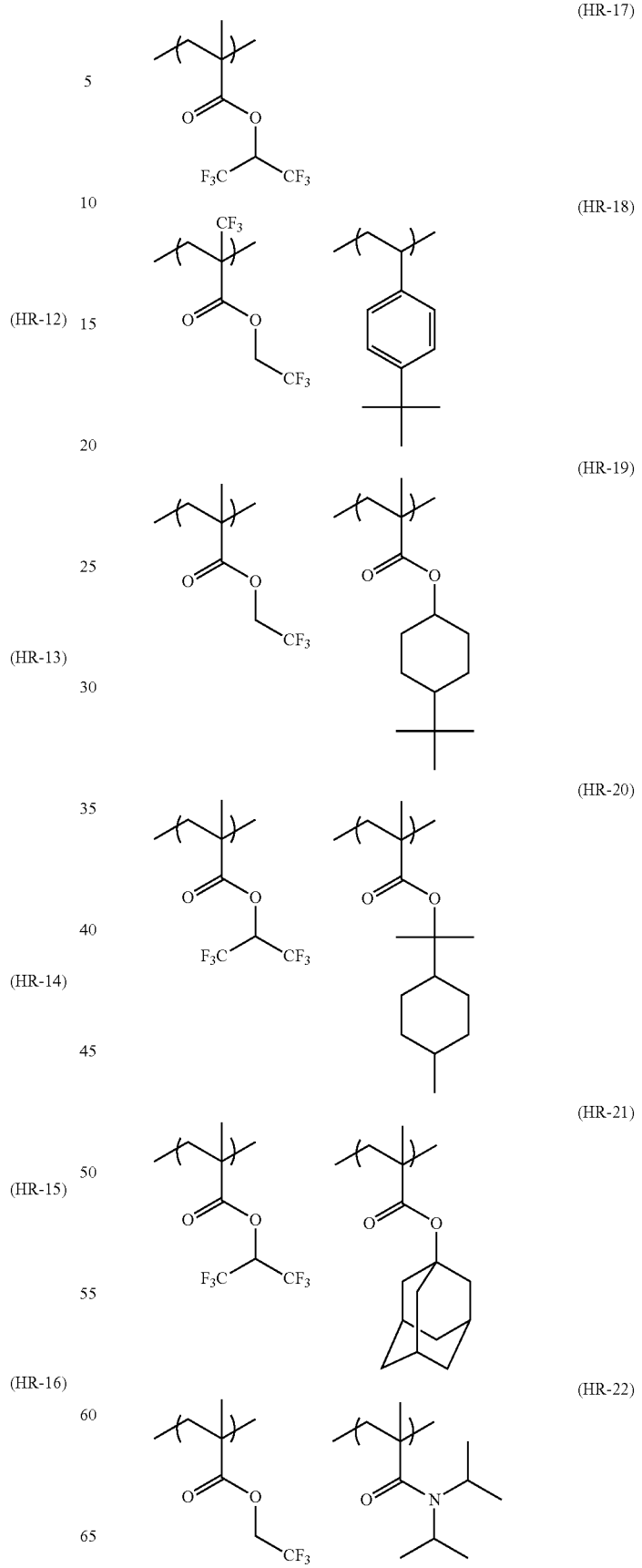

(HR-23) 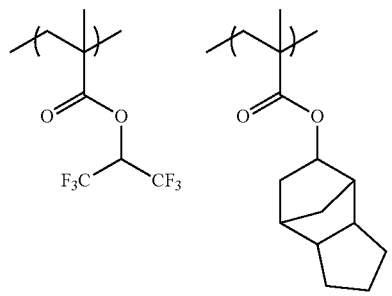
(HR-24) 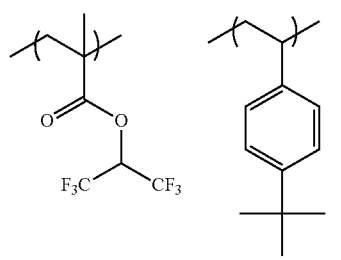
(HR-25) 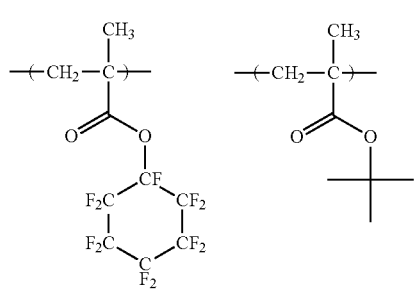
(HR-26) 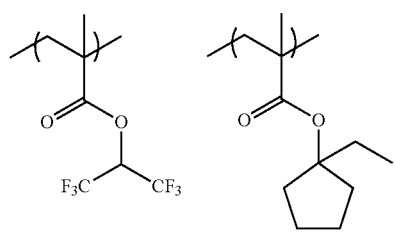
(HR-27) 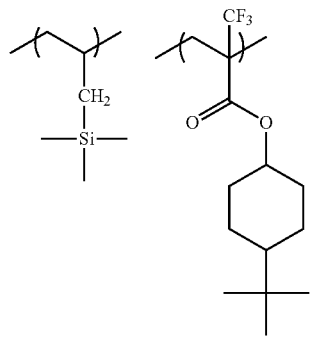
(HR-28) 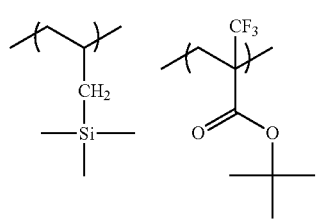
(HR-29) 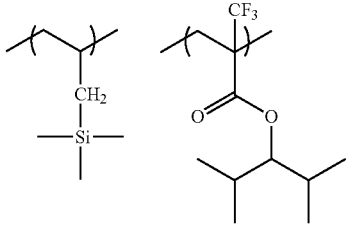
(HR-30) 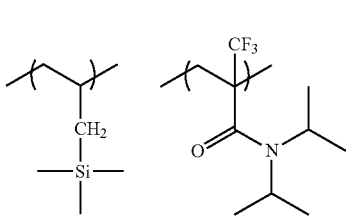
(HR-31) 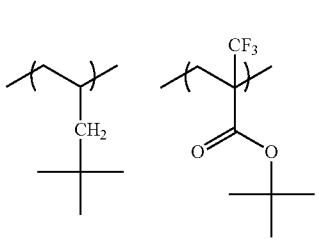
(HR-32) 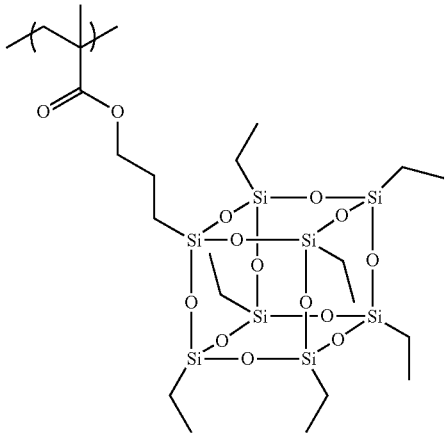
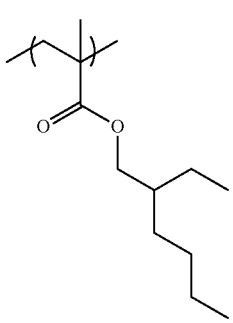

(HR-33)
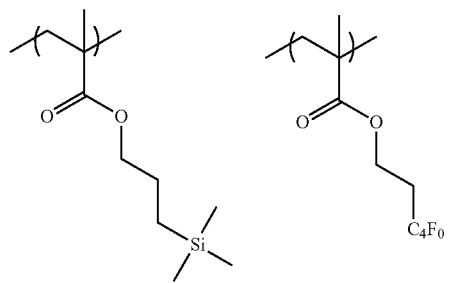
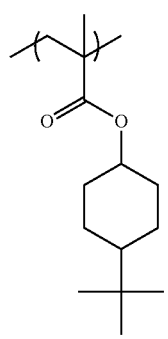
(HR-34)
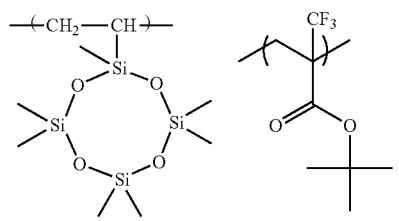
(HR-35)
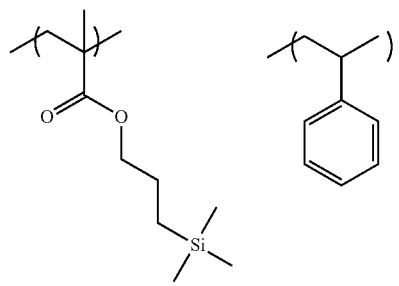
(HR-36)
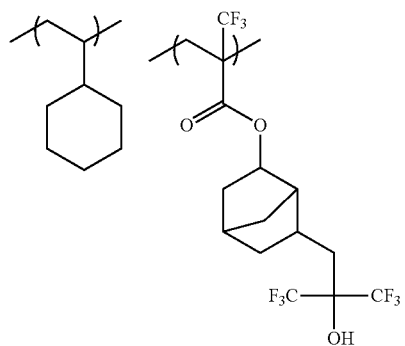
(HR-37)
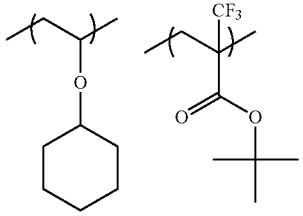
(HR-38)
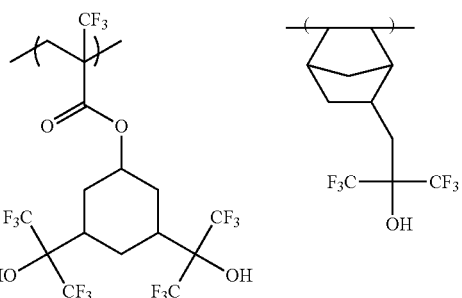
(HR-39)
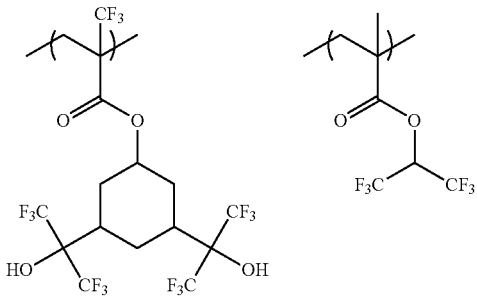
(HR-40)
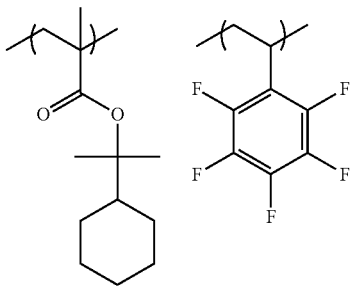
(HR-41)
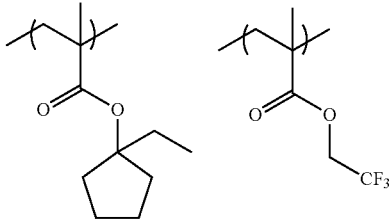
(HR-42)
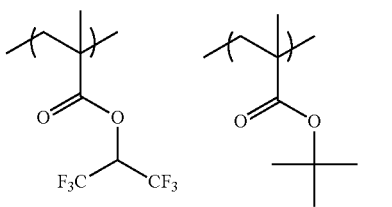

(HR-43)
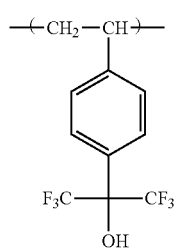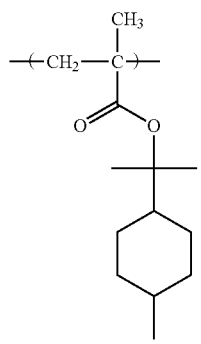
(HR-44)
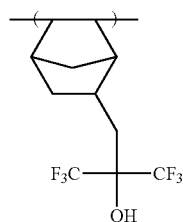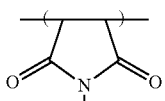
(HR-45)
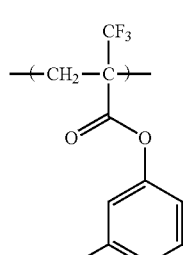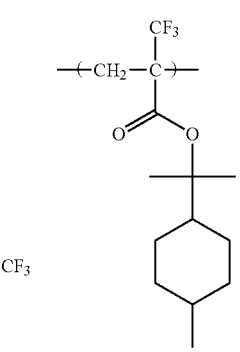
(HR-46)
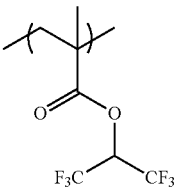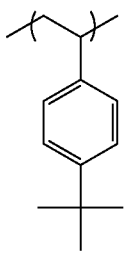
(HR-47)
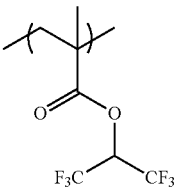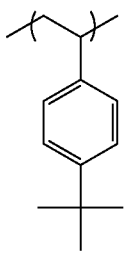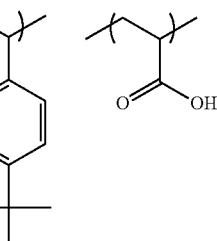
(HR-48)
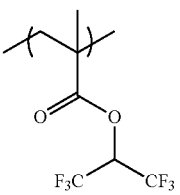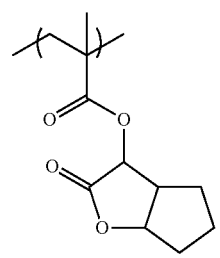
(HR-49)
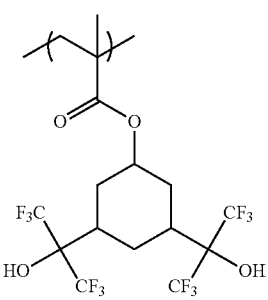
(HR-50)
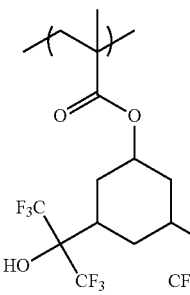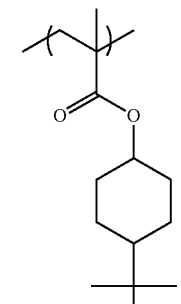
(HR-51)
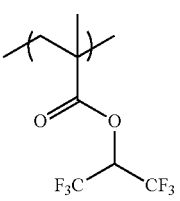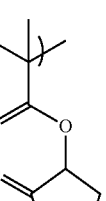

-continued
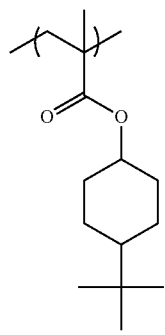
(HR-52)
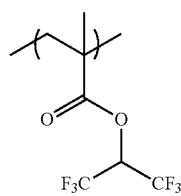 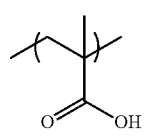
(HR-53)
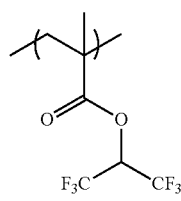 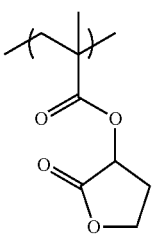
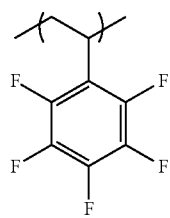
(HR-54)
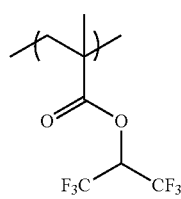 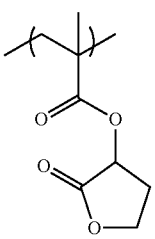
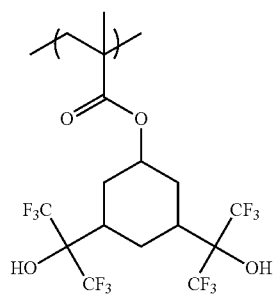
-continued
(HR-55)
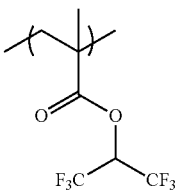 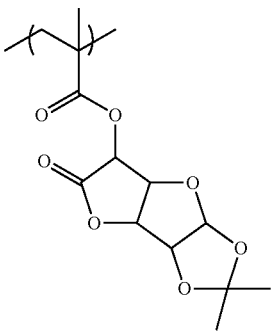
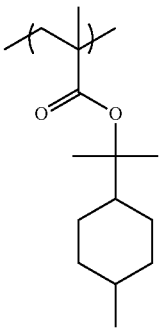
(HR-56)
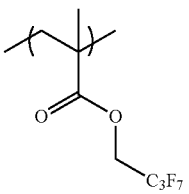
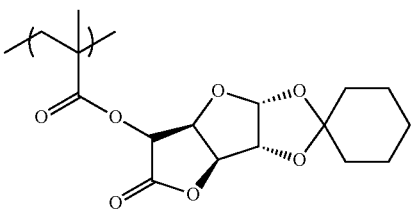
(HR-57)
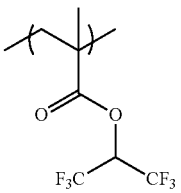 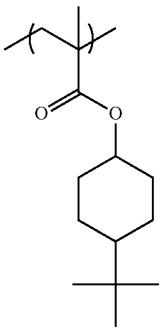

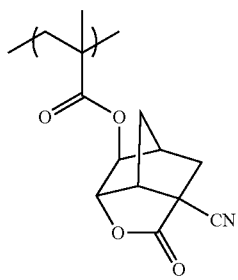
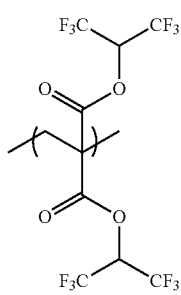 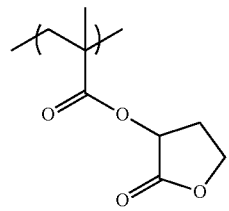
(HR-58)
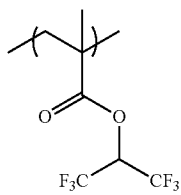 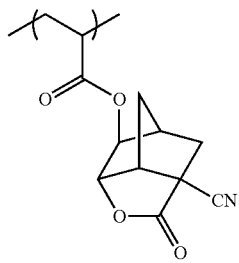
(HR-59)
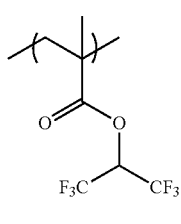 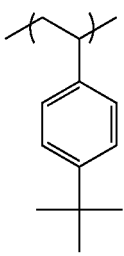
(HR-60)
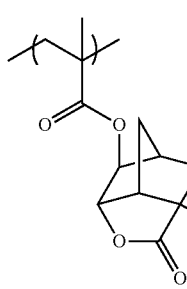 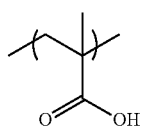
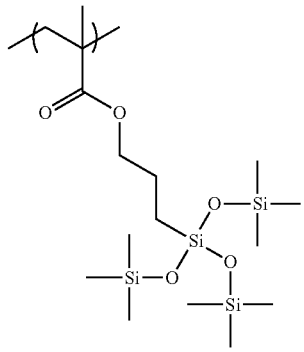
(HR-61)
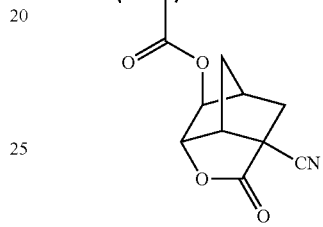
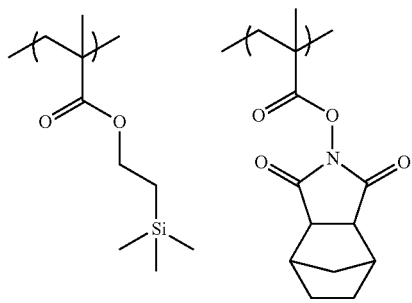
(HR-62)
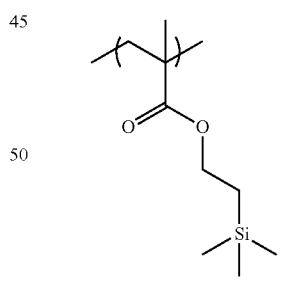
(HR-63)
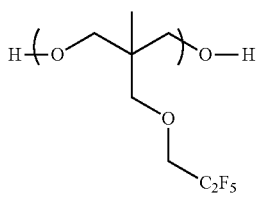
(HR-64)

(HR-65)
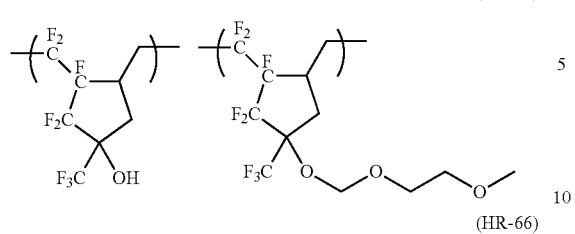
(HR-66)
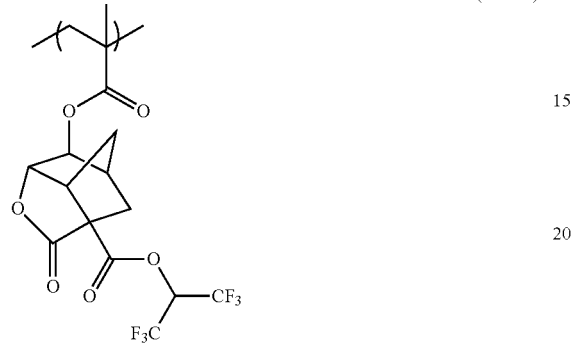
(HR-67)
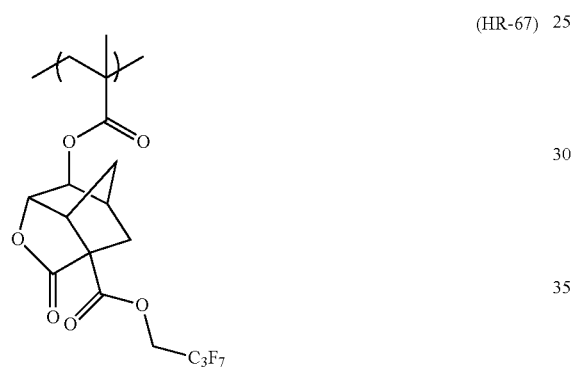
(HR-68)
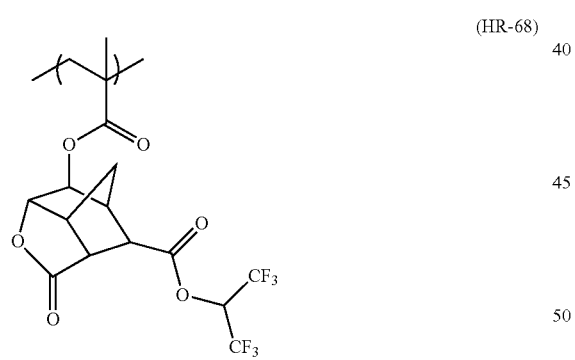
(HR-69)
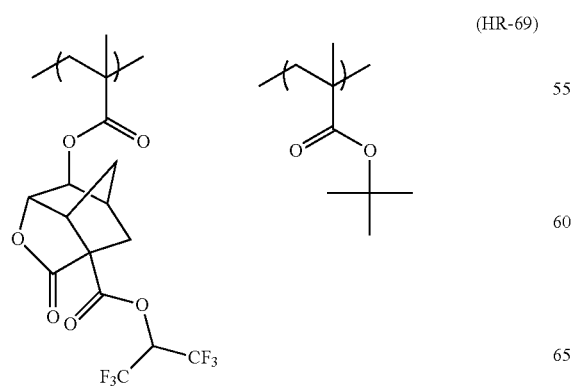
(HR-70)
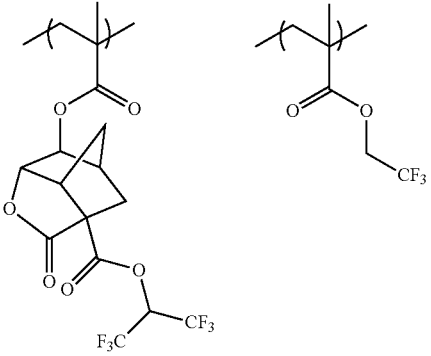
(HR-71)
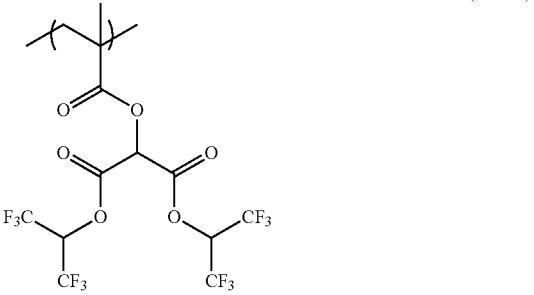
(HR-72)
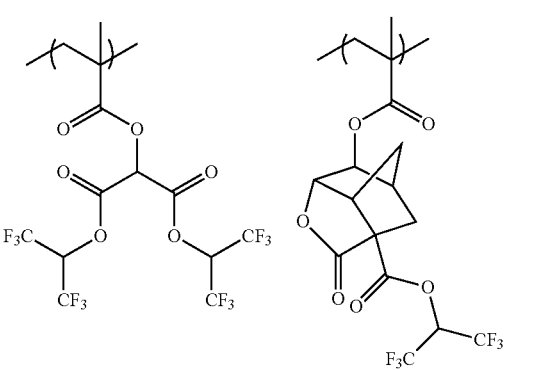
(HR-73)
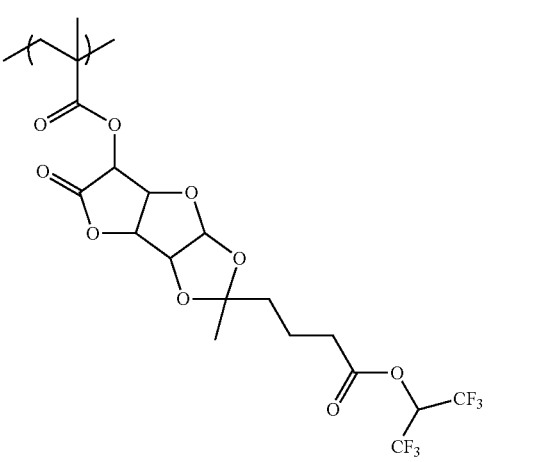

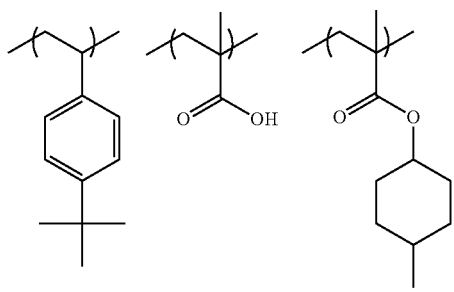
(HR-74)
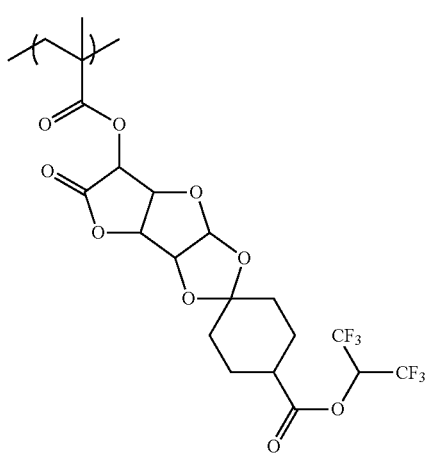
(HR-75)
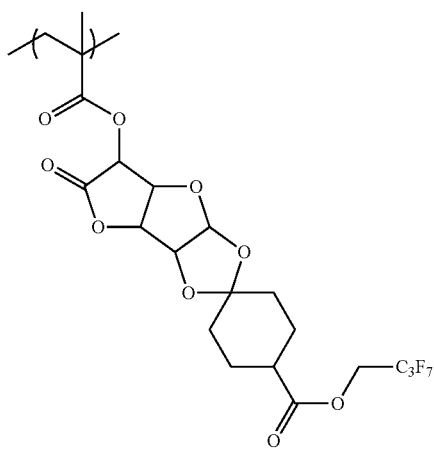
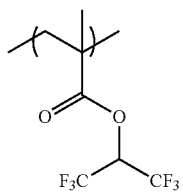
(HR-76)
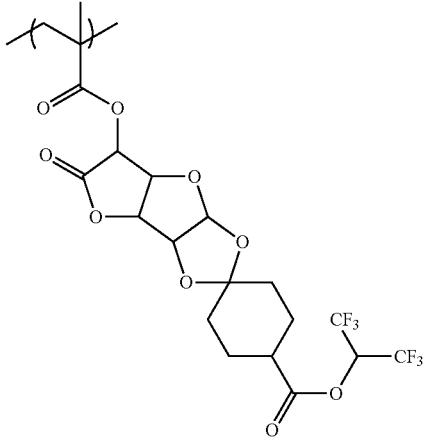
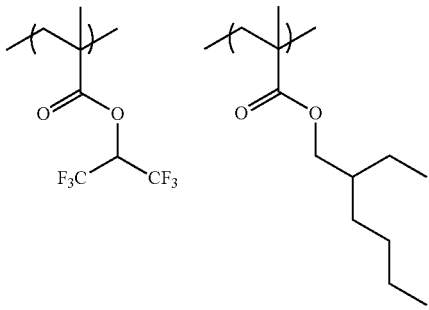
(HR-77)
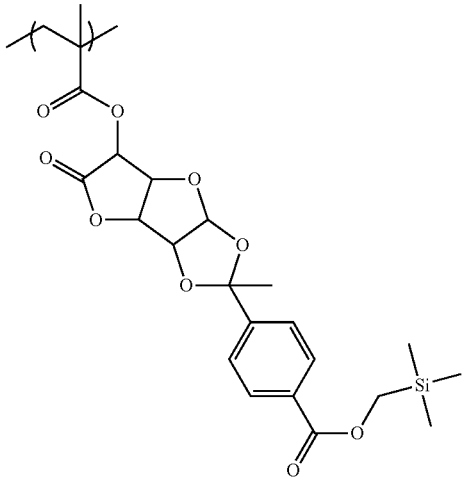

(HR-78)
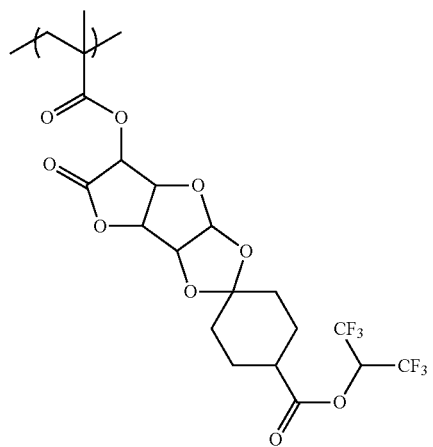
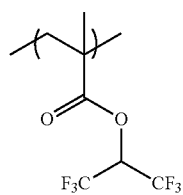
(HR-79)
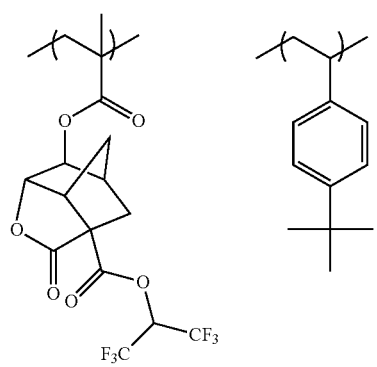  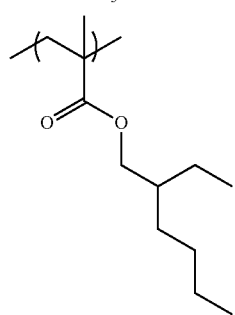
(HR-80)
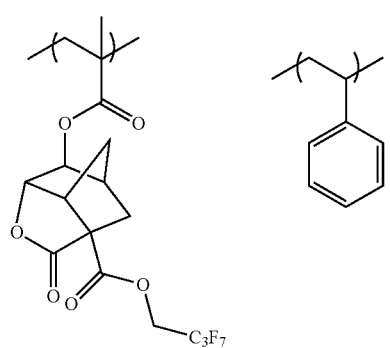
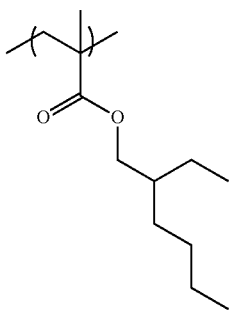
(HR-81)
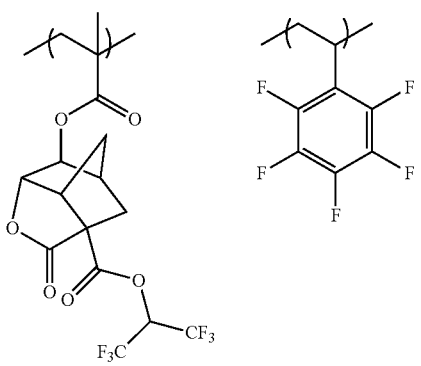
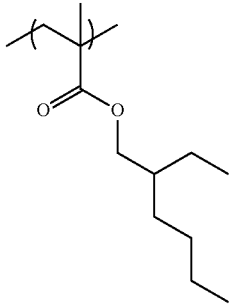
(HR-82)
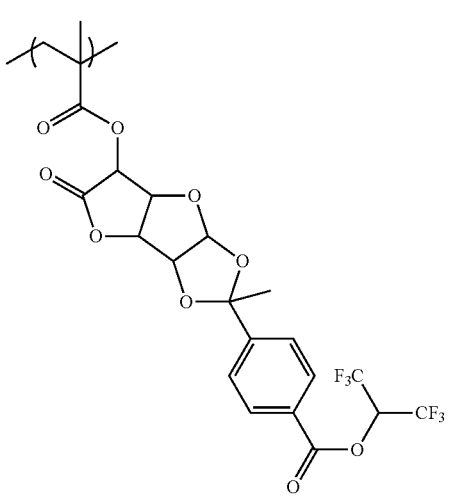

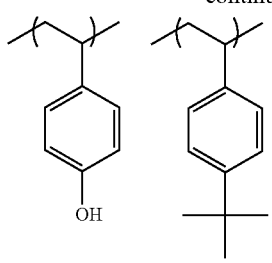
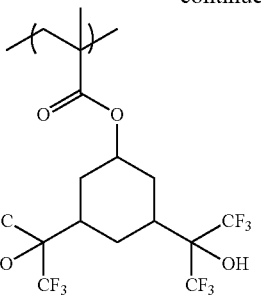
(HR-83)
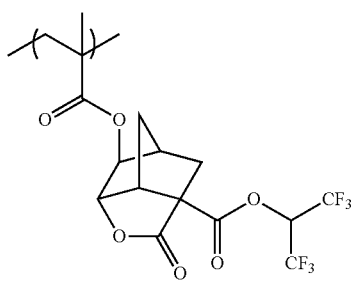
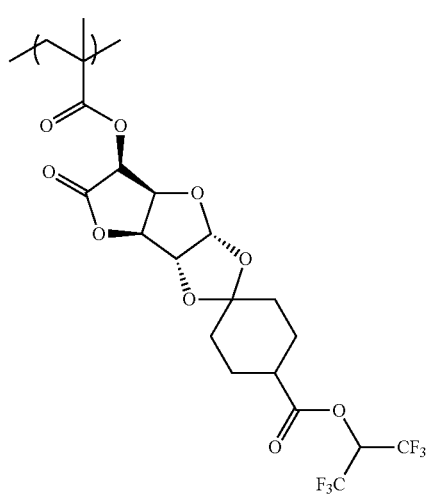
(HR-86)
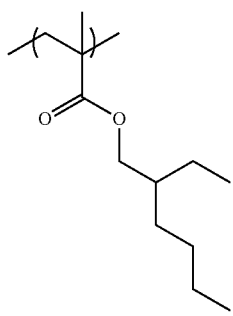
(HR-84)
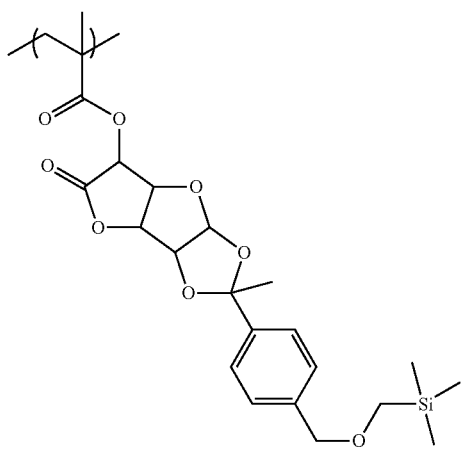
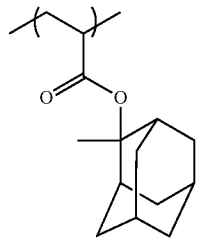
(HR-85)
(HR-87)
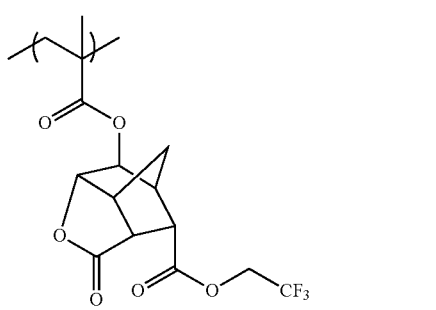
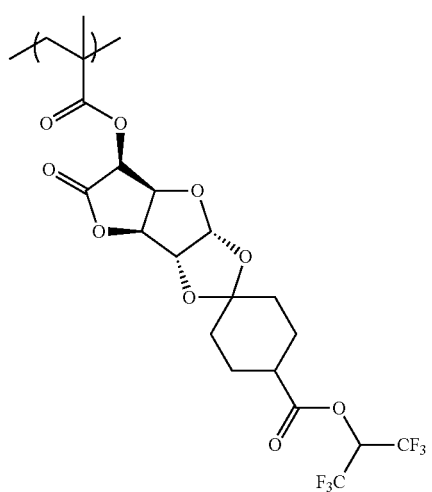

171
-continued
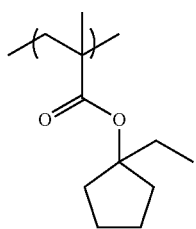
(HR-88)
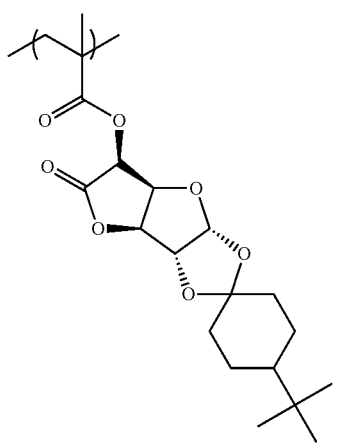
(HR-89)
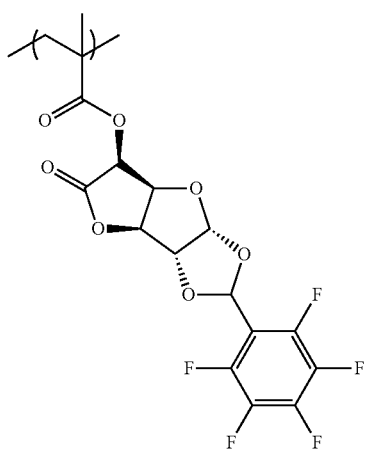
(HR-90)
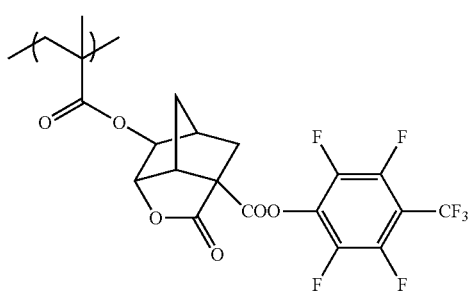
172
-continued
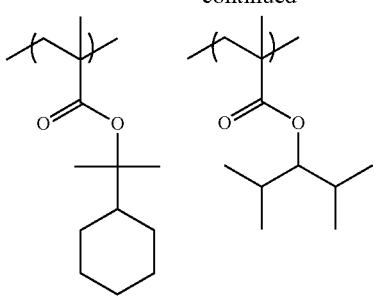
TABLE 1
| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |

TABLE 1-continued

| Resin | Composition | Mw | Mw/Mn |
|---|---|---|---|
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |

TABLE 2

| Resin | Composition | Mw | Mw/Mn |
|---|---|---|---|
| HR-66 | 100 | 6000 | 1.5 |
| HR-67 | 100 | 6000 | 1.4 |
| HR-68 | 100 | 9000 | 1.5 |
| HR-69 | 60/40 | 8000 | 1.3 |
| HR-70 | 80/20 | 5000 | 1.4 |
| HR-71 | 100 | 9500 | 1.5 |
| HR-72 | 40/60 | 8000 | 1.4 |
| HR-73 | 55/30/5/10 | 8000 | 1.3 |
| HR-74 | 100 | 13000 | 1.4 |
| HR-75 | 70/30 | 8000 | 1.3 |
| HR-76 | 50/40/10 | 9500 | 1.5 |
| HR-77 | 100 | 9000 | 1.6 |
| HR-78 | 80/20 | 3500 | 1.4 |
| HR-79 | 90/8/2 | 13000 | 1.5 |
| HR-80 | 85/10/5 | 5000 | 1.5 |
| HR-81 | 80/18/2 | 6000 | 1.5 |
| HR-82 | 50/20/30 | 5000 | 1.3 |
| HR-83 | 90/10 | 8000 | 1.4 |
| HR-84 | 100 | 9000 | 1.6 |
| HR-85 | 80/20 | 15000 | 1.6 |
| HR-86 | 70/30 | 4000 | 1.42 |
| HR-87 | 60/40 | 8000 | 1.32 |
| HR-88 | 100 | 3800 | 1.29 |
| HR-89 | 100 | 6300 | 1.35 |
| HR-90 | 50/40/10 | 8500 | 1.51 |

[5] (E) Basic Compound

The resist composition of the present invention preferably contains (E) a basic compound so as to reduce the change of performance with aging from exposure to heating.

The basic compound is preferably a compound having a structure represented by the following formulae (A) to (E):

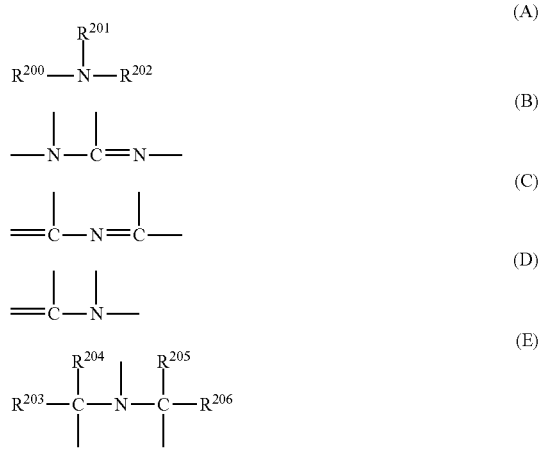

In formulae (A) to (E), each of $R^{200}$, $R^{201}$ and $R^{202}$, which may be the same or different, represents a hydrogen atom, an alkyl group (preferably having a carbon number of 1 to 20), a cycloalkyl group (preferably having a carbon number of 3 to 20) or an aryl group (having a carbon number of 6 to 20), and $R^{201}$ and $R^{202}$ may combine or an aryl group (having a carbon number of 6 to 20), and $R^{201}$ and $R^{202}$ may combine together to form a ring. Each of $R^{203}$, $R^{204}$, $R^{205}$ and $R^{206}$, which may be the same or different, represents an alkyl group having a carbon number of 1 to 20.

As for the alkyl group, the alkyl group having a substituent is preferably an aminoalkyl group having a carbon number of 1 to 20, a hydroxyalkyl group having a carbon number of 1 to 20, or a cyanoalkyl group having a carbon number of 1 to 20.

The alkyl group in formulae (A) to (E) is more preferably unsubstituted.

Preferred examples of the compound include guanidine, aminopyrrolidine, pyrazole, pyrazoline, piperazine, aminomorpholine, aminoalkylmorpholine and piperidine. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole and benzimidazole. Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene. Examples of the compound having an onium hydroxide structure include a triarylsulfonium hydroxide, a phenacylsulfonium hydroxide, and a sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. The compound having an onium carboxylate structure is a compound where the anion moiety of the compound having an onium hydroxide structure becomes a carboxylate, and examples thereof include an acetate, an adamantane-1-carboxylate and a perfluoroalkyl carboxylate. Examples of the compound having a trialkylamine structure include tri(n-butyl)amine and tri(n-octyl)amine. Examples of the compound having an aniline structure include 2,6-diisopropylaniline, N,N-dimethylaniline, N,N-dibutylaniline and N,N-dihexylaniline. Examples of the alkylamine derivative having a hydroxyl group and/or an ether bond include ethanolamine, diethanolamine, triethanolamine and tris(methoxyethoxyethyl)amine. Examples of the aniline derivative having a hydroxyl group and/or an ether bond include N,N-bis(hydroxyethyl)aniline.

Other preferred basic compounds include a phenoxy group-containing amine compound, a phenoxy group-containing ammonium salt compound, a sulfonic acid ester group-containing amine compound and a sulfonic acid ester group-containing ammonium salt compound.

In the phenoxy group-containing amine compound, phenoxy group-containing ammonium salt compound, sulfonic acid ester group-containing amine compound and sulfonic acid ester group-containing ammonium salt compound, at least one alkyl group is preferably bonded to the nitrogen atom. Also, an oxygen atom is preferably contained in the alkyl chain to form an oxyalkylene group. The number of oxyalkylene groups within the molecule is 1 or more, preferably from 3 to 9, more preferably from 4 to 6. Among oxyalkylene groups, structures of —$CH_2CH_2O$—, —$CH(CH_3)CH_2O$— and —$CH_2CH_2CH_2O$— are preferred.

Specific examples of the phenoxy group-containing amine compound, phenoxy group-containing ammonium salt compound, sulfonic acid ester group-containing amine compound and sulfonic acid ester group-containing ammonium salt compound include, but are not limited to, Compounds (C1-1) to (C3-3) illustrated in of U.S. Patent Application Publication 2007/0224539. One of these basic compounds may be used alone, or two or more kinds thereof may be used in combination.

The amount of the basic compound used is usually from 0.001 to 10 mass %, preferably from 0.01 to 5 mass %, based on the solid content of the resist composition.

The ratio between the acid generator and the basic compound used in the composition is preferably acid generator/basic compound (by mol)=from 2.5 to 300. That is, the molar ratio is preferably 2.5 or more in view of sensitivity and resolution and preferably 300 or less from the standpoint of suppressing the reduction in resolution due to thickening of the resist pattern with aging after exposure until heat treatment. The acid generator/basic compound (by mol) is more preferably from 5.0 to 200, still more preferably from 7.0 to 150.

[6] (F) Surfactant

The resist composition of the present invention may or may not further contain a surfactant and in the case of containing a surfactant, it is preferred to contain any one of fluorine-containing and/or silicon-containing surfactants (a fluorine-containing surfactant, a silicon-containing surfactant or a surfactant containing both a fluorine atom and a silicon atom), or two or more thereof.

By virtue of containing a surfactant, the resist composition of the present invention can give a resist pattern with good sensitivity, resolution and adherence as well as little development defect when used for exposure to a light source of 250 nm or less, particularly 220 nm or less.

Examples of the fluorine-containing and/or silicon-containing surfactants include the surfactants described in paragraph [0276] of U.S. Patent Application Publication 2008/0248425, such as EFtop EF301 and EF303 (produced by Shin-Akita Kasei K. K.); Florad FC430, 431 and 4430 (produced by Sumitomo 3M Inc.); Megaface F171, F173, F176, F189, F113, F110, F177, F120 and $R^{08}$ (produced by Dainippon Ink & Chemicals, Inc.); Surflon S-382, SC101, 102, 103, 104, 105 and 106 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); EFtop EF121, EF122A, EF122B, RF122C, EF125M, EF135M, EF351, EF352, EF801, EF802 and EF601 (produced by JEMCO Inc.); PF636, PF656, PF6320 and PF6520 (produced by OMNOVA); and FTX-204G, 208G, 218G, 230G, 204D, 208D, 212D, 218D and 222D (produced by NEOS Co., Ltd.). In addition, polysiloxane polymer KP-341 (produced by Shin-Etsu Chemical Co., Ltd.) may also be used as the silicon-containing surfactant.

Other than these known surfactants, a surfactant using a polymer having a fluoro-aliphatic group derived from a fluoro-aliphatic compound which is produced by a telomerization process (also called a telomer process) or an oligomerization process (also called an oligomer process), may be used. The fluoro-aliphatic compound can be synthesized by the method described in JP-A-2002-90991.

Examples of the surfactant coming under this type include Megaface F178, F-470, F-473, F-475, F-476 and F-472 (produced by Dainippon Ink & Chemicals, Inc.), a copolymer of a $C_6F_{13}$ group-containing acrylate (or methacrylate) with a (poly(oxyalkylene)) acrylate (or methacrylate), and a copolymer of a $C_3F_7$ group-containing acrylate (or methacrylate) with a (poly(oxyethylene)) acrylate (or methacrylate) and a (poly(oxypropylene)) acrylate (or methacrylate).

In the present invention, a surfactant other than the fluorine-containing and/or silicon-containing surfactants, described in paragraph [0280] of U.S. Patent Application Publication 2008/0248425, may also be used.

One of these surfactants may be used alone, or some of them may be used in combination.

In the case where the resist composition contains a surfactant, the amount of the surfactant used is preferably from 0.0001 to 2 mass %, more preferably from 0.0005 to 1 mass %, based on the entire amount of the resist composition (excluding the solvent).

On the other hand, by setting the amount added of the surfactant to 10 ppm or less based on the entire amount of the resist composition (excluding the solvent), the hydrophobic resin is more unevenly distributed to the surface, so that the resist film surface can be made more hydrophobic and the followability of water at the immersion exposure can be enhanced.

[7] (G) Onium Carboxylate

The resist composition of the present invention may or may not contain an onium carboxylate. Examples of the onium carboxylate include those described in paragraphs [0605] and [0606] of U.S. Patent Application Publication No. 2008/0187860.

Such an onium carboxylate can be synthesized by reacting a sulfonium, iodonium or ammonium hydroxide and a carboxylic acid with silver oxide in an appropriate solvent.

In the case where the resist composition contains an onium carboxylate, the content thereof is generally from 0.1 to 20 mass %, preferably from 0.5 to 10 mass %, more preferably from 1 to 7 mass %, based on the entire solid content of the composition.

[8] (H) Other Additives

The resist composition of the present invention may further contain, for example, a dye, a plasticizer, a photosensitizer, a light absorber, an alkali-soluble resin, a dissolution inhibitor, and a compound for accelerating dissolution in a developer (for example, a phenol compound having a molecular weight of 1,000 or less, or a carboxyl group-containing alicyclic or aliphatic compound), if desired.

The phenol compound having a molecular weight of 1,000 or less can be easily synthesized by one skilled in the art with reference to the method described, for example, in JP-A-4-122938, JP-A-2-28531, U.S. Pat. No. 4,916,210 and European Patent 219294.

Specific examples of the carboxyl group-containing alicyclic or aliphatic compound include, but are not limited to, a carboxylic acid derivative having a steroid structure, such as cholic acid, deoxycholic acid and lithocholic acid, an adamantanecarboxylic acid derivative, an adamantanedicarboxylic acid, a cyclohexanecarboxylic acid and a cyclohexanedicarboxylic acid.

The solid content concentration of the resist composition of the present invention is usually from 1.0 to 10 mass %, preferably from 2.0 to 5.7 mass %, more preferably from 2.0 to 5.3 mass %. When the solid content concentration is in this range, the resist solution can be uniformly coated on a substrate and moreover, a resist pattern improved in the line edge roughness can be formed. The reasons therefor are not clearly know, but it is considered that by setting the solid content concentration to 10 mass % or less, preferably 5.7 mass % or less, the materials, particularly the photoacid generator, in the resist solution are prevented from aggregation, as a result, a uniform resist film can be formed.

The solid content concentration is a weight percentage of the weight of resist components excluding solvents, based on the total weight of the resist composition.

[9] Pattern Forming Method

The pattern forming method (negative pattern forming method) of the present invention includes:
(i) a step of forming a film (resist film) from a chemical amplification resist composition,
(ii) a step of exposing the film, and
(iii) a step of developing the exposed film by using an organic solvent-containing developer.

The resist film is formed from the above-described chemical amplification resist composition of the present invention and, more specifically, is preferably formed on a substrate. In the pattern forming method of the present invention, the step of forming a film from a resist composition on a substrate, the step of exposing the film, and the development step can be performed by a generally known method.

The present invention also relates to a chemical amplification resist composition used for the pattern forming method.

The pattern forming method also preferably contains, after film formation, a pre-baking step (PB) before entering the exposure step.

Furthermore, the pattern forming method also preferably contains a post-exposure baking step (PEB) after the exposure step but before the development step.

As for the heating temperature, both PB and PEB are preferably performed at 70 to 120° C., more preferably at 80 to 110° C.

The heating time is preferably from 30 to 300 seconds, more preferably from 30 to 180 seconds, still more preferably from 30 to 90 seconds.

The heating can be performed using a device attached to an ordinary exposure/developing machine or may be performed using a hot plate or the like.

Thanks to baking, the reaction in the exposed area is accelerated, and the sensitivity and pattern profile are improved.

The light source wavelength of the exposure apparatus for use in the present invention is not limited, but, for example, a KrF excimer laser wavelength (248 nm), an ArF excimer laser wavelength (193 nm) and an $F_2$ excimer laser wavelength (157 nm) are applicable.

In the present invention, an immersion exposure method can be applied in the step of performing exposure.

The immersion exposure method is a technique to increase the resolution, and this is a technique of performing the exposure by filling a high refractive-index liquid (hereinafter, sometimes referred to as an "immersion liquid") between the projection lens and the sample As for the "effect of immersion", assuming that $\lambda_0$ is the wavelength of exposure light in air, n is the refractive index of the immersion liquid based on air, $\theta$ is the convergence half-angle of beam and $NA_0 = \sin \theta$, the resolution and the depth of focus in immersion can be expressed by the following formulae. Here, $k_1$ and $k_2$ are coefficients related to the process.

(Resolution)=$k_1 \cdot (\lambda_0/n)/NA_0$ (Depth of focus)=$\pm k_2 \cdot (\lambda_0/n)/NA_0^2$ That is, the effect of immersion is equal to use of an exposure wavelength of 1/n. In other words, in the case of a projection optical system having the same NA, the depth of focus can be made n times larger by the immersion. This is effective for all pattern profiles and furthermore, can be combined with the super-resolution technology under study at present, such as phase-shift method and modified illumination method.

In the case of performing immersion exposure, a step of washing the film surface with an aqueous chemical solution may be performed (1) before the exposure step after forming the film on a substrate and/or (2) after the step of exposing the film through an immersion liquid but before the step of heating the film.

The immersion liquid is preferably a liquid being transparent to light at the exposure wavelength and having as small a temperature coefficient of refractive index as possible in order to minimize the distortion of an optical image projected on the film. Particularly, when the exposure light source is an ArF excimer laser (wavelength: 193 nm), water is preferably used in view of easy availability and easy handleability in addition to the above-described aspects.

In the case of using water, an additive (liquid) capable of decreasing the surface tension of water and increasing the surface activity may be added in a small ratio. This additive is preferably a liquid that does not dissolve the resist layer on the wafer and at the same time, gives only a negligible effect on the optical coat at the undersurface of the lens element.

Such an additive is preferably, for example, an aliphatic alcohol having a refractive index nearly equal to that of water, and specific examples thereof include methyl alcohol, ethyl alcohol and isopropyl alcohol. By virtue of adding an alcohol having a refractive index nearly equal to that of water, even when the alcohol component in water is evaporated and its content concentration is changed, the change in the refractive index of the entire liquid can be advantageously made very small.

On the other hand, if a substance opaque to light at 193 nm or an impurity greatly differing in the refractive index from water is mingled, this incurs distortion of the optical image projected on the resist. Therefore, the water used is preferably distilled water. Pure water after further filtration through an ion exchange filter or the like may also be used.

In the present invention, the substrate on which the film is formed is not particularly limited, and an inorganic substrate such as silicon, SiN, $SiO_2$ and SiN, a coating-type inorganic substrate such as SOG, or a substrate generally used in the process of producing a semiconductor such as IC or producing a liquid crystal device or a circuit board such as thermal head or in the lithography process of other photo-fabrication processes can be used. If desired, an organic antireflection film may be formed between the film and the substrate.

In the case where the pattern forming method of the present invention further includes a step of developing the film with an alkali developer, examples of the alkali developer which can be used include an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, or cyclic amines such as pyrrole and piperidine, can be used.

This alkaline aqueous solution above may also be used after adding thereto alcohols and a surfactant each in an appropriate amount.

The alkali concentration of the alkali developer is usually from 0.1 to 20 mass %.

The pH of the alkali developer is usually from 10.0 to 15.0.

In particular, an aqueous 2.38 mass % tetramethylammonium hydroxide solution is preferred.

As for the rinsing solution in the rinsing treatment performed after the alkali development, pure water is used, and the pure water may be used after adding thereto a surfactant in an appropriate amount.

As for the developer which can be used in the step of developing the film by using an organic solvent-containing developer (hereinafter, sometimes referred to as an "organic developer"), a polar solvent such as ketone-based solvent, ester-based solvent, alcohol-based solvent, amide-based solvent and ether-based solvent, or a hydrocarbon-based solvent can be used.

Examples of the ketone-based solvent include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetyl acetone, acetonyl acetone, ionone, diacetonyl alcohol, acetyl carbinol, acetophenone, methyl naphthyl ketone, isophorone and propylene carbonate.

Examples of the ester-based solvent include methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate.

Examples of the alcohol-based solvent include an alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; and a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol.

Examples of the ether-based solvent include, in addition to the glycol ether-based solvents above, dioxane and tetrahydrofuran.

Examples of the amide-based solvent which can be used include N-methyl-2-pyrrolidone, N,N-dimethylacetamide, N,N-dimethylformamide, hexamethylphosphoric triamide and 1,3-dimethyl-2-imidazolidinone.

Examples of the hydrocarbon-based solvent include an aromatic hydrocarbon-based solvent such as toluene and xylene, and an aliphatic hydrocarbon-based solvent such as pentane, hexane, octane and decane.

A plurality of these solvents may be mixed, or the solvent may be used by mixing it with a solvent other than those described above or with water. However, in order to sufficiently bring out the effects of the present invention, the water content ratio in the entire developer is preferably less than 10 mass %, and it is more preferred to contain substantially no water.

That is, the amount of the organic solvent used in the organic developer is preferably from 90 to 100 mass %, more preferably from 95 to 100 mass %, based on the entire amount of the developer.

In particular, the organic developer is preferably a developer containing at least one kind of an organic solvent selected from a ketone-based solvent, an ester-based solvent, an alcohol-based solvent, an amide-based solvent and an ether-based solvent.

The vapor pressure at 20° C. of the organic developer is preferably 5 kPa or less, more preferably 3 kPa or less, still more preferably 2 kPa or less. By setting the vapor pressure of the organic developer to 5 kPa or less, evaporation of the developer on a substrate or in a development cup is suppressed and the temperature uniformity in the wafer plane is enhanced, as a result, the dimensional uniformity in the wafer plane is improved.

Specific examples of the solvent having a vapor pressure of 5 kPa or less include a ketone-based solvent such as 1-octanone, 2-octanone, 1-nonanone, 2-nonanone, 4-heptanone, 2-hexanone, diisobutyl ketone, cyclohexanone, methylcyclohexanone, phenylacetone and methyl isobutyl ketone; an ester-based solvent such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, butyl formate, propyl formate, ethyl lactate, butyl lactate and propyl lactate; an alcohol-based solvent such as n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an ether-based solvent such as tetrahydrofuran; an amide-based solvent such as N-methyl-2-pyrrolidone, N,N-dimethylacetamide and N,N-dimethylformamide; an aromatic hydrocarbon-based solvent such as toluene and xylene; and an aliphatic hydrocarbon-based solvent such as octane and decane.

Specific examples of the solvent having a vapor pressure of 2 kPa or less that is a particularly preferred range include a ketone-based solvent such as 1-octanone, 2-octanone, 1-nonanone, 2-nonanone, 4-heptanone, 2-hexanone, diisobutyl ketone, cyclohexanone, methylcyclohexanone and phenylacetone; an ester-based solvent such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, ethyl lactate, butyl lactate and propyl lactate; an alcohol-based solvent such as n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an amide-based solvent such as N-methyl-2-pyrrolidone, N,N-dimethylacetamide and N,N-dimethylformamide; an aromatic hydrocarbon-based solvent such as xylene; and an aliphatic hydrocarbon-based solvent such as octane and decane.

In the organic developer, a surfactant can be added in an appropriate amount, if desired.

The surfactant is not particularly limited but, for example, an ionic or nonionic fluorine-containing and/or silicon-containing surfactant can be used. Examples of such a fluorine-containing and/or silicon-containing surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988 and U.S. Pat. Nos. 5,405,720, 5,360,692, 5,529,881, 5,296,330, 5,436,098, 5,576,143, 5,294,511 and 5,824,451. A nonionic surfactant is preferred. The nonionic surfactant is not particularly limited, but use of a fluorine-containing surfactant or a silicon-containing surfactant is more preferred.

The amount of the surfactant used is usually from 0.001 to 5 mass %, preferably from 0.005 to 2 mass %, more preferably from 0.01 to 0.5 mass %, based on the entire amount of the developer.

As regards the developing method, for example, a method of dipping the substrate in a bath filled with the developer for a fixed time (dipping method), a method of raising the developer on the substrate surface by the effect of a surface tension and keeping it still for a fixed time, thereby performing the development (puddle method), a method of spraying the developer on a substrate surface (spraying method), and a method of continuously ejecting the developer on the substrate spinning at a constant speed while scanning the developer ejecting nozzle at a constant rate (dynamic dispense method) may be applied.

In the case where the above-described various developing methods include a step of ejecting the developer toward the resist film from a development nozzle of a developing apparatus, the ejection pressure of the developer ejected (the flow velocity per unit area of the developer ejected) is preferably 2 $mL/sec/mm^2$ or less, more preferably 1.5 $mL/sec/mm^2$ or less, still more preferably 1 $mL/sec/mm^2$ or less. The flow velocity has no particular lower limit but in view of throughput, is preferably 0.2 $mL/sec/mm^2$ or more.

By setting the ejection pressure of the ejected developer to the range above, pattern defects attributable to the resist residue after development can be greatly reduced.

Details of this mechanism are not clearly known, but it is considered that thanks to the ejection pressure in the above-described range, the pressure imposed on the resist film by the developer becomes small and the resist film or resist pattern is kept from inadvertent chipping or collapse.

Here, the ejection pressure ($mL/sec/mm^2$) of the developer is a value at the outlet of a development nozzle in a developing apparatus.

Examples of the method for adjusting the ejection pressure of the developer include a method of adjusting the ejection pressure by a pump or the like, and a method of supplying the developer from a pressurized tank and adjusting the pressure to change the ejection pressure.

After the step of developing the film by using an organic solvent-containing developer, a step of stopping the development by replacing the solvent with another solvent may be practiced.

A step of washing the film with a rinsing solution is preferably provided after the step of developing the film by using an organic solvent-containing developer.

The rinsing solution used in the rinsing step after the step of developing the film by using an organic solvent-containing developer is not particularly limited as long as it does not dissolve the resist pattern, and a solution containing a general organic solvent may be used. As for the rinsing solution, a rinsing solution containing at least one kind of an organic solvent selected from the group consisting of a hydrocarbon-based solvent, a ketone-based solvent, an ester-based solvent, an alcohol-based solvent, an amide-based solvent and an ether-based solvent is preferably used.

Specific examples of the hydrocarbon-based solvent, ketone-based solvent, ester-based solvent, alcohol-based solvent, amide-based solvent and ether-based solvent, are the same as those described above for the organic solvent-containing developer.

After the step of developing the film by using an organic solvent-containing developer, more preferably, a step of washing the film by using a rinsing solution containing at least one kind of an organic solvent selected from the group consisting of a ketone-based solvent, an ester-based solvent, an alcohol-based solvent and an amide-based solvent is preformed; still more preferably, a step of washing the film by using a rinsing solution containing an alcohol-based solvent or an ester-based solvent is performed; yet still more preferably, a step of washing the film by using a rinsing solution containing a monohydric alcohol is performed; and most preferably, a step of washing the film by using a rinsing solution containing a monohydric alcohol having a carbon number of 5 or more is performed.

The monohydric alcohol used in the rinsing step includes a linear, branched or cyclic monohydric alcohol, and specific examples of the monohydric alcohol which can be used include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol and 4-octanol. As for the particularly preferred monohydric alcohol having a carbon number of 5 or more, 1-hexanol, 2-hexanol, 4-methyl-2-pentanol, 1-pentanol, 3-methyl-1-butanol and the like can be used.

A plurality of these components may be mixed, or the solvent may be used by mixing it with an organic solvent other than those described above.

The water content ratio in the rinsing solution is preferably 10 mass % or less, more preferably 5 mass % or less, still more preferably 3 mass % or less. By setting the water content ratio to 10 mass % or less, good development characteristics can be obtained.

The vapor pressure at 20° C. of the rinsing solution used after the step of developing the film by using an organic solvent-containing developer is preferably from 0.05 to 5 kPa, more preferably from 0.1 to 5 kPa, and most preferably from 0.12 to 3 kPa. By setting the vapor pressure of the rinsing solution to the range from 0.05 to 5 kPa, the temperature uniformity in the wafer plane is enhanced and moreover, swelling due to permeation of the rinsing solution is suppressed, as a result, the dimensional uniformity in the wafer plane is improved.

The rinsing solution may also be used after adding thereto a surfactant in an appropriate amount.

In the rinsing step, the wafer after development using an organic solvent-containing developer is washed using the above-described organic solvent-containing rinsing solution. The method for washing treatment is not particularly limited, but examples of the method which can be applied include a method of continuously ejecting the rinsing solution on the substrate spinning at a constant speed (spin coating method), a method of dipping the substrate in a bath filled with the rinsing solution for a fixed time (dipping method), and a method of spraying the rinsing solution on the substrate surface (spraying method). Above all, it is preferred to perform the washing treatment by the spin coating method and after the washing, remove the rinsing solution from the substrate surface by spinning the substrate at a rotational speed of 2,000 to 4,000 rpm. It is also preferred to contain a heating step (Post Bake) after the rinsing step. The developer and rinsing solution remaining between patterns and in the inside of the pattern are removed by the baking. The heating step after the rinsing step is performed at usually from 40 to 160° C., preferably from 70 to 95° C., and for usually from 10 seconds to 3 minutes, preferably from 30 to 90 seconds.

EXAMPLES

The present invention is described below by referring to Examples, but the present invention should not be construed as being limited thereto.

Synthesis Example 1

Synthesis of Resin (A-1)

In a nitrogen stream, a three-neck flask was charged with 40 g of cyclohexanone and heated at 80° C. (Solvent 1). Monomers corresponding to the following repeating units were dissolved in a molar ratio of 40/40/20 in cyclohexanone to prepare a 22 mass % monomer solution (400 g), and polymerization initiator V-601 (produced by Wako Pure Chemical Industries, Ltd.) in a concentration of 7.2 mol % based on the monomers was added thereto and dissolved. The resulting solution was added dropwise to Solvent 1 over 6 hours. After the completion of dropwise addition, the reaction was further allowed to proceed at 80° C. for 2 hours. The reaction solution was left standing to cool and then poured in 3,600 ml of heptane/400 ml of ethyl acetate, and the powder precipitated was collected by filtration and dried, as a result, 74 g of Resin (A-1) was obtained. The weight average molecular weight of the obtained Resin (A-1) was 8,000 and the polydispersity (Mw/Mn) was 1.5.

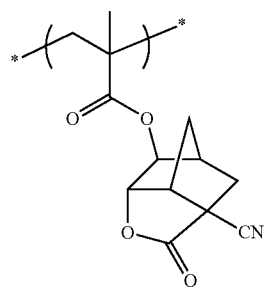

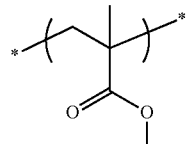

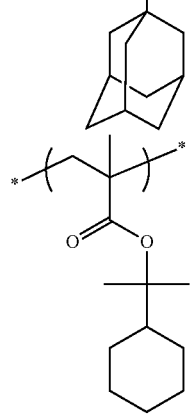

(A-1)

Synthesis Example 2

Synthesis of Hydrophobic Resin (3b)

Synthesis of Compound (4)

Compound (1) shown below was synthesized by the method described in International Publication No. 07/037,213, pamphlet.

150.00 g of water was added to 35.00 g of Compound (1), and 27.30 g of sodium hydroxide was further added. The mixture was stirred for 9 hours under heating and refluxing conditions. The resulting reaction solution was made acidic by adding hydrochloric acid and then extracted with ethyl acetate. The organic layers were combined and concentrated to obtain 36.90 g of Compound (2) (yield: 93%).

$^1$H-NMR (400 MHz in $(CD_3)_2CO$): σ (ppm)=1.56-1.59 (1H), 1.68-1.72 (1H), 2.13-2.15 (1H), 2.13-2.47 (2H), 3.49-3.51 (1H), 3.68 (1H), 4.45-4.46 (1H).

Subsequently, 200 ml of $CHCl_3$ was added to 20.00 g of Compound (2), and 50.90 g of 1,1,1,3,3,3-hexafluoroisopropyl alcohol and 30.00 g of 4-dimethylaminopyridine were further added, followed by stirring. To the resulting solution, 22.00 g of 1-ethyl-3-(3-dimethylaminopropyl)carbodiimide hydrochloride was added, and the mixture was stirred for 3 hours. This reaction solution was added to 500 ml of 1 N HCl to stop the reaction, and the organic layer was washed further with 1 N HCl and then washed with water. The obtained organic layer was concentrated to obtain 30.00 g of Compound (3) (yield: 85%).

$^1$H-NMR (400 MHz in $(CD_3)_2CO$): σ (ppm)=1.62 (1H), 1.91-1.95 (1H), 2.21-2.24 (1H), 2.45-2.53 (2H), 3.61-3.63 (1H), 3.76 (1H), 4.32-4.58 (1H), 6.46-6.53 (1H).

Thereafter, 300.00 g of toluene was added to 15.00 g of Compound (3), and 3.70 g of methacrylic acid and 4.20 g of p-toluenesulfonic acid monohydrate were further added. The mixture was refluxed for 15 hours while azeotropically removing the water produced, and the resulting reaction solution was concentrated. The concentrate was purified by column chromatography to obtain 11.70 g of Compound (4) (yield: 65%).

$^1$H-NMR (400 MHz in $(CD_3)_2CO$): σ (ppm)=1.76-1.79 (1H), 1.93 (3H), 2.16-2.22 (2H), 2.57-2.61 (1H), 2.76-2.81 (1H), 3.73-3.74 (1H), 4.73 (1H), 4.84-4.86 (1H), 5.69-5.70 (1H), 6.12 (1H), 6.50-6.56 (1H).

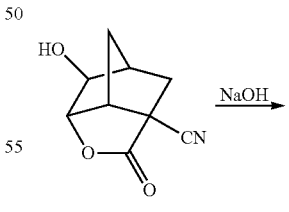

1

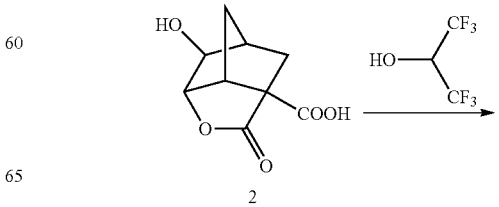

2

-continued

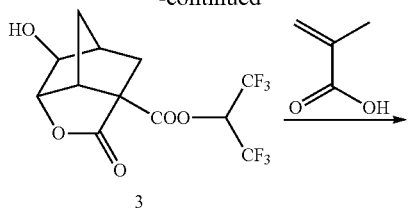

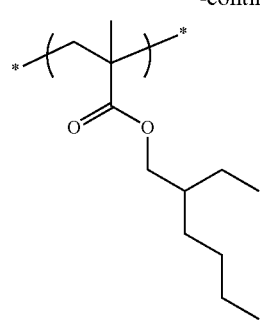

Synthesis of Hydrophobic Resin (3b)

Respective monomers corresponding to the following repeating units were charged in a ratio (molar ratio) of 90/8/2 and dissolved in PGMEA to prepare 450 g of a solution having a solid content concentration of 15 mass %. To this solution, 1 mol % of polymerization initiator V-60 produced by Wako Pure Chemical Industries, Ltd. was added and in a nitrogen atmosphere, the resulting mixture was added dropwise over 6 hours to 50 g of PGMEA heated to 100° C. After the completion of dropwise addition, the reaction solution was stirred for 2 hours. Once the reaction was completed, the reaction solution was cooled to room temperature and crystallized from 5 L of methanol, and the precipitated white powder was filtered to collect the objective Resin (3b).

The compositional ratio (molar ratio) of the polymer determined from NMR was 90/8/2. Also, the weight average molecular weight in terms of standard polystyrene as determined by GPC measurement was 10,000, and the polydispersity was 1.5.

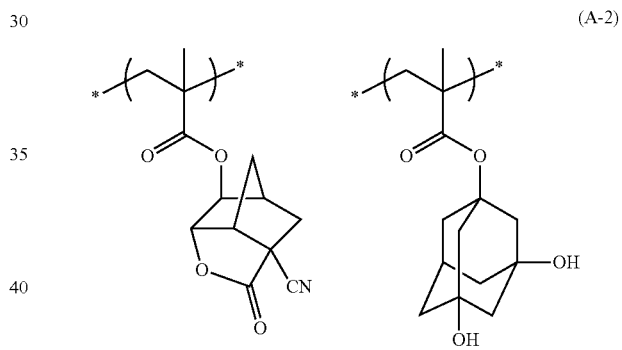

(3b)

-continued

Resins (A-2) to (A-11) and Hydrophobic Resins (1b) and (2b) were synthesized in the same manner as in Synthesis Examples 1 and 2 except for using monomers corresponding to respective repeating units to give a desired compositional ratio (molar ratio). Here, Hydrophobic Resins (1b) to (3b) come under the hydrophobic resin (D).

Structures of Resins (A-2) to (A-11) and Resins (1b) and (2b) are shown below. Also, the compositional ratio (molar ratio), weight average molecular weight and polydispersity of each of Resins (A-2) to (A-11) and Resins (1b) and (2b), including Resin (A-1) and Resin (3b), are shown in Table 3.

(A-2)

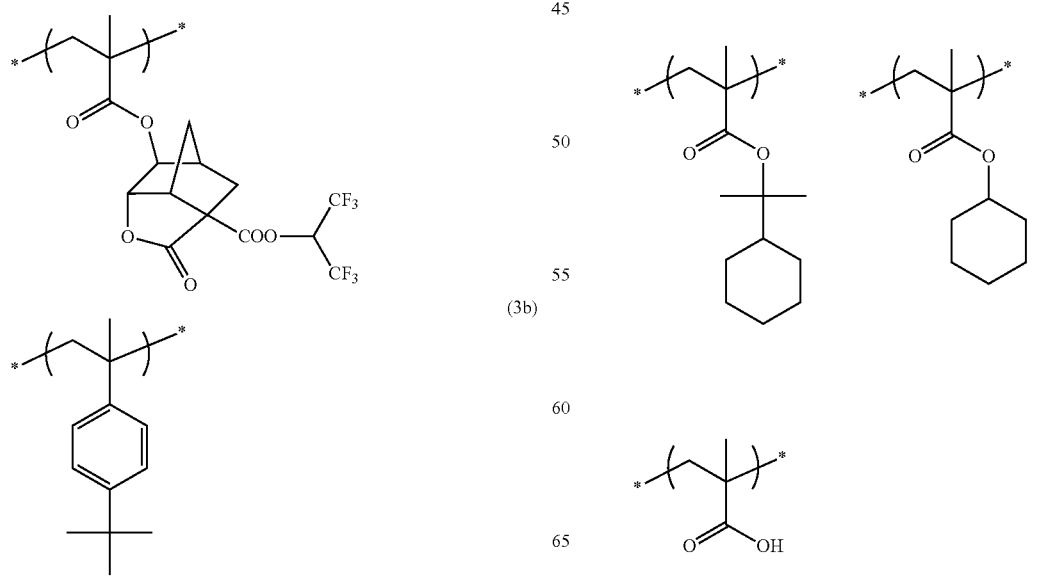

-continued
(A-3)
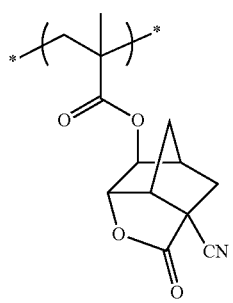 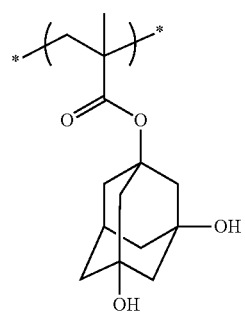
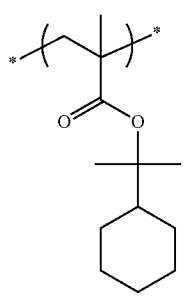 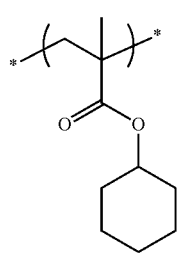
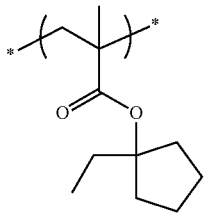 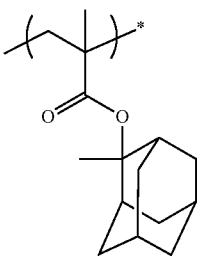
(A-6)
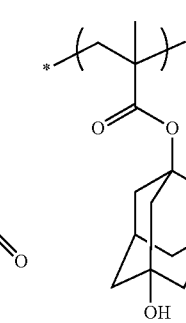 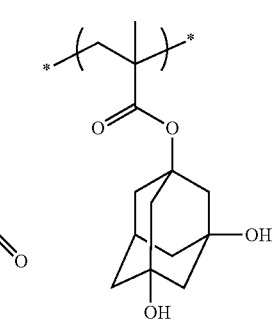
(A-4)
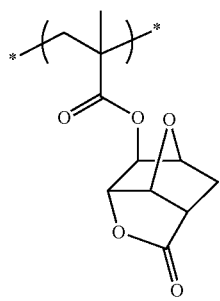 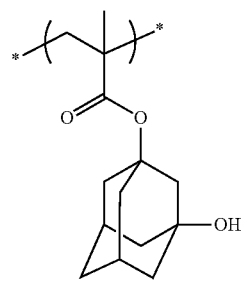
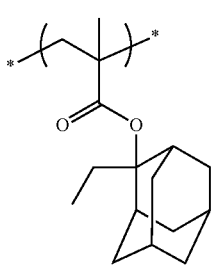
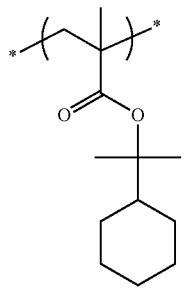 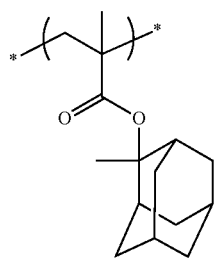
(A-7)
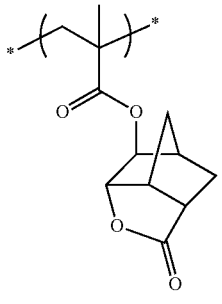 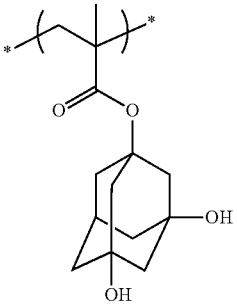
(A-5)
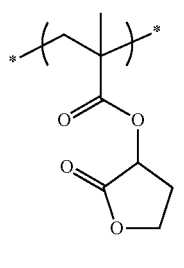 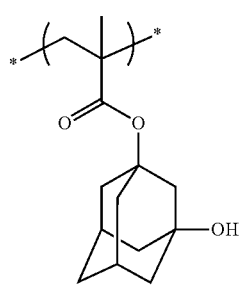
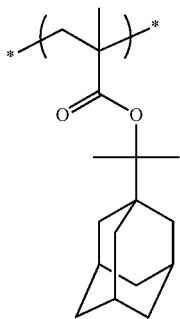

(A-8)
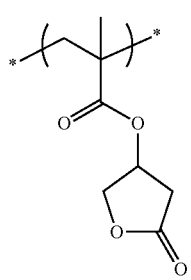 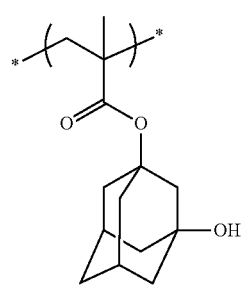
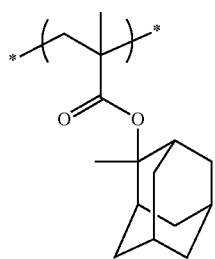 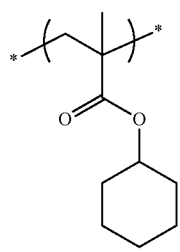
(A-9)
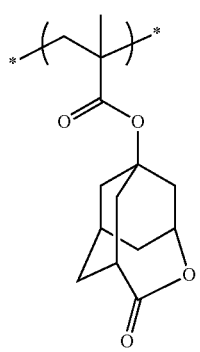 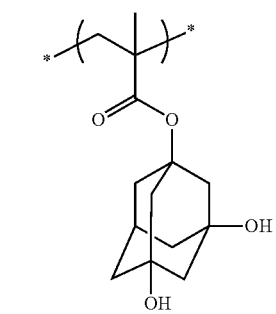
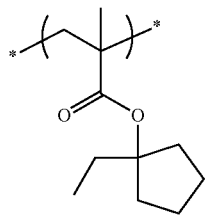 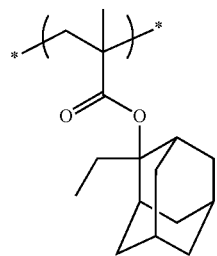
(A-10)
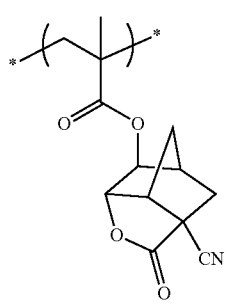 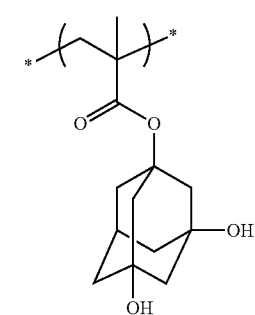
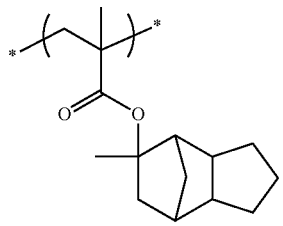
(A-11)
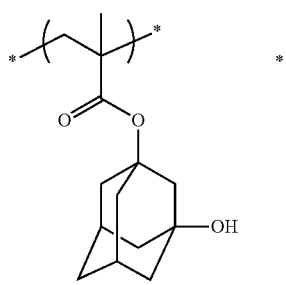 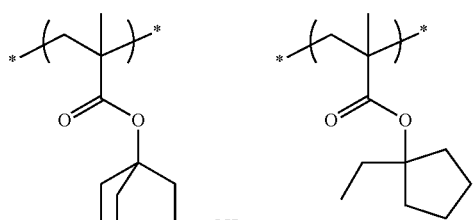
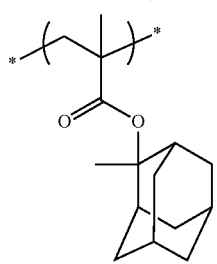
(1b)
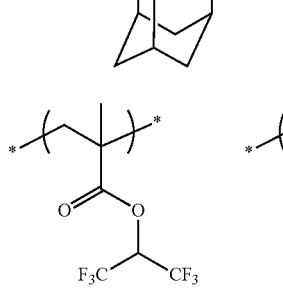 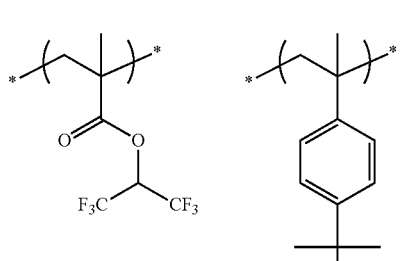
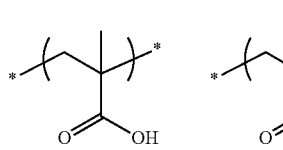 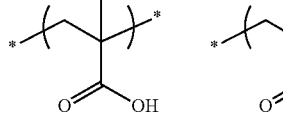 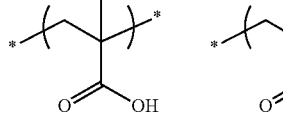
(2b)
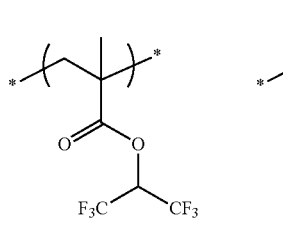 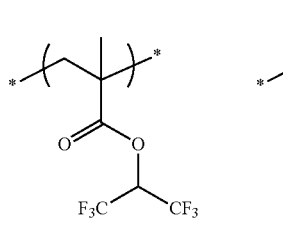

TABLE 3

| Resin | Composition (mol %) | Weight Average Molecular Weight (Mw) | Polydispersity (Mw/Mn) |
|---|---|---|---|
| A-1 | 40/40/20 | 8,000 | 1.5 |
| A-2 | 35/10/40/10/5 | 10,000 | 1.8 |
| A-3 | 40/10/40/10 | 9,000 | 1.4 |
| A-4 | 40/20/20/20 | 8,500 | 1.6 |
| A-5 | 40/20/20/20 | 9,500 | 1.5 |
| A-6 | 36/25/39 | 9,000 | 1.6 |
| A-7 | 40/20/40 | 8,000 | 1.5 |
| A-8 | 30/10/40/20 | 7,000 | 1.4 |
| A-9 | 40/20/20/20 | 12,000 | 1.5 |
| A-10 | 40/20/40 | 9,000 | 1.6 |
| A-11 | 60/30/10 | 9,200 | 1.6 |
| 1b | 39/57/2/2 | 4,500 | 1.4 |
| 2b | 40/60 | 4,300 | 1.4 |
| 3b | 90/8/2 | 10,000 | 1.5 |

Synthesis Example 3

Synthesis of Acid Generator (B-2)

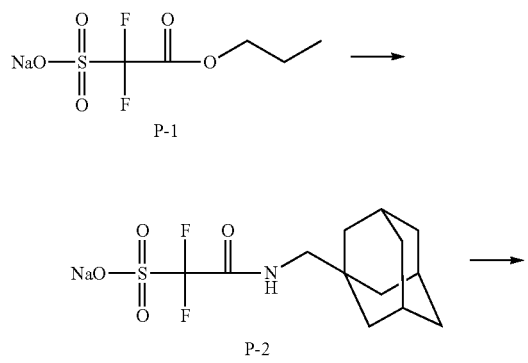

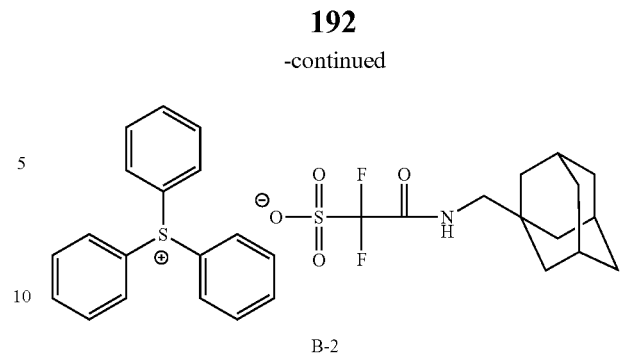

B-2

Compound P-1 was synthesized by referring to the method described in JP-A-2008-170983. After dissolving Compound P-1 (3 g, purity: 62.5%) in tetrahydrofuran (THF) (20 g), 1-adamantanemethylamine (2.27 g) was added thereto, and the resulting mixture was stirred at room temperature for 12 hours. The reaction solution was concentrated in an evaporator to obtain P-2 as a crude product (white solid), and the obtained crude product was dissolved in a mixed solution of 20 g of water and 20 g of acetonitrile. Triphenylsulfonium bromide (4.29 g) was added thereto, and the resulting mixture was stirred for 15 minutes. The reaction solution was concentrated in an evaporator to remove acetonitrile and then extracted twice by using 50 g of chloroform for each time, and the organic layer was washed three times by using 100 g of deionized water for each time. The organic layer was concentrated in an evaporator to obtain Compound B-2 as a white solid (4.53 g, yield: 62%).

$^1$H NMR Spectrum (DMSO-d6): σ (ppm) 1.429 (6H, d), 1.598 (6H, dd), 1.900 (3H, s), 2.502 (2H, m), 7.768-7.887 (15H, m), 7.889-8.000 (1H, M).

Other acid generators were synthesized using the same technique.

Structures of Acid Generators (B-1) to (B-34) are shown below. Here, Acid Generators (B-1) to (B-12) and (B-24) to (B-34) come under the compound (B), and Acid Generators (B-13) to (B-23) come under the compound (B').

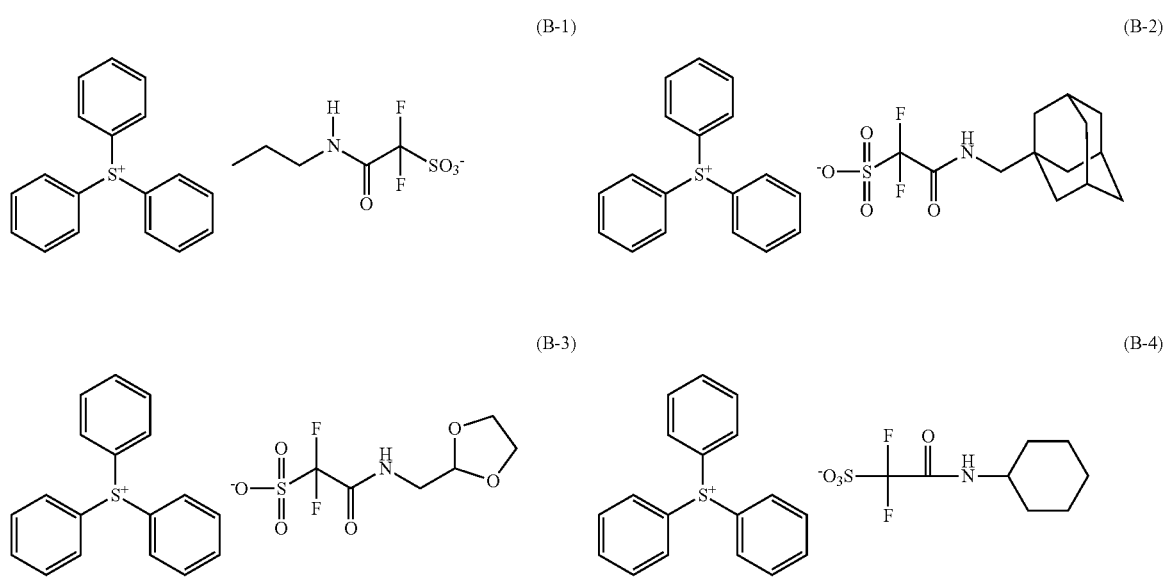

-continued
(B-5)
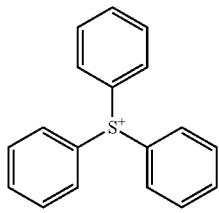 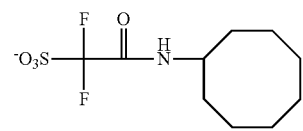
(B-6)
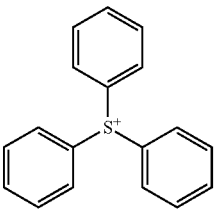 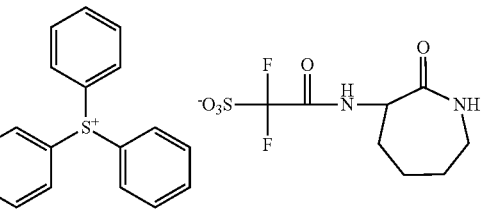
(B-7)
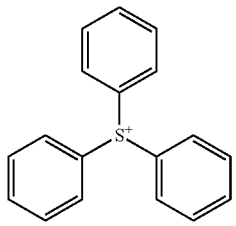 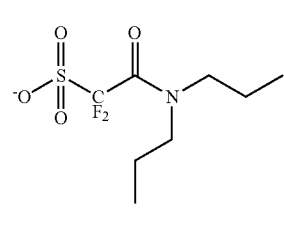
(B-8)
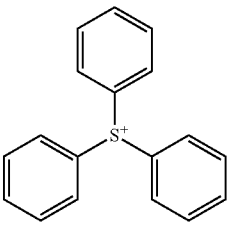 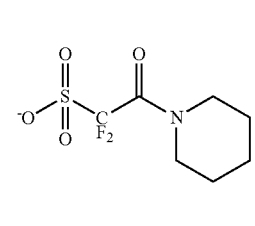
(B-9)
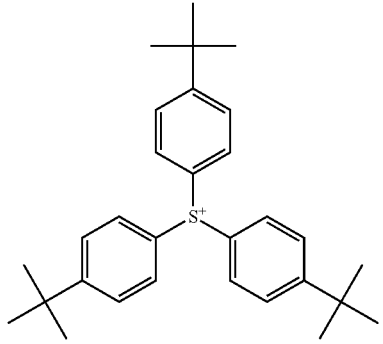 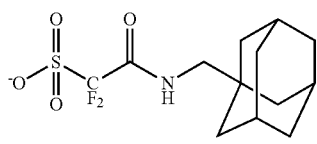
(B-10)
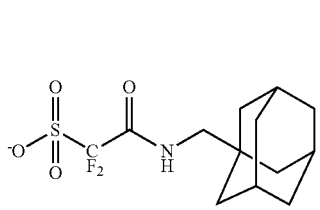 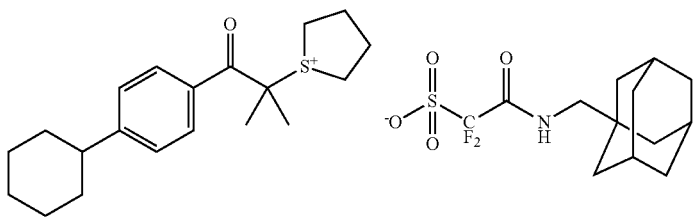
(B-11)
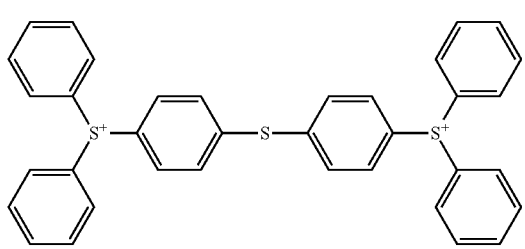 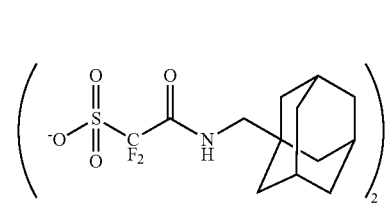
(B-12)
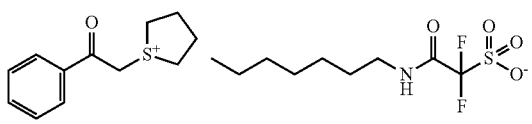
(B-13)
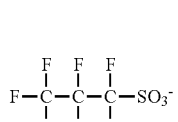 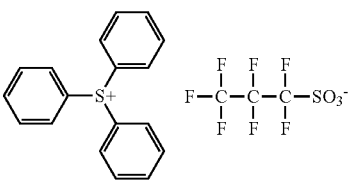

-continued
(B-14)
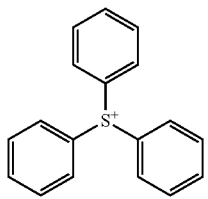 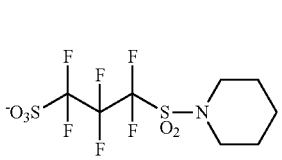
(B-15)
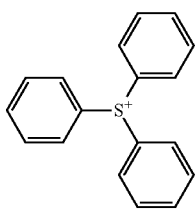 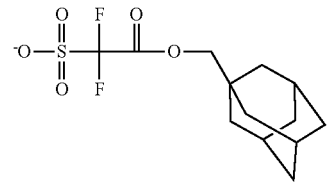
(B-16)
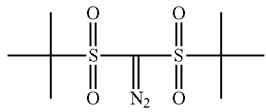
(B-17)
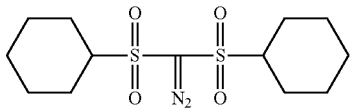
(B-18)
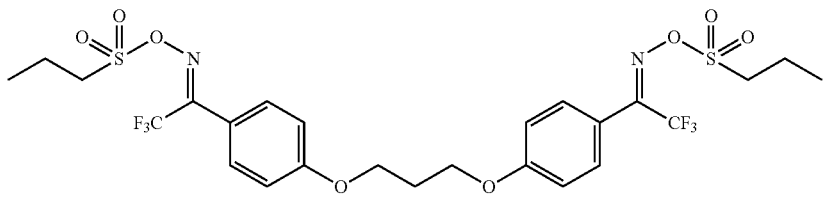
(B-19)
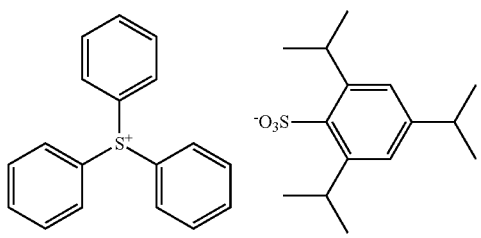
(B-20)
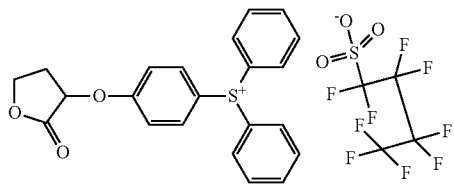 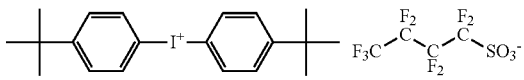
(B-21)
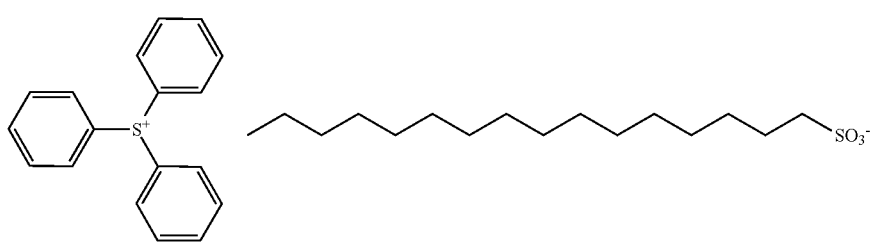
(B-22)
(B-23)
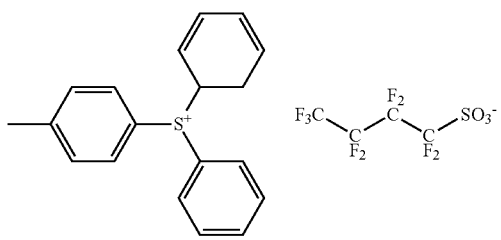
(B-24)
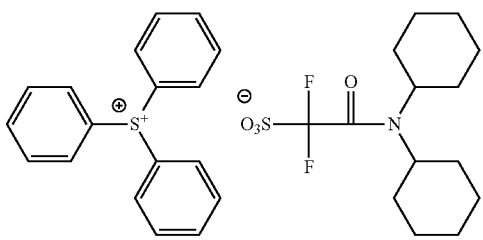

-continued (B-25) 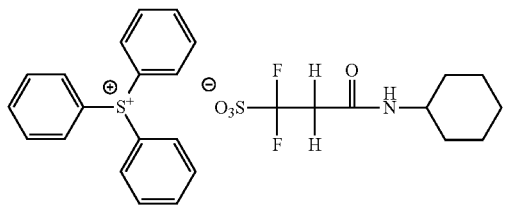

(B-26) 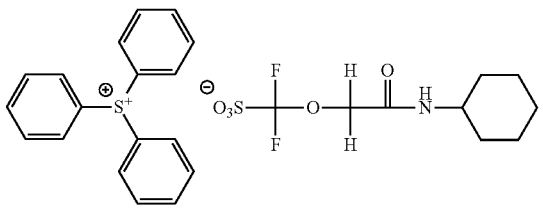

(B-27) 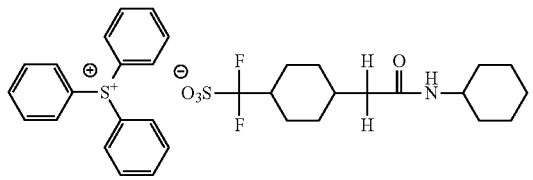

(B-28) 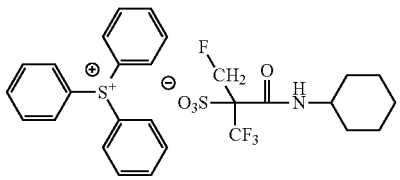

(B-29) 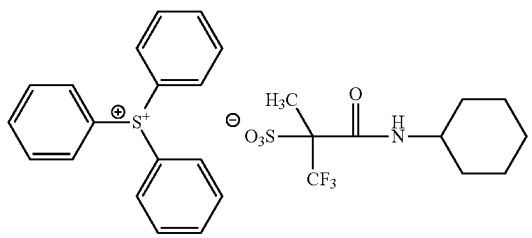

(B-30) 

(B-31) 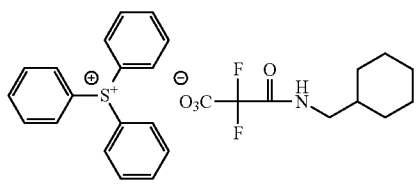

(B-32) 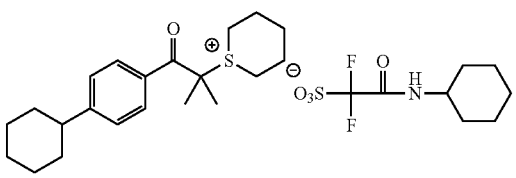

(B-33) 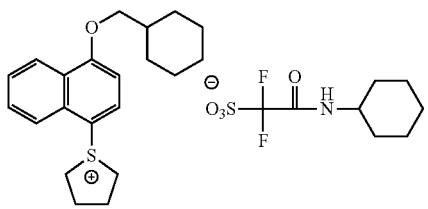

(B-34) 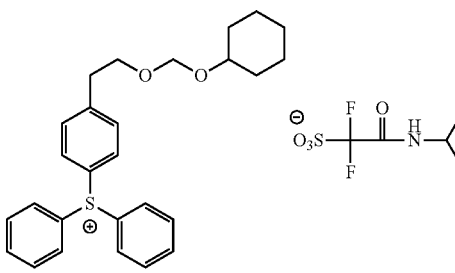

<Preparation of Resist Composition>

The components shown in Table 4 below were dissolved in the solvent shown in Table 4 to prepare a solution having a solid content concentration of 3.5 mass %, and the solution was filtered through a polyethylene filter having a pore size of 0.03 μm. In this way, Resist Compositions (Ar-1) to (Ar-45), (Ref-Ar-1) and (Ref-Ar-2) were prepared. In Table 4, the concentration value of each component except for the solvent is a value based on the entire solid content of the resist composition.

TABLE 4

| Resist Compound | Resin (mass %) | | Acid generator (mass %) | | Hydrophobic Resin (mass %) | | Basic Compound (mass %) | | Surfactant (mass %) | Solvent (mass %) | | |
|---|---|---|---|---|---|---|---|---|---|---|---|---|
| Ar-1 | A-1 (88.0) | — | B-1 (10.0) | — | — | — | C-1 (2.0) | — | — | A1 (60) | B1 (40) | — |
| Ar-2 | A-2 (87.5) | — | B-2 (10.0) | — | — | — | C-2 (2.0) | — | W-1 (0.5) | A1 (60) | B1 (40) | — |
| Ar-3 | A-3 (87.5) | — | B-3 (10.0) | — | — | — | C-1 (2.0) | — | W-1 (0.5) | A1 (60) | B1 (40) | — |
| Ar-4 | A-4 (87.5) | — | B-4 (10.0) | — | — | — | C-3 (2.0) | — | W-2 (0.5) | A1 (60) | B1 (40) | — |
| Ar-5 | A-5 (87.5) | — | B-5 (10.0) | — | — | — | C-4 (2.0) | — | W-2 (0.5) | A1 (60) | B1 (40) | — |
| Ar-6 | A-6 (88.0) | — | B-6 (10.0) | — | — | — | C-1 (2.0) | — | — | A1 (60) | B1 (40) | — |
| Ar-7 | A-1 (40.0) | A-2 (46.5) | B-7 (10.0) | — | — | — | C-1 (2.0) | C-4 (1.0) | W-3 (0.5) | A1 (60) | B1 (40) | — |
| Ar-8 | A-5 (87.0) | — | B-8 (10.0) | — | — | — | C-1 (2.0) | C-10 (0.5) | W-3 (0.5) | A1 (60) | B2 (40) | — |
| Ar-9 | A-6 (87.0) | — | B-9 (10.0) | — | — | — | C-1 (2.0) | C-5 (0.5) | W-1 (0.5) | A1 (60) | B2 (40) | — |
| Ar-10 | A-7 (88.0) | — | B-10 (10.0) | — | — | — | C-4 (2.0) | — | — | A1 (100) | — | — |
| Ar-11 | A-8 (87.5) | — | B-11 (10.0) | — | — | — | C-4 (2.0) | — | W-2 (0.5) | A1 (60) | B2 (40) | — |
| Ar-12 | A-7 (87.5) | — | B-12 (10.0) | — | — | — | C-1 (2.0) | — | W-3 (0.5) | A1 (60) | B2 (40) | — |
| Ar-13 | A-8 (86.5) | — | B-2 (5.0) | B-13 (6.0) | — | — | C-5 (2.0) | — | W-1 (0.5) | A1 (60) | B2 (40) | — |
| Ar-14 | A-9 (82.5) | — | B-2 (5.0) | B-14 (10.0) | — | — | C-6 (2.0) | — | W-1 (0.5) | A1 (60) | B2 (40) | — |
| Ar-15 | A-10 (82.5) | — | B-2 (5.0) | B-15 (10.0) | — | — | C-1 (2.0) | — | W-3 (0.5) | A1 (40) | A2 (20) | B2 (40) |
| Ar-16 | A-11 (82.5) | — | B-1 (10.0) | B-16 (5.0) | — | — | C-7 (2.0) | — | W-2 (0.5) | A1 (40) | A2 (20) | B2 (40) |
| Ar-17 | A-2 (82.5) | — | B-2 (10.0) | B-17 (5.0) | — | — | C-8 (2.0) | — | W-1 (0.5) | A1 (40) | A2 (20) | B2 (40) |
| Ar-18 | A-2 (83.0) | — | B-2 (10.0) | B-18 (5.0) | — | — | C-1 (2.0) | — | — | A1 (40) | A2 (20) | B2 (40) |
| Ar-19 | A-2 (84.5) | — | B-2 (10.0) | B-19 (3.0) | — | — | C-9 (2.0) | — | W-2 (0.5) | A1 (40) | A3 (20) | B2 (40) |
| Ar-20 | A-2 (84.5) | — | B-4 (10.0) | B-20 (3.0) | — | — | C-10 (2.0) | — | W-3 (0.5) | A1 (40) | A3 (20) | B2 (40) |
| Ar-21 | A-4 (85.0) | — | B-1 (10.0) | B-2 (3.0) | — | — | C-3 (2.0) | — | — | A1 (40) | A3 (20) | B2 (40) |
| Ar-22 | A-2 (84.5) | — | B-1 (10.0) | B-21 (3.0) | — | — | C-1 (2.0) | — | W-1 (0.5) | A1 (60) | B2 (40) | — |
| Ar-23 | A-2 (84.5) | — | B-1 (10.0) | B-22 (3.0) | — | — | C-11 (2.0) | — | W-1 (0.5) | A1 (60) | B2 (40) | — |
| Ar-24 | A-6 (87.0) | — | B-24 (10.0) | — | — | — | C-1 (2.0) | C-5 (0.5) | W-1 (0.5) | A1 (60) | B2 (40) | — |
| Ar-25 | A-7 (88.0) | — | B-25 (10.0) | — | — | — | C-4 (2.0) | — | — | A1 (100) | — | — |
| Ar-26 | A-8 (87.5) | — | B-26 (10.0) | — | — | — | C-4 (2.0) | — | W-2 (0.5) | A1 (60) | B2 (40) | — |
| Ar-27 | A-7 (87.5) | — | B-27 (10.0) | — | — | — | C-1 (2.0) | — | W-3 (0.5) | A1 (60) | B2 (40) | — |
| Ar-28 | A-2 (87.5) | — | B-28 (10.0) | — | — | — | C-2 (2.0) | — | W-1 (0.5) | A1 (60) | B1 (40) | — |
| Ar-29 | A-3 (87.5) | — | B-29 (10.0) | — | — | — | C-1 (2.0) | — | W-1 (0.5) | A1 (60) | B1 (40) | — |
| Ar-30 | A-4 (87.5) | — | B-30 (10.0) | — | — | — | C-3 (2.0) | — | W-2 (0.5) | A1 (60) | B1 (40) | — |
| Ar-31 | A-1 (87.5) | — | B-1 (10.0) | — | 1b (0.5) | — | C-1 (2.0) | — | — | A1 (60) | B1 (40) | — |
| Ar-32 | A-2 (86.8) | — | B-2 (10.0) | — | 2b (0.7) | — | C-2 (2.0) | — | W-1 (0.5) | A1 (60) | B1 (40) | — |
| Ar-33 | A-1 (87.3) | — | B-1 (10.0) | — | 1b (0.2) | 3b (0.5) | C-1 (2.0) | — | — | A1 (60) | B1 (40) | — |
| Ar-34 | A-3 (87.5) | — | B-31 (10.0) | — | — | — | C-1 (2.0) | — | W-1 (0.5) | A1 (70) | A3 (30) | — |
| Ar-35 | A-2 (85.0) | — | B-2 (8.0) | B-10 (5.0) | — | — | C-2 (1.5) | — | W-2 (0.5) | A1 (70) | A3 (30) | — |
| Ar-36 | A-2 (84.5) | — | B-4 (10.0) | B-32 (3.0) | — | — | C-1 (2.0) | — | W-1 (0.5) | A1 (70) | A3 (30) | — |
| Ar-37 | A-2 (84.5) | — | B-4 (10.0) | B-33 (4.0) | — | — | C-4 (1.0) | — | W-3 (0.5) | A1 (70) | A3 (30) | — |
| Ar-38 | A-4 (88.0) | — | B-34 (10.0) | — | — | — | C-2 (1.5) | — | W-1 (0.5) | A1 (70) | A3 (30) | — |

TABLE 4-continued
| Resist Compound | Resin (mass %) | | Acid generator (mass %) | | Hydrophobic Resin (mass %) | | Basic Compound (mass %) | | Surfactant (mass %) | | Solvent (mass %) | | |
|---|---|---|---|---|---|---|---|---|---|---|---|---|---|
| Ar-39 | A-5 (82.5) | — | B-4 (8.0) | B-34 (7.0) | — | — | C-1 (2.0) | — | W-1 (0.5) | | A1 (70) | A3 (30) | — |
| Ar-40 | A-3 (87.0) | — | B-31 (10.0) | — | 1b (0.5) | — | C-1 (2.0) | — | W-1 (0.5) | | A1 (70) | A3 (30) | — |
| Ar-41 | A-2 (84.5) | — | B-2 (8.0) | B-10 (5.0) | 1b (0.5) | — | C-2 (1.5) | — | W-2 (0.5) | | A1 (70) | A3 (30) | — |
| Ar-42 | A-2 (84.0) | — | B-4 (10.0) | B-32 (3.0) | 1b (0.5) | — | C-1 (2.0) | — | W-1 (0.5) | | A1 (70) | A3 (30) | — |
| Ar-43 | A-2 (84.0) | — | B-4 (10.0) | B-33 (4.0) | 1b (0.5) | — | C-4 (1.0) | — | W-3 (0.5) | | A1 (70) | A3 (30) | — |
| Ar-44 | A-4 (87.5) | — | B-34 (10.0) | — | 1b (0.5) | — | C-2 (1.5) | — | W-1 (0.5) | | A1 (70) | A3 (30) | — |
| Ar-45 | A-5 (82.0) | — | B-4 (8.0) | B-34 (7.0) | 1b (0.3) | 2b (0.2) | C-1 (2.0) | — | W-1 (0.5) | | A1 (70) | A3 (30) | — |
| Ref-Ar-1 | A-2 (87.5) | — | B-13 (10.0) | — | — | — | C-1 (2.0) | — | W-1 (0.5) | | A1 (60) | B2 (40) | — |
| Ref-Ar-2 | A-2 (87.5) | — | B-23 (10.0) | — | — | — | C-1 (2.0) | — | W-1 (0.5) | | A1 (60) | B2 (40) | — |
Abbreviations in Table 4 are as follows.
C-1 to C-11: Each indicates the compound shown below.
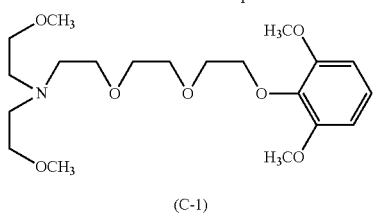
(C-1)
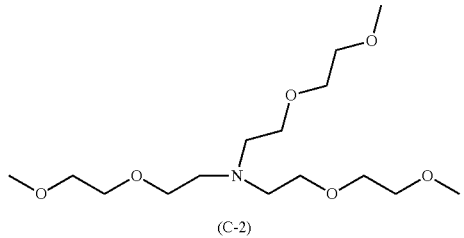
(C-2)
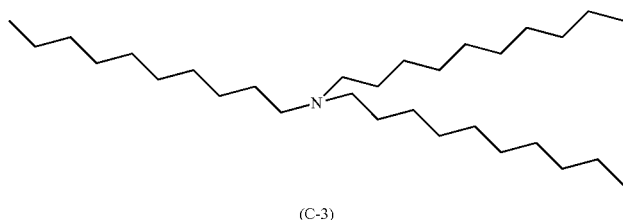 [SMILES: CCCCCCCCCCN(CCCCCCCCCC)CCCCCCCCCC ; "(C-3)"]
(C-3)
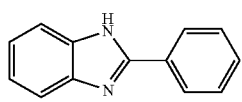
(C-4)
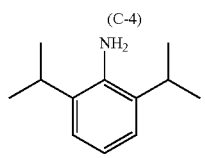
(C-5)
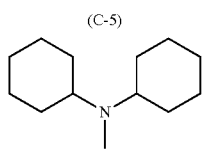
(C-6)

TABLE 4-continued

| Resist Compound | Resin (mass %) | Acid generator (mass %) | Hydrophobic Resin (mass %) | Basic Compound (mass %) | Surfactant (mass %) | Solvent (mass %) |
|---|---|---|---|---|---|---|

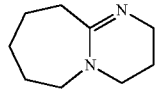

(C-7)

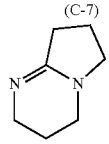

(C-8)

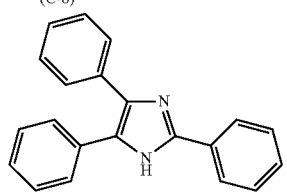

(C-9)

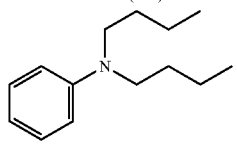

(C-10)

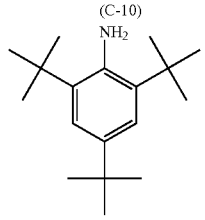

(C-11)

W-1: Megaface F176 (produced by Dainippon Ink & Chemicals, Inc.)
W-2: Megaface R08 (produced by Dainippon Ink & Chemicals, Inc.)
W-3: PF6320 (produced by OMNOVA)
A1 : Propylene glycol monomethyl ether acetate
A2: γ-Butyrolactone
A3: Cyclohexanone
B1: Propylene glycol monomethyl ether
B2: Ethyl lactate
Using the prepared resist composition, a resist pattern was formed by the following method.

Example 1 (One Exposure→Negative Development, abbr.: E-B-N)

An organic antireflection film, ARC29A (produced by Nissan Chemical Industries, Ltd.), was coated on a silicon wafer and baked at 205° C. over 60 seconds to form an antireflection film having a thickness of 86 nm.

Resist Composition Ar-1 was coated on the antireflection film and baked at 100° C. over 60 seconds to form a resist film having an average thickness of 0.10 nm.

The formed resist film was exposed through a 6% halftone mask having a 1:1 line-and-space pattern with a line width of 75 nm by using an ArF excimer laser scanner (PAS5500/1100, manufactured by ASML, NA: 0.75, Dipole, σo/σi=0.89/0.65). Thereafter, the resist film was baked at 90° C. over 60 seconds and dipped in an organic solvent-based developer (butyl acetate) over 30 seconds. After this development treatment, the film was rinsed using a rising solution (4-methyl-2-pentanol) and then spin-dried to form a 1:1 line-and-space resist pattern with a line width of 75 nm.

Examples 2 to 36 and Comparative Examples 1 and 2

A 1:1 line-and-space resist pattern with a line width of 75 nm was formed in the same manner as in Example 1 except for employing the resist compositions shown in Table 5.

Example 37 (One Exposure→Positive Development→Negative Development, abbr.: E-B-P-N)

An organic antireflection film, ARC29A (produced by Nissan Chemical Industries, Ltd.), was coated on a silicon wafer and baked at 205° C. over 60 seconds to form an antireflection film having a thickness of 86 nm.

Resist Composition Ar-1 was coated on the antireflection film and baked at 100° C. over 60 seconds to form a resist film having an average thickness of 0.10 μm.

The formed resist film was exposed through a 6% halftone mask having a 1:1 line-and-space pattern with a line width of 240 nm by using an ArF excimer laser scanner (PAS5500/1100, manufactured by ASML, NA: 0.75, Dipole, σo/σi=0.89/0.65). Thereafter, the resist film was baked at 105° C. over 60 seconds, developed with an aqueous tetramethylammonium hydroxide solution (2.38 mass %) (alkali developer) for 30 seconds (positive development) and rinsed with pure water to obtain a pattern having a pitch of 480 nm and a line width of 360 nm. Subsequently, the film was developed with an organic solvent-based developer (butyl acetate) for 30 seconds (negative development) and rinsed with a rising solution (4-methyl-2-pentanol), and then the wafer was spun at a rotational speed of 4,000 rpm for 30 seconds to obtain a 1:1 line-and-space resist pattern with a line width of 120 nm.

Comparative Example 3

A 1:1 line-and-space resist pattern with a line width of 120 nm was formed in the same manner as in Example 37 except for employing Resist Compositions (Ref-Ar-2).

Example 38 (One Exposure→Negative Development→Positive Development, Abbr.: E-B-N-P)

An organic antireflection film, ARC29A (produced by Nissan Chemical Industries, Ltd.), was coated on a silicon wafer and baked at 205° C. over 60 seconds to form an antireflection film having a thickness of 86 nm.

Resist Composition Ar-1 was coated on the antireflection film and baked at 100° C. over 60 seconds to form a resist film having an average thickness of 0.10 μm.

The formed resist film was exposed through a 6% halftone mask having a 1:1 line-and-space pattern with a line width of 200 nm by using an ArF excimer laser scanner (PAS5500/1100, manufactured by ASML, NA: 0.75, Dipole, σo/σi=0.89/0.65). Thereafter, the resist film was baked at 105° C. over 60 seconds, developed with an organic solvent-based developer (butyl acetate) for 30 seconds (negative development) and rinsed with a rising solution (4-methyl-2-pentanol), and then the wafer was spun at a rotational speed of 4,000 rpm for 30 seconds to obtain a pattern having a pitch of 400 nm and a line width of 300 nm. Subsequently, the film was developed with an aqueous tetramethylammonium hydroxide solution (2.38 mass %) (alkali developer) for 30 seconds (positive development) and rinsed with pure water to obtain a 1:1 line-and-space resist pattern with a line width of 100 nm.

Comparative Example 4

A 1:1 line-and-space resist pattern with a line width of 100 nm was formed in the same manner as in Example 38 except for employing Resist Compositions (Ref-Ar-2).

Example 39 (Two Exposures→Negative Development, abbr.: E-E-B-N)

An organic antireflection film, ARC29A (produced by Nissan Chemical Industries, Ltd.), was coated on a silicon wafer and baked at 205° C. over 60 seconds to form an antireflection film having a thickness of 86 nm.

Resist Composition Ar-1 was coated on the antireflection film and baked at 100° C. over 60 seconds to form a resist film having an average thickness of 0.10 μm. The formed resist film was subjected to a first exposure through a 6% halftone mask having a 1:1 line-and-space pattern with a line width of 75 nm by using an ArF excimer laser seamier (PAS5500/1100, manufactured by ASML, NA: 0.75, Dipole, σo/σi=0.89/0.65). Subsequently, the mask was rotated in the direction orthogonal to the first exposure, and the resist film was subjected to a second exposure through the mask. Thereafter, the film was baked at 105° C. over 60 seconds, developed by puddling an organic solvent-based developer (butyl acetate) for 30 seconds (negative development) and rinsed by puddling a rising solution (4-methyl-2-pentanol) for 30 seconds, and then the wafer was spun at a rotational speed of 4,000 rpm for 30 seconds to obtain a pattern having a pitch of 150 nm and a line width of 75 nm.

Example 40 (one exposures→baking→positive development→negative development, abbr.: E-B-P-B-N)

An organic antireflection film, ARC29A (produced by Nissan Chemical Industries, Ltd.), was coated on a silicon wafer and baked at 205° C. over 60 seconds to form an antireflection film having a thickness of 86 nm.

Resist Composition Ar-1 was coated on the antireflection film and baked at 100° C. over 60 seconds to form a resist film having an average thickness of 0.10 μm.

The formed resist film was exposed through a 6% halftone mask having a 1:1 line-and-space pattern with a line width of 200 nm by using an ArF excimer laser scanner (PAS5500/1100, manufactured by ASML, NA: 0.75, Dipole, σo/σi=0.89/0.65). Thereafter, the resist film was baked at 95° C. over 60 seconds, developed with an aqueous tetramethylammonium hydroxide solution (2.38 mass %) (alkali developer) for 30 seconds (positive development) and rinsed with pure water to obtain a pattern having a pitch of 400 nm and a line width of 300 ma. Subsequently, the film was baked at 105° C. over 60 seconds, developed with an organic solvent-based developer (butyl acetate) for 30 seconds (negative development) and rinsed with a rising solution (4-methyl-2-pentanol), and then the wafer was spun at a rotational speed of 4,000 rpm for 30 seconds to obtain a 1:1 line-and-space resist pattern with a line width of 100 nm.

Example 41 (one exposures→baking→negative development→positive development, abbr.: E-B-N-B-P)

An organic antireflection film, ARC29A (produced by Nissan Chemical Industries, Ltd.), was coated on a silicon wafer and baked at 205° C. over 60 seconds to form an antireflection film having a thickness of 86 nm.

Resist Composition Ar-1 was coated on the antireflection film and baked at 100° C. over 60 seconds to form a resist film having an average thickness of 0.10 μm.

The formed resist film was exposed through a 6% halftone mask having a 1:1 line-and-space pattern with a line width of 200 nm by using an ArF excimer laser scanner (PAS5500/1100, manufactured by ASML, NA: 0.75, Dipole, σo/σi=0.89/0.65). Thereafter, the resist film was baked at 95° C. over 60 seconds, developed with an organic solvent-based developer (butyl acetate) for 30 seconds (negative development) and rinsed with a rising solution (4-methyl-2-pentanol), and then the wafer was spun at a rotational speed of 4,000 rpm for 30 seconds to obtain a pattern having a pitch of 400 nm and a line width of 300 nm. Subsequently, the film was baked at 105° C. over 60 seconds, developed with an aqueous tetramethylammonium hydroxide solution (2.38 mass %) (alkali developer) for 30 seconds (positive development) and rinsed with pure water to obtain a 1:1 line-and-space resist pattern with a line width of 100 nm.

<Evaluation Method>

[Sensitivity ($E_{opt}$)]

The line width was observed using a Critical Dimension scanning electron microscope (SEM, S-9260, manufactured by Hitachi Ltd.), and the optimal exposure dose when resolving a 1:1 line-and-space resist pattern with a line width of 75 nm (here, with respect to Example 37 and Comparative Example 3, a 1:1 line-and-space pattern with a line width of 120 nm; with respect to Examples 38, 40 and 41 and Comparative Example 4, a 1:1 line-and-space pattern with a line width of 100 nm; and with respect to Example 39, a hole pattern with a pitch of 150 nm and a hole diameter of 75 nm) was defined as the sensitivity ($E_{opt}$) (mJ/cm$^2$) (in the case of multiple development, the exposure dose means an exposure dose for finally forming the above-described line-and-space resist pattern after multiple development; and in the case of multiple exposure, the exposure dose means a first exposure dose for forming the above-described line-and-space resist pattern). As this value is smaller, the sensitivity is higher.

[Exposure Latitude (EL)]

The exposure dose latitude allowing for a ±10% tolerance on the pattern size of each of Examples and Comparative Examples when changing the exposure dose from the above-described optimal exposure dose with respect to the pattern formation in Examples and Comparative Examples was determined, and this value was divided by the sensitivity ($E_{oot}$) and expressed in percentage. As the value is larger, the fluctuation of performance due to change in the exposure dose is smaller and the exposure latitude (EL) (%) is better.

[Line Width Roughness (LWR)]

A 1:1 line-and-space resist pattern with a line width of 75 nm (here, with respect to Example 37 and Comparative Example 3, a 1:1 line-and-space pattern with a line width of 120 nm; and with respect to Examples 38, 40 and 41 and Comparative Example 4, a 1:1 line-and-space pattern with a line width of 100 nm) was observed using a Critical Dimension scanning electron microscope (SEM: S-9260, manufactured by Hitachi Ltd.), and the line width was measured at 50 points at regular intervals in the range of 2 μm edge in the longitudinal direction of the space pattern. From the standard deviation thereof, 3σ was computed, whereby the line width roughness was measured. A smaller value indicates higher performance.

[Mask Error Enhancement Factor (MEEF)]

With respect to the mask used in each of Examples and Comparative Examples, the line width of the mask was changed while fixing the pitch (the sum of a line width and a space width) of the mask, and a pattern was formed according to the method of each of Examples and Comparative Examples with the above-described optimal exposure dose in each of Examples and Comparative Examples. The absolute value of gradient of the change in the line width (in Example 39, the diameter of a hole pattern) of the obtained pattern was defined as MEEF. That is, MEEF defined by the following formula was calculated. As this value is closer to 1, the performance as a resist is higher.

Line width (nm) of pattern=a×variation (nm) of line width of mask+b(the absolute value of a=MEEF, b=constant).

[Pattern Profile]

The cross-sectional profile of each pattern at the exposure dose giving the above-described sensitivity was observed using a scanning electron microscope (S-4800, manufactured by Hitachi Ltd.), and the pattern profile was evaluated according to the following criteria.

5: The cross-sectional shape was rectangular and the effect of standing wave was not observed.
4: The cross-sectional shape was almost rectangular and the effect of standing wave was not observed.
3: The cross-sectional shape was almost rectangular and the effect of standing wave was partially observed.
2: The cross-sectional shape was tapered and the effect of standing wave was partially observed.
1: The cross-sectional shape was tapered and the effect of standing wave was observed.

TABLE 5

| | Resist Composition | Sensitivity (mJ/cm$^2$) | EL (%) | LWR (nm) | MEEF | Pattern Profile |
|---|---|---|---|---|---|---|
| Example 1 | Ar-1 | 20 | 15 | 3.5 | 4.2 | 3 |
| Example 2 | Ar-2 | 20 | 17 | 2.1 | 3.5 | 5 |
| Example 3 | Ar-3 | 23 | 14 | 3.2 | 3.1 | 3 |
| Example 4 | Ar-4 | 25 | 15 | 3.0 | 3.3 | 4 |
| Example 5 | Ar-5 | 26 | 14 | 3.1 | 3.4 | 4 |
| Example 6 | Ar-6 | 25 | 13 | 3.0 | 3.5 | 4 |
| Example 7 | Ar-7 | 24 | 12 | 3.5 | 4.2 | 4 |
| Example 8 | Ar-8 | 23 | 14 | 3.1 | 3.7 | 4 |
| Example 9 | Ar-9 | 20 | 16 | 2.5 | 3.4 | 5 |
| Example 10 | Ar-10 | 21 | 15 | 2.5 | 3.2 | 5 |
| Example 11 | Ar-11 | 20 | 15 | 2.6 | 3.1 | 5 |
| Example 12 | Ar-12 | 25 | 12 | 3.5 | 4.1 | 3 |
| Example 13 | Ar-13 | 19 | 16 | 2.4 | 3.4 | 5 |
| Example 14 | Ar-14 | 20 | 16 | 2.8 | 3.4 | 5 |
| Example 15 | Ar-15 | 24 | 13 | 3.3 | 3.9 | 3 |
| Example 16 | Ar-16 | 25 | 12 | 3.4 | 3.8 | 3 |
| Example 17 | Ar-17 | 21 | 17 | 2.7 | 3.2 | 4 |
| Example 18 | Ar-18 | 22 | 16 | 2.8 | 3.3 | 5 |
| Example 19 | Ar-19 | 23 | 16 | 2.6 | 3.4 | 5 |
| Example 20 | Ar-20 | 25 | 14 | 3.0 | 3.7 | 3 |
| Example 21 | Ar-21 | 26 | 13 | 3.1 | 3.9 | 4 |
| Example 22 | Ar-22 | 25 | 13 | 3.9 | 3.8 | 3 |
| Example 23 | Ar-23 | 27 | 12 | 3.6 | 3.6 | 3 |
| Example 24 | Ar-24 | 20 | 16 | 2.5 | 3.3 | 5 |
| Example 25 | Ar-25 | 23 | 13 | 2.8 | 3.7 | 4 |
| Example 26 | Ar-26 | 24 | 14 | 2.7 | 3.6 | 3 |
| Example 27 | Ar-27 | 23 | 15 | 2.9 | 3.7 | 4 |
| Example 28 | Ar-28 | 24 | 14 | 2.8 | 3.5 | 4 |
| Example 29 | Ar-29 | 25 | 15 | 2.7 | 3.6 | 4 |
| Example 30 | Ar-30 | 24 | 15 | 2.8 | 3.7 | 4 |
| Example 31 | Ar-34 | 25 | 16 | 3.0 | 3.3 | 4 |
| Example 32 | Ar-35 | 24 | 15 | 2.5 | 3.2 | 5 |
| Example 33 | Ar-36 | 25 | 15 | 2.4 | 3.4 | 4 |
| Example 34 | Ar-37 | 23 | 14 | 2.5 | 3.4 | 5 |
| Example 35 | Ar-38 | 25 | 15 | 3.1 | 3.2 | 4 |
| Example 36 | Ar-39 | 24 | 16 | 2.4 | 3.4 | 4 |
| Example 37 | Ar-1 | 20 | 18 | 2.9 | 3.4 | 5 |
| Example 38 | Ar-1 | 20 | 14 | 2.9 | 3.5 | 5 |
| Example 39 | Ar-1 | 23 | 17 | — | 4.2 | 4 |
| Example 40 | Ar-1 | 25 | 12 | 3.0 | 3.7 | 4 |
| Example 41 | Ar-1 | 20 | 17 | 2.3 | 2.5 | 4 |
| Comparative Example 1 | Ref-Ar-1 | 40 | 5 | 5.0 | 7.0 | 1 |
| Comparative Example 2 | Ref-Ar-2 | 50 | 6 | 4.7 | 8.2 | 1 |
| Comparative Example 3 | Ref-Ar-2 | 47 | 6 | 4.8 | 8.2 | 1 |
| Comparative Example 4 | Ref-Ar-2 | 50 | 5 | 5.0 | 8.2 | 1 |

It is seen from Table 5 that according to the pattern forming method of the present invention, the sensitivity, exposure latitude (EL), mass error enhancement factor (MEEF) and pattern profile are excellent and the line width variation (LWR) can be reduced, as compared with the pattern forming method of Comparative Examples where the acid generator capable of generating a sulfonic acid represented by formula (I) is not used.

Example 42 (One Exposure Negative Development, Abbr. iE-B-N)

An organic antireflection film-forming coating agent, ARC29A (produced by Nissan Chemical Industries, Ltd.), was coated on a silicon wafer and baked at 205° C. over 60 seconds to form an antireflection film having a thickness of 86 nm.

Resist Composition Ar-31 was coated on the antireflection film and baked at 100° C. over 60 seconds to form a resist film having an average thickness of 0.10 μm.

The formed resist film was exposed through a 6% halftone mask having a 1:1 line-and-space pattern with a line width of 75 nm by using an ArF excimer laser immersion scanner (XT1700i, manufactured by ASML, NA: 1.20, C-Quad, outer sigma: 0.981, inner sigma: 0.895, XY deflection). As for the immersion liquid, pure water was used. Thereafter, the resist film was baked at 90° C. over 60 seconds and dipped in an organic solvent-based developer (butyl acetate) over 30 seconds. After this development treatment, the film was rinsed with a rising solution (4-methyl-2-pentanol) and then spin-dried to form a 1:1 line-and-space resist pattern with a line width of 75 nm.

Example 43

A 1:1 line-and-space resist pattern with a line width of 75 nm was formed in the same manner as in Example 42 except for employing Resist Composition Ar-32.

Example 44

A 1:1 line-and-space resist pattern with a line width of 75 nm was formed in the same manner as in Example 42 except for employing Resist Composition Ar-33.

Examples 45 to 50

A 1:1 line-and-space resist pattern with a line width of 75 nm was formed in the same manner as in Example 42 except for employing each of Resist Compositions Ar-40 to Ar-45.

With respect to Examples 42 to 50, the sensitivity, exposure latitude (EL), line width variation (LWR), mask error enhancement factor (MEEF) and pattern profile were measured by the same methods as in Examples and Comparative Examples above, as a result, the same excellent results as in Examples 1 and 2 were obtained.

That is, the pattern forming method of the present invention was found to be suitably usable also for the pattern forming method using immersion exposure.

According to such the pattern forming performance, it is apparent that the pattern forming method and the chemical amplification resist composition of the present invention are remarkably effective in the production of an electronic device.

INDUSTRIAL APPLICABILITY

According to the present invention, a pattern forming method, a chemical amplification resist composition and a resist film, ensuring that the performance in terms of sensitivity, exposure latitude (EL), mask error enhancement factor (MEEF) and pattern profile is excellent and the line width variation (LWR) is reduced, can be provided.

The entire disclosure of Japanese Patent Application No. 2010-67076 filed on Mar. 23, 2010, and Japanese Patent Application No. 2011-031437 filed on Feb. 16, 2011, from which the benefit of foreign priority has been claimed in the present application, is incorporated herein by reference, as if fully set forth.

The invention claimed is:

1. A pattern forming method comprising:
(i) a step of forming a film from a chemical amplification resist composition,
(ii) a step of exposing the film, and
(iii) a step of developing the exposed film by using an organic solvent-containing developer,
wherein the resist composition contains:
(A) a resin capable of increasing the polarity to decrease the solubility for an organic solvent-containing developer by the action of an acid,
(B) at least one kind of a compound capable of generating a sulfonic acid represented by the following formula (I) upon irradiation with an actinic ray or radiation, and
(C) a solvent,

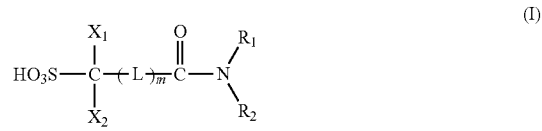

wherein each of $X_1$ and $X_2$ independently represents a fluorine atom or a fluoroalkyl group;
each of $R_1$ and $R_2$ independently represents a hydrogen atom, an alkyl group or a group having a cyclic structure, and $R_1$ and $R_2$ may combine with each other to form a ring, provided that $R_1$ and $R_2$ are not a hydrogen atom at the same time;
L represents a divalent linking group and when a plurality of L's are present, each L may be the same as or different from every other L; and
m represents an integer of 0 or more,
wherein the divalent linking group L is selected from the group consisting of a single bond, an alkylene group, a cycloalkylene group, and an alkenylene group.

2. The pattern forming method according to claim 1, wherein the content of the organic solvent in the organic solvent-containing developer is from 90 to 100 mass % based on the entire amount of the developer.

3. The pattern forming method according to claim 1, wherein the compound (B) is a compound represented by the following formula (II):

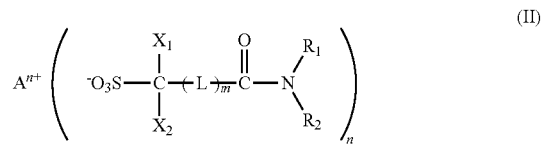

wherein $A^{n+}$ represents an n-valent cation, n represents 1 or 2, and $X_1$, $X_2$, $R_1$, $R_2$, L and m have the same meanings as $X_1$, $X_2$, $R_1$, $R_2$, L and m in formula (I).

4. The pattern forming method according to claim 1, wherein in formula (I), $R_1$ is a group having a polycyclic structure.

5. The pattern forming method according to claim 1, wherein in formula (I), each of $X_1$ and $X_2$ is independently a fluorine atom or a perfluoroalkyl group.

6. The pattern forming method according to claim 1, wherein in formula (I), each of $X_1$ and $X_2$ is a fluorine atom.

7. The pattern forming method according to claim 1, wherein the developer is a developer containing at least one kind of an organic solvent selected from the group consisting of a ketone-based solvent, an ester-based solvent, an alcohol-based solvent, an amide-based solvent and an ether-based solvent.

8. The pattern forming method according to claim 1, wherein the resin (A) is a resin capable of increasing the polarity to increase the solubility for an alkali developer by the action of an acid and the method further comprises:
(iv) a step of developing the film by using an alkali developer.

9. The pattern forming method according to claim 1, wherein the exposure in the step (ii) is immersion exposure.

10. The pattern forming method according to claim 1, which is a negative-type pattern forming method.

11. A method for producing an electronic device, comprising the pattern forming method according to claim 1.

12. An electronic device formed by the method according to claim 11.

13. The pattern forming method according to claim 1, wherein in formula (I), $X_1$ and $X_2$ are a fluorine atom.

14. The pattern forming method according to claim 3, wherein in formula (II), n is 1.

15. The pattern forming method according to claim 1, wherein in formula (I), m is 0.

16. The pattern forming method according claim 1, wherein in formula (I), L is —COO—, —OCO—, —CO—, —O—, —S—, —SO—, —SO$_2$—, an alkylene group, a cycloalkylene group or an alkenylene group.

17. The pattern forming method according to claim 1, wherein the chemical amplification resist composition further contains a hydrophobic resin having at least either a fluorine atom or a silicon atom.

18. The pattern forming method according to claim 1, wherein the resin (A) contains a repeating unit represented by the following formula (AI):

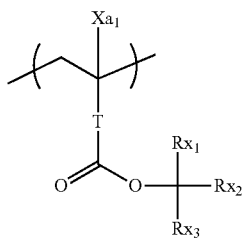

(AI)

wherein, $Xa_1$ represents a hydrogen atom, a methyl group which may have a substituent, or a group represented by —CH$_2$—R$_9$, R$_9$ represents a hydroxyl group or a monovalent organic group,
T represents a single bond or a divalent linking group,
each of $Rx_1$ to $Rx_3$ independently represents an linear or branched alkyl group or a monocyclic or polycyclic cycloalkyl group, provided that two members out of $Rx_1$ to $Rx_3$ may combine to form a monocyclic or polycyclic cycloalkyl group.

19. The pattern forming method according to claim 1, wherein the resin (A) contains a repeating unit having a lactone structure.

20. The pattern forming method according to claim 3, wherein in formula (II), n is 1, and the compound (B) represents a structure represented by the following formula (ZI-3):

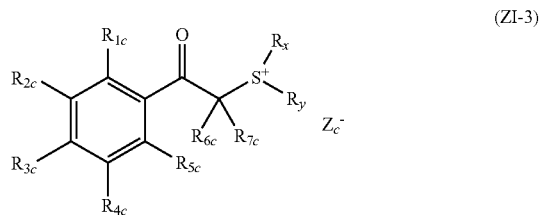

(ZI-3)

wherein, each of $R_{1c}$ to $R_{5c}$ independently represents a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group or an arylthio group,
each of $R_{6c}$ and $R_{7c}$ independently represents a hydrogen atom, an alkyl group, a cycloalkyl group, a halogen atom, a cyano group or an aryl group,
each of $R_x$ and $R_y$ independently represents an alkyl group, a cycloalkyl group, a 2-oxoalkyl group, a 2-oxocycloalkyl group, an alkoxycarbonylalkyl group, an allyl group or a vinyl group,
any two or more members out of $R_{1c}$ to $R_{5c}$, a pair of $R_{5c}$ and $R_{6c}$, a pair of $R_{6c}$ and $R_{7c}$, a pair of $R_{5c}$ and $R_x$, or a pair of $R_x$ and $R_y$ may combine together to form a ring structure, this ring structure may contain an oxygen atom, a sulfur atom, a ketone group, an ester bond or an amide bond,
$Zc^-$ represents a sulfonate anion of the compound represented by formula (II).

21. The pattern forming method according to claim 3, wherein in formula (II), n is 1, and the compound (B) represents a structure represented by the following formula (ZI-4):

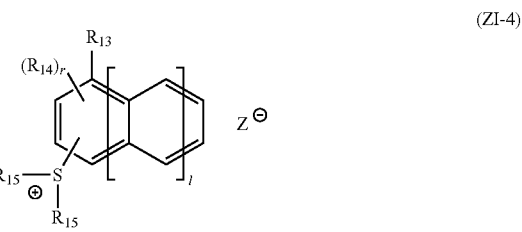

(ZI-4)

wherein, $R_{13}$ represents a hydrogen atom, a fluorine atom, a hydroxyl group, an alkyl group, a cycloalkyl group, an alkoxy group, an alkoxycarbonyl group, or a group having a cycloalkyl group, these groups may have a substituent,
$R_{14}$ represents, when a plurality of $R_{14}$'s are present, each independently represents, a hydroxyl group, an alkyl group, a cycloalkyl group, an alkoxy group, an alkoxycarbonyl group, an alkylcarbonyl group, an alkylsulfonyl group, a cycloalkylsulfonyl group, or a group having a cycloalkyl group, these groups may have a substituent, each $R_{15}$ independently represents an alkyl group, a cycloalkyl group or a naphthyl group, two $R_{15}$'s may combine with each other to form a ring, these groups may have a substituent, l represents an integer of 0 to 2, r represents an integer of 0 to 8, $Z^{31}$ represents a sulfonate anion of the compound represented by formula (II).

* * * * *